United States Patent
Pillay et al.

(10) Patent No.: US 6,948,098 B2
(45) Date of Patent: Sep. 20, 2005

(54) CIRCUITS AND METHODS FOR DEBUGGING AN EMBEDDED PROCESSOR AND SYSTEMS USING THE SAME

(75) Inventors: Sanjay Ramakrishna Pillay, Austin, TX (US); Raghunath Krishna Rao, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 574 days.

(21) Appl. No.: 09/822,052

(22) Filed: Mar. 30, 2001

(65) Prior Publication Data

US 2003/0051192 A1 Mar. 13, 2003

(51) Int. Cl.$^7$ .............................................. G06F 11/00
(52) U.S. Cl. ........................... 714/34; 714/30; 714/47
(58) Field of Search ............................ 714/27, 30, 34, 714/35, 39

(56) References Cited

U.S. PATENT DOCUMENTS

| | | | | |
|---|---|---|---|---|
| 5,321,828 A | * | 6/1994 | Phillips et al. ................. 703/28 |
| 5,329,471 A | * | 7/1994 | Swoboda et al. .............. 703/23 |
| 5,426,741 A | * | 6/1995 | Butts et al. .................... 710/18 |
| 5,687,311 A | * | 11/1997 | Hashimoto ..................... 714/34 |
| 5,812,830 A | * | 9/1998 | Naaseh-Shahry et al. ... 713/400 |
| 5,867,644 A | * | 2/1999 | Ranson et al. ................. 714/39 |
| 5,875,294 A | * | 2/1999 | Roth et al. ..................... 714/39 |
| 5,951,696 A | * | 9/1999 | Naaseh et al. ................. 714/34 |
| 6,012,142 A | * | 1/2000 | Dokic et al. .................... 713/2 |
| 6,131,174 A | * | 10/2000 | Fischer et al. .............. 714/733 |
| 6,587,967 B1 | * | 7/2003 | Bates et al. ................... 714/35 |
| 6,601,189 B1 | * | 7/2003 | Edwards et al. .............. 714/30 |
| 6,665,817 B1 | * | 12/2003 | Rieken ......................... 714/30 |
| 6,754,852 B2 | * | 6/2004 | Swoboda ...................... 714/39 |

OTHER PUBLICATIONS

Bannatyne, Ross, "Debugging Aids for Systems–on–a–Chip", IEEE, 1998.*

* cited by examiner

Primary Examiner—Robert Beausoliel
Assistant Examiner—Gabriel L. Chu
(74) Attorney, Agent, or Firm—Thompson & Knight LLP; James J. Murphy

(57) ABSTRACT

A debugging subsystem for testing a system-on-a-chip includes an embedded processor and memory and includes at least one debugging subblock monitors a bus between the processor and the memory to detect selected triggering events, counts the number of triggering events detected and when the number of triggering events reaches a predetermined threshold, generates a debugging signal.

18 Claims, 38 Drawing Sheets

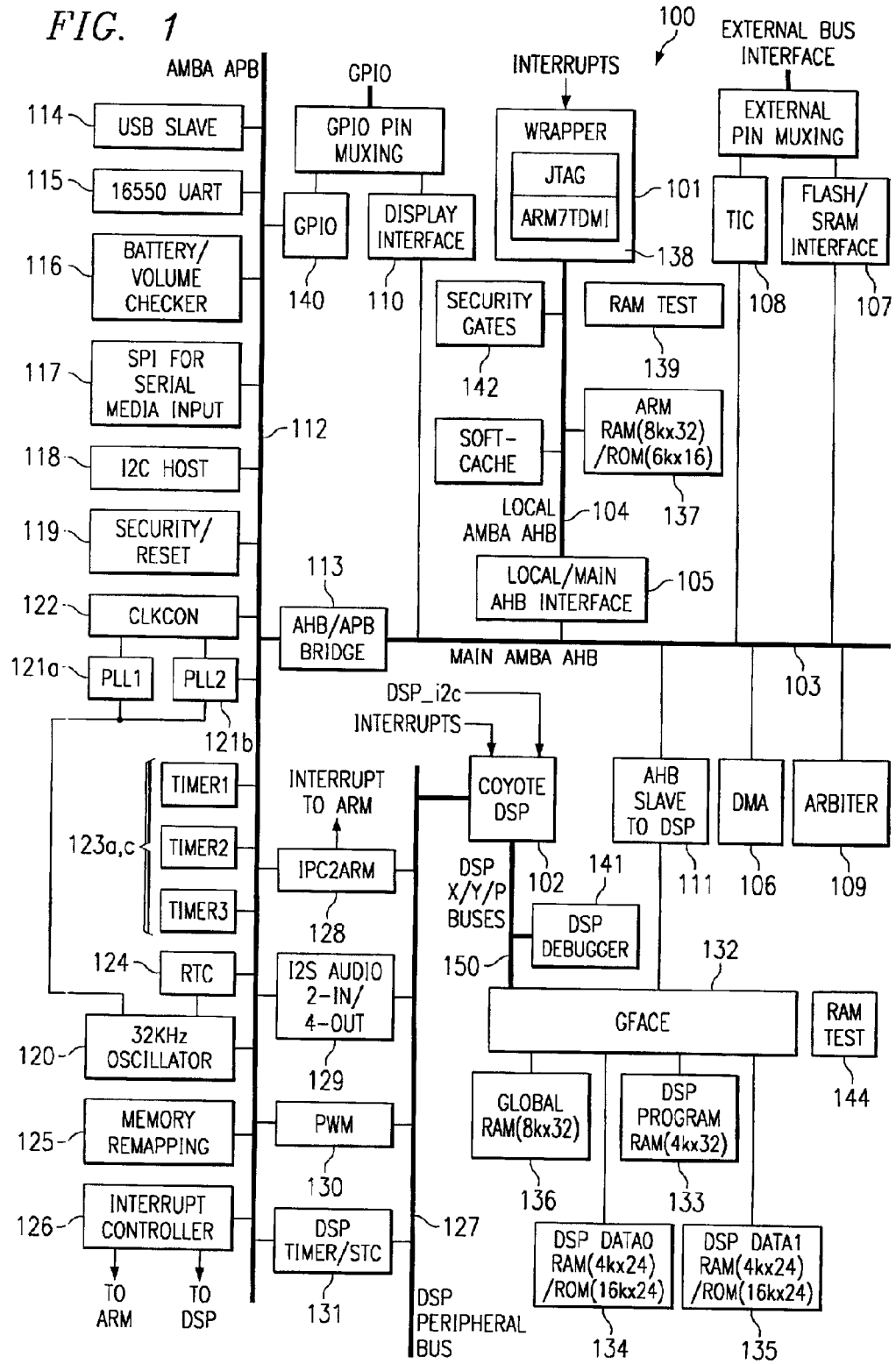

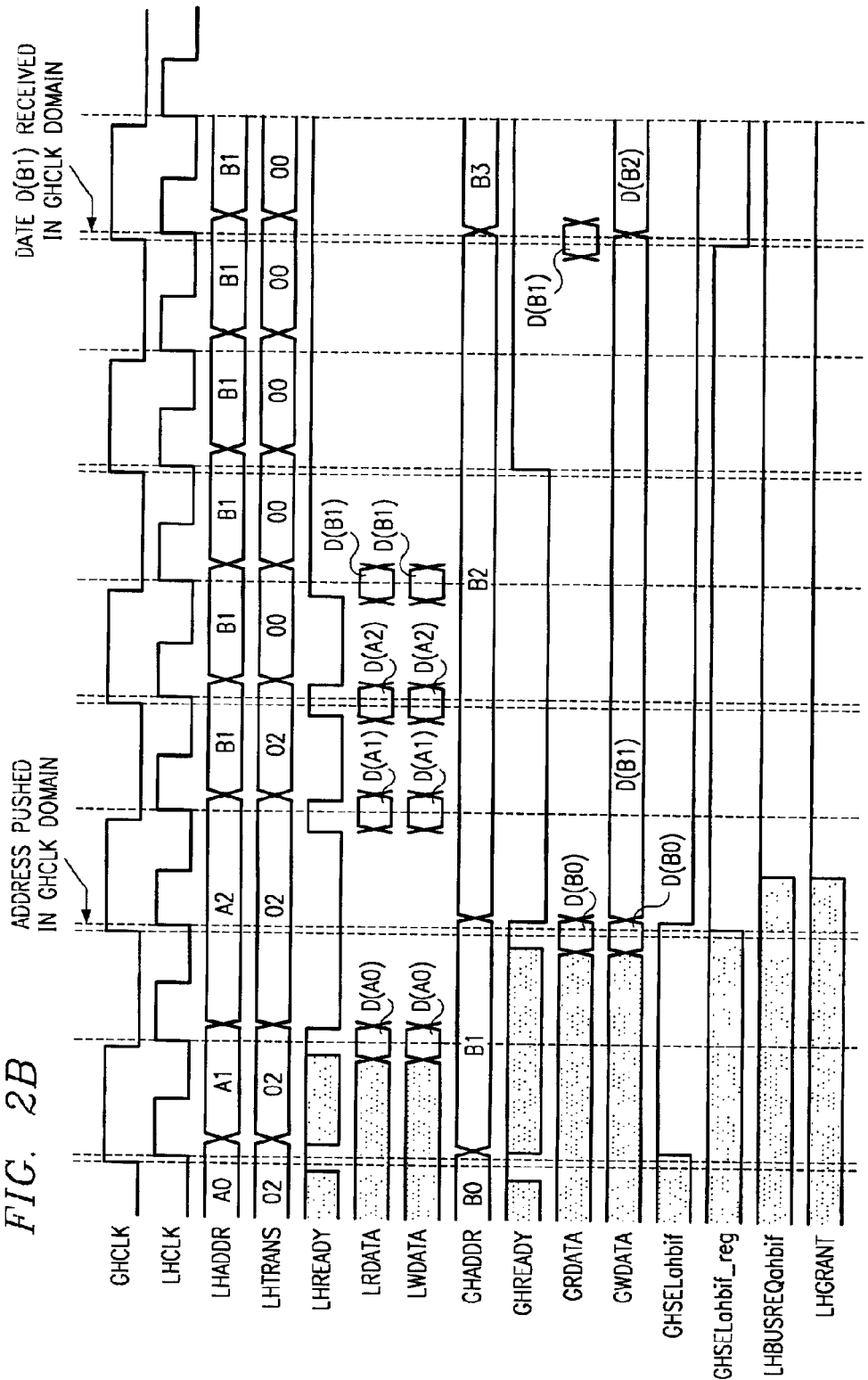

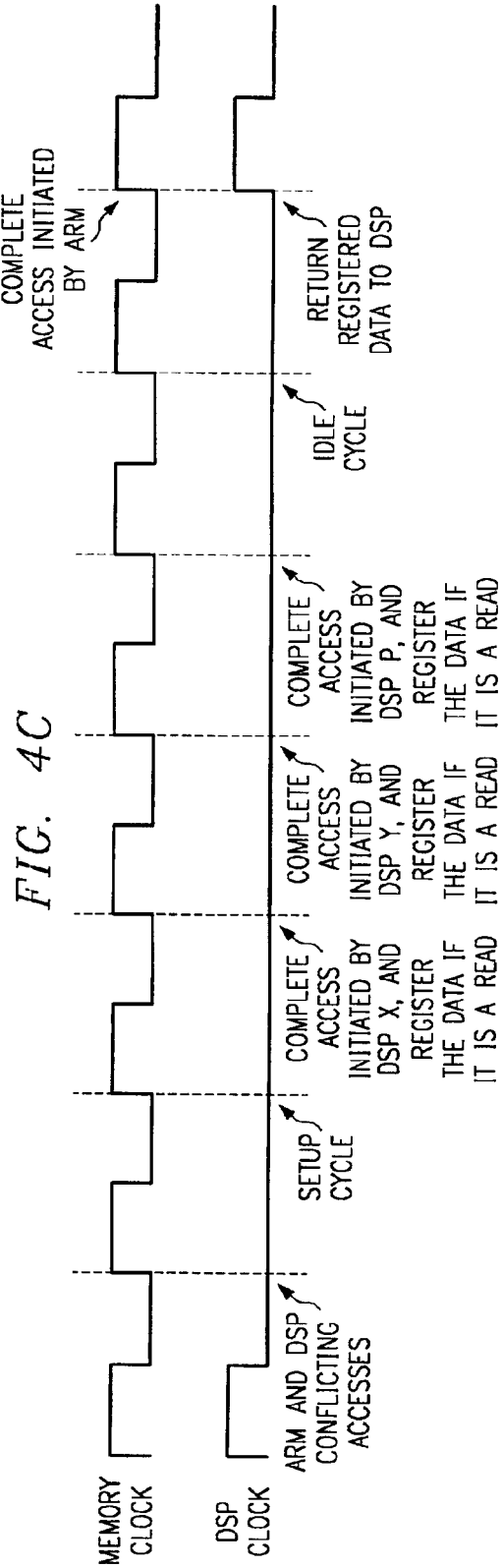
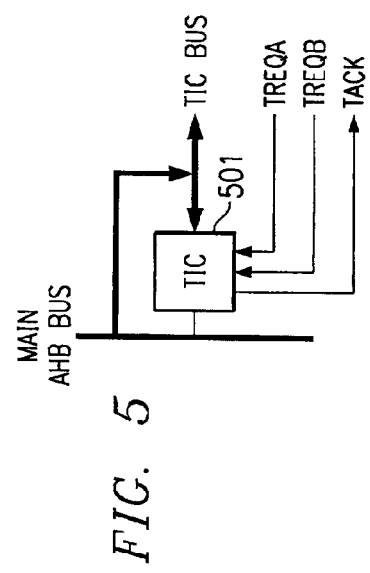

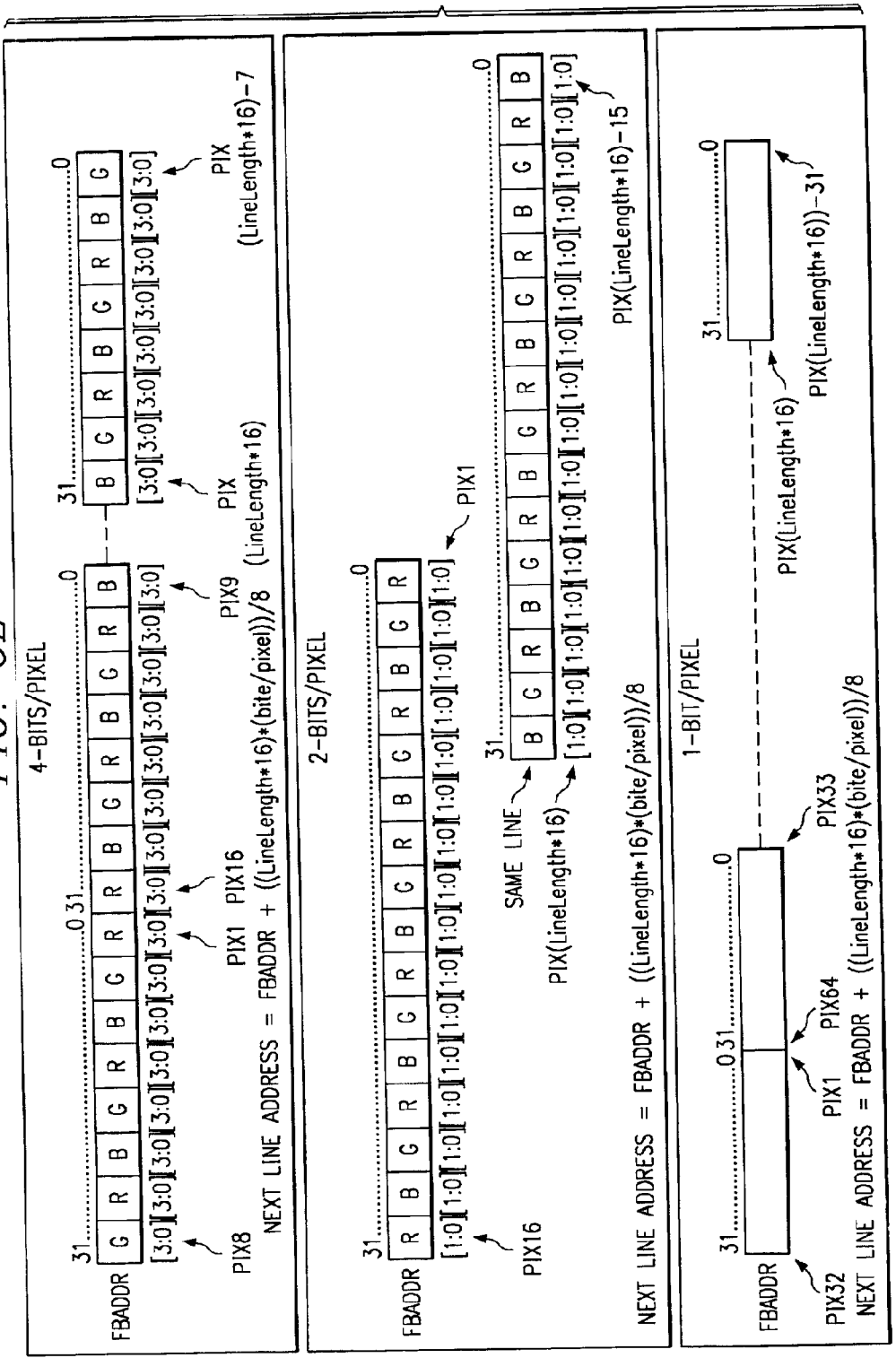

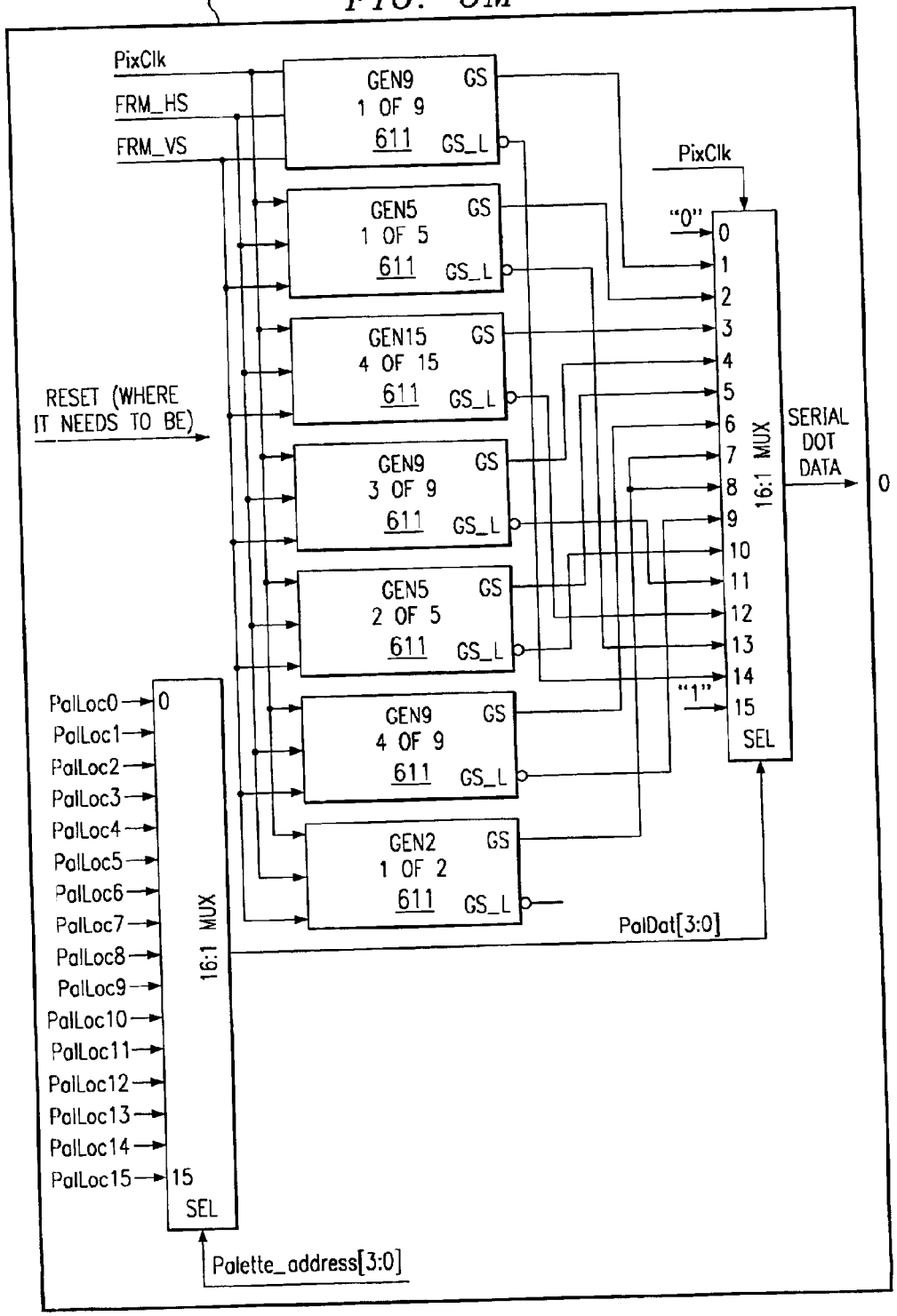

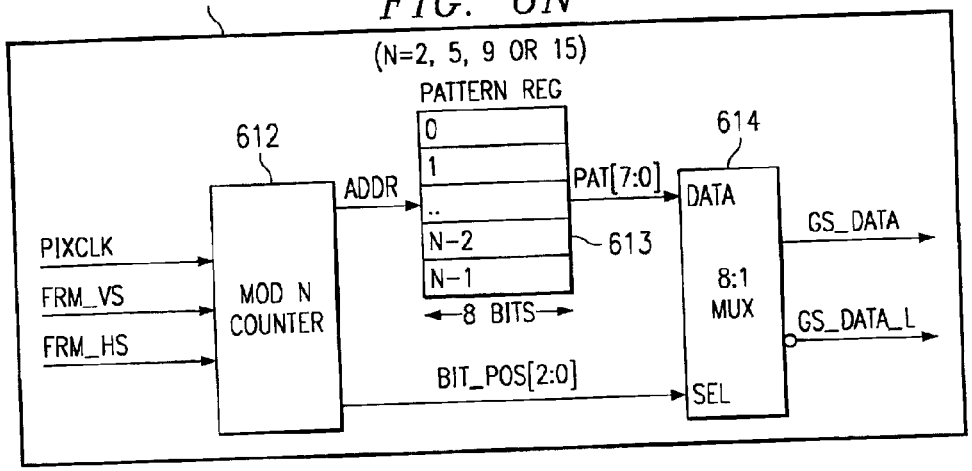
FIG. 6N
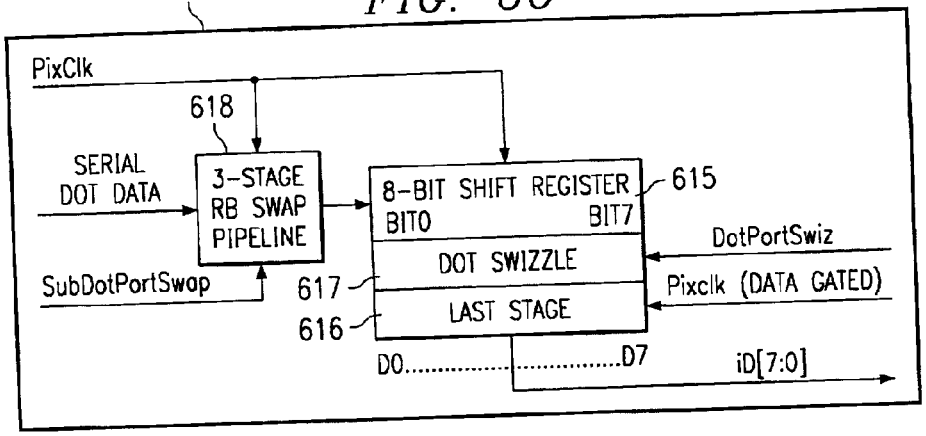
FIG. 6O
FIG. 6P
TIME (FROM THE SHIFT REGISTER POINT OF VIEW)
SubDotPortSwap=0
{BnGnRn}.....{B3G3R3}{B2G2R2}{B1G1R1}{B0G0R0}
SubDotPortSwap=1

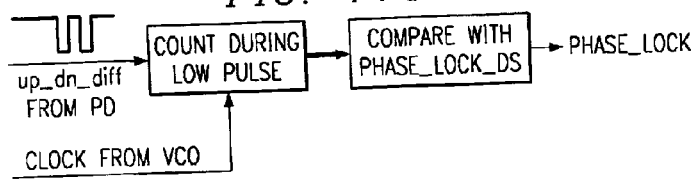
FIG. 11C
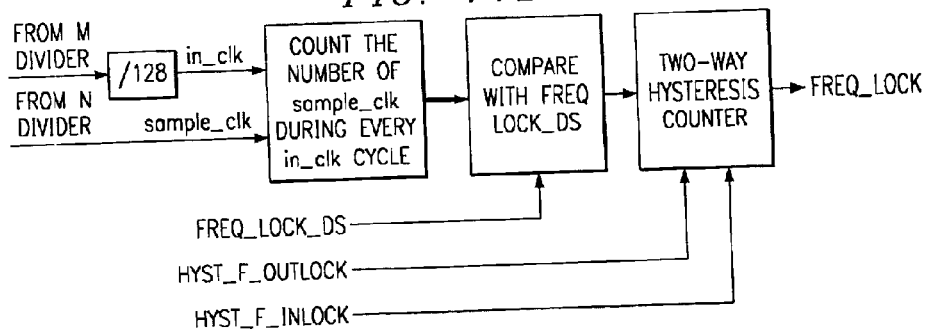
FIG. 11D
FIG. 12A
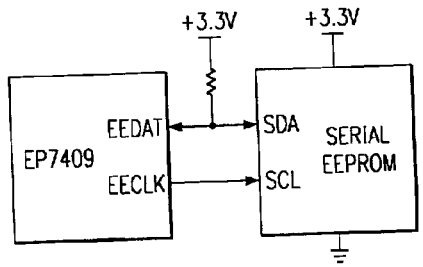
FIG. 12B
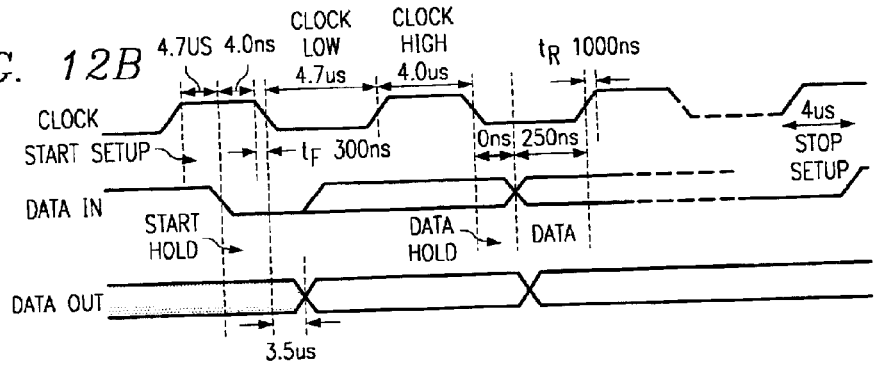

CIRCUITS AND METHODS FOR DEBUGGING AN EMBEDDED PROCESSOR AND SYSTEMS USING THE SAME

CROSS-REFERENCE TO RELATED APPLICATION

The following applications contain related information and is hereby incorporated by reference:

Ser. No. 09/822,546, by North entitled "A SYSTEM-ON-CHIP WITH SOFT CACHE AND SYSTEMS AND METHODS USING THE SAME", filed Mar. 30, 2001, and granted Sep. 16, 2003 as U.S. Pat. No. 6,622,208 B2; and Ser. No. 09/821,897 by Luo and North entitled "A SYSTEM ON A CHIP WITH MULTIPLE POWER PLANES AND ASSOCIATE POWER MANAGEMENT METHODS", filed Mar. 30, 2001, currently pending.

BACKGROUND OF THE INVENTION

1. Field of the Invention

The present invention relates in general to integrated circuits and in particular, to a system-on-a-chip with circuits and methods for debugging an embedded processor and systems using the same.

2. Description of the Related Art

Handheld personal electronic appliances have become increasingly popular as new technologies have produced affordable devices with a high degree of functionality. One such device is the portable digital audio player, which downloads digital audio data, stores those data in a read-writable memory, and converts those data into audio on user demand. The digital data is downloaded from a network or retrieved from a fixed medium, such as a compact disk, in one of several forms, including the MPEG Layer 3, ACC, and MS Audio protocols. An audio decoder, supported by appropriate firmware, retrieves the encoded data from memory, applies the corresponding decoding algorithm and coverts the decoded data into analog form for driving a headset or other portable speaker system.

The use of systems-on-a-chip in the design and construction of handheld digital music players allows all the requisite functionality to be contained in a compact, relatively inexpensive unit. Notwithstanding, the integration of the major functions of a digital music player into a single chip device is not a trivial task. Not only must the device include the processing power capable of performing digital to audio conversion efficiently, it must also be capable of interfacing with various sources of digitally encoded data, support different user I/O options, such as LCD displays and headphones, and operate in conjunction with sufficiently large on-chip and off-chip memory spaces storing (programming code and data) needed to produce high-quality audio.

SUMMARY OF THE INVENTION

According to one embodiment of the principles of the present invention, a debug subsystem is disclosed for testing a system-on-a-chip including an embedded processor and memory. The debug system includes at least one subblock for monitoring a bus between the processor and the memory to detect selected triggering events, counting the number of triggering events detected, and when the number of triggering events reaches a predetermined threshold, generating a debugging signal.

Systems and methods embodying the principles of the present invention realize substantial advantages over the prior art. Among other things, break points can be set by trapping the fetch of one or more instructions in program memory. Additionally, data input and output, especially between a processor and its peripherals, can be monitored by bus snooping. Moreover, the present principles allow for the identification of corrupted main or interrupted code, as well as peripheral or processor causing the corruption. Finally, the activity of a certain on chip resources, especially shared and arbitrated resources, can be monitored in real time and during actual usage.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a high level functional block diagram of a system-on-a-chip system embodying the principles of the present invention;

FIGS. 2B–2E are exemplary timing diagrams illustrating the operation of the bus architecture of FIG. 2A, where FIGS. 2B and 2C illustrate a typical transaction from the global AHB domain to the local AHB domain and FIGS. 2D and 2E illustrate a typical transaction from the local AHB domain to the global AHB domain;

FIG. 4C is a timing diagram illustrating a possible conflict when three DSP accesses and one microprocessor access to global memory occur simultaneously;

FIG. 5 is a block diagram illustrating the TIC bus connections;

FIG. 6L is timing diagram of an exemplary frame buffer mapping;

FIG. 6M is a high level functional block diagram of the frame rate modulator circuit of FIG. 6F;

FIG. 6N is a functional block diagram of a selected one of the generator circuits of FIG. 6M;

FIG. 6O is a functional block diagram of the swap, swizzle and collection buffer circuits of datapath block of 6F;

FIG. 6P is a diagram of illustrating a typical bit-swapping operation;

FIG. 11C is a functional block diagram of the phase lock detector of FIG. 11B;

FIG. 11D is a functional block diagram of the frequency lock detector of FIG. 11B;

FIG. 12A is a block diagram illustrating exemplary connections between the system of FIG. 1 and an external serial EEPROM;

FIG. 12B is a timing diagram of illustrating the clock and data relationship for the interconnections shown in FIG. 12A;

is a diagram of an exemplary debug block

Figure 17:
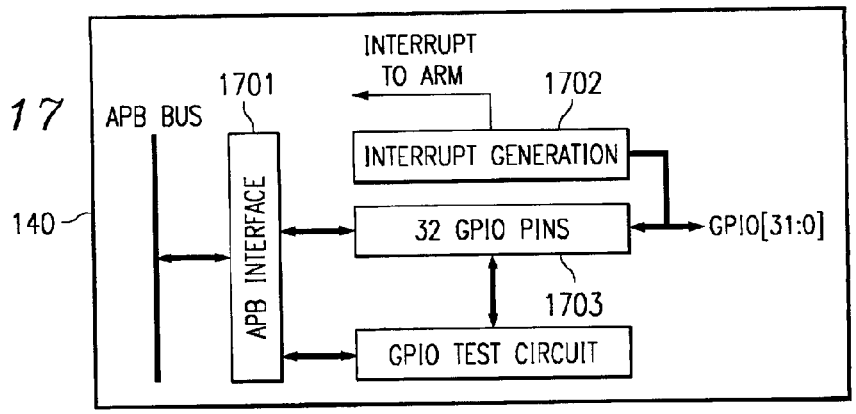
Figure 18:
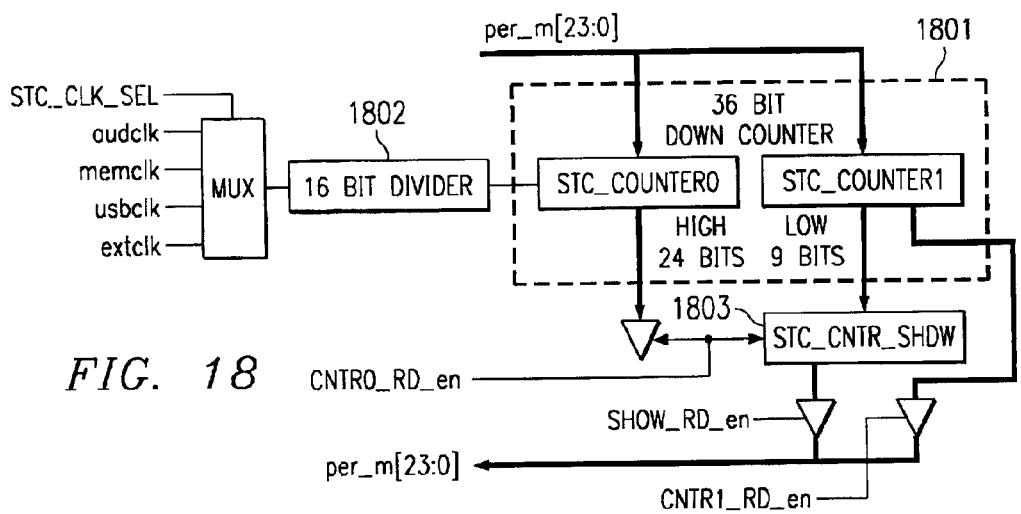
Figure 15:
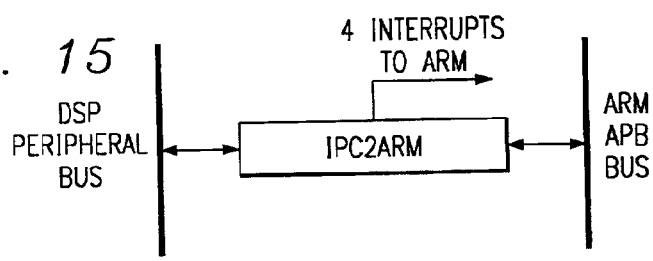
Figure 16A:
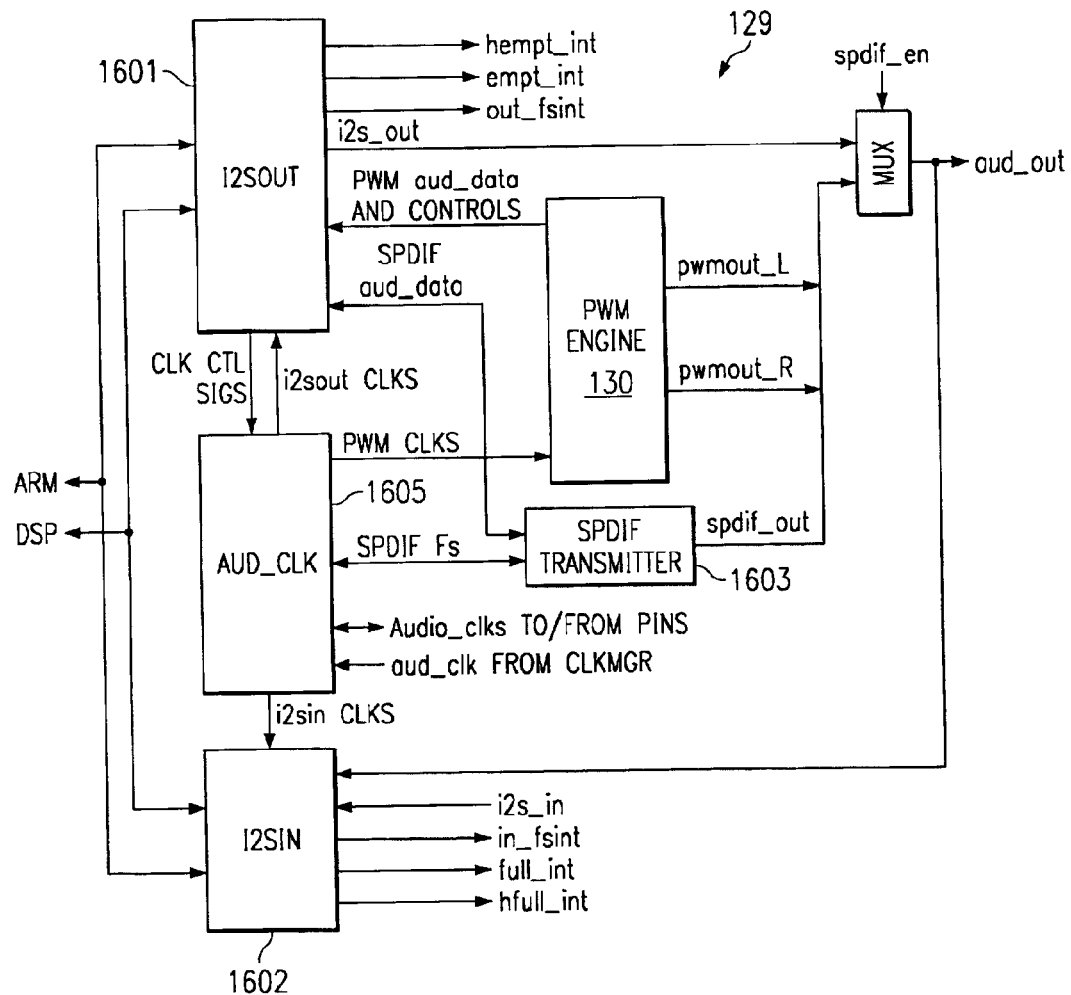
Figure 16B:
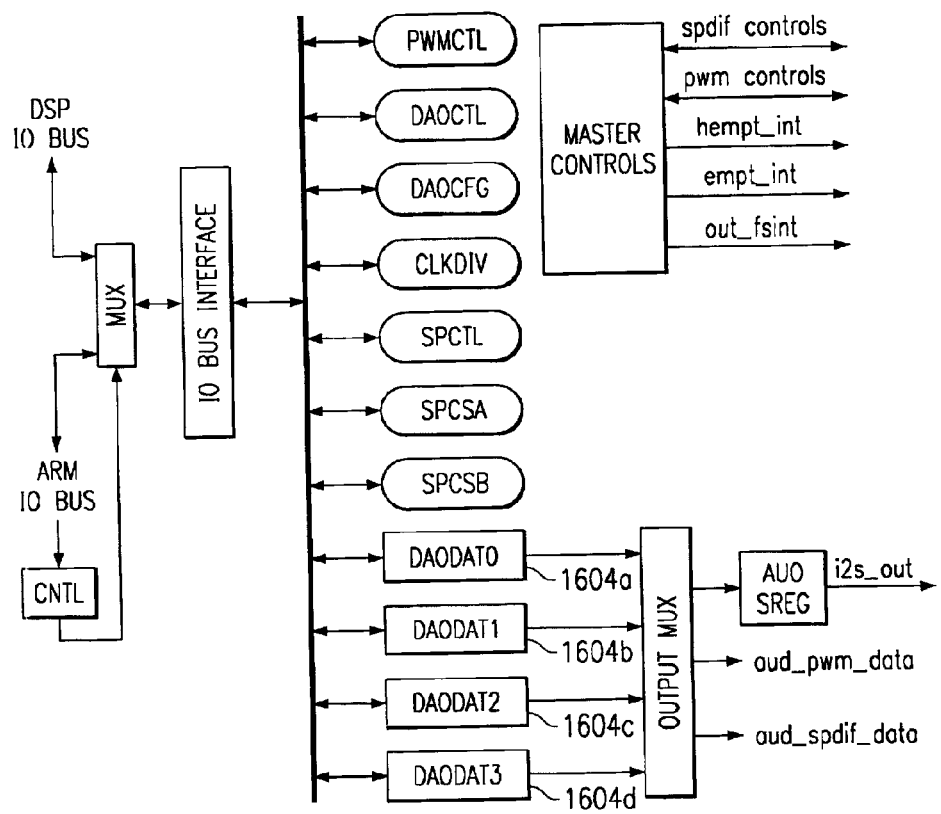
Figure 16C:
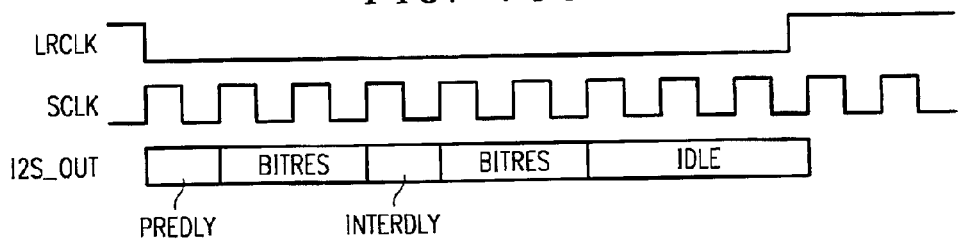
Figure 16D:
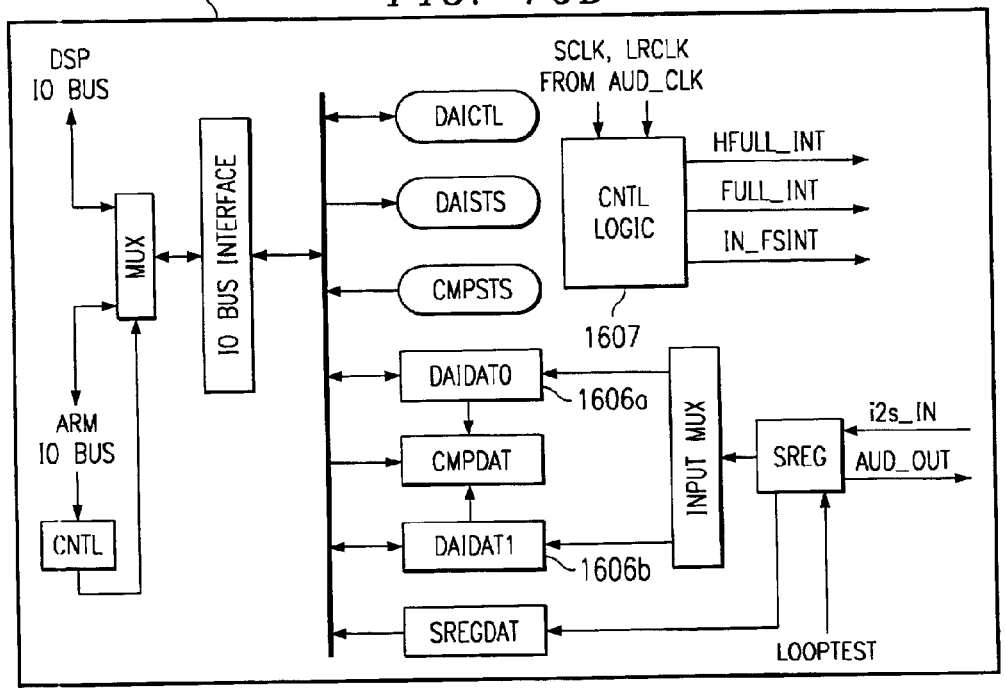
Figure 19A:
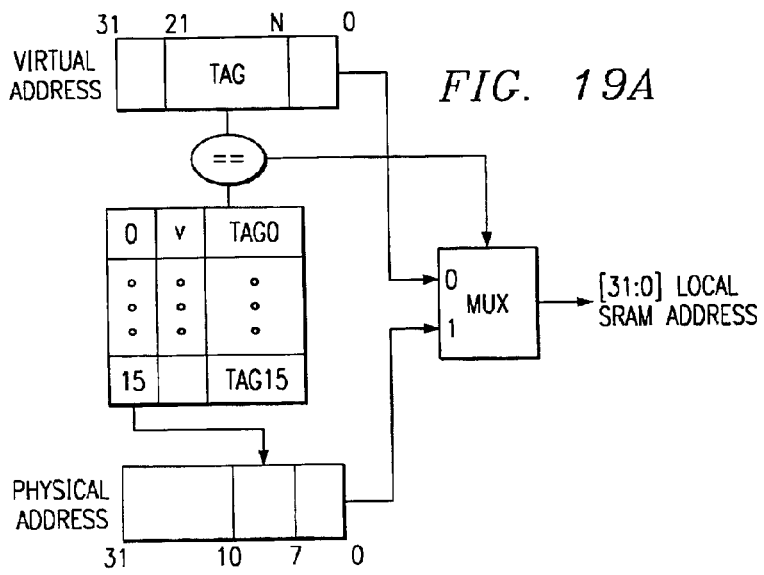
Figure 19B:
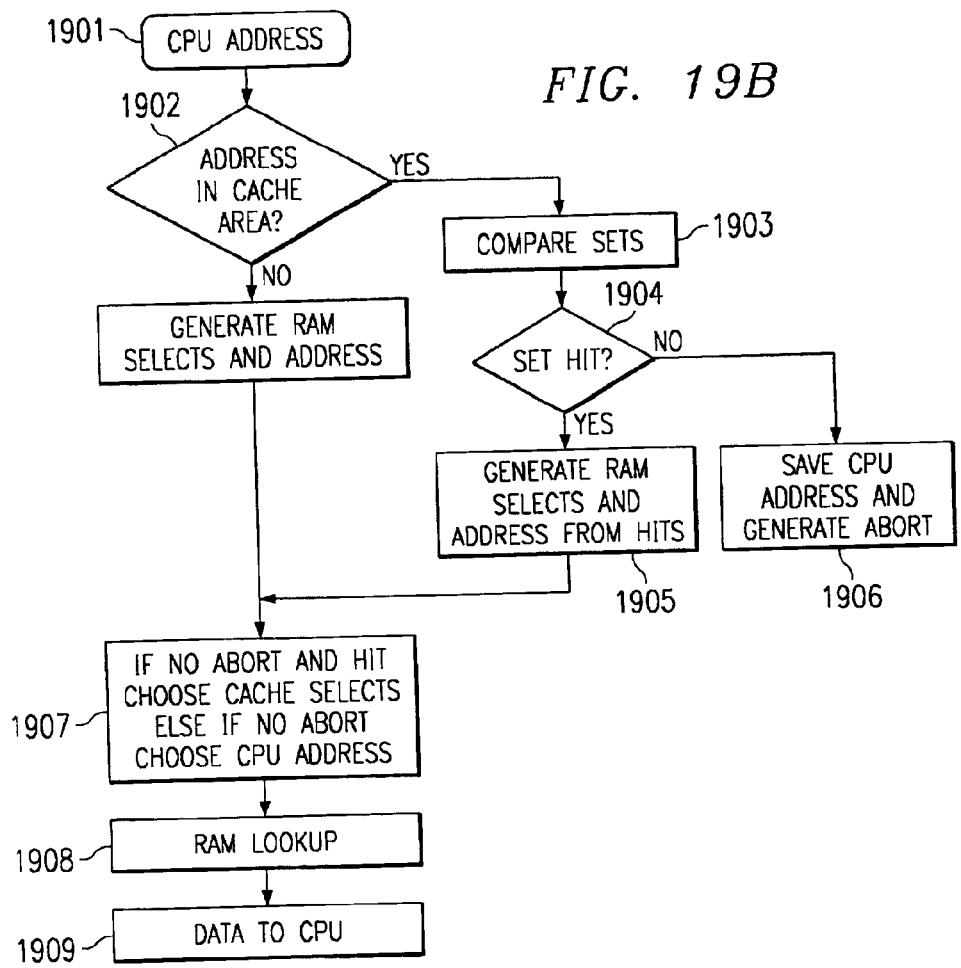
Figure 19C:
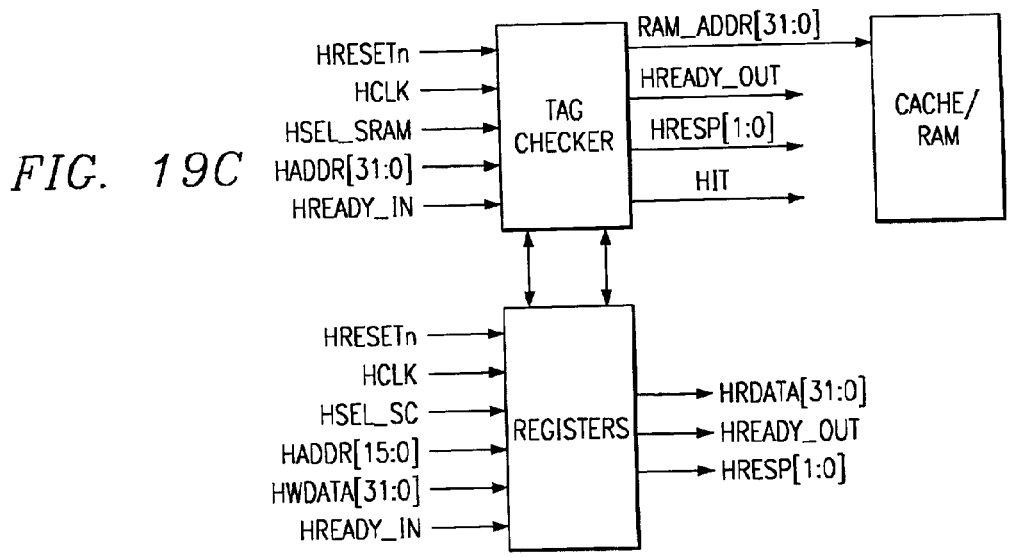
Figure 20A:
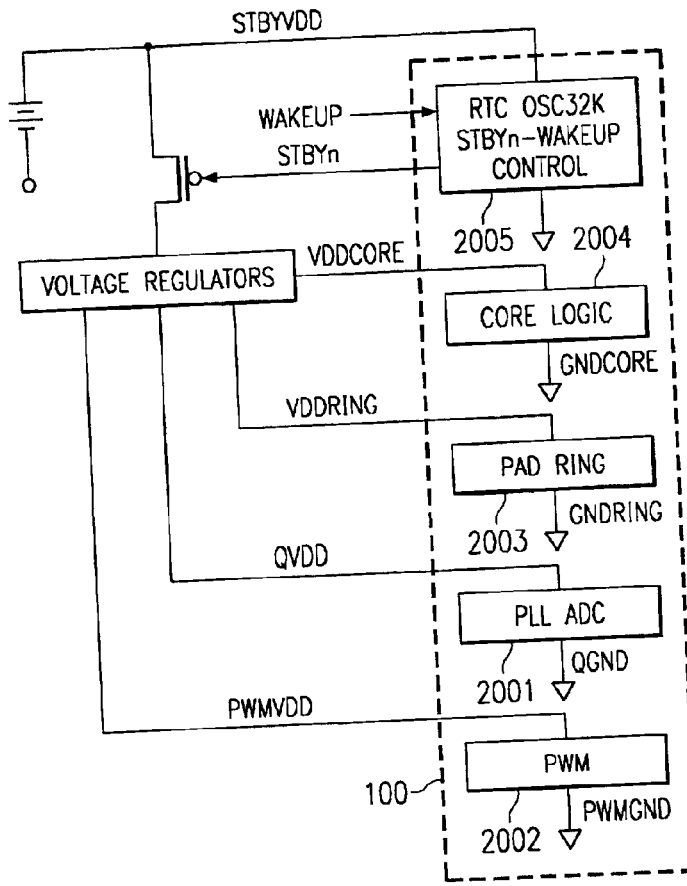
Figure 20B:
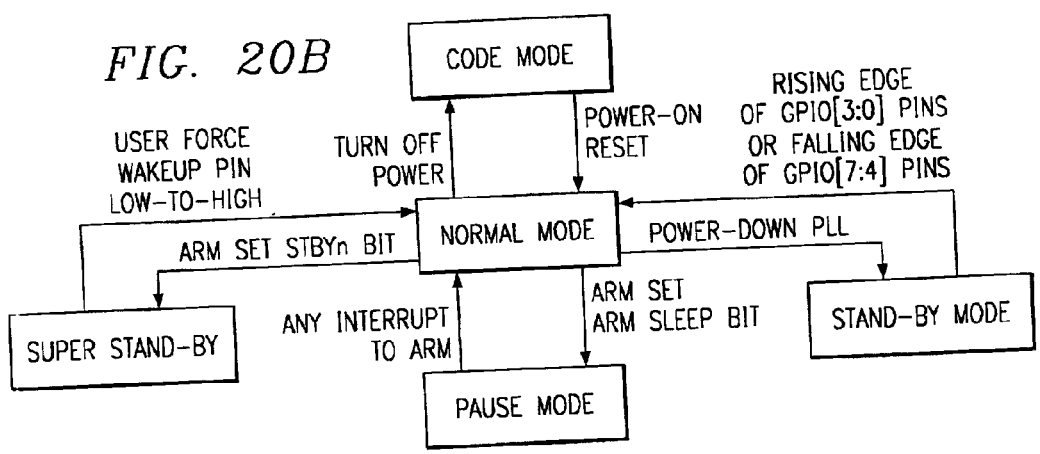
Figure 20C:
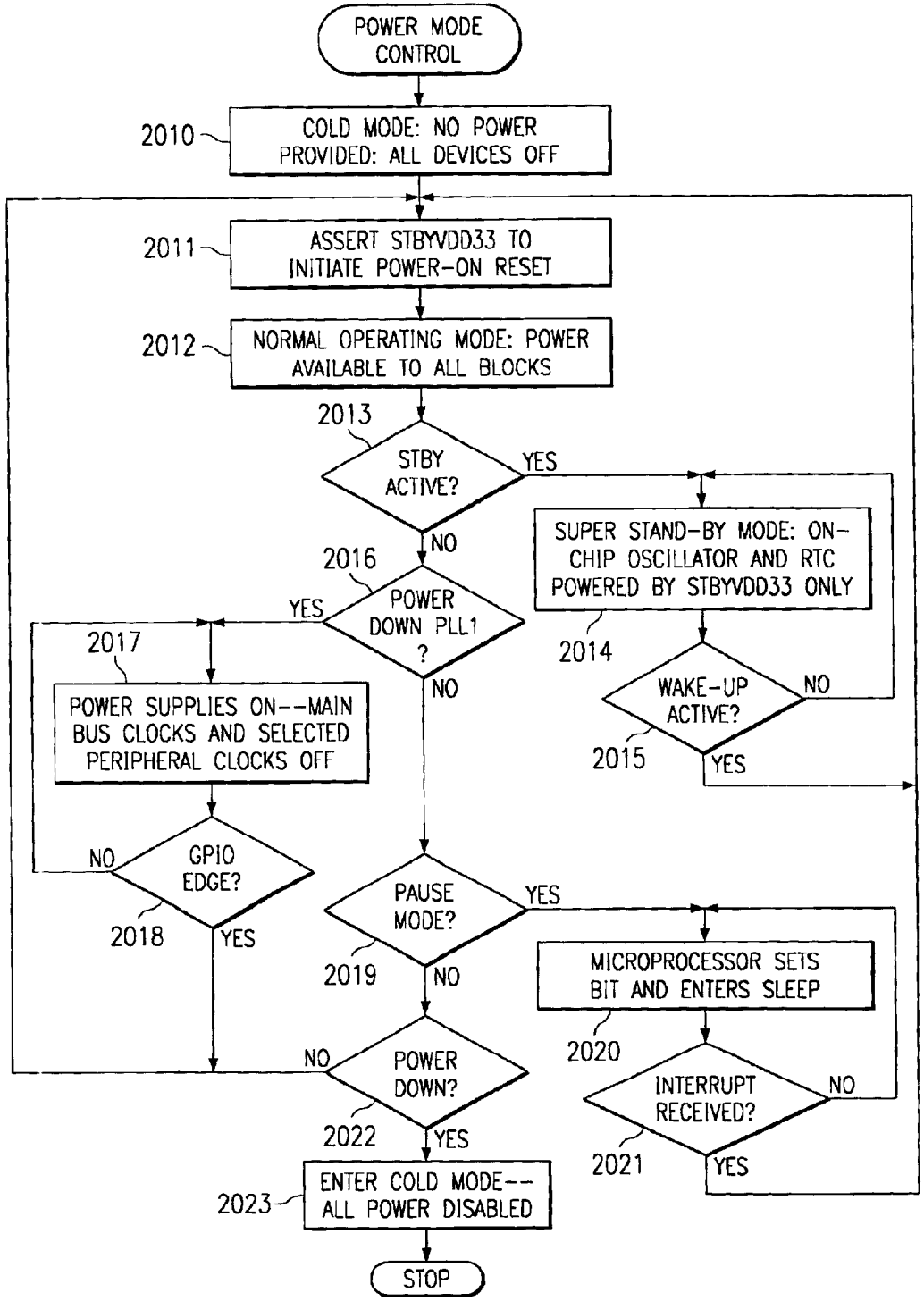
Figure 21A:
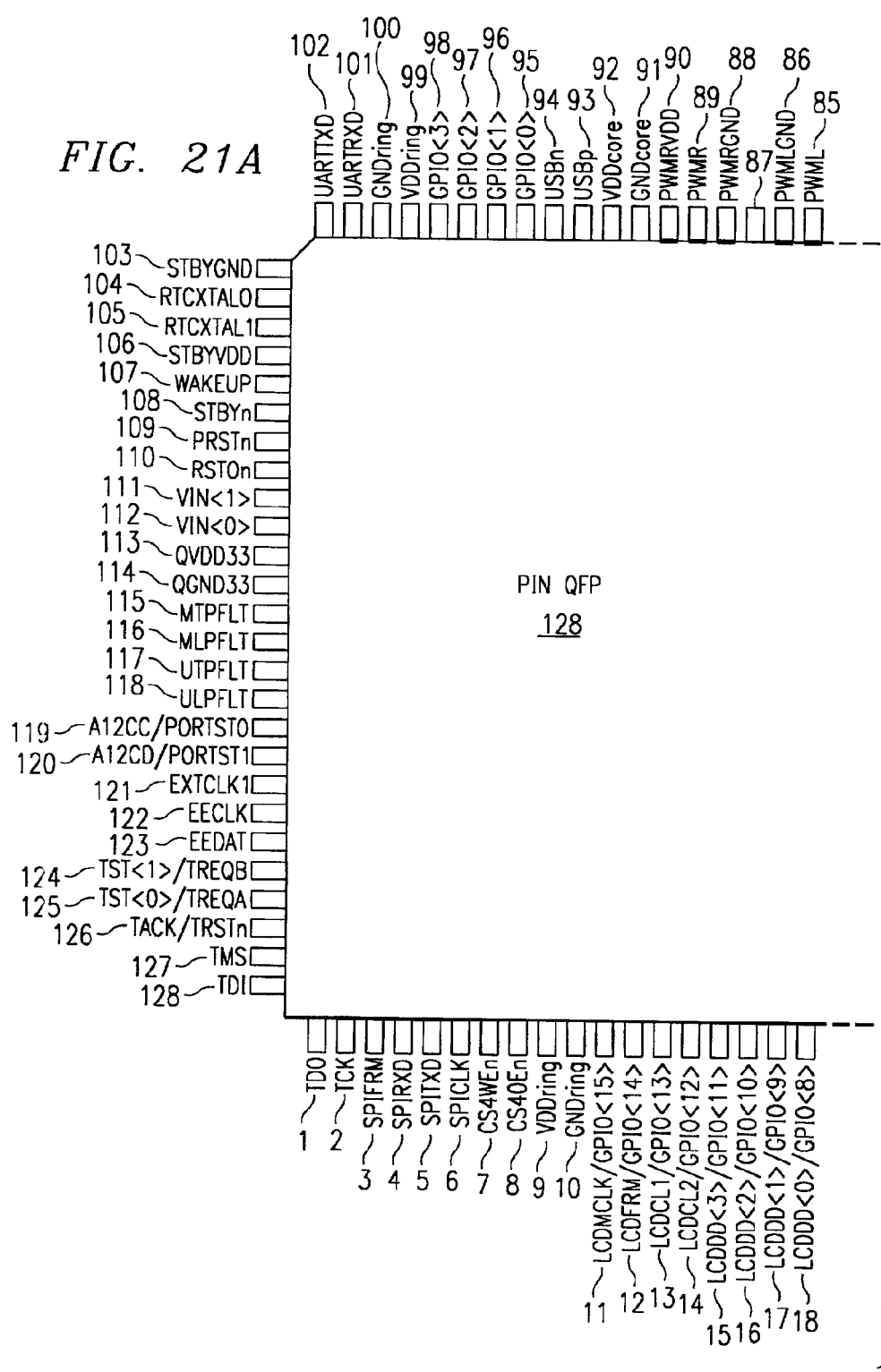
Figure 21B:
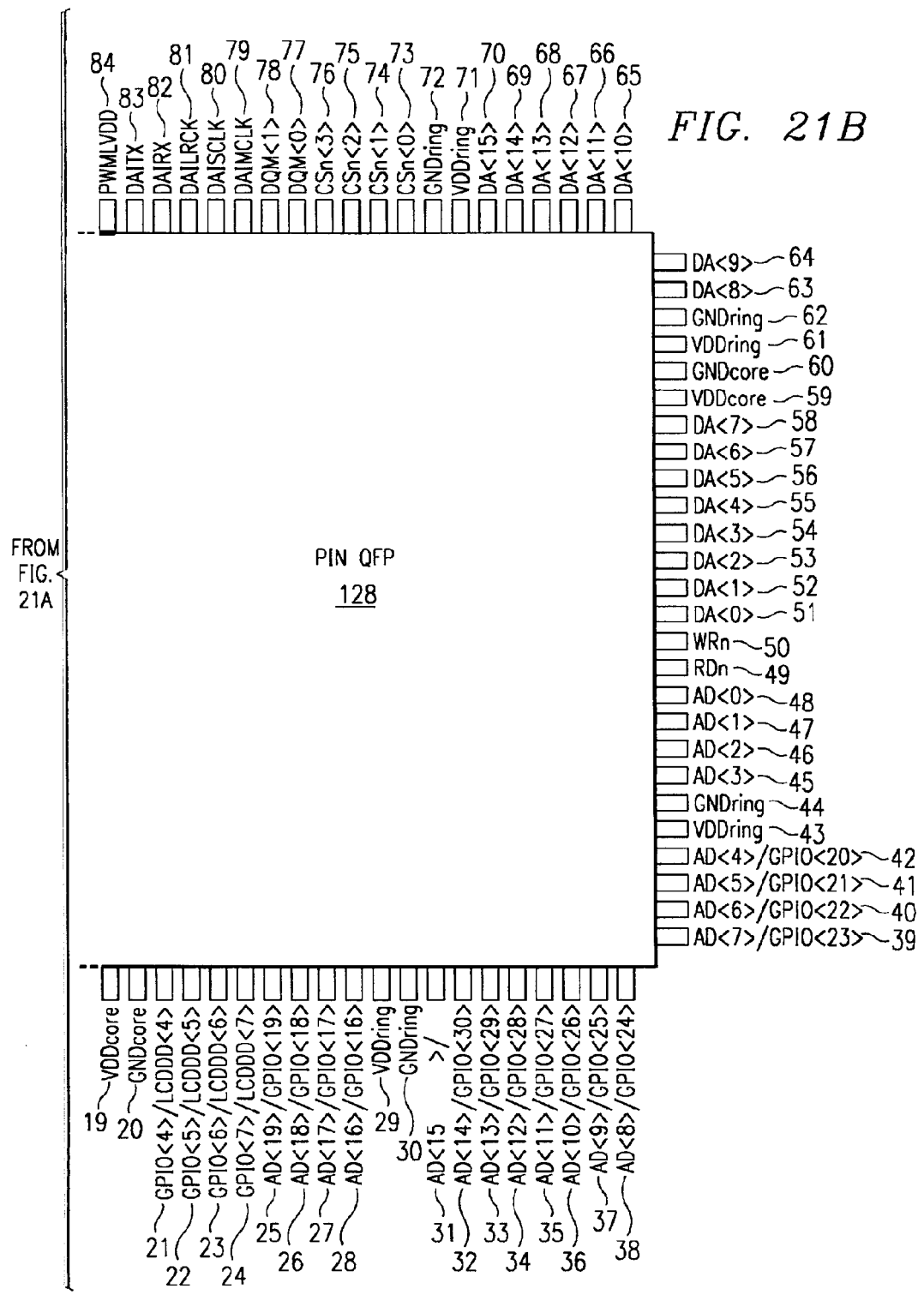

FIG. 15 is a high level functional block diagram of the interprocessor communications block of the system of FIG. 1;

FIG. 16A is a functional block diagram of the digital audio input/output block of FIG. 1;

FIG. 16B is a functional block diagram of the output block of FIG. 16A;

FIG. 16C is a timing diagram illustrating the typical transmission of data from the output block of FIG. 16B;

FIG. 16D is a functional block diagram of the input block of FIG. 16A;

FIG. 17 is a functional block diagram of the general purpose input/output (GPIO) block of FIG. 1;

FIG. 18 is a functional block diagram of the timer block of FIG. 1;

FIG. 19A is a conceptual diagram of the soft cache system of FIG. 1;

FIG. 19B is a flow chart describing the operation of the soft cache system of FIG. 19A;

FIG. 19C is a logical diagram of the soft cache system of FIG. 19A;

FIG. 20A is a block diagram of the power planes of the system of FIG. 1;

FIG. 20B is a block diagram of illustrating the power mode transitions for the system of FIG. 1;

FIG. 20C is a flow chart illustrating a procedure for power mode transition for the system of FIG. 1; and FIG. 21 is a diagram of the pin-out the system of FIG. 1, as packaged in a 128-pin QFP package.

DESCRIPTION OF THE PREFERRED EMBODIMENTS

The principles of the present invention and their advantages are best understood by referring to the illustrated embodiment depicted in FIG. 1–21 of the drawings, in which like numbers designate like parts.

FIG. 1 is a high level functional block diagram of a system-on-a-chip system 100 embodying the principles of the present invention. System 100 is based on a microprocessor core, a digital signal processor, a set of peripherals, and associated buses, each of which will be discussed in further detail below. Among the possible applications of system 100 are multi-standard portable audio devices processing digital audio data in such formats as a MP3, AAC, and MS-Audio.

In the preferred embodiment, system 100 includes an ARM7TDMI microprocessor core 101, available from ARM Ltd. Cambridge, United Kingdom. Microprocessor core 101 serves various functions including interfacing the peripherals, packing and unpacking data, and acts as the system master which determines the overall function and state of the chip.

Digital signal processor (DSP) 102 is a computation-intensive engine which takes dispatched data from microprocessor 101 and then decodes and controls the playback of those data through the peripheral ports.

The system bus architecture is based on ARM Advanced Microprocessor Bus Architecture (AMBA) bus system. The specific requirements for the AMBA bus architecture are in accordance with the ARM Ltd. AMBA specification. A main or high-speed bus(AHB) bus 103 is connected to high bandwidth blocks which require more frequent access to the memory. Microprocessor 101 and its local memory (RAM/ROM) 137 operate from main bus 103 via a local AHB bus 104 and an interface 105 which bridges local AHB bus 104 and main AHB bus 103. This configuration minimizes bus conflicts when microprocessor 101 is running a program and another bus master, for example the DMA engine, is transferring data through main AHB bus 103.

Among the other devices operating directly off main AHB bus 103 are a 4-channel DMA engine 106, and flash/SRAM interface 107, including an external memory controller, which maps up to 512 MByte external memory into the microprocessor memory space as an extension of on-chip memory, a test interface controller (TIC) 108, arbiter 109 and LCD interface 110. Test Interface Controller (TIC) 108 can take over the bus control from microprocessor 101 and mimic the bus cycle in order to stimulate the blocks connected to AHB/APB buses. Arbiter 109 arbitrates bus requests on main bus 103. LCD interface 110 supports connections to various LCD panels (since the display may require a large frame buffer, display controller 110 operates from the high speed bus).

An AHB-DSP interface 111, which is a slave to main bus 103, allows microprocessor 101 to move data block to and from DSP memory.

System 100 also employs an AMBA Advanced Peripheral Bus (APB) 112 which links to the system low band-width peripherals. APB 112 operates from main bus 103 through AHB/APB bridge 113, which is also a slave to main bus 103. In the illustrated embodiment, all peripherals interfacing with system-external devices operate from APB bus 112.

The peripherals operating from APB bus 112 include a USB slave interface 114 which supports communications between system 100 and a personal computer (PC) or similar device. When system 100 is used in a portable digital music appliance, this interface enables the quick downloading files from the PC to the portable audio system. UARTa115 is a serial port is fully 16550 compatible and supports various baud rates. It also provides a legacy communication channel to an associated PC.

Battery/Volume Checker 116 is an on-chip analog-to-digital converter (ADC) which takes two analog inputs and provides a digital signal with 8-bit precision at up to a 100 Hz sample rate for use in battery level monitoring and volume switch checking.

An SPI port 117 also operates from APB bus 112 for use with various serial storage media such as Multi-Media Card (MMC). A master mode compatible Standard Serial Interface (SSI) port 118 provides another common serial interface to a range of devices such as EEPROM, DAC/Codecs and some displays.

Security/Reset port 119 operates in conjunction with security code in ROM to determine the appropriate chip initialization procedure and a boot-up sequence. Generally, this block makes certain system blocks invisible to the external user, as enabled by the security code.

A 32 KHz on-chip oscillator 120 operates in conjunction with a direct connection to an off-chip 32.768 KHz crystal/ and provides the reference clock to the on-chip PLLs 121a and 121b. PLLs 121a,b provide different clocks that are needed by various blocks using a set of user- programmable dividers. Additionally, built-in self-calibration circuitry allows optimization of the bias currents in order to overcome changes in the working environment. Clock control is implemented through block 122 which is the main "valve" for all on-chip clock sources. It can be configured to provide full speed or a fraction of the full speed to each clock domain, as well to gate a clock off for power saving if certain block is not used in a particular application.

Three freeruning timers 123a,c operate off APB bus 112 in support of microprocessor 101. RTC block 124 provides real time clock information for the system.

Memory Remapping 125a block a comprises 3 different memory mapping schemes for different on-chip and off-chip memory configurations.

Interrupt Controller 126 collects all interrupt sources and generates request to microprocessor 101 and/or DSP 102.

DSP 102 operates in conjunction with a DSP Peripheral Bus 127. Inter-Processor Communication (IPC) block 128 provides hardware for synchronization and message exchange between microprocessor 101 and DSP 102 via DSP Peripheral bus 127 and APB bus 112.

$I^2S$ In/Out block 129, which also operates off both APB bus 112 and DSP Peripheral bus 127, supports a 2-channel input in either $I^2S$ mode or burst mode and aa4-channel output mode. It can be used, for example, to connect to an external ADC/DAC or transport-demuxer.

Pulse width modulator (PWM) 130 provides an analog audio output requiring minimal external passive components and shares two of the four channels output from I2S output block.

DSP Timer/STC block 131 provides timer and system timing clocks to the DSP sub-system for the purpose of synchronizing DSP routines.

GFace 132 interfaces DSP 102 with main bus 102, through slave AHB/DSP interface 111, and with the DSP memory. In the illustrated embodiment, DSP 102 is associated with dedicated on-chip Program Memory 133 and two blocks Data (Data0 and Data1) Memory 134 and 135. Global RAM 136 serves the communication buffer between microprocessor 101 and DSP 102. All DSP memories 133–135 and the Global RAMa 136 are mapped into the microprocessor address space so that microprocessor 101 can initialize those memories and pass data to DSP 102. Global RAM 136 is also mapped into the DSP Program/ Data0/Data1 address space, for DSP access.

Figure 2A:
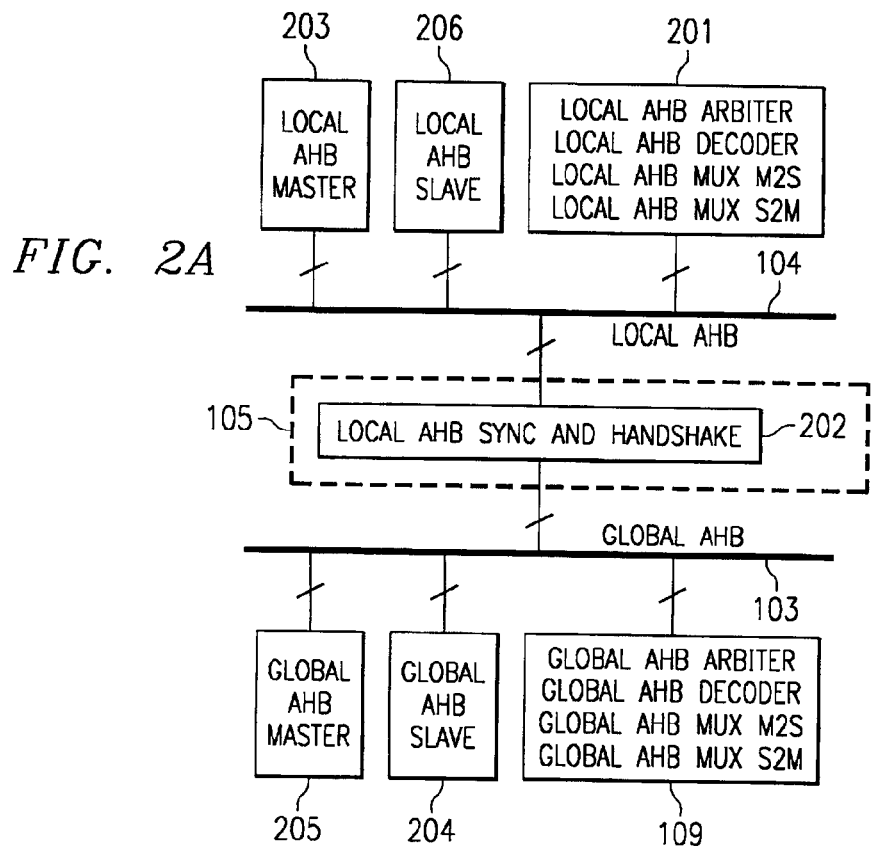
FIG. 2A is a functional block diagram of the bus architecture of the system of FIG. 1.
Figure 3:
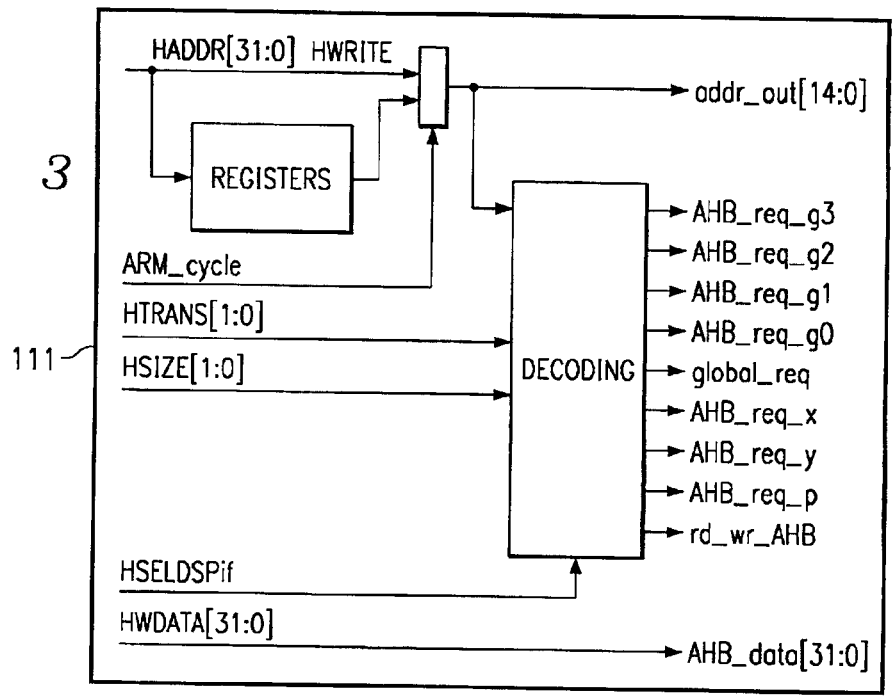
FIG. 3 is a high level functional block diagram of the AHB/SP slave interface of FIG. 1.
Figure 2C:
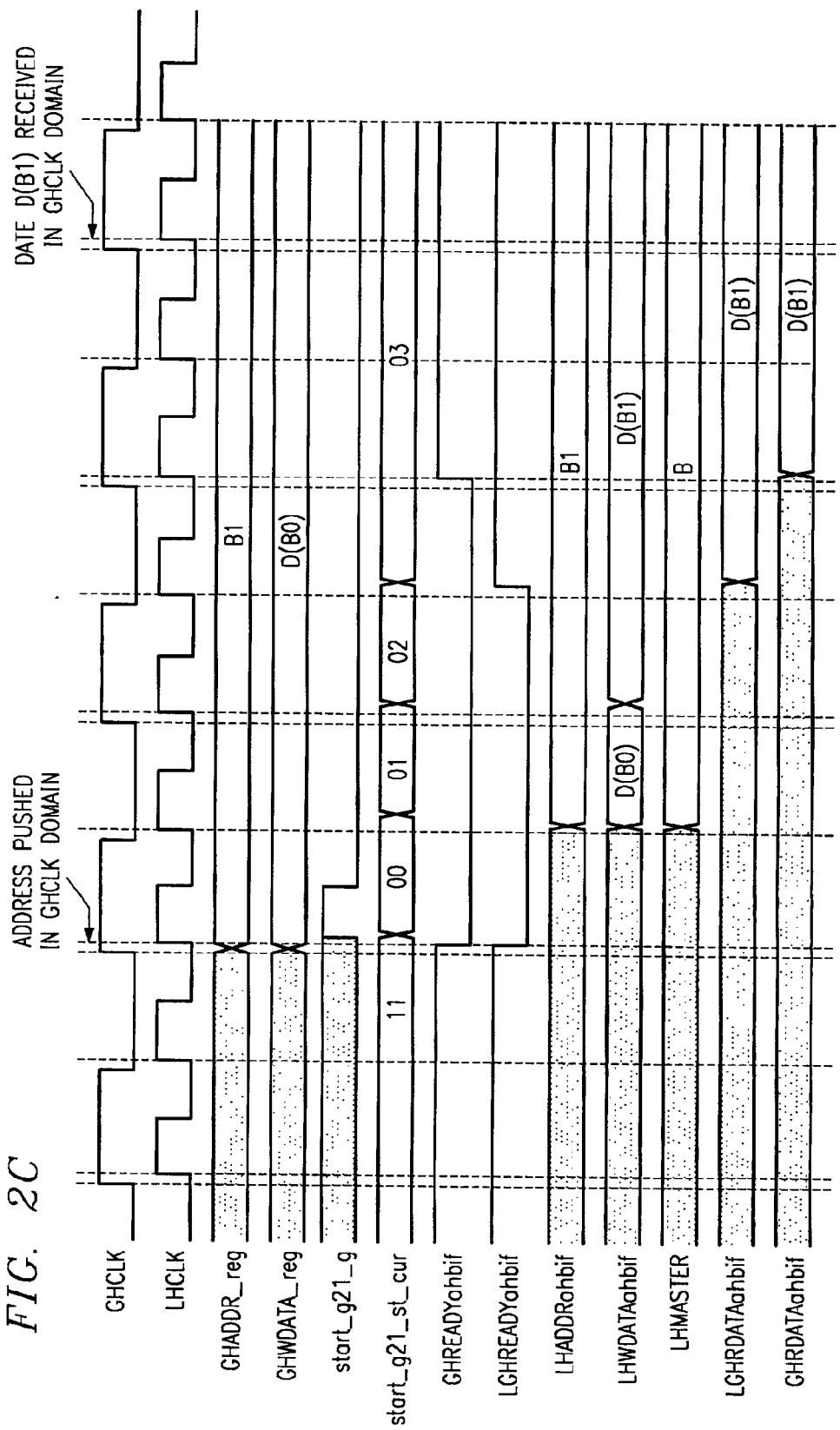

The preferred bus structure of system 100 is shown in FIG. 2A in additional detail. Exemplary timing diagrams are provided as FIGS. 2B–2E, where FIGS. 2B and 2C illustrate a typical transaction from the global AHB domain to the local AHB domain and FIGS. 2D and 2E illustrate a typical transaction from the local AHB domain to the global AHB domain.

A Local AHB Arbiter (Block 201) controls the arbitration between the microprocessor 101 master and a Local AHB Sync & Handshake (AHBIF) master 202, with AHBIF master 202 given the highest priority and microprocessor 101 the lowest priority when granting control of the Local AHB bus 104. If no other bus masters are requesting access to Local AHB bus 104, then microprocessor 101 is granted the default access to the bus.

AHBIF master 202 performs synchronization and handshaking of transactions from Local bus 104, and Global bus 103 and vice versa.

Figure 2D:
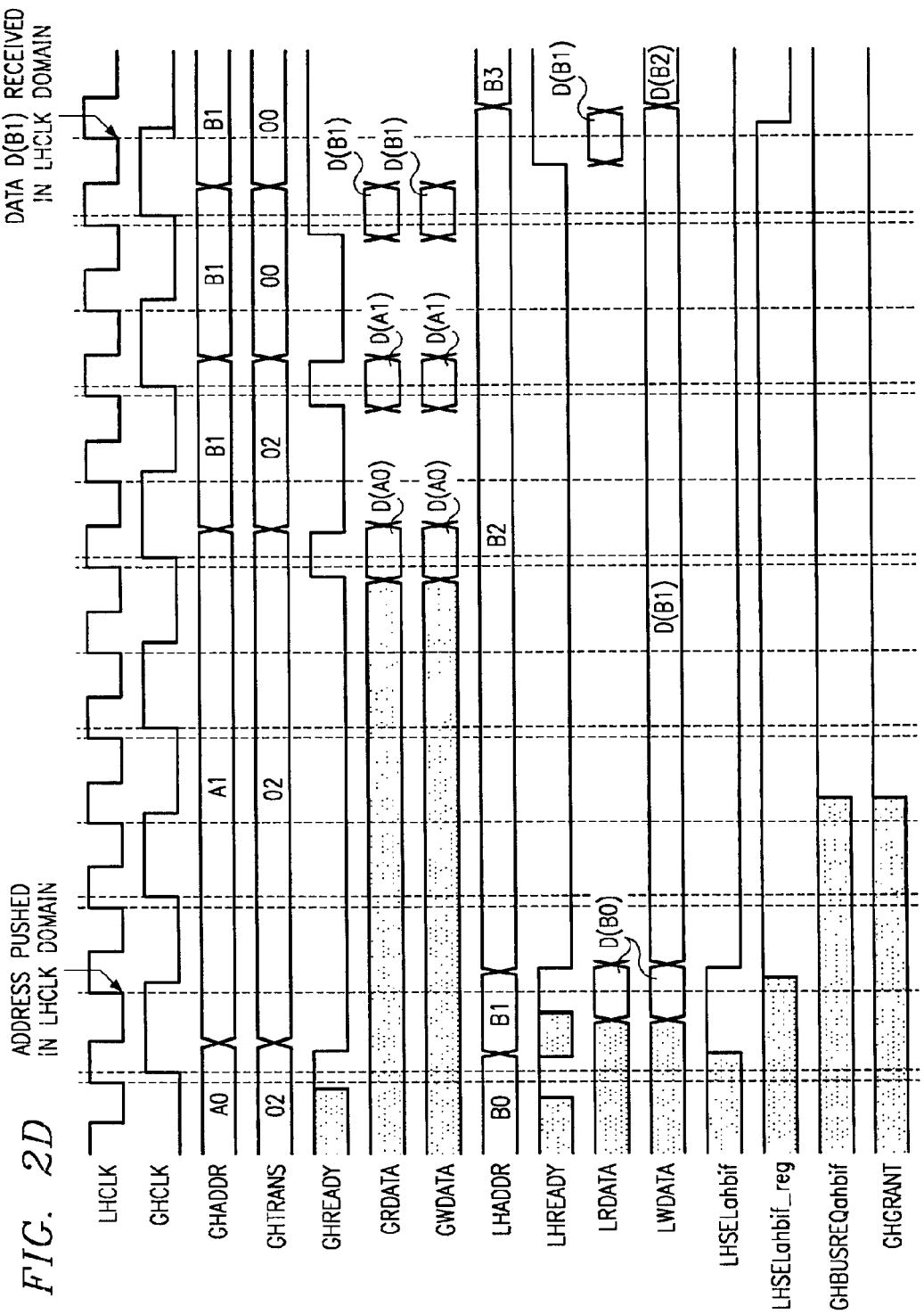
Figure 2E:
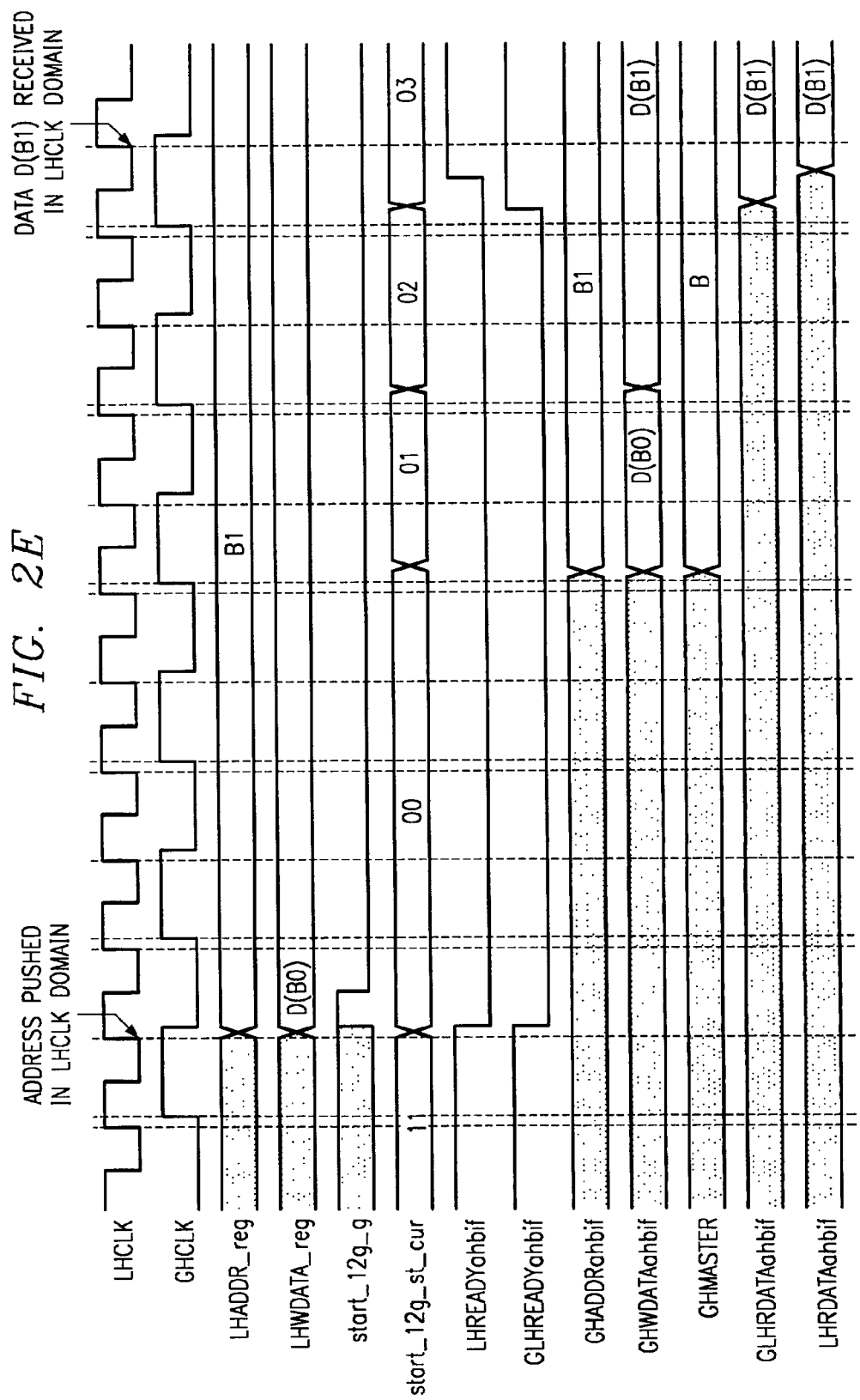

If a given master on Local AHB bus 104 initiates a transaction to a slave on a Global AHB bus 103, as illustrated in the timing diagrams of FIGS. 2D and 2E, the following operations take place:

(1) The initiating master arbitrates for the Local bus 104 and once it receives control, transmits valid transaction data and control signals;

(2) AHBIF 202 acts as a slave to the Local AHB arbiter 201, capturing the valid transaction data and control signals from the Local bus 104 and generating bus request signal to Global AHB arbiter (Block 109). A flag is also set indicating entry into a wait state for the completion of transaction by the Local AHB master;

(3) AHBIF master 201 acts as a master to the Global AHB arbiter, in this scenario, arbitrating for Global bus 103. After securing control of Global bus 103, AHBIF master transmits the captured transaction data and control signals on the Global bus 103; and (4) The target global slave 204 on Global bus 103 decodes the transaction data and control signals and indicates completion of the transaction by setting a flag. AHBIF master 202 detects the flag and in turn sets a flag to indicate completion of transaction to the Local AHB master.

If a master operating from Global AHB bus 103 initiates a transaction to a slave on the Local AHB bus 104, as illustrated in the timing diagrams of FIGS. 2B and 2C, the following operations are performed:

(1) The given master arbitrates for the Global bus 103 and, once securing control of the bus, transmits valid transaction data and control signals;

(2) AHBIF 202 acts as a slave to Global AHB arbiter 109, capturing the valid transaction data and control signals from Global bus 103 and generating a bus request signal to Local AHB arbiter 201. AHBIF master 202 also sets a flag to indicate entry into a wait state for the completion of transaction by the Global AHB master 205;

(3) AHBIF 202 acts as a master to the Local AHB arbiter and arbitrates for the Local bus 104. After securing control of the bus, it transmits the captured transaction data and control on the Local bus 104; and (4) The target slave 206 on Local bus 104 decodes the transaction data and control signals and indicates completion of transaction by setting a flag. In response, AHBIF master 202 sets a flag to indicate completion of transaction to the given Global AHB master 205.

Deadlock situations can arise if two masters, neither of which is AHBIF master 202, have control of the Local bus 104 and Global bus 103 respectively and are attempting to access a slave on the opposite side of AHBIF master 202. Deadlocks are broken by forcing completion of the transaction initiated by the Local AHB master with a retry response. This enables AHBIF 202 to become a master on the Local AHB bus and complete the transaction initiated by the Global AHB master.

One possible deadlock scenario is as follows:

1) AHBIF 202 detects a valid transaction from a Local AHB master 203 to be passed on to a slave on Global AHB bus 103, generates a bus request signal to Global AHB arbiter 109 and pulls signal LHREADY low to indicate entering into a wait state for the completion of the transaction by the Local AHB master.

2) Before AHBIF 202 is granted access to Global AHB bus 103, the current master or a higher priority master is granted Global AHB bus 103 to access a slave on the Local AHB bus.

3) AHBIF 202 detects a valid transaction from a Global AHB master 205 to be passed on to a slave on Local AHB bus 104, generates a bus request signal to local AHB arbiter 201 and pulls signal GHREADY low to indicate entry into a wait state for completion of the transaction by the Global AHB master 205.

4) A deadlock situation has occurred since two masters, neither of which is AHBIF 202 have control of Local bus 104 and Global AHB bus 103 and are attempting to access a slave on the opposite side of the AHBIF. The AHBIF can therefore not become a master on either side of the global and local busses to break the deadlock.

Preferably, testing of system 100 includes testing of the following bus cycle sequences:

(1) Local AHB master reads/writes to multiple Local AHB slaves with multiple Global AHB master reads/writes to multiple Local AHB slaves;

(2) Multiple Global AHB master reads/writes to multiple Global AHB slaves with Local AHB master reads/writes to multiple Global AHB slaves 3) Various deadlock creation sequences.

AHB to DSP Slave Interface 111 allows microprocessor 101 to send read and write requests to the different local memories 133–135 of DSP 102 and global memory 136. Additionally, interface 111 synchronizes the microprocessor and DSP clock domains and performs the necessary handshaking. In particular, Interface 111 responds to transaction requests from the currently granted local or global AHB master 203/205. The transaction requests are then passed to GFACE 132 and the individual memory selection signals, (x_sel, y_sel, p_sel, and g_sel) decoded from the corresponding address. AHB_DSP slave interface 111 is shown in further detail in FIG. 3

AHB to DSP slave interface 111 operates between two different clock domains. Preferably, the frequency of the DSP clock domain is an integer multiple of the frequency of the microprocessor clock domain and the edges of both domains are aligned for every microprocessor clock domain rising edge. It therefore becomes necessary to prevent the microprocessor from performing multiple memory accesses during its cycle when DSP domain is based on a faster clock. Preferably, a signal is taken from the clock generator which indicates to Interface 111 the last DSP cycle before the next microprocessor clock domain rising edge. From this, a microprocessor memory access can be restricted to only on first cycle, if there is no DSP conflict, or to the second cycle if a DSP conflict occurs. All other cycles are locked to the DSP.

In one preferred method of synchronization, the AHB transaction signals are first latched by HCLK (AHB highspeed clock), then re-latched by DSP clock in order to avoid the glitches. The latched signals in DSP clock domain are sent to global memory interface (GFACE) 132 for further decoding and arbitration with the DSP memory accesses. A state machine is provided to prevent redundant accesses since HCLK can be slower than DSP clock. For instance, when DSP clock is twice as fast as HCLK, AHB transaction requests in one full HCLK cycle could be interpreted as two full cycles of memory access requests in DSP clock domain. The state machine will issue only one memory access bus cycle in DSP clock domain instead of two.

Figure 4A:
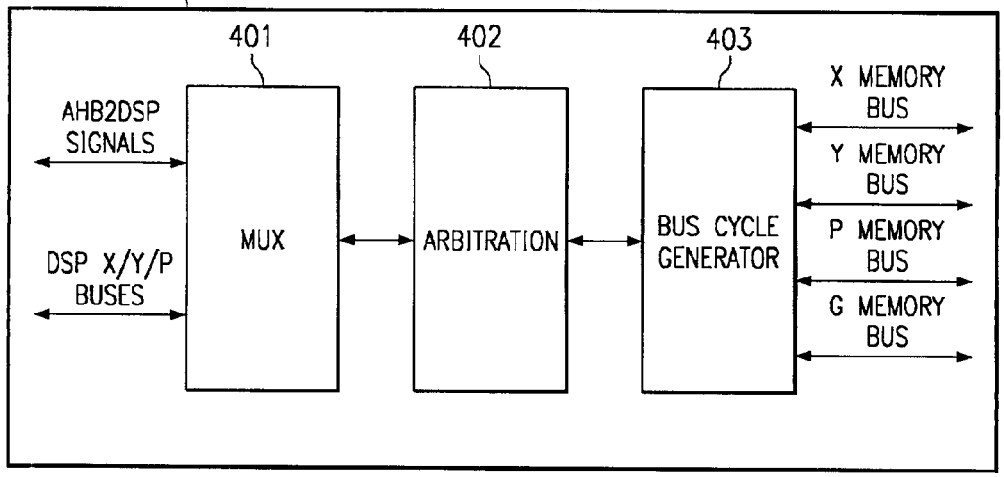
FIG. 4A is a high level functional block diagram of the GFACE of FIG. 1.

GFACE 132, shown in further detail in FIG. 4A, interfaces microprocessor 101 and DSP 102 to both the global (g) program (p) and DSP specific memory spaces (x, y, z). GFACE 132 includes a multiplexor 401, arbitration logic 402 and bus cycle generation logic 403. In particular, GFACE 132 manages all accesses to these memory spaces, resolves conflicting accesses from the DSP and the microprocessor when they arise, and serializes parallel accesses to the global memory from the DSP. Generally, conflicts are resolved by extending the low clock phase of the DSP when microprocessor 101 and DSP 102 both access the same memory module.

When DSP 102 and microprocessor 101 attempt to access the same memory block at the same time, GFACE 132 performs the following operations:

1) The first cycle is the setup cycle in which the GFACE detects the conflicts and arbitrates the access sequence. Since the global memory can be mapped into DSP X/Y/P space, its arbitration sequence is: DSP access g memory via x space, DSP access g memory via y space, DSP access g memory via p space and microprocessor 101 access g memory. For all three physical memory modules X, Y and P, the arbitration sequence is DSP 102 access first, then microprocessor 101 access.

2) In the second cycle, GFACE accesses the proper memory X, Y, Z module according to the arbitration sequence listed above. If it is a read from DSP, the data fetched from the memory module are registered in GFACE 132. Meanwhile, the DSP clock low phase is extended. This step is repeated as necessary to complete all the other accesses initiated by DSP, and register the data in GFACE 132. The DSP clock is kept low for the entire cycle.

3) The last cycle completes the memory access initiated by microprocessor 101. All registered data in GFACE is sent to DSP and the DSP clock is released.

Figure 4B:
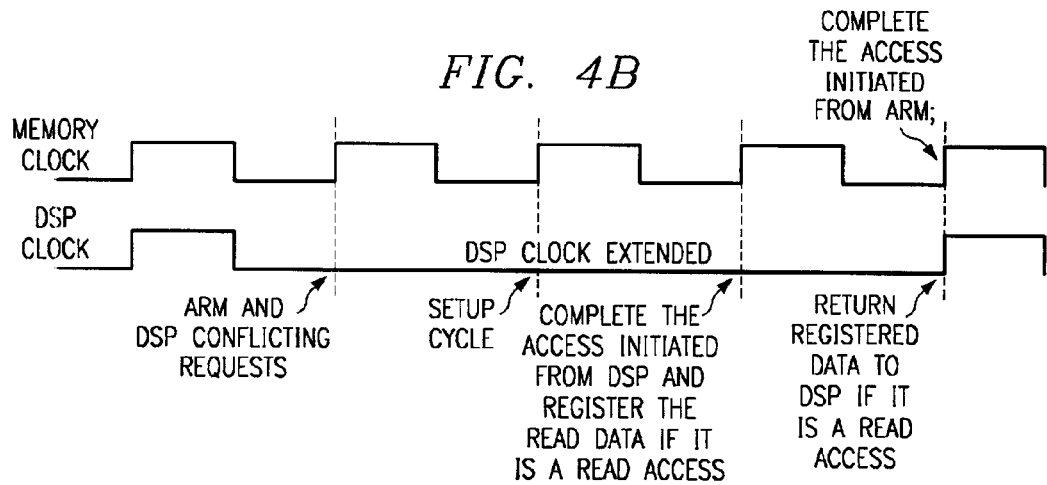
FIG. 4B is a timing diagram illustrating a possible memory conflict when one DSP access and one microprocessor access occur simultaneously.

In order to better illustrate the scenarios of access conflicts, exemplary waveforms are provided as FIGS. 4B and 4C. FIG. 4B illustrates the possible conflict for X/Y/P/G memory when one DSP access and one microprocessor access occurs simultaneously. FIG. 4C illustrates the worst case conflict which occurs in the global (g) memory module when DSP issues three accesses to the g memory and microprocessor 101 attempts to access the g memory as well.

A signal is provided between DSP 102 and GFACE 132 which allows the DSP to request a one cycle stretch in the memory timing. When the DSP asserts this signal, and provided that there are no conflicts on that cycle, GFACE 132 stretches both the DSP and RAM clocks. (If there is a conflict between the DSP and the microprocessor, there be no need for a stretch, because the DSP will be automatically stalled one cycle.)

In the illustrated embodiment, DSP 102 operates in conjunction three memory busses designated X, Y, and P, shown collectively at 150 in FIG. 1. Notwithstanding, Global Memory 136, has only one port. Therefore, in the event that more than one of these busses attempts to access the global memory at the same time, GFACE 132 will serialize the requests to avoid conflicts. GFACE 132 also extends the high phase of the DSP clock while it performs the necessary number of accesses to global memory. Upon completing all accesses, GFACE 132 completes the DSP memory access cycles, and returns the DSP clock to its usual duty cycle. If microprocessor 101 requests an access to the global memory space during this process, the DSP is backed off for an additional clock cycle for the microprocessor access.

In the preferred embodiment, GFACE 132 does not include coherency hardware and therefore, coherency is maintained in the software programming.

Preferably, writeback registers pipeline the write data such that the data written to memory is one write cycle behind. Consequently, data from the first write will not be placed in RAM until another write takes place to that same memory block.

The possible coherency problems which are dealt with in software include:

1) DSP write to location alpha follow by a microprocessor write to location alpha followed by any DSP write to the same memory. This problem applies to all four memories, x, y, p and global. The result is after the second DSP write, the contents of the writeback register are placed into location alpha. This overwrites the microprocessor write data with stale data from the first DSP write.

2) DSP write to location alpha followed by a microprocessor read of location alpha. This problem applies to all four memories, x, y, p and global. In this case the new DSP data are in the writeback register, until the next DSP write to the same memory, so the microprocessor reads stale data.

3) DSP write to location alpha in global memory by either x, y, or p spaces followed by a DSP write to location alpha in global memory by a different space (x, y, or p) followed by any write to this second memory space, and followed by another DSP write to the first memory space. This problem arises because each space is associated with a dedicated writeback register, consequently when the fourth write is executed, the data in location alpha are overwritten by the data of the first write.

4) DSP write to location alpha in global memory by either x, y, or p spaces followed by a DSP read from location alpha in global memory by a different space (x, y, or p). In this case the new DSP data is in the writeback register, until the next DSP write to the first memory, so the DSP will read stale data from the second memory space.

A wrapper 138 surrounds microprocessor 101 such that microprocessor 101 becomes a standard AMBA-AHB master/slave device.

AHB/APB Bridge 113 spans main (global) bus 103 and APB bus 112. When any AHB bus master requests access the address space located on APB bus, bridge 113 translates the signals from the AHB to the APB format, as well as re-times the signals when main bus is operating at a HCLK (high-speed clock) rate higher than that of the peripheral bus clock (PCLK).

Microprocessor 101 operates in conjunction with dedicated on-chip memory subsystem 137, which includes an 8K×32 RAM and a 6K×16 ROM connected to the local AHB bus 104. Microprocessor 101 can perform byte, half-word and word access to both the RAM and ROM sections. Memory interface logic makes the RAM and ROM AHB compliant slave devices. Since the preferred ROM space is 16-bit wide only, when Microprocessor 101 performs a word-read, wrapper 138 issues two consecutive reads to the ROM and concatenates the two read results into a 32-bit word, which is returned to Microprocessor 101.

In order to enhance the testability and reduce the production testing time, a weak-write test circuit 139 is built in the RAM second to accelerate the RAM retention test speed The RAM can be divided into two equal size banks which can be put into weak-write mode independently, so that when one bank is in test mode and the other one can be used as scratch pad for the testing program.

TIC 108 supports debugging by Microprocessor 101, and acts as an AHB bus master with the highest priority. The TIC bus connections 501 are shown in the block diagram of FIG. 5. When system debugging is allowed in a test or non-security mode, the TIC drivers allow access of all address-mapped registers and/or memory in the entire system for debugging purpose. When TIC mode is enabled, TIC uses 32 pins of the external memory interface as a 32-bit bi-directional data bus. An external clock (EXTCLKI) is used to clock main AHB bus 103, as well as for synchronizing main AHB bus 103 with the TIC bus, so that an external TIC controller is able to access the main AHB bus as a AMBA bus master through the TIC block. When TIC 100 is engaged by external TIC driver software, the user can stimulate all the Microprocessor 101 devices through TIC directly without requiring intervention by Microprocessor 101 processor.

Display interface 110 includes an LCD Display Controller which supports an interface to any one of a number of LCD displays. In particular, system 100 can drive STN (Super Twisted Pneumatic) display panels which have the advantage of requiring less power than similar active TFT panels. The LCD controller shares pins with the General Purpose Input/Output port (GPIO) 140 described further below.

Character displays have a small display resolution. Usually the LCD controller is integrated on the panel and generally comprises a character generator. Graphics functionality is typically not included. For those character display panels which do not have and LCD controller on board, the row/column timing as well as the character data that drives the panel must be generated externally, such as by system 100.

Graphics displays have a higher display resolution. Usually 128 lines or greater. For example, 64×128, 320×240, and 640×480. These types of panels can have an integrated controller IC as well. Communication with the panel is implemented through a standard interface. These panels have slightly more complex (versus character generator) LDC controllers that require external SRAM. (For very complex graphics, a graphics IC (i.e. super VGA) is usually used to drive the panel.)

Advantageously, by integrating the LCD controller into system 100 display resolution gap between the low end (character displays) and the high end (graphics ICs) by supporting a 320×240 type resolution is bridged. Cost savings due to integration and cost savings due to tailoring the required functionality are also benefits.

Figure 6A:
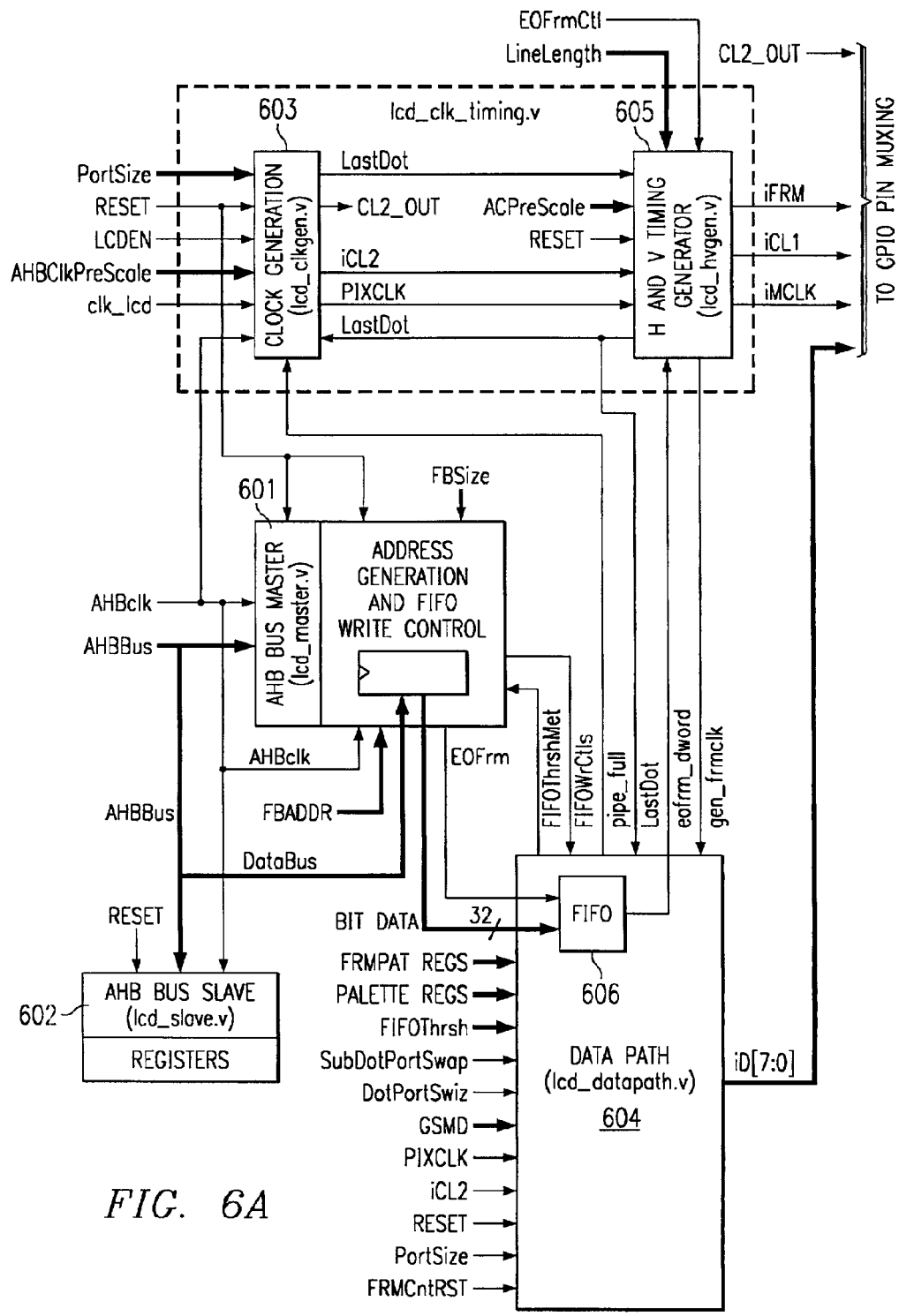
FIG. 6A is a functional block diagram of the preferred LCD interface/controller of the system of FIG. 1.
Figure 6B:
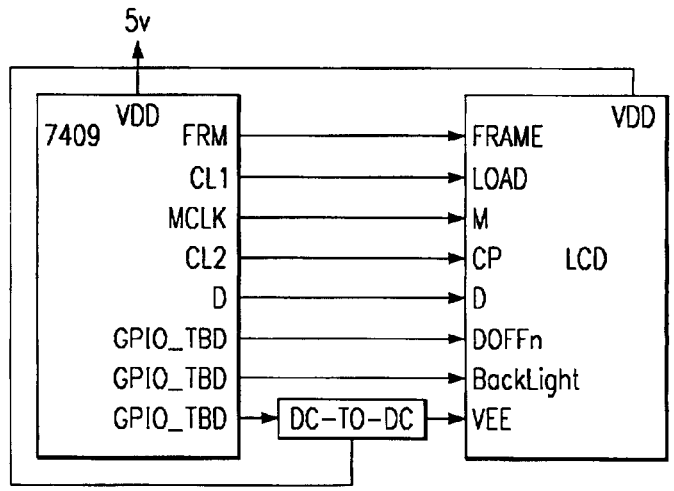
FIG. 6B illustrates the preferred connections to an external LCD panel through the LCD interface of FIG. 6A.

FIG. 6A is a functional block diagram of the preferred LCD interface/display controller 110. In this embodiment, the display interface includes both an AHB bus master 601 and an AHB slave 602 operating off main AHB bus 103. The preferred connections to the external LCD panel are shown in FIG. 6B. For the purposes of the present discussion, the LCD controller register definitions are provided in Tables 1–29.

The general operation of LCD interface/controller 110 can be generally described in reference to FIG. 6C, and will be described in further detail below. Clock generation block 603 generates the internal pixel clock (iPixClk) by dividing down the AHBCLK from bus 103 by a prescale factor selected as a function of the frame refresh rate. This clock drives the majority of the display controller logic and represents a single pixel or subpixel. The internal clock iCL2 is generated by dividing down the pixel clock as a function of width of the interface bus to the external device, and is used internally for such operations as data muxing iCL2 allows multiple dots to be clocked across the data bus per cycle. Clock CL2_OUT (CL2) is the LCD Dot Clock clocking between one and eight dots per cycle to the external panel, and is similar to iCL2, with dead time inserted for transition of clock CL1. For example, if CLK2=PIXCLK, then one dot is sent to the display per CLK2 period, if CLK2=PIXCLK/2, then two dots are sent, and if CLK2=PIXCLK/4, then four dots are sent.

Clock CL1 is the Line Latch Pulse and is generated by horizontal-vertical (H&V) timing generator 605 for one CL2 clock period at the end of a display line (as indicated by LastDot). CL1 is used to latch lines of dots into the display secondary buffer for driving the display and increments the LCD panel row driver in preparation to generate the next display line. Additionally, H&V timing generator 605 generates the LCD Frame Synchronization (FRM) and LCD AC Bias Drive signals. The FRM signal is used by the display panel to reset to row line 1 and is generated after receiving an End of Frame signal from Bus Master 601. MCLK is used to insure that the display driver voltage frequency does not fall to DC.

Data path 604 includes a FIFO 606 which is kept filled with data from main bus 103 by Bus Master 601 (in the AHB clock domain) as a function of the programmable threshold signal FIFO Thrsh. Data is read from the FIFO in the pixel clock domain as a function of the number of bits per pixel required for the external display panel. The data retrieved from FIFO is used to address a palette which supports gray scaling. Data path 604 also performs operations such as frame rate modulation, swizzle and red/blue swaps. Frame rate modulation is a technique used by LCD controllers to utilize the slow response time of the liquid crystal to produce gray shades. This method varies the duty cycle of the LCD pixels in time over multiple frames. These features also will be discussed further below.

Figure 6C:
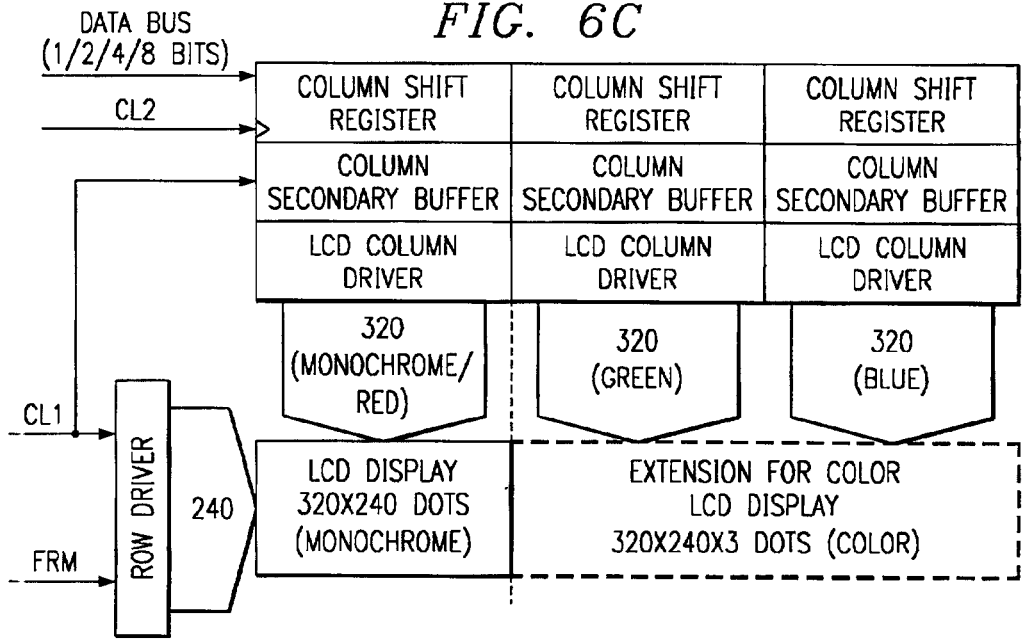
FIG. 6C is a diagram describing the general operation of LCD interface/controller and associated display panel.
Figure 6D:
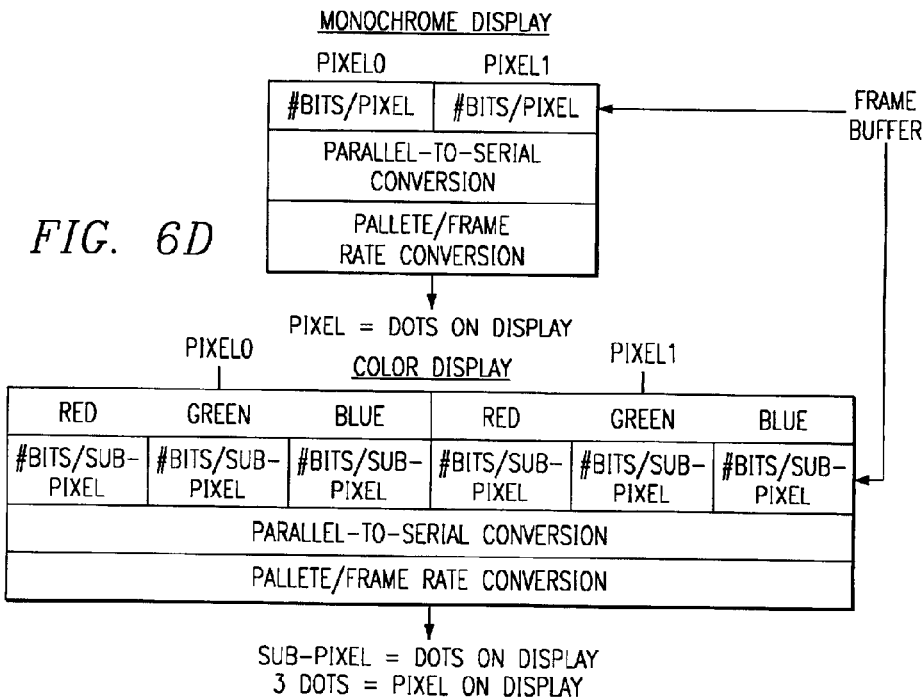
FIG. 6D is a diagram generally illustrating the mapping of display data in the frame buffer to the display panel.

As shown in FIG. 6D, for a monochrome display, the system 100 frame buffer represents a pixel as a number of bits. These bits are then converted, parallel-to-serial, to dots on the display. Each pixel in the frame buffer represents a dot on the display. For color displays, the system 100 represents a sub-pixel as a number of bits. Collectively, three sub-pixels represent a pixel. Color displays therefore require three times the number of bits than the monochrome representation to define a pixel (display resolution and #bits/sub-pixel are the same). The sub-pixels are then converted parallel-to-serial to sub-pixel dots on the display.

Figure 6E:
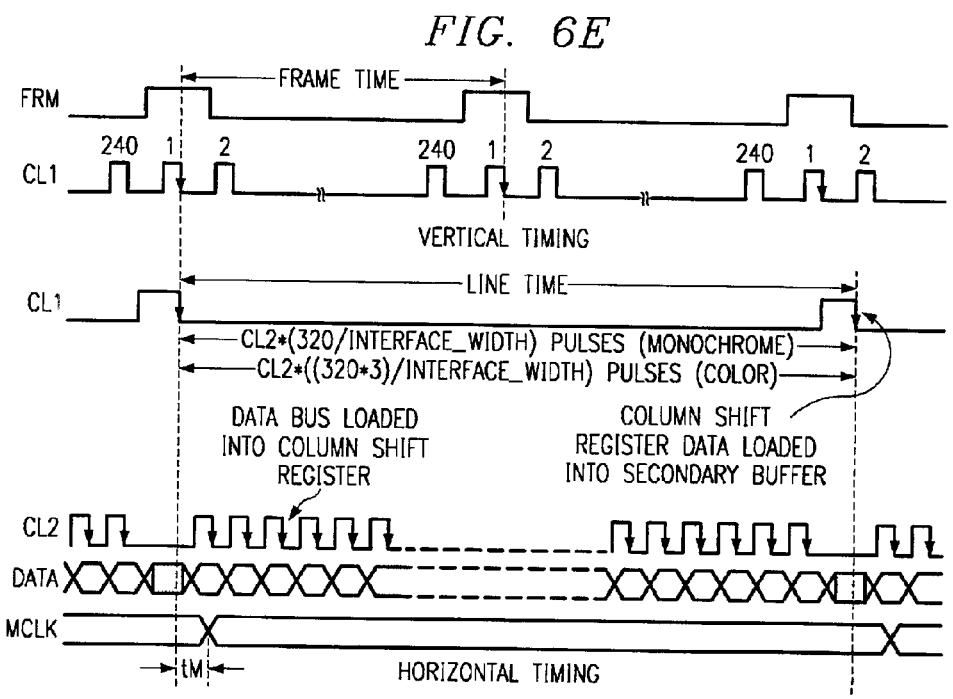
FIG. 6E is a timing diagram of the horizontal timing generated by the LCD controller to drive the display panel.

The general operation of display controller can be described in reference to FIG. 6C and the horizontal timing diagram of FIG. 6E. Consider the CL1 pulse for Line 240. At the depicted instance of time, Line 240 is being loaded into the secondary buffer and will be displayed. While Line 240 is being displayed, dots for the next line are being shifted into the shift register via CL2. On the next CL1 pulse, dots stored in the shift register will be loaded into the secondary buffer. Since FRM is active on the falling edge of CL1, the row driver will display these dots on line 1 of the display. FRM insures that line 1 of the frame buffer is synchronized with line 1 of the display.

As illustrated by the horizontal timing diagram of FIG. 6D, for this particular resolution display, there must be

- (320/interface_width) CL2 pulses—for monochrome displays, and
- ((320*3)/interface_width) CL2 pulses—for color displays during one line time. Again, this is due to the fact that each bit of the data bus contains a "dot" to display on the screen. The following illustrates the number of pulses per line for a particular interface_width using the 320×240 display as an example:

| Data Width | # CL2 pulses per line |
| --- | --- |
| 1 | 320 |
| 2 | 160 |
| 4 | 80 |
| 8 | 40 (monochrome); 3*40 = 120 (color) |

The generic equation for any LCD panels line resolution would be:

(#dots_per_line/Interface_width) CL2 pulses—for monochrome displays, and ((#dots_per_line*3)Interface_width) CL2 pulses—for color displays Note in the horizontal timing diagram of FIG. 6D that there is dead time on CL2 clock after the last dots are clocked in by CL2 of a previous line and before CL1 latches those data into the secondary buffer. There is also dead time on the CL2 clock after CL1 latches the data of a previous line and before CL2 clocks the first dots of a next line. This dead time is to ensure timing requirements for the delay from the falling edge of CL2 to the falling edge of CL1 when latching the last dots from a previous line into the secondary buffer. The dead time is also required to meet the timing requirements for the delay from the failing edge of CL1 to the falling edge of CL2 to ensure that the shift register contents are transferred to the secondary buffer so that the first dots of a new line can be cleanly clocked in. There is a delay from the falling edge of CL1 to the transition of MCLK. This delay is typically +−100 ns and should easily be satisfied at the pins.

LCD Panels usually have a frame refresh frequency between 60 Hz and 85 Hz. Consider the 320×240 display example with a desired frame refresh rate of 80 Hz. The line frequency is calculated as follows:

Line(f)=frame_refresh_freq*#_dots_per_line=80 Hz*320=25.6 kHz(monochrome display)

Line(f)=frame_refresh_freq'*#_dots_per_line*3=80 Hz*960= 76.8 kHz (color display)

Pixel frequency for a single dot is calculated as follows:

pixclk(f)=Line(f)*#_lines_per_frame=25.6 Khz*240=6.144 MHz (monochrome display)

pixclk(f)=Line(f)*#_lines_per_frame=76.8 Khz*240=18.432 MHz (color display)

Each dot on the display may be represented by multiple bits in the frame buffer (this is called pixel/sub-pixel depth). Therefore, assume in this example that there are 4-bits/pixel or 4-bits/sub-pixel. The AHB bus bandwidth needed to support this display example at 80 Hz with 4 bit/pixel is calculated as follows:

BW(MB/s)=pixclk (1/s)'*(bits/pixel)'*(1 byte)*⅛ (bits)=(6.144 MHz*4)/8=3.072 MB/s (color)

BW(MB/s)=pixclk (1/s)(bits/pixel)*3*(1 byte)*⅛ (bits)=(6.144 MHz*)/8=9.216 MB/s (color)

From the above equation, the bandwidth required is directly proportional to the frame refresh frequency, the resolution of the display, and the number of bits/pixel. For example, if the refresh frequency and the display resolution remain constant, but the number of bits/pixel required is 2, the bandwidth will be cut in half versus the previous example (1.536 MB/s—for monochrome). Also, the requirement to support a color display is triple the bandwidth versus a monochrome display.

Figure 6F:
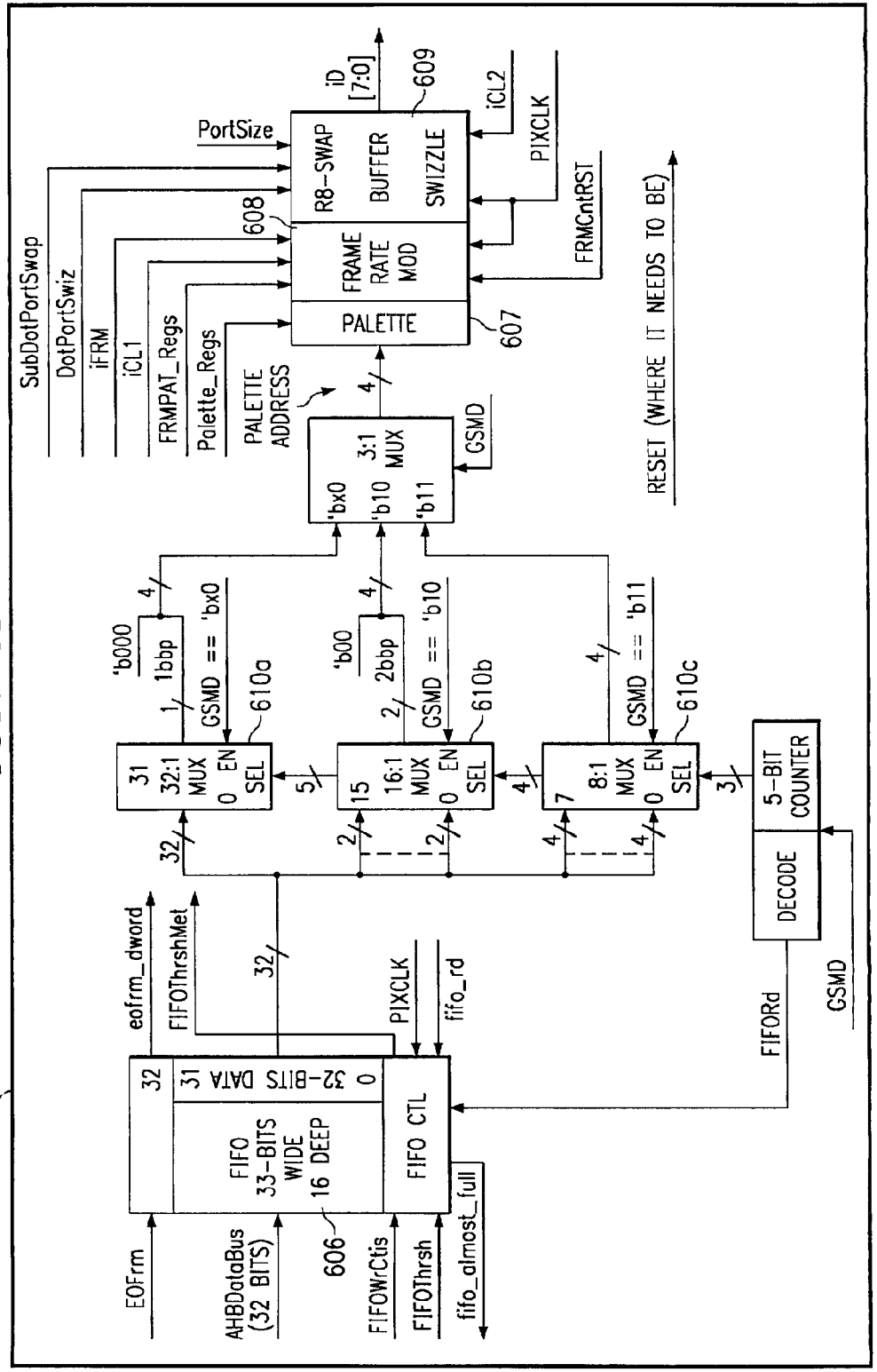
FIG. 6F is a functional block diagram further detailing the datapath block of FIG. 6A.

Datapath 604 is shown in further detail in FIG. 6F and includes a first-in-first-out buffer 606 having a width of 33 bits (32 bits of data and 1 bit of status) and a depth of 16 entries. The FIFO threshold is programmable via register bits FIFO Thrsh. The FIFO write and read ports are asynchronous such that the FIFO 606 may be simultaneously written to and read from. Additionally FIFO 606 may be accessed by AHB bus master 601 via the LCD controller registers for test purposes. The FIFO is only accessible in this manner when the LCDEN bit is 0.

Pixels from the frame buffer serve as the address to a particular location in palette 607. When the pixel size is 1 bit, only the least significant 2 locations of the palette are accessed (locations 0–1). When the pixel or sub-pixel size is 2-bits, the least significant 4 locations of the palette are accessed (locations 0–3), and, when the pixel/sub-pixel size is 4-bits, all 16 locations in the palette are accessible. The 4-bit value stored in a palette location addressed by a pixel/sub-pixel is then directed to frame rate modulator 608. Frame rate modulator 608 translates the 4-bit value from the palette to a dot on the display. The output from frame rate modulator 608 is then passed to the RB-swap buffer and swizzler shown at 609, and discussed further below.

Figure 6G:
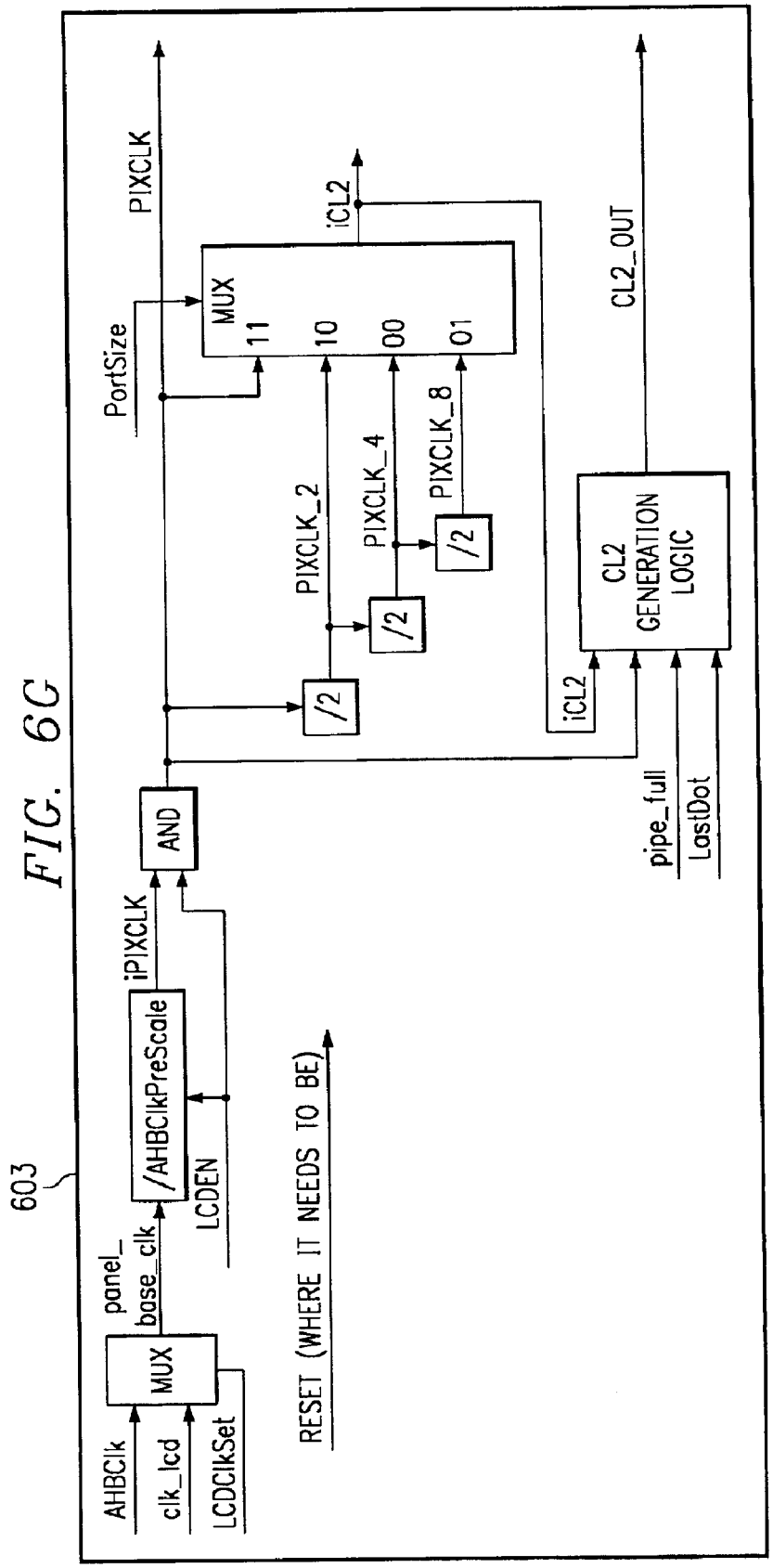
FIG. 6G is a functional block diagram depicting in further detail the clock generation block of FIG. 6A.
Figure 6H:
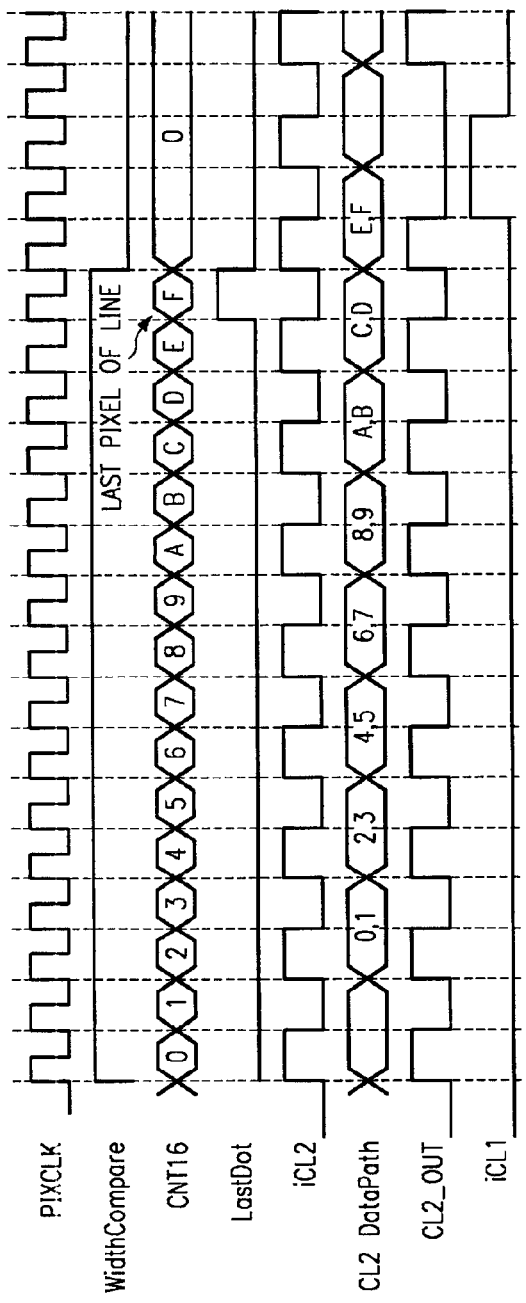
FIG. 6H is a timing diagram depicting the relationship between selected clocks and control signals utilized by the clock generation block.

Clock generation circuitry 603 is shown in further detail in FIG. 6G. The typical operation of clock generation circuitry 603 is illustrated in FIG. 6H. Internal PixClk ("iPixClk") is generated by dividing the AHBClk by bits AHBClkPreScale 610. In the preferred embodiment, AHBClkPreScale is a 6-bit value and the divisor is from 1 to 64. The divisor must be programmed so that the iPixClk generated adheres to the desired line/frame refresh rate. When LCDEN="1", PixClk and iPixclk will be generated. When LCDEN="0", PixClk and iPixClk will be driven to the rail and the LCD controller will be in an idle state.

The frequency of the Internal CL2 clock (iCL2) is the determined by bits PortSize (i.e. the data bus width at the panel interface). Depending on the size of the interface bus width, iCL2 frequency is the PixClk frequency divided by 1, 2, 4, or 8. iCL2 drives the remainder of the core and is especially important for muxing in DataPath Module 604. iCL2 is a free running clock and is not altered like CL2_OUT which goes to the interface. However, the majority of the datapath logic runs on the PIXCLK clock, to ease synthesis and layout. Where possible (for example, at the 8-bit last stage output register), the divided PIXCLK signals are used to enable data latching into the output register, which runs on PIXCLK. Minimizing the number of internally-generated clocks dramatically eases the synthesis/ layout burden, particularly with regard to meeting hold time.

As mentioned above, CL2_OUT is the signal for the LCD interface, and requires special treatment. In this example, the LCD panel bus interface width is 2. Therefore, iCL2=Pixclk/2. At the end of every line, dots in the LCD panel shift register must be loaded into the panel secondary buffer for display (see FIG. 6C). The secondary buffer load is accomplished via the falling edge of CL1. To ensure proper timing requirements between the failing edge of CL1 and the falling (previous dot: previous row)/rising (next dot: next row) edge of CL2, dead time is inserted on CL2_OUT.

Figure 6I:
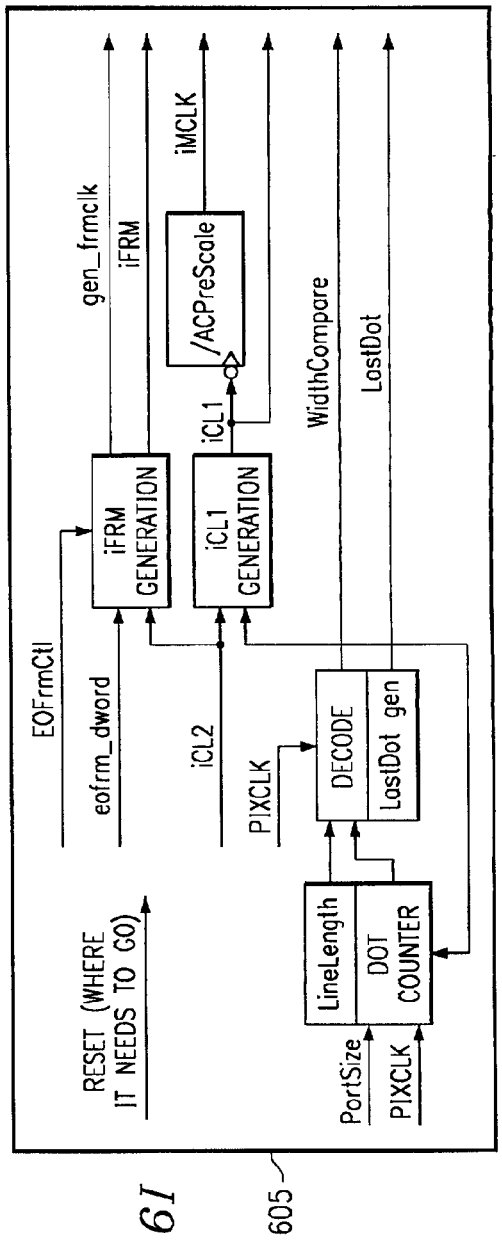
FIG. 6I is a block diagram of the H & V timing generation block of FIG. 6A.
Figure 6J:
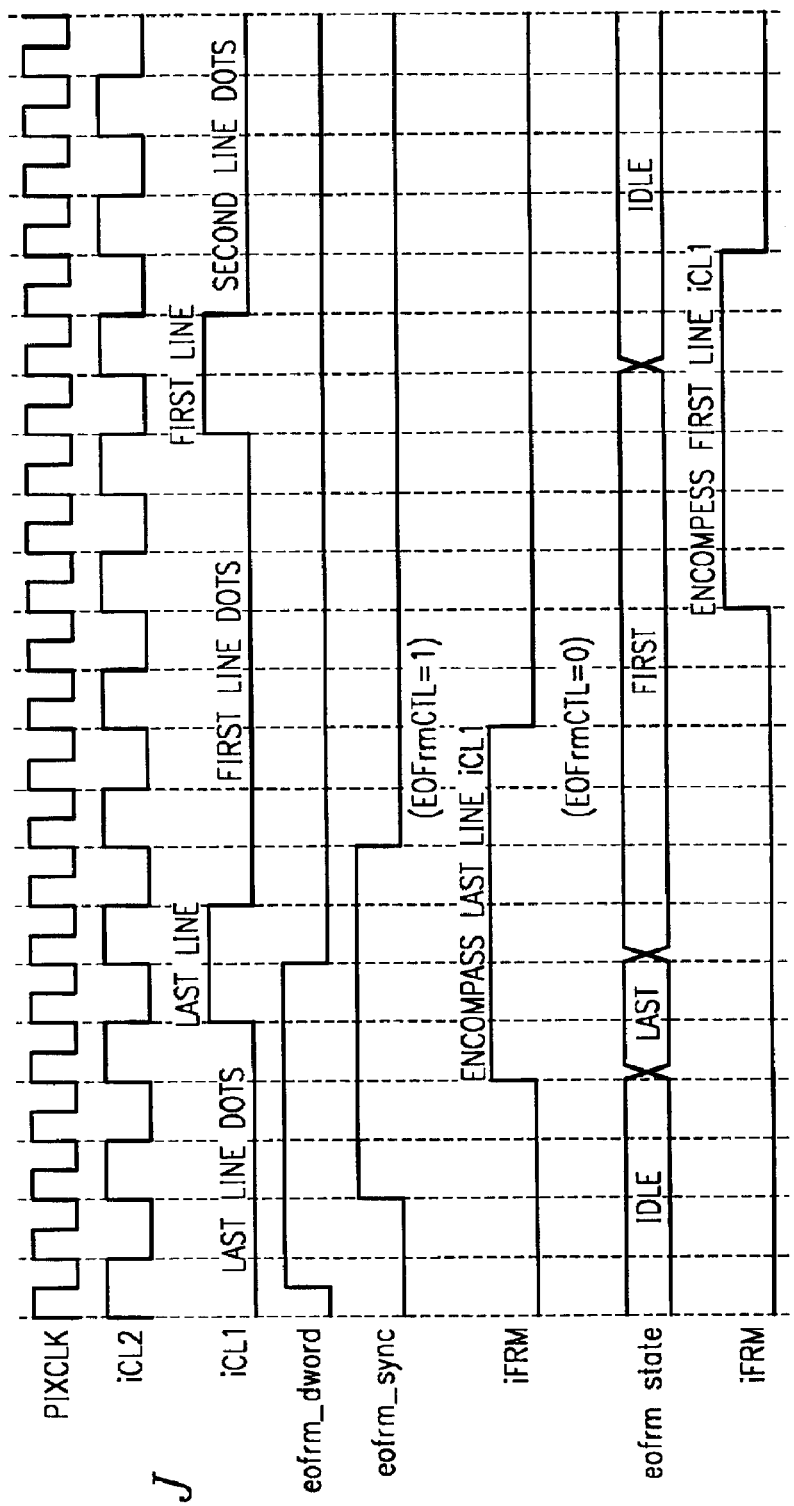
FIG. 6J is a timing diagram depicting the relationship between the k and control signals utilized by the H & V timing generation block.

A more detailed block diagram of H&V Timing Generation module 605, shown in further detail in FIG. 6I. An associated timing diagram is provided in FIG. 6J. Width-Compare has a granularity of 16 pixels and signals the approach of the end of the display line. In other words, 16 more pixels indicate the end of a line. A 4-bit counter can be implemented to determine when the last pixel occurs. Note, iCL2 is free running and clocking pairs of pixels in DataPath module 604 because the panel interface bus width is 2 (2-dots per CL2 period). When the last pixel occurs, the signal LastDot goes active. At this point iCL1 becomes active and will have a duration of 1 iCL2 clock period. At the proper time in relationship to iCL1, as indicated by FIG. 6J, CL2_Out will be "0" and resume following iCL2 after 1.5*iCL2_period.

To meet setup and hold time at the interface, the interface signals that have a relation to the falling edge of CL2 at the pin are effectively clocked off the rising edge of iCL2 in the LCD Controller. This is accomplished using iCL2 as a data enable for the output register which is running on PIXCLK, the same clock as the shift register. A four stage pipeline is implemented between the FIFO read port and the first stage of the output shift register to align timing with the datapath and to accommodate a 3-bit staging structure for Red/Blue bit swapping for color panels. Note that the first CL2 clock pulse after CL1 will be delayed for a number of cycles on the first line while the pipeline fills. Once the pipe is full, however, CL2 will run at the maximum possible bandwidth. WidthCompare and LastDot are in the Pixclk domain, while iCL1 is in the iCL2 Domain The DOT COUNTER is clocked off PIXCLK in order to eliminate hold time issues with the WidthCompare signal. Depending on the panel data port width (1, 2, 4 or 8 bits), this counter is incremented by 1, 2, 4, or 8 on the same cycle as CL2 rises. When DOT COUNTER bits [9:4] (16-dot granularity)=LineLength, WidthCompare is generated to enable Clock Generation module 603 to count the remaining 16 pixels. LastDot indicates that the last pixel has been counted by the Clock Generation Module 603. LastDot resets DOT COUNTER, thereby enabling pixels for the new line to be counted and compared to LineLength. On the new line, after LastDot resets DOT COUNTER, which does not restart until the appropriate CL2_OUT/iCL1 dead time has been accounted for, LastDot also turns off WidthCompare so that the pixel counter in Clock Generation module 603 will quit counting pixels (i.e. so that a false LastDot will not be generated).

The LastDot signal also serves as an indicator to the iCL1 Generation logic. When LastDot goes active, iCL1 will become active and have a duration of 1 iCL2 clock before being deactivated.

iMCLK transitions off the falling edge of iCL1. Bit ACPreScale defines the number of high-to-low or low-to-high transitions (i.e. iMCLK changes phases after bits ACPreScale have been met).

The gen_frmclk signal is used by datapath frame rate modulation logic 609 to increment the modulator counters.

EOFrm (End of Frame) is a signal from Bus Master module 601 and is generated with the 33$^{rd}$ bit of data being written into FIFO 606, along with the last doubleword of frame buffer data. Since the FIFO will likely have some locations filled with pixels for the last line, EOFrm is carried through the data pipe in phase with the data for the last line. Depending on the state of bit EOFrmCtl, the internal frame clock iFRM will encompass the last line iCL1 (EOFrmCtl="1") or the first line iCL1 (EOFrmCtl="0"). iFRM must be setup/held relative to the falling edge of CL1. Multiple iCL2 clocks are used to form the setup/hold relationship. For the EOFrm-Ctl="0" case, a 3-state state machine is used to store the EOFrm state and sense both the last line iCL1 pulse, and the subsequent first line iCL1 pulse, and to generate iFRM at the appropriate time for the first line. If the controller is coming out of a hardware reset state and EOFrmCTL=0, then iFRM will be generated at the end of the first line of dots sent to the panel, to allow the LCD panel to reset/initialize its row counter.

EOFrm is in the AHBClk clock domain. By storing it in the FIFO, it is shifted to the PIXCLK domain when read out with the frame buffer data (this is the signal "eofrm_dword" shown in FIG. 6E). Eofrm_dword is synchronized to the iCL2 clock domain before generating iFRM.

Figure 6K:
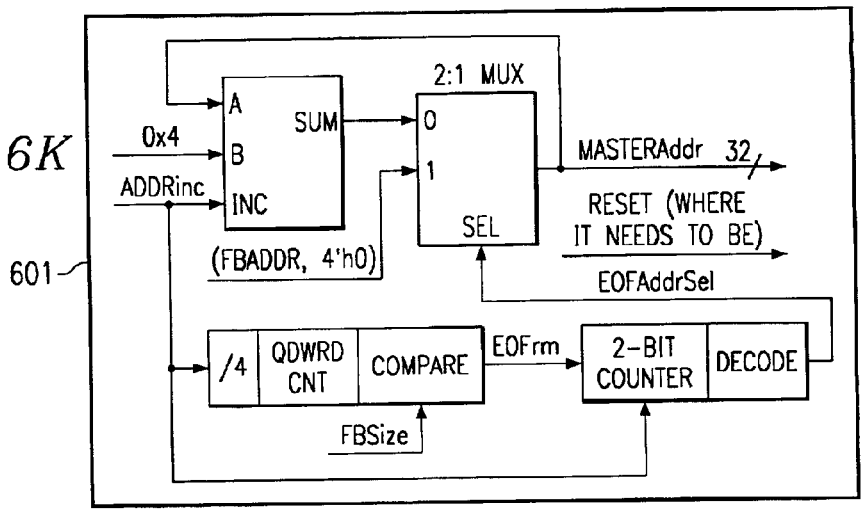
FIG. 6K is a functional block diagram of the address generation circuitry of the bus master block of FIG. 6A.

The address generation circuitry of bus master 601 is shown in further detail in FIG. 6K. For purposes of the present discussion of address generation, an exemplary frame buffer mapping is shown in FIG. 6L.

The register value of FBADDR sets the start address for the frame buffer, and is re-loaded at the end of every frame (i.e. FBSize has been satisfied). The granularity of FBADDR is preferably 128-bits. However, DWRD accesses are preferably performed on the AHB Bus when the FIFO threshold is met. This can be accomplished with an accumulator.

The EOFrm signal is generated by comparing the number of QDWRDs addresses by the Bus Master 601 to bits FBSize. However, there are 4 DWRDs in a QDWRD, therefore, EOFAddrSel (End Of Frame Address Select) can be generated by counting the remaining 4 Bus Master DWRD transactions. When EOFAddrSel is generated, it is held active, indicating the address for the first DWRD of the frame, until the Bus Master 601 latches the address for use. After the Bus Master 601 latches the address, EOFAddrSel can be de-asserted and 0×4 is added to the previous DWRD address to generate the next DWRD address. ADDRLNC is in terms of DWRD Bus Master transactions and is divided by 4 before being utilized by the QDWRD Counter so that QDWRD Bus Master Transactions can be logged.

As shown in FIG. 6L, pixels are preferably mapped Little Endian style. Pixels are stored linearly in memory, with no address gaps from the end of one line to the beginning of the next. "RGB" sub-pixel components are also defined in the FIG. 6L.

With respect to Data Path 604, FIFO 606 is written to by AHB Bus Master 601 with AHB Data and EOFrm. The request is made to Bus master 601 by signal FIFOThrshMet (FIG. 6A) indicating that the FIFO threshold has been met. The FIFO threshold is determined by register bits FIFO-Thrsh. AHB Bus Master 601 fills the FIFO until it is full. Bus FIFOWrCtls (FIG. 6A) controls writing to the FIFO via the AHB Bus Master in the AHBClk domain.

Returning to FIG. 6F, FIFO reads are a function of number of bits/pixels required by the datapath (GSMD) in the PixClk clock domain. A 5 bit counter and associated decode may be used to determine FIFO reads as follows:

(1) Decode all 5-bits of the counter. All 5-bits used by 32:1 mux 610a for pixel select. 16:1 and 8:1 muxes 610b,c disabled to conserve power.

(2) Decode 4 LSBs of the counter. Four LSBs used by 16:1 mux 610b for pixel select. The upper bit of the counter should not be allowed to toggle to conserve power. 32:1 and 8:1 610a,c muxes disabled to conserve power.

(3) Decode-3 LSBs of the counter. Three LSBs used by 8:1 mux for pixel select. The 2 upper bits of the counter should not be allowed to toggle to conserve power. 32:1 and 16:1 muxes 610a,b disabled to conserve power.

In addition, the 5-bit counter is reset for the first pixel of every line to account for the CL1/CL2 dead time.

The output of datapath 32:1, 16:1 or 8:1 muxes 610a,c serves as a 4-bit address to the palette (a pixel at a time). Which 4-bit output addresses the palette is determined by a 3:1 mux whose select is register bits GSMD. Gray scaling is enabled for all bit-per-pixel modes. Note that the data size out of 32:1 mux 610a is 1-bit and out of 16:1 601b mux is 2-bits. These bits are the LSBs of the palette address. For 1 bit-per-pixel mode, "000b" is appended to the LSB and for 2 bit-per-pixel mode, "00b" is appended to the two LSBs to form the 4-bit address required by the palette.

The frame rate modulator, which is shown in further detail in FIG. 6M, receives, a pixel at a time, the 4-bit palette data accessed by the 4-bit pixel data address. The frame rate modulator converts the 4-bit palette data into a dot for display depending on the value of the palette data.

Frame rate modulation is a technique used by LCD controllers to utilize the slow response time of the liquid crystal to produce gray shades. This method varies the duty cycle of the LCD pixel in time over multiple frames. While this will produce gray shades, an unacceptable side effect is frame rate flicker. This effect can be minimized by applying a spatial distribution to the modulation pattern in the x and y directions.

To produce 16 shades of gray requires a minimum frame rate of ~90 hz. This allows a minimum modulation rate of ~10 Hz on a typical monochrome panel with a response time of 250–300 ms. Care must be taken in choosing the modulation frame rate because over time the AC value on each pixel must be zero DC. DC build up can occur because the modulation pattern and the AC bias signal (MCLK) interact. Given these restrictions the following 16 frame duty cycles preferably are used:

Frame Duty Cycle:
0, 1/8, 1/5, 4/15, 3/8, 2/5, 4/9, 1/2, 5/9, 3/5, 5/8, 11/15, 4/5, 8/9, 1.

This method of gray scale generation can produce varying levels of quality on different panels. Therefore a programmable pattern generator will be employed to manage these panel differences.

A typical generator 611 in FIG. 6M consists of a modulo counter, pattern register and a parallel to serial generator, as shown in FIG. 6N. A pair of modulo counters 612 generates an address to pattern register 613 every 8 pixel times (pixclks). In order to maintain a spatial pattern in x, y and frame to frame, two modulo counters are used. A vertical counter maintains the frame to frame shift and a horizontal counter will maintain the line to line shift. The following pseudocode snippet shows their relationship.

```
parameter  MODULO_X = 5;         // modulation count
input      FRM_VS;               // frame vertical sync
input      FRM_HS;               // frame horiz sync
input      PIXEL_CLK;            // pixel clock
reg [3:0]  NEXT_PAT_ADDR;        // next pattern reg address
reg [3:0]  PAT_ADDR;             // current pattern address
reg [3:0]  NEXT_VERT_ADDR;       // next horizontal start address
reg [3:0]  VERT_ADDR;            // current horizontal address
reg [3:0]  NEXT_HORIZ_ADDR;      // next horizontal start address
reg [3:0]  HORIZ_ADDR;           // current horizontal start address
reg [2:0]  bitpos                // pixel position modulo 8
if (FRM VS) //(end of frame)
begin
if (VERT_ADDR == MODULO_X-1 ) NEXT_VERT_ADDR= 0;
else       NEXT_VERT_ADDR = VERT_ADDR + 1;
```

Pattern register 613 contains the modulation pattern for the gray shade and contains enough bits to map a 320×240 screen into smaller manageable pieces. The intent is to modulate small sections of the screen at different phasing to minimize the area the eye integrates. Simply put, the smaller the area, the less likely flicker will be perceived. The length is determined by defining a common multiple of the modulo count and 8. For example if the modulo is 5, the length of the pattern register will be 40 (5*8) bits. Choosing a multiple of 8 greatly simplifies the logic needed to obtain the pixel and frame phasing of pixels.

8:1 mux 614 functions as a parallel to serial converter for each of the generated 8 bit modulation patterns. Only 7 generators are needed to produce 16 gray levels since the gray scale pattern and its complement are valid shades. Therefore, the preferred embodiment incorporate modulo 2, 5 (2 instances), 9 (3 instances) and 15 generators.

The swap, swizzle and collection buffer portions of datapath block 609 are shown in FIG. 6O. Dot data is collected in a shift register 615 at the PixClk rate and collected at a last stage buffer 616 at the iCL2 rate before being sent to the pins. Along the way, the red and blue sub-dot data can be swapped and/or the dot data at the pins can be swizzled in block 617, as discussed below.

In order to support Red/Blue dot swapping for all panel interface widths, a dual 3-stage ping-pong staging buffer 618 is used to queue up the 3 color bits prior to swapping the red and blue bits. The concept of RB swapping is shown in FIG. 6P.

Red/Blue Sub-Dot data from the modulator may be swapped depending on the state of bits SubDotPortSwap. Then, the dot data is collected in a shift register buffer at the PixClk rate and sent to the pins at the iCL2 rate. Again, iC12 reflects the rate required for a particular LCD interface bus width as determined by bits PortSize. After the data is collected in the buffer, bit DotPortSwiz may determine dot swizzling at the interface.

Figure 6Q:
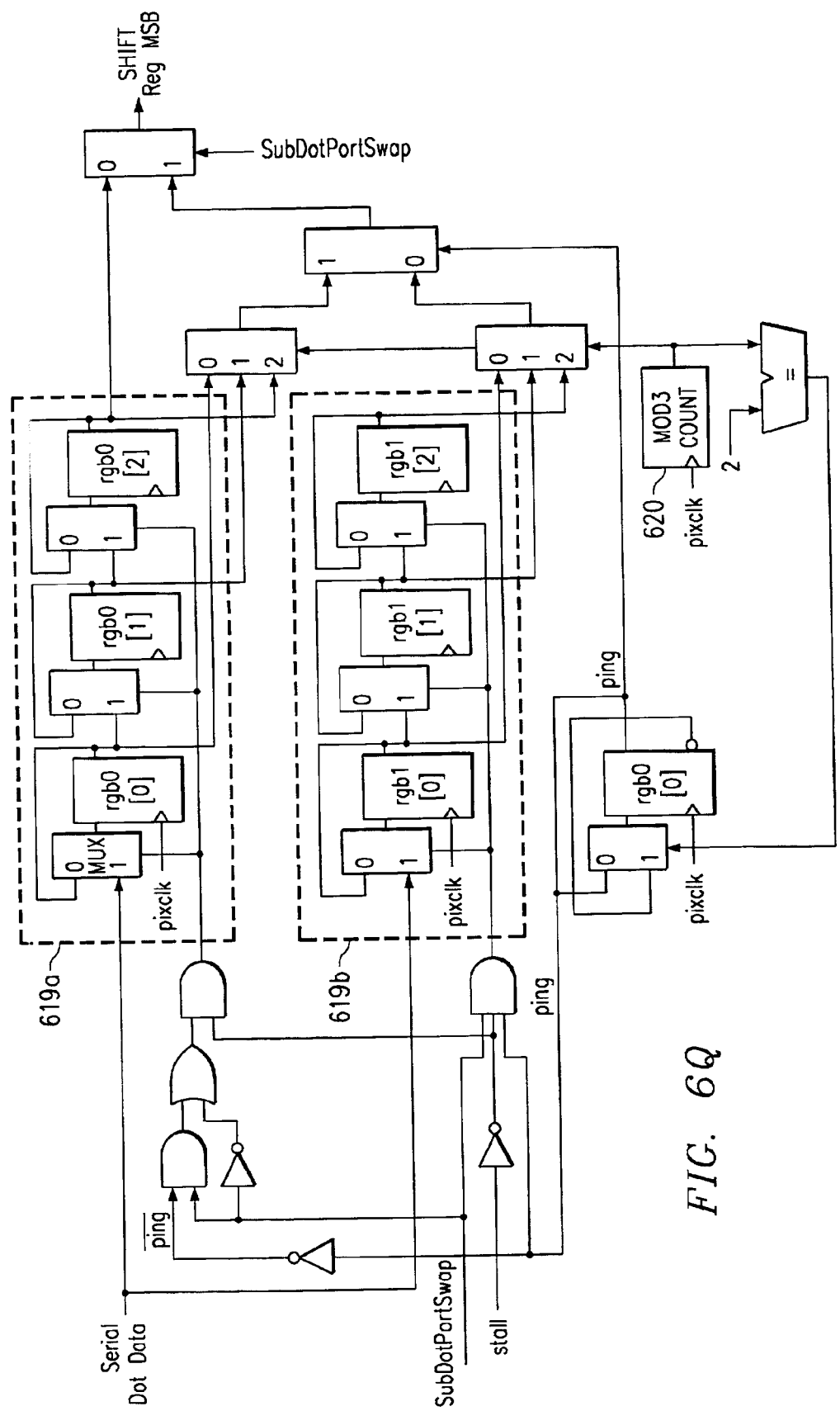
FIG. 6Q is a functional block diagram of the RB swap staging buffer of FIG. 6O.

RB swap staging buffer 618, shown in further detail in FIG. 6Q, consists of two three-stage shifters (RGB shifters) 619a,b in parallel and a modulo 3 counter 620. Prior to sending the pixel data to the 8-bit shift register, three bits at a time are stored in one RGB shifter 619 or the other. While one RGB shifter is filling with data, the other is being shifted into the 8-bit output staging shift register, albeit with the red and blue bits reversed, hence the ping-pong technique. On each count cycle of modulo 3 counter 620, the logic switches between one RGB shifter 619a,b and the other (i.e. while one is filling, the other is being "drained"). If RB swap is disabled, only one of the RGB shifters 619a,b is used (rgb0), and no RB swap muxes are enabled, so the data entering the RB swap logic is the same as what exits. In any case, the pipeline remains fixed at the same length, simplifying the control logic.

Figure 6R:
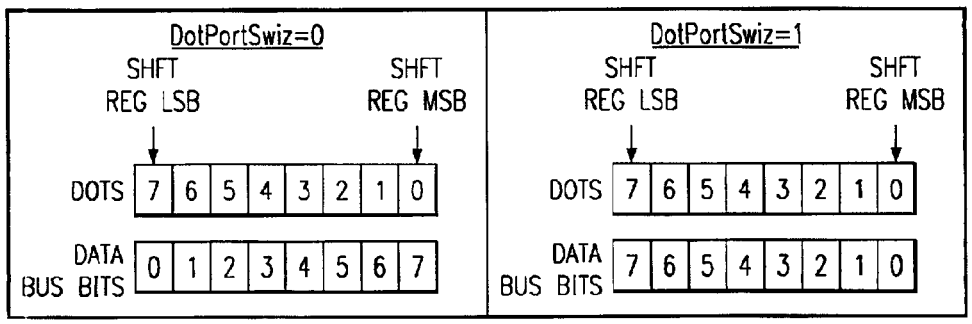
FIG. 6R is a diagram illustrating a typical a 8-bit data swizzle.

A 8-bit data swizzle is illustrated in FIG. 6R. For a 4-bit interface, only bits [3:0] of the shift register are swizzled, and for the 2-bit interface, only bits [1:0] of the shift reg are swizzled.

Figure 6S:
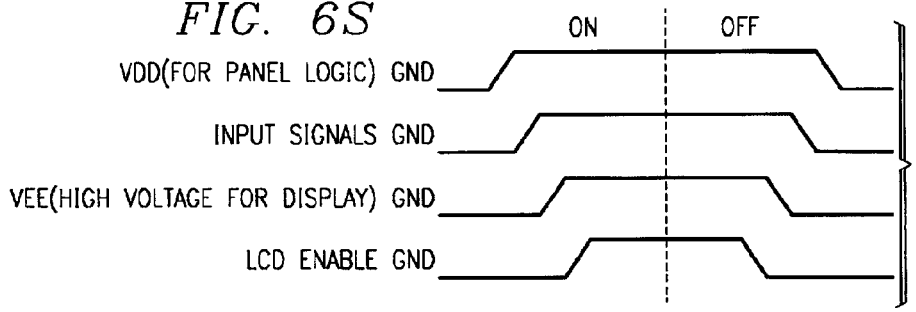
FIG. 6S is a timing diagram illustrating typical LCD panel power-up and power-down operations.

To prevent latch-up or DC operation of the panel the power on/off sequence illustrated in FIG. 6S is required. The power-on programming sequence for LCD controller 110 is as follows:

1) At power on, VDD will transition from GND to VDD.
2) Set bits GPIO Mux Selector Register for the bus width of interest. The reset state of the LCD interface signals (FRM, MCLK, CL1, CL2 and data will be 1s). Set the appropriate GPIO pins corresponding to FRM, MCLK, CL1, CL2, and Data to direction=output. At this point, since the pin enable mode is set and bit LCDEN has not yet been programmed, the LCD "input signals" will transition from GND to VDD.
3) Program the GPIO direction bits to output for the GPIO pins that control the panel LCD Enable & VEE pin. Since the GPIO data is 0s at Reset, the panel's LCD Enable pin will be a GND.
4) Set the GPIO data bit associated with turning VEE on.
5) Set the GPIO data bit associated with turning on the panel's LCD Enable pin.
6) Set bit LCDEN to allow operation of the internal LCD controller.

If an LCD panel has an on-board LCD controller with a standard interface, it is the responsibility of the on-board IC to meet power-on/off requirements of the panel.

The preferred power-off sequence for LCD controller 110 is as follows:

1) Reset the GPIO data bit associated with turning on the panel's LCD Enable pin.
2) Reset the GPIO data bit associated with turning VEE on.
3) Reset bit LCDEN so that the internal LCD Controller is idle.
4) Reset GPIO Mux Selector Register to "00"(normal GPIO operation)—GPIO data will now be present at the pins. At this point, the GPIO data bits associated with FRM, MCLK, CL1, CL2 and Data should still be at 0s—the default value.

AHBClk is the source of all timing for the AHB interface in the LCD controller. The data path (from the FIFO read port to the panel data port) can run on either the AHBclk or clk_Lcd, which is derived from the USB PLL. AHBClk is generated from separate a PLL. The LCD controller should therefore not be enabled until the PLLs are locked. For the case of an audio sample rate change when the LCD controller is enabled, the AHBClk PLL N/M dividers may be changed (sample clock is the REFCLK for the PLL). In this case, the PLL must be re-locked and the refresh rate of the LCD display will be affected as the PLL locks—refresh rate will be gradually higher until locking completes. Turning off the display is not feasible. So the ability to run the panel interface off of the USB PLL, which is not variable like the AHBClk PLL, has been added. The FIFO logic is designed to accommodate asynchronous write and read clocks.

Figure 7A:
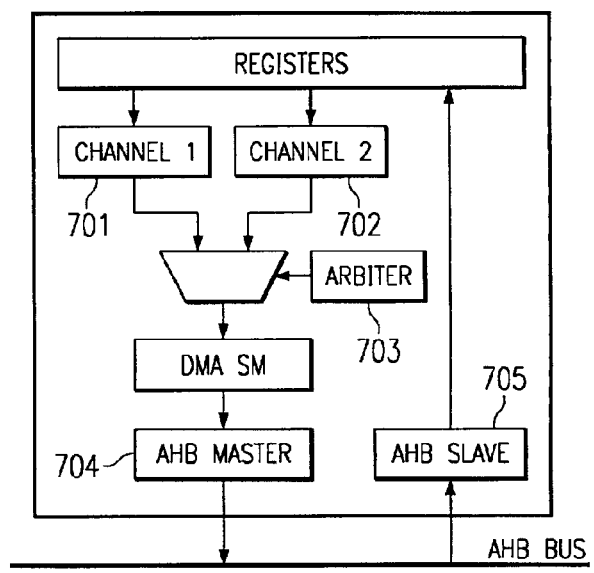
FIG. 7A is a functional block diagram of the DMA engine of FIG. 1.

As shown in additional detail in FIG. 7A, DMA block 106 includes 2 separate DMA channels 701 and 702, a 2-way Arbiter 703, a shared AHB bus master 704, and a shared AHB register slave 705. Each DMA channel 701/702 receives 4-bit DMA requests. The requests are issued from system resources such as USB port 114. Each DMA channel can be used independently or dedicated to any request signal. For purposes of the discussion below, the DMA configuration and control registers are provided in Tables 31–43.

AHB bus 103 is based on pipe-lined address and data architecture, therefore DMA transfer operations generally proceed as follows. When enabled, the given DMA channel 701/702 performs an internal request which generates an AHB bus request. When the request is granted, the appropriate DMA channel signals are routed based on internal 2-way arbiter 703 and the selected channel begins the transfer with the source location address driven on the bus during the previous data cycle. During all transfers, the individual channel asserts an internal channel lock signal to lock DMA arbiter 703 to the current channel so that the active DMA channel can complete the transfer without interruption. Timeouts are used to avoid starvation, and to allow higher priority masters to assume control of AHB bus 103.

Source and destination addressing for each DMA channel can be independently programmed to increment, decrement, or stay at the same value. Generally, 32-bit source and destination address pointers in register define the DMA transfer configuration and are incremented or decremented based on the control bit configuration set in register for each channel. If the increment and decrement bits are the same value, the associated address remains the same. This configuration is used for transfers to/from I/O ports. When performing a DMA transfer of a specific length, a transfer count value of up to one less than 64K transfers is also set in register.

Unsynchronized transfers are initiated by software configuration of register bits and occur whenever the DMA channel is granted access to the bus. Synchronized transfers are DMA channel controlled by DMA requests from various resources, such as serial channel transmit or receive buffers.

Arbiter 703 follows the AMBA bus protocol to grant the bus access permission when simultaneous bus access requests are issued by different bus masters on main AHB bus 103. Again, there are total four AMBA bus masters in the System 100, and their bus access priority highest to the lowest as follows: (1) TIC 108; (2) display interface 110; (3) DMA controller 106; and (4) Local/Main AHB Interface 105.

Figure 7B:
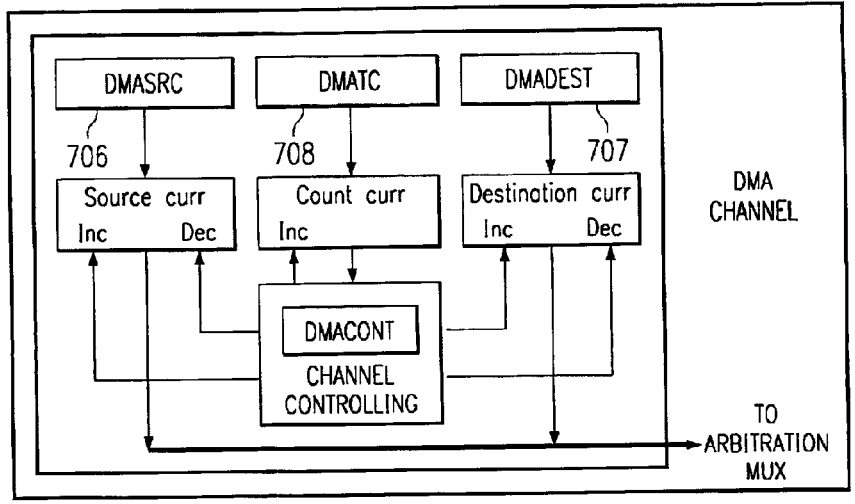
FIG. 7B is a functional block diagram of a selected one of the DMA channels shown in FIG. 7A.

The preferred configuration of he DMA engine and its operation can now be described in particular detail. A selected one of the DMA channels is shown in FIG. 7B for reference.

A 32-bit source address pointer in DMASRCx (x=1,2) register 706k and a 32-bit destination address pointer in DMADESTx register 707 are provided for DMA transfer configuration. These addresses are incremented or decremented based on the DMACONTx.SINC/SDEC and DMACONTx.DINC/DDEC control bit configuration for the given channel. If the increment and decrement bits are the same value, the associated address remains the same. This configuration is used for transfers to/from I/O ports. The address counters preferably increment as a little-endian address.

When performing a DMA transfer of a specific length, a transfer count value must be provided in DMATCx register 708. This value may be up to one less than 64K transfers which provides the maximum block size of 64K×32 bit. In the preferred embodiment 32-bit-word transfers are used.

In addition, if the DMACONTx.INTEN control bit is set, an interrupt is generated when the entire block transfer is done. The DMACONTx.INT bit is used to set, clear, and read status for this interrupt.

The DMACONTx.ENABLE bits are enables for each of the channels. During an unsynchronized transfer, setting the DMACONTx.ENABLE bit starts the transfer. Clearing the DMACONTx.ENABLE bit stops the transfer. The DMACONTx.ENABLE bit will also be automatically cleared when the transfer count reaches zero. During a transfer, when the DMACONTx.ENABLE bit is set, the DMA channel will transfer data when the request line to the DMA module is active and the specific DMA channel is granted by the internal channel arbiter.

Since there are two independent channels in the DMA, an arbitration scheme is provided when both channels are enabled. The preferred scheme implemented in the DMA is as follows: (1) First-come-first-service (whichever is enabled first, will start transfer first); and (2) If Channel 1 and Channel 2 are enabled at the same time, Channel 1 starts first. A TIMEOUT register is provided for each channel (TIMEOUTx). After finishing TIMEOUTx number of transfers, the channel arbiter will grant the permission to the other channel.

Since DMA operations typically involve a large block of transfers, it is possible that the DMA engine will occupy the bus for a long period of time and thereby prevent a lower-priority bus master from gaining bus access permission. A TIMEOUTG register is therefore also defined such that after TIMEOUTG number of transfers are performed, the bus permission is dropped for one cycle to create a window of one cycle within which a lower-priority bus master may be able to perform some bus access instead of being completely starved.

Arbiter 109 follows the AMBA bus protocol to grant the bus access permission to the proper bus master when simultaneous bus access requests are issued by different bus masters on the main AHB bus.

As previously indicated, there are total four AMBA bus masters in the Maverick, and there bus access priority from the highest to the lowest.

Figure 8:
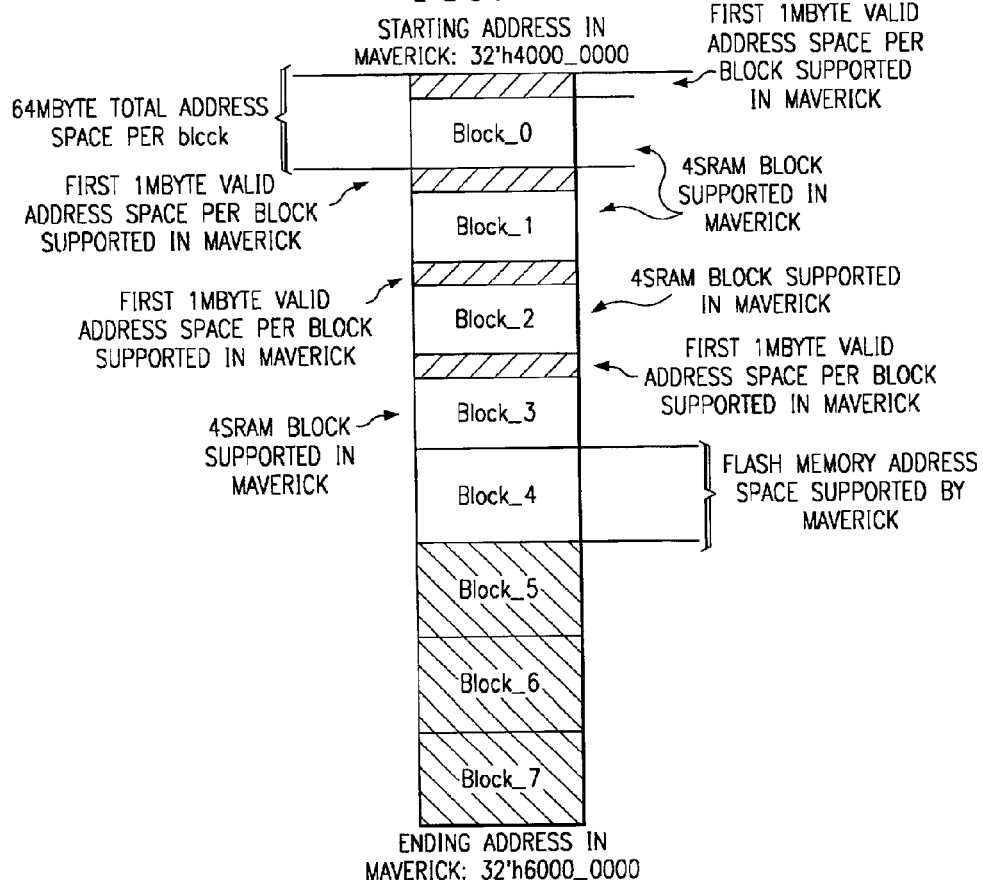
FIG. 8 is a diagram illustrating the address space supported by the static memory controller of FIG. 1.

External SRAM/Flash Memory Controller (SMC) 107 supports eight external memory blocks, each having an address space up to 64 M Bytes. In the preferred embodiment of system 100, 4 SRAMs blocks are used, each with 1 M-byte address space, along with one block of FLASH RAM, as shown in FIG. 8. Each Bank has its own configuration register with which programmers can configure the Bank to support a specific type of External memory. In FIG. 8, the banks designated BANK 0–3 comprise 16-bit external SRAMs and the bank designated BANK4 comprises 8-bit wide external Flash RAMs.

FIG. 8 is a diagram of the address space supported by static memory controller (SMC) 107. In the preferred embodiment, the address space is partitioned into 8 blocks out of which the first five blocks are used. These blocks can be 8-bit or 16-bit SRAMs with the MW bit in register set to 01(16-bit) or 00(8-bit). The interface nXWEN and nXOEN are connected to the memory WRn and RDn pins respectively, the nXCS(3:0] to the memory, CSn_ou[3:0] pins, the XADDR[19:0] to the memory AD[19:0] pins, nXBLS[1:0] to DQMn[1:0] pins, XDATAOUT[15:0] are connected to DA_out[15:0] signals. XDATAIN[15:0] are connected to DA_in[15:0] signals. XDATAIN[31:16] are tied to 0. SMC's -(nXDATAEN[1:0]) are connected to DA_en[1:0] signals.

DA-out, DA-in and DA_en respectively couple to the chip pads to create DA[15:0], DA_en[1:0] being the pad enable signals for individual bytes. All the signals and pins except DA, DA-in, DA_out, DA_en, and AD are active negative, and the control pins remain disabled if access to any other Block is performed. Connections to external SRAM should be made as specified in SMC: controls of the SMCBCRx registers should be made for 16-bit (or lesser) wide external memory only.

Static Memory Controller (SMC) in interface 107 also partially supports FLASH memory such NAND and NOR 8-bit wide Flash memory modules in Block 4. In the preferred embodiment, a write strobe (CS4WEn pin) and a read strobe (CS4OEn) are provided. These signals are active low and are connected to SMC's nXBLS[0] and nXOEN, and are disabled if access to any other Block is performed. Additionally, DATA/ADDRESS pins (DAx and ADx) are muxed. Additionally, some GPIO pins can be programmed as Address/Data latch signal, chip select signal, and any other signals needed for a specific flash memory. SMC Block 4 Control Register (SMCBCR4) is programmed to suit the flash memory functions. Thus SMCBCR4's MW should be set to 00, and RBLE should be set to 0.

The Debug I2C interrupt is mapped to DSPint0 and has the highest priority. This interrupt is not visible to the ARM. The priority for the DSP interrupts is: DSPint1 has a higher priority and DSPint15 has the lowest priority.

Figure 9:
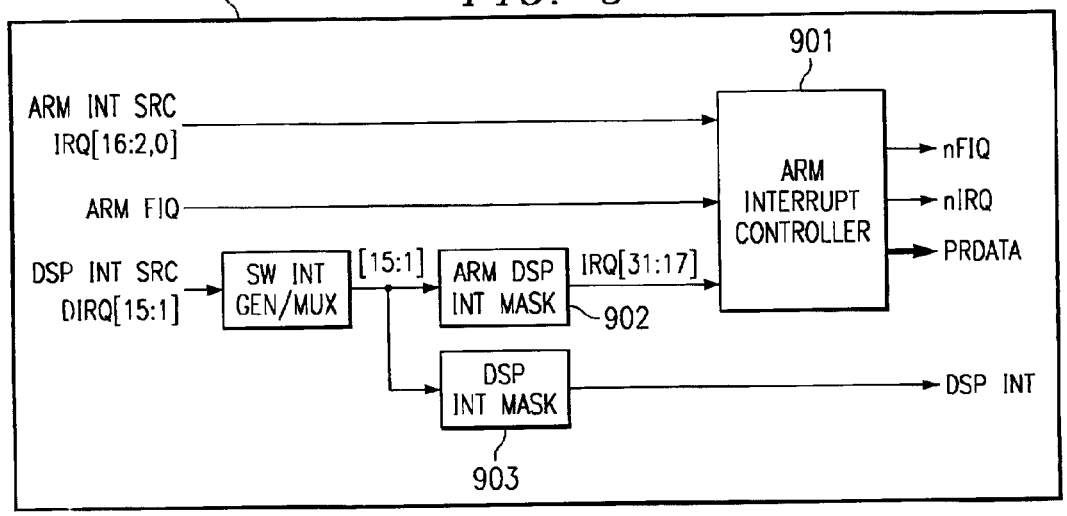
FIG. 9 is a functional block diagram of the interrupt controller block of FIG. 1.
Figure 10A:
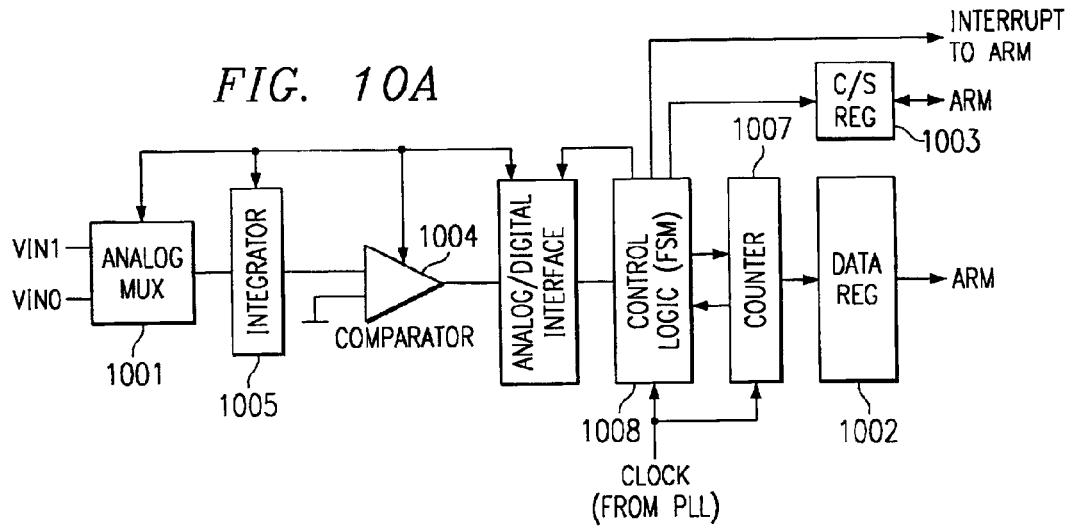
FIG. 10A is a functional diagram of the ADC/volume control block of FIG. 1.
Figure 10B:
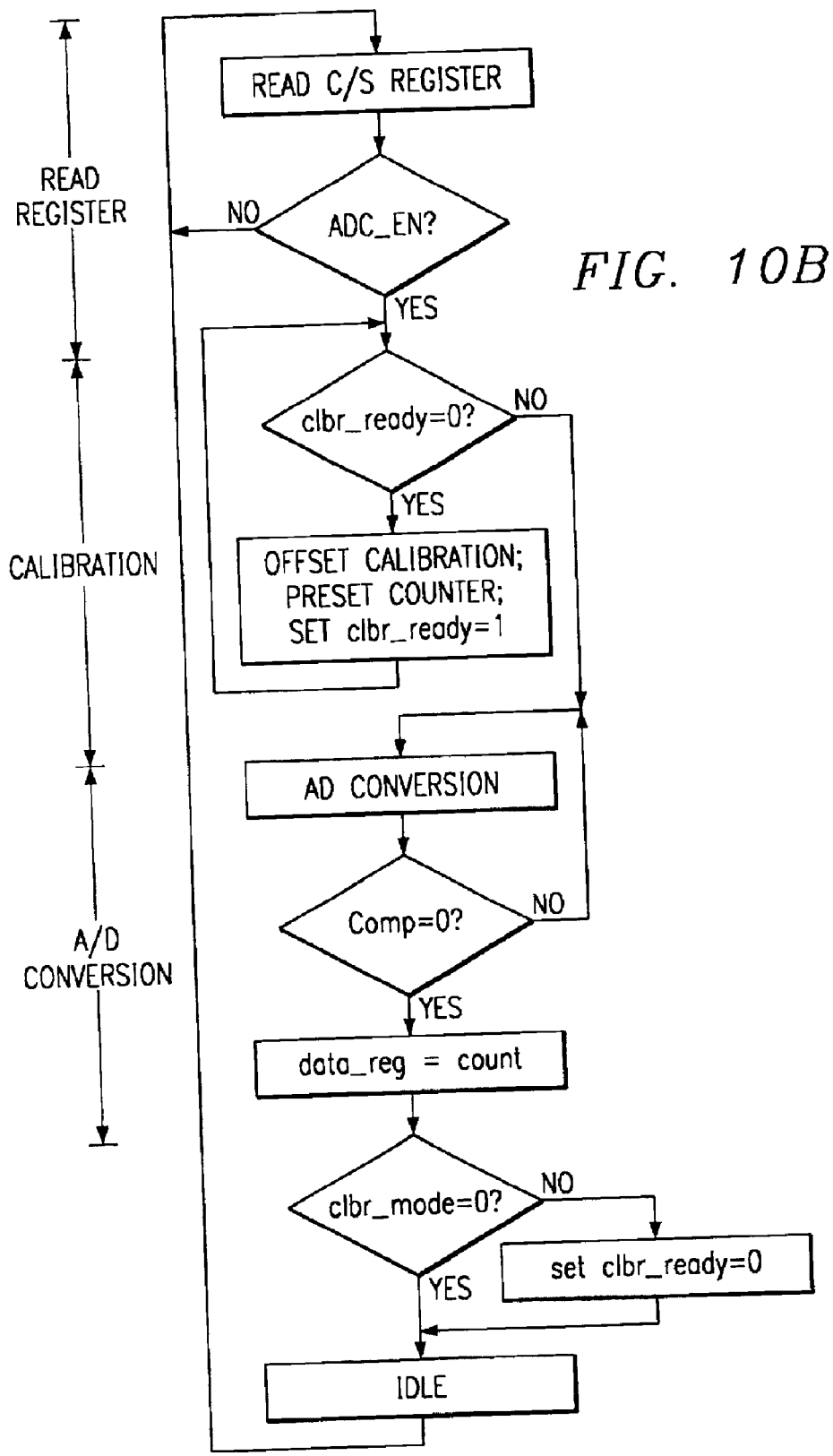
FIG. 10B is an exemplary work flow diagram illustrating the typical operation of the ADC/volume control block of FIG. 10B.

Interrupt controller 126 is an APB peripheral and is configured by Microprocessor 101. All the interrupts in the chip, which are level sensitive, including the DSP interrupts, pass through this block. FIG. 9 is a more detailed functional block diagram of Interrupt Controller 126 block, which is based on an ARM specified interrupt controller 901.

The size of the interrupt request space (IRQsize) is 32 in the illustrated implementation. The lower 17 interrupt sources (including IRQ1 which is a software programmed interrupt) are dedicated to microprocessor 101. There is no hardware priority for the microprocessor 101 IRQs and therefore a software interrupt handler reads the source register in the Microprocessor 101 and prioritizes the asserted interrupts. The FIQ (Fast Interrupt Request) is generated separately, and is also mapped to the microprocessor 101 space only. Any interrupt microprocessor 101 can be routed as a normal interrupt request via nIRQ or as a fast interrupt request via nFIQ.

The 15 DIRQs (interrupt request sources for the DSP) are mapped to the higher is IRQs. All the DSP interrupts can be generated by software by setting bits in register. DIRQs can be individually gated off to the microprocessor 101 by setting the microprocessor—DSP mask register 902 and masked off from the DSP by setting the DSP in mask register 902. The Register definitions are provided for the preferred embodiment in Tables 44–49.

Battery checker/volume monitor is preferably a Dual-Slope integrating Analog to Digital converter(ADC) with a resolution of 8 bits and a nominal sampling rate of 100 Hz. A block diagram is provided as FIG. 10A along with an exemplary work flow in FIG. 10B. The input to the ADC comes from a 2:1 analog mux 1001 selecting either the battery voltage or the volume input voltage, under microprocessor control. The output data register 1002 is a 32-bit register which shows the value of the current sample in counter 1007, with the higher 24 bits set to zero. Output register 1002 is updated at each sample period and an interrupt to the microprocessor is generated when the data is ready. Dual-Slope integration and A/D conversion is based on a conventional integrator 1005 and comparator 1004. Enablement, configuration and status data are implemented by configuration/status register 1003 within the Microprocessor 101 space under control of logic 1008. The ADC control registers are provided for the illustrated embodiment in Tables 50–52.

Figure 11A:
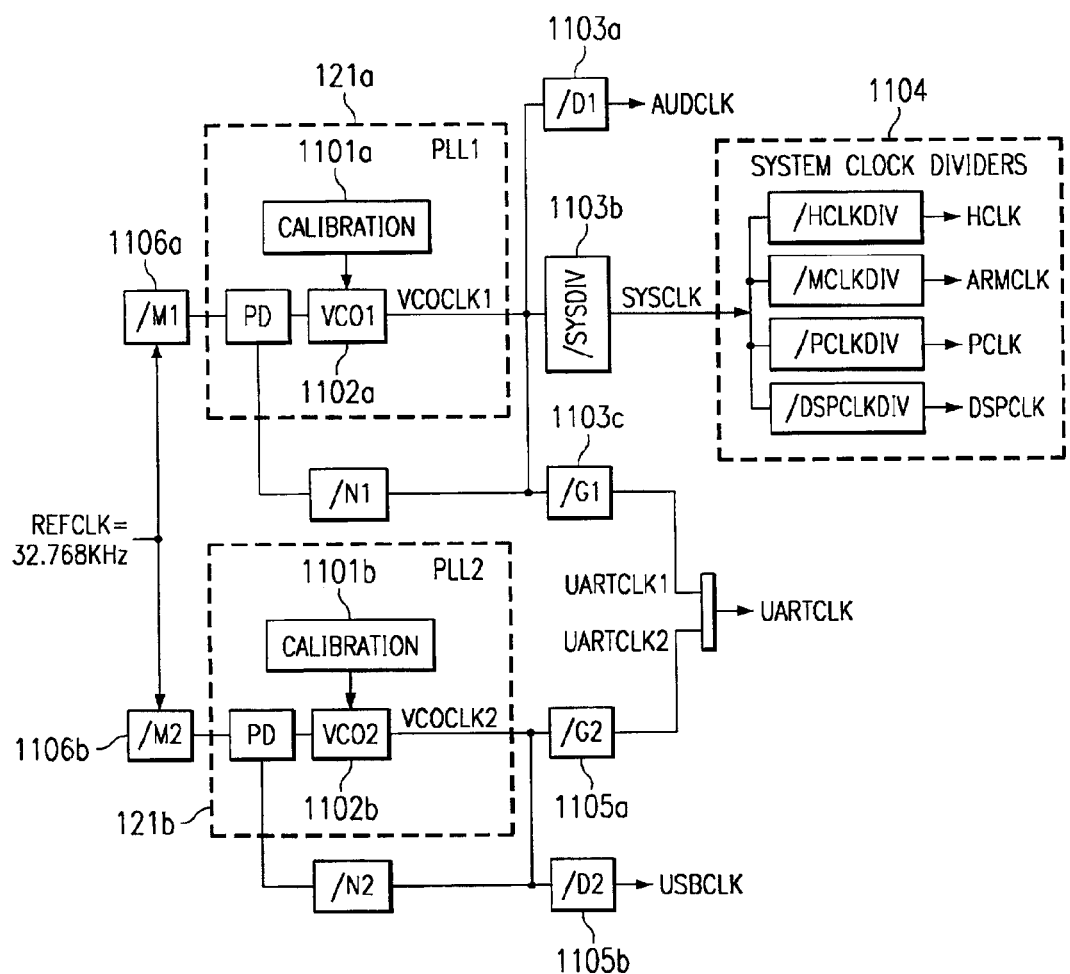
FIG. 11A is a functional block diagram of the PLL/clock control blocks of FIG. 1.

System 100 has two identical PLLs 121a,b on-chip which generate all needed clock frequencies for operating the processors, setting the audio sample rate and clocking the peripherals. A block diagram of the system clock generation scheme is illustrated in FIG. 11A.

Both PLLs 121a,b use the on-chip 32.768 KHz oscillator 120 as reference clock. Each PLL 121a,b includes a calibration circuit 1101 which can set the bias current to the corresponding VCO 1102a,b to account changes in working environment such as temperature and supply voltage.

Preferably, the first PLL (PLL 1) is used to generate the oversampled audio frequency (AudClk), the system clock SYSCLK, and the UART clock using dividers 1103a,c set with divisors D1, H1, and G1. SYSCLK is further divided down by system clock dividers 1104 to generate the base clocks HCLK (high-speed bus clock), MCLK microprocessor (ARM) clock, PCLK (peripheral clock) and the DSPCLK DSP clock. The second PLL (PLL2) is used to generate the USB clock and a backup UART clock. PLL2 is associated with dividers 1105a,b which generate these clocks by dividing-down by the PLL outputs by factors G2 and D2. Prescalers 1106a,b support division of the reference clock by the values M1 and M2 prior to the inputs of PLLs 121a,b, respectively.

Figure 11B:
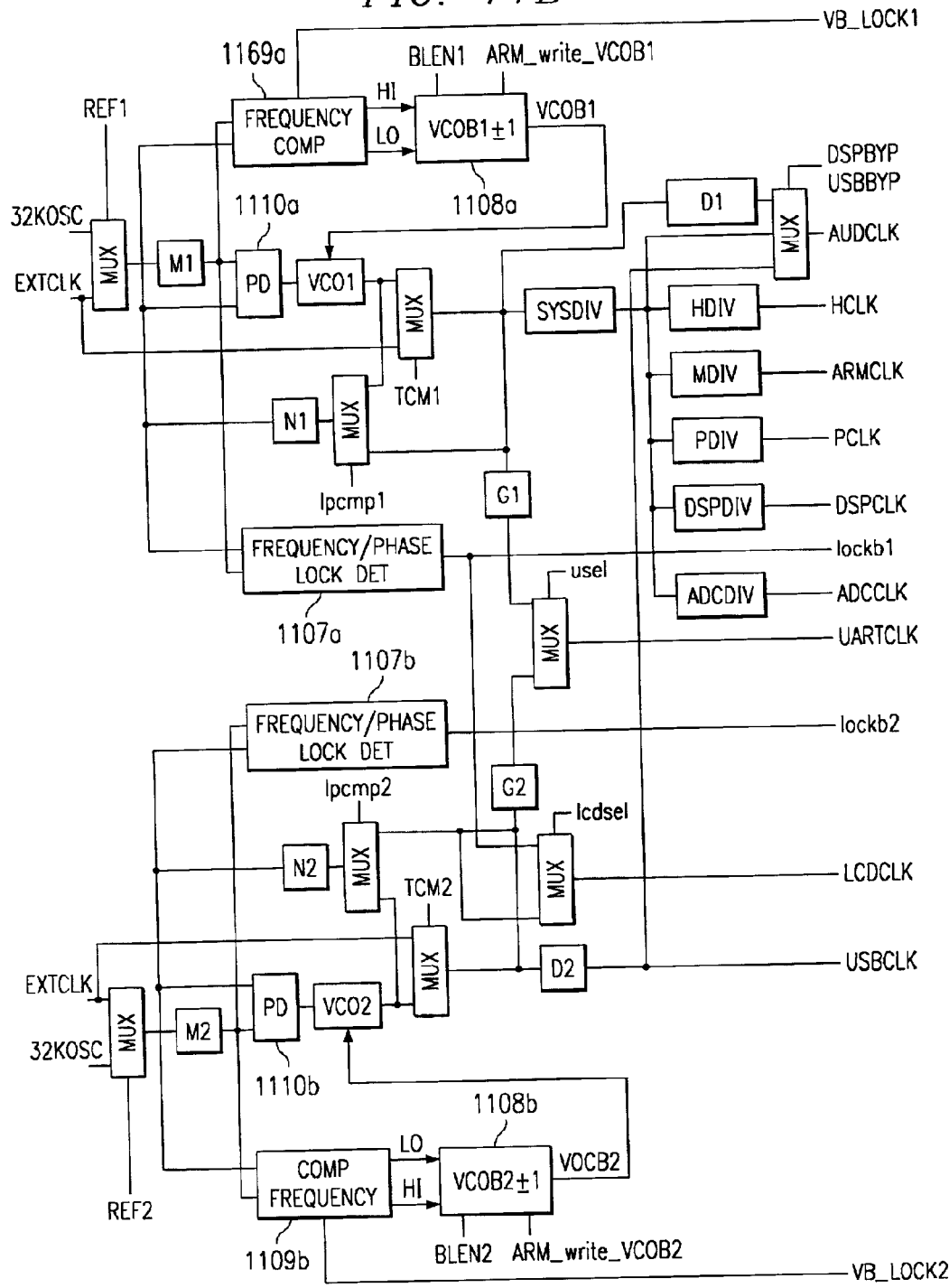
FIG. 11B is a functional block diagram of the PLL/clock control blocks of FIG. 1.

FIG. 11B shows clock control block 112 in further detail. The Tables 54–55 show the supporting frequencies and corresponding configurations of these two PLLs.

Clock control block 112 contains the registers required to set the divisors and other operational parameters for the PLLs. Tables 53–63 list the preferred register set for configuring clock control block 112.

Generally, clock generation is performed as follows: The reference clock source is selected by the REF 1 field in the clock control register1 (CMCTL1) as well as a hardware boot-up mode. The reference clock is divided by the 4-bit M1 value and input to phase-frequency detector 1110a (FIG. 11B). The other input to the phase-frequency detector is the divided version of the master clock. The output of the phase-frequency detector (PD) 1110a controls the output frequency of the VC01.

The output frequency range of the VC01 is 100 MHz to 200 MHz across process and temperature, controlled by the VCOEN1 and VCOB1 fields in the clock control register. These two control fields are used together when configuring and locking PLL1. Clearing the VCOEN1 bit fixes the VCO control voltage to its nominal value and causes VC01 to output its nominal clock frequency (approximately 150 MHz). When the VCOEN1 bit is clear, the phase detector (PD) 1110a output has no effect on the VC01 output frequency. The VCOB1 field is a 6-bit value that controls the bias current to the VC01. The VCOB1 value can be adjusted to control the nominal frequency of the VC01.

Upon reset, VC01 runs at its nominal frequency. VCOEN1 is cleared, and the D1, DSPDIV, PON, MDIV, and HDIV dividers are set to their default values giving an open-loop DSPCLK, MCLK, HCLK, PCLK of 6 MHz-14 MHz.

The master clock (VC01 output divided by SYSDIV) is divided down to generate the DSP clock (DSPCLK), the audio over-sample clock (AUDCLK), and the feedback clock to the phase detector (PD) controlling the VCO. Specifically, the master clock is divided by the DSPDIV value to generate the DSP clock and by the D1 to generate the audio clock, which is used to synchronize the audio input and output blocks. The audio clock is typically in the range of 8 MHz to 24 MHz. Additionally, the reference clock selected can be routed to the audio clock port for observation when the REFCLKBP bit is set. The master clock is further divided by the 12-bit N1 value to generate the feedback clock for PLL1. Similarly, the master clock is divided down to generate microprocessor 101 clock (MCLK) and AHB/APB clocks.

PLL2 generates the USB clock by locking a reference clock to a divided down version of the USB clock. Typically, the reference clock is input from the 32.768 KHz crystal oscillator, but another possibility is to derive the USB clock from the externally supplied clock used for test/debug. The reference clock source is selected by the REF2 field in the clock control register 2 (CMCTL2). The reference clock is divided by the 4-bit M2 value and input to the phase-frequency detector (PD) 1110b. The other input to the phase-frequency detector is the divided version of the master clock. The output of the phase-frequency detector 1110b controls the output frequency of the VC02.

The output frequency range of the VC02 is 70 MHz to 130 MHz across process and temperature, controlled by the VCOEN2 and VCOB2 fields in the Clock Control Register 2. These two control fields are used together when configuring and locking PLL2. Clearing the VCOEN2 bit fixes the VC02 control voltage to its nominal value and causes the VCO to output its nominal clock frequency (approximately 100 MHz). When the VCOEN2 bit is clear, the phase-frequency detector 1110b output has no effect on the VCO output frequency. The VCOE2 field is a 6-bit value that controls the bias current to the VCO. The VCOE2 value can be adjusted to control the nominal frequency of the VCO. After hardware power-on reset, VC02 is in power-down mode for power saving purpose.

PLLs internal VCOs 121a,b require a low pass filter network to be connected from the LPFLT pin to GNDA which is sufficient for all allowable reference input frequencies. PLLs 121a,b also require a filter network from the TPFLT pin to VDDA. It must be stressed that the best analog performance can be achieved by placing the capacitor as close as possible to the FLT pins and that the proper layout precautions be taken to avoid noise coupling.

The TCM 1 and TCM2 bits—in the CMCTL register enables the clock manager test mode. This mode drives the dividers with the EXT clock instead of the VCO outputs. This gives controlled test visibility of the divider chains.

In order to reduce VCO gain tolerances, a VCO bias current calibration circuit 1108a,b (FIG. 11B) is included to compensate for process variations in the bias circuitry. The bias calibration is performed before enabling VCOs 121a,b in order to obtain the correct operation bias current. The bias calibration is automatic, but can also be controlled manually if necessary.

VCO calibration is enabled by writing a one to the corresponding bias lock enable bit (BLEN1/2) register after configuring the PLL registers for a given sample rate and reference clock. The VCOB1 field is reset to 0x1c (near the middle of its range) and the VCOB2 reset to 0x11. The calibration circuitry searches for the optimum VCO bias value. Upon completion, the VCO bias lock (VBLOCK1/2) flag is cleared, signifying that the bias value is "locked".

Alternatively, the VCO bias calibration can be performed under software control if the BLEN1/2 bit is cleared. Microprocessor 101 can write values to the VCOB1/2 fields and monitor the HI/LO flags to determine if the VCO output frequency is higher or lower than desired.

The VCO bias calibration sequence is not reversible in the automatic calibration mode. In another word, once the VCOB1/2 value is locked by the calibration circuitry, it can not be modified unless the calibration circuitry is reset by toggling VBLOCK_RST bit.

PLL lock detection circuitry 1107a,b is utilized to continuously monitor PLLs 121a,b and report the status. Each block 1107a,b circuitry is comprised of a Frequency Lock Detector (FIG. 11D) and Phase Lock Detector (FIG. 11C). Each one or both of these detectors can be enabled to determine the PLL locked/unlocked condition. When a PLL is locked, the corresponding LOCK flag will go low. If a PLL loses lock, the corresponding LOCK flag will be set. Meanwhile a low-to-high transition of the LOCK will cause an interrupt if the lock interrupt enable bit (LKIEN) is set.

The output of the phase detectors 1110a,b indicates the phase difference between the divided incoming reference clock and the divided feedback VCO clock. When the given PLL is locked, the phase difference is minimal. The programmer is able to define the range of the phase difference which is considered as out-of-lock situation by-programming bits PHASE-LOCK-DS in the CMCFG register. To enable the Phase Lock Detector to be part of the LOCK generation, bit PHASE_LOCK_EN is programmed in the CMCFG register.

The outputs of M and N divider are fed into a frequency comparator 1109a,b. The programmer has the ability to define the variation beyond which two frequencies are considered mismatched via bits FREQ_LOCK_DS in the CMCFG register. Meanwhile, hysteresis is built in for indicating PLL in-lock and out-of-lock situations through bits HYST_F INLOCK and HYST_F_OUTLOCK in the CMCFG register. The Frequency Lock detector can be part of the LOCK generation bit FREQ_LOCK_EN in the CMCFG register is programmed appropriately.

SSI Interface 118 performs two primary functions, namely that of an SSI configuration interface that activates on chip startup, and that of a general purpose serial interface for operating either SSI devices or similar 2 and 3 wire serial devices.

The preferred implementation allows connection to an external serial EEPROM containing power-up configuration information (FIG. 12A), as may be required for a given system configuration. After a hardware reset, a state machine attempts to load the configuration data, and if present, the first 40 bytes of configuration data are transferred to a set of on-chip configuration registers. If the EEPROM device is not present, or the header is invalid, the Configuration Registers are left in their previous state. The EEPROM device is accessible to the host processor by reading/writing to control registers.

In the preferred embodiment, the only time when the system 100 accesses the EEPROM is after a hardware reset; the system 100 can only read EEPROM devices—it cannot write them unassisted. Writing to EEPROM can be accomplished through a configuration interface register accessible from the microprocessor 101 processor. The timing of the data and clock signals for the initialization load are generated by a hardware state machine. The minimum timing relationship between the clock and data is shown in FIG. 12B. The state of the data line can change only when the clock line (CLOCK) is low. A state change of the data line during the time that the clock line is high is used to indicate start and stop conditions.

Figure 12C:
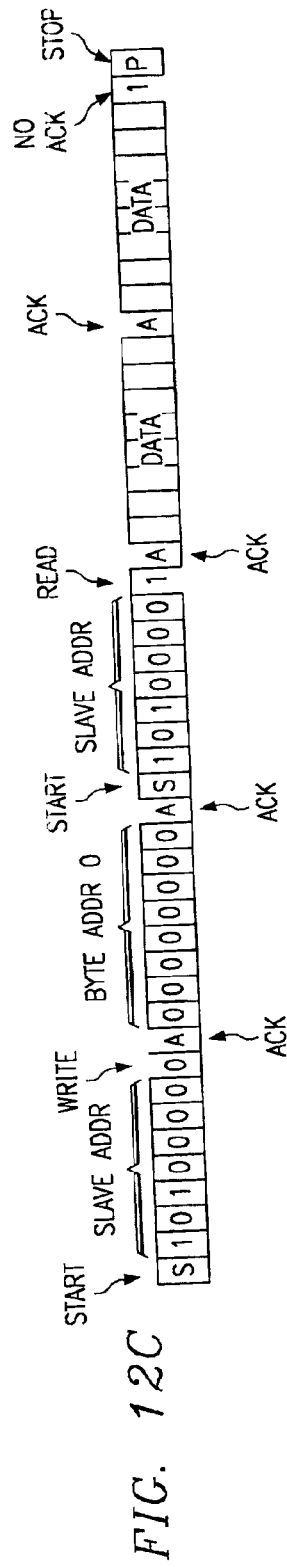
FIG. 12C is a diagram illustrating the transfer of data and addresses across the interconnections of FIG. 12A.

The EEPROM device read access sequence is shown in FIG. 12C. The timing generally follows that of a random read sequence. System 100 first performs a dummy write operation, generating a start condition followed by the slave device address and an byte address of zero. The slave address is made up of a device identifier (0×A) and a bank select bits (A2–A0). The bank select bits select among eight 256 byte blocks which may be within a single device, i.e. a 1 KB memory may be comprised of a single 1 KB EEPROM with four 256 byte banks. System 100 always begins access at byte address zero and continues accessing one byte at a time. The byte address automatically increments by one until a stop condition is detected.

The SSI register interface is illustrated in Tables 64–67.

The SSI register interface consists of a data register and a configuration interface register(CFGI). The data register is used to read or write the interface signal states. The CFGI contains the control bits for host software-based control if signal direction, output driver type, and status bits for the EEPROM controller.

Software access to the EEPROM is provided by the Data Interface Register and Configuration Interface Register. By controlling the data and direction bits, the external signal pins can be driven with the desired protocol and timing. The timing of the clock and data signals is completely determined by host-based software and should meet the timing requirements as shown previously.

Software access to other serial devices can be accomplished in a similar manner. If the EECLK and EEDATA signal are shared between an SSI device and a non-SSI device, extra care must be taken to ensure the protocol used does not disturb the unintended device. The SSI interface specification provides reserved addresses to allow sharing with non-12C devices.

The Memory Data Format for the EEPROM configuration is shown in Table 688, where the Byte Offset is the address within the EEPROM device.

In the general purpose control interface mode, the SSI interface can be used for general purpose I/O. Each pin is controllable as an input or an output, and under software control, can implement various of serial interfaces. For example, interface 118 could be configured to communicate with external power control devices, such as those used to control Flash EEROM programming voltage, and the PCM-CIA interface operating voltage.

Figure 13A:
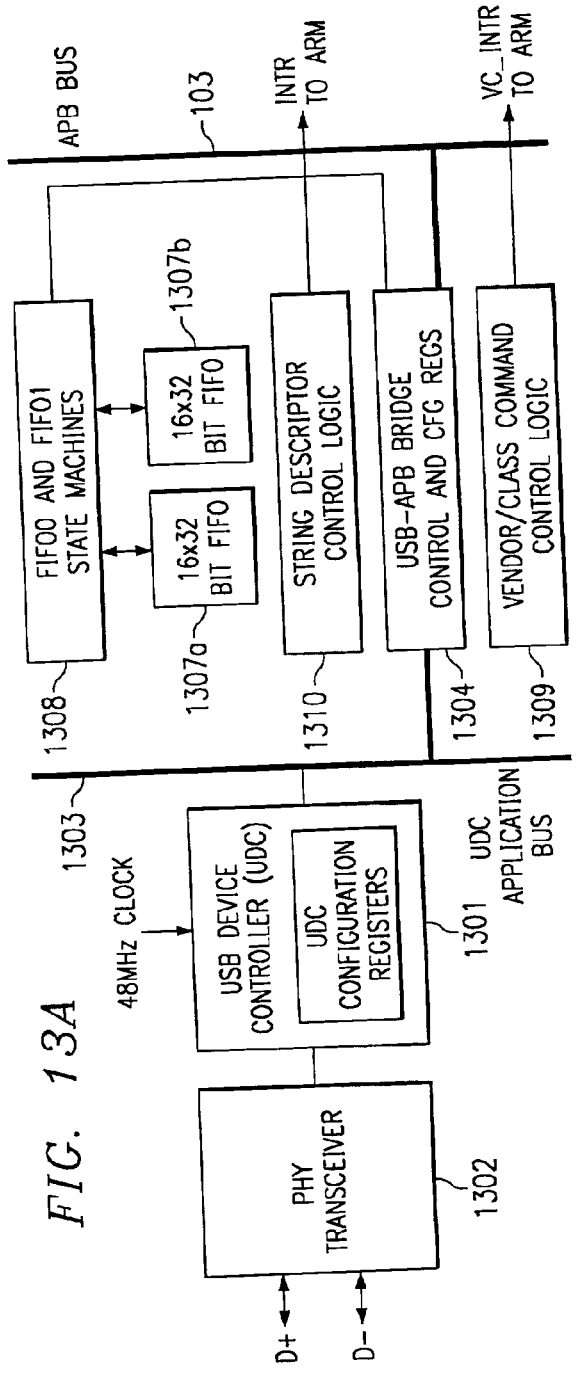
FIG. 13A is a functional block diagram of the USB port of FIG. 1.
Figure 13B:
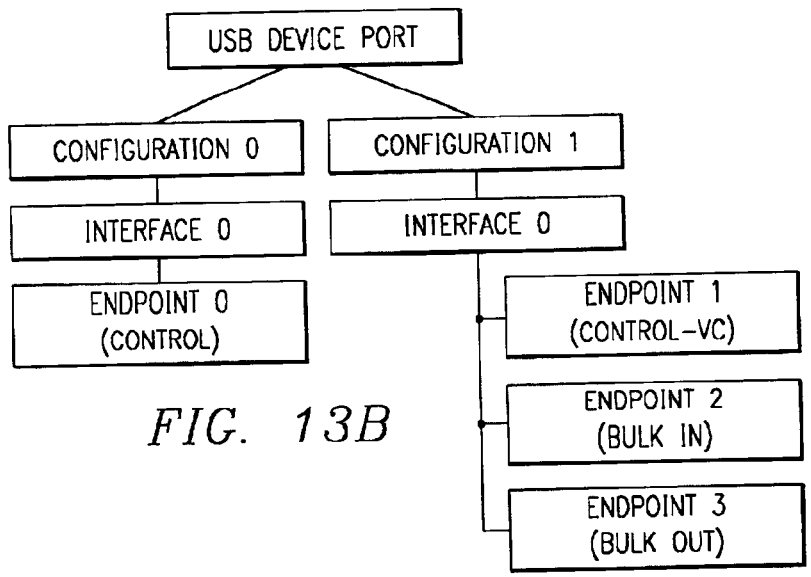
FIG. 13B is a diagram illustrating the alternate configurations of the USB port of FIG. 13A.

USB port 114 in the illustrated embodiment complies USB Specification Revision 1.1, as shown in further detail in FIGS. 13A and 13B. Its primary purpose is to down-load and/or up-load music files from a host PC with Internet access. This USB device port generally is self-powered and supports 64-byte/packet bulk-in and bulk-out modes, as well as vendor/class custom commands. Since the device uses Bulk transfers, it is a Full Speed Device (12 MBps).

A USB Device Controller (UDC) 1301 interfaces with an external USB compliant device through transceiver 1302 and with main bus 103 through UDC bus application 1303 and USB-AHB bridge 1304. Bridge 1304 is configured using dedicated control and configuration registers and spans buses 103 and 1303. A pair of FIFOs 1307a,b and associated state machine 1308 support bulk transfers, where one FIFO can hold a packet of data while the other is exchanging data with the microprocessor.

USB port 114 can operate in either Configuration 0, where the control endpoint is for standard commands or Configuration 1, where the control endpoint is for Vendor/Class commands. String Descriptor Control Logic 1310 decodes string commands in the standard configuration. Vendor/Class commands are not decoded, but instead are stored and an interrupt sent to microprocessor 101 by Vendor/Class Control Logic. Subsequently, microprocessor 101, under software control, decodes Vendor/Class commands.

For Bulk IN and Bulk OUT transfers, USB port 114 has two 16×32bit FIFOs 1307a,b (FIFOO and FIF01). Each FIFO is bidirectional, although, as mentioned above, the pair of FIFOs only operates in one direction at a time. Each FIFO 1307a,b holds a wMaxPacketSize of 64 bytes, although a transfer can be less than 64 bytes. A bulk transfer is complete when an endpoint (host or device) performs one of the following: 1) Has transferred exactly the amount of data expected, and 2) Transfers a packet with a payload size less than wMaxPacketSize or transfers a zero-length packet.

To keep track of how many valid bytes are in each FIFO 1307a,b, a TOTLCNT register is provided for each FIFO. For Bulk IN transfers, microprocessor 101 writes to these registers. For Bulk OUT transfers the TOTLCNT registers are written to by the USB-APB bridge 1304. In the case where microprocessor 101 fills both FIFOs for a Bulk IN transfer, FIFOSTRT bit indicates to bridge 1304 which FIFO to read first.

On the UDC Application Bus 1303, FIFOs 1307a,b are drained and filled one byte at a time in little endian byte order. Therefore, microprocessor 101 must write/read the bytes in the 32-bit words in the FIFO in the same manner. As mentioned above, the TOTLCNT register indicates how many bytes in the FIFO are valid.

FIFOs 1307a,b are time-sharing in the data transfer mode. During a Bulk OUT transfer, when one FIFO is holding one packet of data and waiting for microprocessor 101 to drain that FIFO or microprocessor 101 is currently draining that FIFO, the other FIFO can continue to receive data. When USB-APB 1304 bridge has filled a FIFO during a Bulk OUT, it will generate an interrupt to microprocessor 101, which read the FIFOORDY and FIFO1RDY bits to determine which FIFO is full. The bridge will always fill FIFOO first. After microprocessor 101 has begun draining the FIFOs during the Bulk OUT transfer, it must keep track of which FIFO it is to be read next. Preferably, it should start with FIFOO and then ping-pong back and forth until all the Bulk OUTS have completed.

During a Bulk IN transfer, when one FIFO is holding one packet of data and waiting to transmit or is transmitting, microprocessor 101 can fill up the other FIFO with another packet. Whenever microprocessor 101 fills two FIFOs at once, it must write the FIFOSTRT bit to indicate to USB-ABP bridge 1304 which FIFO to start with. The bridge will then ping-pong the FIFOSTRT bit as it reads one FIFO and then the other. When the bridge has drained one FIFO it will interrupt microprocessor 101. Microprocessor 101 can then determine which FIFO to fill by reading the FIFOORDY and FIF01 RDY bits. If the latency is such that microprocessor 101 will again fill both FIFOs, it must again set the FIFOS-TRT bit. After filling a FIFO, microprocessor 101 writes the TOTLCNT register, as an indication to bridge 1304 that the data in the FIFO is ready to be sent to the UDC.

The state of each FIFO is also available in the FIFO_0_STATE and FIFO_1 STATE bits. These are read only registers available for debug and/or to aid microprocessor 101 in determining the state of the FIFOs independent of a Bulk OUT/IN transfer or between interrupt.

USB device port 114 supports all standard USB commands to endpoint zero (the default endpoint, always present) except the "Set Descriptor and "SynchFrame" commands. The supported standard commands are provided in Table 70 for convenience. All the standard commands are decoded by UDC device 1301 without intervention by microprocessor 101. Even though the UDC will decode all these commands, the SETUP packets are still written to the VC_SETHI/LO registers whenever a SETUP packet is transmitted. For debug, microprocessor 101 can poll this register to see what SETUP packets are crossing USB.

USB-APB bridge 1304 supports 6 String Descriptors for the "Get Descriptor (String)" command. Since the length of the string varies according to the application, it is impossible to put the entire contents of the string in the USB block. Thus, single 4-byte STRBUFx Registers are used to buffer the strings. When the USB host issues Get String Descriptor commands, UDC 1301 attempts to read the appropriate STRBUFx register. If the STRBUFx register does not hold valid data, i.e., the STROKx register is 0, the bridge will not acknowledge (NAK) the UDC and interrupt microprocessor 101 with the proper STRINTRx interrupt. When the STRBUFx data is sent to the UDC, bridge 1304 will reset the STROKx bit. If microprocessor 101 "knows" how big the string is, it can poll the STROKx bit and then fill the STRBUFx register and set the STROKx bit before another STRINTRx interrupt. Otherwise, the bridge will NAK the Get String Descriptor requests to UDC 1301 while it asserts the STRINTRx interrupt to microprocessor 101. All SETUP packets end up in the VC_SETHI/LO registers so if microprocessor 101 needs access to Language ID in the WINDEX field this will be in these registers.

All the port configuration information is stored in the Config Registers which requires proper initialization before USB port is enabled.

USB-APB bridge 1304 supports Vendor/Class commands by providing endpoint 1. The UDC does not interpret or decode any Vendor/Class commands. It requires intervention software for this function. USB-APB bridge 1304 stores the Vendor/Class command and generates a Vendor/Class command (VC_INTR) interrupt to microprocessor 100. If the Vendor/Class command is followed by Control IN transactions, microprocessor 101 must supply the proper response in the VC_INHI/LO registers. If the Vendor/Class command is followed by Control OUT transactions, the data are read by microprocessor 101 from the VC_OUTHI/LO registers.

The VC_SETHI/LO registers are provided to hold the 8-byte SETUP packet from the USB host. The SETUP packet is written into the VC_SETHI/LO registers in Big Endian byte order.

The supported configurations of USB port 114 is shown in FIG. 13B and the corresponding register map in Tables 71–113.

In order to decrease power consumption, UDC 1301 is able to detect activity on the USB cable. If there is no activity on the USB cable for 3 ms, the UDC will enter SUSPEND mode and USB-APB bridge 1304 will assert the SUSINTR interrupt. Upon detecting the SUSINTR interrupt, microprocessor 101 can shut down the PLL2 which generates the 48 MHz USB clock.

There are two ways to wake up UDC 1301 when the port is in suspend mode. microprocessor 101 powers up the PLL2. After PLL2 is locked and a stable 48 MHz is generated, microprocessor 101 sets the UDCRESUME bit to enable the remote wake-up feature. Alternatively, The UDC detects a resume event on the USB cable and the USB-APB bridge asserts the RESINTR interrupt. Upon detecting the RESINTR interrupt, microprocessor 101 will enable the PLL2 to generate the 48 MHz USB clock.

USB-APB bridge 1304 is able to generate two classes of interrupts to microprocessor 101. The first is a general interrupt (INTR), the second is the Vendor/Class command interrupt (VC_INTR). The INTR interrupt is asserted for events covered in the USBINTRCN register The VC_INTR interrupt is generated for events covered in the VC_INTRCN register. Each individual interrupt bit remains set until cleared by microprocessor 101. Each individual interrupt has a corresponding mask bit and each class of interrupt has a global enable bit, USBINTREN and VC_INTREN, respectively. The mask function is an AND gate, so an interrupt is masked when the corresponding mask bit is cleared (set to 0). Each interrupt mask and the global interrupt enables preferably only masks the assertion of INTR and VC_INTR. Each interrupt bit will therefore still be set if an interrupt would have otherwise been generated. This allows microprocessor 101 to track interrupts that were generated and masked without having INTR or VC_INTR asserted.

The BLKINTR Bulk Transfer Interrupt interrupt is generated during Bulk IN/OUT transfers. Generally, BLKINTR indicates that a FIFO 1307a,b has been filled by UDC 1301 for a Bulk OUT or that a FIFO has been drained by UDC 1301 for a Bulk IN transfer. To aid microprocessor 101 in determining the state of each FIFO, the internal state bits are provided in the FIFO-0-STATE and FIFO_1_STATE registers. To aid in error recovery, each FIFO and its associated state machine can be reset by setting the proper FIFO0RST/FIFO1RST bit. This bit is not self-resetting and must be set then cleared by microprocessor 101.

The BLKINTR interrupt is first asserted during a Bulk OUT transfer as soon as the UDC has filled FIFO0. FIFO0 will always be filled first at the beginning of a Bulk OUT transfer. After FIFO0 is filled and the BLKINTR is asserted, the UDC may fill FIF01. Once microprocessor 101 detects BLKINTR it reads the USBBLKDIR bit to determine direction of the Bulk transfer, and then the FIFOORDY/FIFO1RDY bits to determine which FIFO to drain. Since a packet can be less than 64 bytes, microprocessor 101 also reads the TOTLCWT register to see how much valid data is in the FIFO. As noted, FIFO0 will always fill first so if both FIFO0ORDY and FIFO1RDY are asserted then the interrupt latency is such that the UDC filled both FIFOs before microprocessor 101 could respond, and therefore microprocessor 101 should drain FIFO0.

Due to the relatively slow nature of the UDC interface (12 Mbs), the time to fill a FIFO 1307a,b will be approximately 48 microseconds. The time between assertion of the BLKINTR and the UDC attempting to fill another FIFO will not be less than 0.4 microseconds. Depending on the latency of microprocessor 101 and the APB bus cycle time, it is reasonable for microprocessor 101 to drain FIFOO before FIF01 is filled. In this case, microprocessor 101 will only be draining FIFOO. USB-APB bridge 1304 always attempts to fill FIFOO if it is empty, FIF01 will only be filled if FIFOO is "full" and another packet is coming from the UDC. Note that "full" simply means that the write into the FIFO has finished and the TOTLCNT register is valid.

The BLKINTR interrupt is asserted at the beginning of a Bulk IN transfer when UDC 1301 attempts to read a FIFO 1307a,b and both FIFOs are empty. Microprocessor 101 will then read the USBBLKDIR bit and the FIF00RDY/FIF01RDY bits to determine which FIFO to fill. It is assumed that microprocessor 101 will fill both FIFOs at the start of a Bulk IN transfer. Microprocessor 101 then sets the FIFOSTRT bit and writes to the appropriate TOTLCNT register. The writing of the TOTLCNT register is an indication to USB-APB bridge 1304 that the FIFO is "full" and the data can be sent to UDC 1301. Each time the bridge finishes draining a FIFO to the UDC, a BLKINTR interrupt is asserted and the appropriate FIFOORDY/FIFOIRDY bit is set. While the bridge is ping-ponging between the FIFOs, it toggles the FIFOSTRT bit. If both FIFOs are allowed to drain and more Bulk data needs to be sent, microprocessor 101 will set the FIFOSTRT bit again.

Whenever UDC 1301 attempts to read a STRBUFx register and the corresponding STROKx bit is not set, USB-APB bridge 1304 asserts the corresponding STRIN-TRx interrupt. Since the bridge is not decoding the SETUP packets, it is only the attempt to read STRBUFx by the UDC which causes the interrupt. Notwithstanding, the bridge always stores the SETUP packets in the VC_SETHI/LO registers, microprocessor 101 can get the Language ID from the WLNDEX field in VC_SETLO[31:16].

Once STRBUFx is read by UDC 1301, the appropriate STROKx bit is cleared by bridge 1304. If microprocessor 101 does not fill the STRBUFx after the STROKx bit is cleared, and simply waits for the next STRINTR interrupt, the UDC request will be NAK'd on the USB cable. If microprocessor 101 "knows" how long the string descriptor is, it can fill STRBUFx after STROKx bit clears and thus keeps "ahead" of the reading of STRBUFx by the UDC.

The SUSINTR interrupt is asserted when the UDC is entering suspend mode, either under direction of the host or due to 3 ms of inactivity on the USB cable. After detecting this interrupt, microprocessor 101 can shut down the PLL generating the 48 MHz clock. While the UDC is in suspend mode, the UDCSUSPEND bit is set. While the UDCSUSPEND bit is set, the SUSINTR bit cannot be cleared. Microprocessor 101 therefore masks the SUSINTR bit by clearing SUSINTMSK and can then either wait for a RESINTR or initiate a remote wakeup.

To initiate a remote wakeup, microprocessor 101 sets the UDCRESUME bit. Before it sets this bit, microprocessor 101 enables the appropriate PLL and assures that the 48 MHz clock is stable such that the Remote Wakeup Operation to the host is timed correctly. As a side effect of the remote wakeup operation, the RESINTR interrupt is also set after microprocessor 101 sets the UDCRESUME bit. Since microprocessor 101 initiates the remote wakeup operation and the 48 MHz clock is already running, microprocessor 101 simply clears the RESINTR bit after a remote wakeup operation.

The RESINTR interrupt is asserted while UDC 1301 is in Suspend mode and it detected a resume event over the USB cable. Microprocessor 101 must then restart the PLL generating the 48 MHz USB clock. Since the RESINTR is set sometime after a Suspend, software clears both the RESINTR and the SUSINTR and sets SUSINTMSK Vendor/Class command interrupts are asserted whenever the UDC executes a Vendor/Class command SETUP packet and also for the Control IN/OUT following the Vendor/Class command as long as the VCCMDEN bit is set.

Specifically, the VC_SETINTR interrupt is asserted whenever UDC 1301 writes a SETUP packet to VC_SETHI/LO and it expects the application to decode the command. In the preferred embodiment, this will only take place for Vendor/Class commands, but as mentioned earlier, all SETUP packets end up in the VC_SETHI/LO registers. After microprocessor 101 reads the VC_SETHI/LO registers it will be expected to respond to the Control IN/OUT following the Vendor/Class command SETUP packet.

The VC_ININTR interrupt is asserted when the UDC attempts to read the VC_INHI/LO registers and microprocessor 101 has not already written to them. If microprocessor 101, as the result of a Vendor/Class command SETUP packet decode, has already written the VC INHI/LO registers and set the VC_INCNT register, then this interrupt is not generated when the UDC attempts the read the VC_INHI/LO registers.

The VC OUTINTR interrupt is asserted after the UDC writes the VC_OUTHI/LO registers and the VC_OUTCNT register is valid. Microprocessor 101 then reads the VCOUTCNT and VC_OUTHI/LO registers. After microprocessor 101 has read these registers, it clears the VC_OUTCNT register by writing back the read value. This is the indication to bridge 1304 that microprocessor 101 has read the VC_OUTHI/LO registers and another packet can be received over the USB bus. This also means that after the bridge receives a Vendor/Class command SETUP packet, it will only accept Control OUT packets as long as VC_OUTCNT is set to OOOOb. Control OUT's received while VC_OUTCNT is not equal to OOOOb will be NAK'd.

After a power-on reset, microprocessor 101 initializes the configuration registers in the USB-APB bridge 1304. Before writing the configuration registers, microprocessor 101 sets the USBEN bit to 1 to bring the UDC out of reset.

Microprocessor 101 then programs the Device, Configuration, Interface, and Endpoint descriptors as required. The UDS configuration registers are listed in Table 114. After the descriptors are programmed, microprocessor 101 can write the UDC configuration information into FIFO0. After all writing the descriptor information, microprocessor 101 sets the ARMCFGRDY bit to a 1. When the bridge has finished initializing the UDC the UDCCFGRDY bit will be set to 1.

While UDC 1301 and USB-APB 1304 bridge are in operational mode, the ARMCFGRDY/UDCCFGRDY bit pair are set to a value other than 11. Clearing the USBEN bit will reset the UDC and require reprogramming of the UDC configuration registers through FIFO0. Setting the self-clearing BRIDGERST bit will reset all the registers in USB-APB bridge 1304 and require reprogramming of all the bridge configuration registers.

Since the UDC configuration registers are programmed only once after each UDC reset, and these values are not needed by USB-APB bridge 1304, FIFO0 is used to hold the values before writing them to UDC 1301. The values programmed into the UDC are written to FIFO0 in big endian byte order. This contrasts with the use of the FIFOs as Bulk data transfer agents where the data is written into each 32-bit Dword in little endian byte order. The values programmed into FIFO0 are listed in Table 114 "UDC Configuration. Register Values (FIFO0)". These values are concatenated in the order listed, divided into 32 bit Dwords, and written to FIFO0. The number of bytes written is 46, so that results in 12 FIFO0 writes with bits [15:01] of the last Dword set to 0.

Microprocessor 101 includes embedded IEEE standard boundary scan circuitry (JTAG). With the supporting driver software, JTAG allows user to view the microprocessor internal state, set break points from the main application, apply special vectors, among other things.

During the development of a combined hardware-software system, by the time the hardware and software have been fully integrated, most operational bugs will have been diagnosed and treated. Notwithstanding, some post-integration operational problems will always occur during full system usage. For example, in the case of a portable music appliance, bugs may occur when certain tracks are played one after another or when certain user control inputs are made during a change in data streams. Random problem symptoms and the symptoms of secondary consequences of a preceding cause are especially difficult to isolate.

Debugging system 100 and its associated software is a non-trivial problem, given the fact that two processors, multiple buses and multiple peripherals may be simultaneously engaged at runtime. For example, it may be relatively easy to diagnose a particular state when an identifiable code module being run on DSP 102 stalls or when a certain data buffer or software state variable is corrupted. However, for the most part, operational problems are typically either the result of complex interactions between multiple processes, such as the operation of processors 101 and 102, interrupt handling and main code execution, or the result of very subtle software bugs. In any event, the source of these problem is very difficult, if not impossible, to detect using simulations or code auditing. This primarily because any debugging is done post facto such that only the apparent symptoms or effects of the primary cause can be observed.

Advantageously, DSP snoop debugging block 141 allows events to be trapped before or at the occurrence of the secondary cause. Subsequently, a determination can be made as to the source of the corruption or bug triggering those events. A watch for reoccurrence those events can then be setup such that the preceding cause can be identified.

Often multiple corrupted buffers or variables are implicated. In this case, debugging block 141 can be used to set up independent traps for each data area such that the first corruption or error to occur can be identified and the fundamental cause diagnosed. In the preferred embodiment, up to 4 independent events can be monitored and the first to occur trapped.

Additionally, in the preferred embodiment, the detection of a trigger event can cause interrupts to DSP 102 (self-interrupt) or to a DSP-external host, such as core 101, (external debug). Self-interrupt allows the DSP state to be frozen quickly while external debug allows debugging by the external host without tampering with the DSP state machine.

Figure 14A:
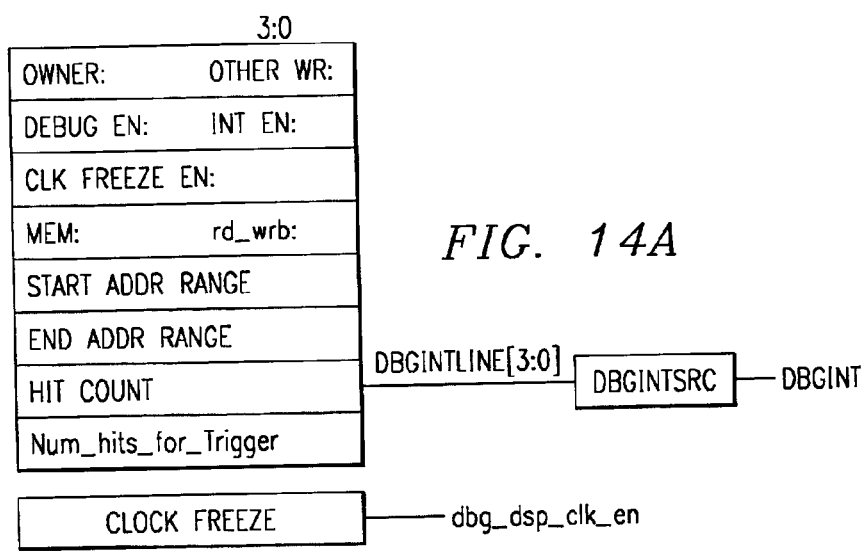
FIG. 14A is a diagram of a selected one of the DSP debugging sub-blocks.

DSP debug block 141 in the illustrated embodiment comprises sub-blocks, each of which can monitor the X/Y/P DSP memory address buses, assert an interrupt to microprocessor 101 or DSP 102, or freeze the DSP clock, if freeze is enabled. One of these sub-blocks is shown in FIG. 14A. The register set is provided in Tables 117–122.

Each snoop debug sub-block has a 1 bit read only "owner" field. When this bit is "0" the owner of this block is Microprocessor 101 and when this bit is "1" the owner is DSP 102. The owner can write to the "Other Wr" field which, if set, allows the other processor to write to the remaining fields of the debug block. Debugging DSP peripherals is supported through DSP Debug block 141, since all these peripherals are mapped into DSP peripheral space.

Figure 14B:
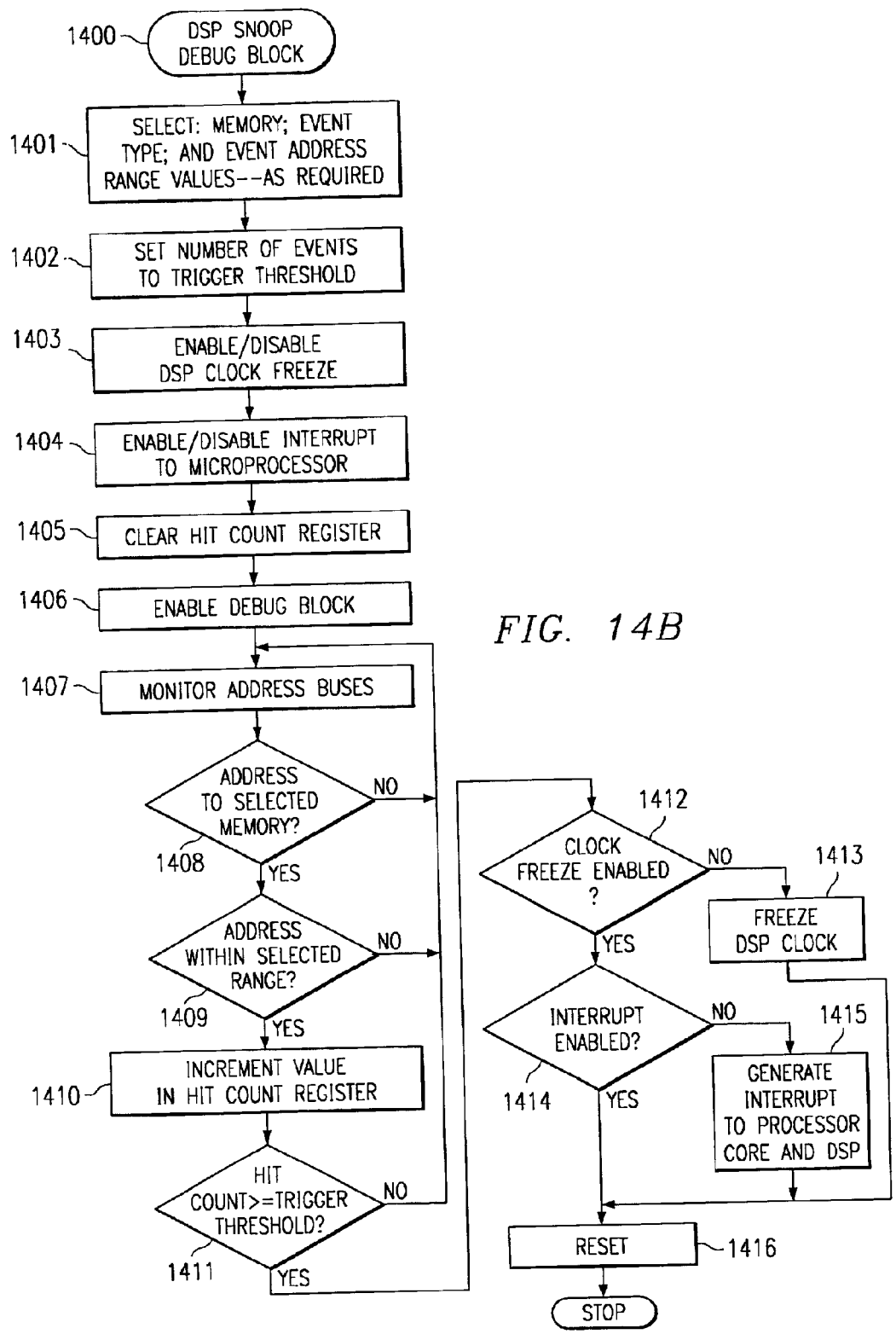
FIG. 14B is a flow chart illustrating the preferred operation of the debugging sub-block of FIG. 14A.

The operation of a given one of the four Snoop Debug sub-blocks (0–3) implemented in DSP debug block 141 of the preferred embodiment is illustrated diagrammatically in FIG. 14B. As will be described further, these four sub-blocks can either be used independently or in combination such that a number of different snooping/debugging operations can be setup.

The parameters for the triggering event are set at Step 1401 in the register DEBUGCFG(0–3) described in Table 115. In the illustrated embodiment, the given sub-debug block is set up in the 2-bit "Mem" field to detect accesses to one of the x and y data and the p program memories by monitoring the corresponding address bus. Also selected in this register is the type of triggering access (e.g. reads or writes). The range of addresses within which the specified access type must fall is set as a function of the corresponding starting and ending addresses in the registers DEBUG_STRT_RNG(0–3) and DEBUG_END_RNG(0–3) (Tables 116–117).

At Step 1402, the threshold is set for the number of triggering events detected using register DEBUG_HIT2TRG(0–3) described in Table 119. As discussed further below, once this threshold is met or exceeded, the DSP clock is frozen and/or an interrupt is generated. DSP clock freeze and Microprocessor/DSP interrupt generation are selectively enabled at Steps 1403 and 1404 in the register DEBUGCFG (0–3).

The hit count register DEBUG_HIT_CNT (Table 118) which registers the number of triggering events detected, is cleared at Step 1405. The selected debug sub-block (0–3) is enabled at Step 1406 in the DEBUGCFG(0–3) "Debug En" field before the actions of the selected debug block become effective. This enable bit is also used to save power when the block is not in use.

When enabled, the selected debug block monitors the address bus for the identified memory for the specified access type and address range. This is illustrated graphically by Steps 1407–1409. Each time a triggering event is detected, the count in the hit count register increments (Step 1410). This process repeats itself until the specified threshold is reached at Step 1411.

When the DSP clock freeze has been enabled, the DSP clock is frozen on the next clock cycle after reaching the threshold such that the state of the system, and in particular DSP 102 and its peripherals, can be diagnosed (Steps 1412–1413). If the interrupt is enabled, then an interrupt is generated to both microprocessor core 101 and DSP 102 (Steps 1414–1415). An interrupt handler routine can then be run for system diagnosis.

Debug block 141 is reset to the state indicated in Tables 115–120 at Step 1416.

It should be noted that while the above discussion described the detection of triggering events in terms of address bus activity, the associated X/Y/P DSP data buses can similarly be monitored. In this case, instead of triggering on a specified address, the triggering takes place when a specified operand or instruction appears on the data bus. This is particularly useful for detecting corrupted data and instructions and identifying the corresponding memory region and the device or devices causing the corruption.

Among the advantages of this procedure is the ability to set breakpoints in the operation of the embedded DSP by freezing the clock. Moreover, the DSP can be observed non-intrusively after the specified events using the interrupts. Additionally, since microprocessor core 101 is the system master and can read and write to all of the DSP memory space, it can generate trigger events to perform substantially all of the DSP and DSP peripheral debug functions. Also, as indicated above, the four debug sub-blocks (0–3) can be used in combination to extend the set of debug functions which can be performed. For example, two or more blocks can be setup to trigger sequentially to step through the code being run by the DSP.

Some of the particular scenarios in which the inventive concepts are:

1. Setting Breakpoints: using the snoop function to trap the fetch of one or more addresses to instructions in PMEM to set a breakpoint or range of breakpoints;
2. Data Input: using the snoop function to detect the arrival of a certain amount of data, especially data coming from those peripherals having DMA;
3. Data Output: using the snoop function to detect the output of a certain amount of data, especially data being sent to the peripherals;
4. Data Corruption: using the snoop function to identify corrupted main or interrupt code and/or identify the peripheral or processor altering a location or region in memory; and
5. Profiling: using the snoop function to observe when and how often certain resources, especially shared and/or arbitrated resources, are accessed. This is particularly useful in multiprocessing schemes and allows the study of the interaction of various subsystems during real-time and actual usage.

Debugging DSP peripherals is supported through DSP Debug block 141, since all these peripherals are mapped into DSP peripheral space.

Inter-Processor Communication block 128 allows Microprocessor 101 and DSP 102 to exchange messages and synchronize and schedule tasks. This is shown in further detail in FIG. 15. Communications are mainly defined at the system (software) implementation level as a two-way interrupt driven scheme. The hardware of this block provides a number of interrupt sources from DSP to Microprocessor 101. (Microprocessor 101 interrupts DSP 102 through Interrupt Controller, as previously described.) The content of the interrupts will be determined by system applications. The IPC configuration registers are described in Tables 121–124.

Digital Audio Input/Output 129 is shown in further detail in FIG. 16. This block provides audio data input/output through two primary sub-blocks I2SOUT 1601 and I2SIN 1602.

ISOUT Block 1601 is shown in additional detail in FIG. 16B. I2SOUT 1601 drives the audio output data pin (Aud_OUT) and also provides audio data and controls to PWM 130 and S/DFIF transmitter 1603. In the preferred embodiment, four output channels are supported through four FIFOs 1604$a,b$ each 16 entries deep and 24 bit wide. Channel configuration is implemented in registers readable and writable by microprocessor 101 and/or DSP 102. ISOUT block 1601 can generate interrupts to the controlling microprocessor DSP when its FIFO is empty (empt_int) or half-empty (hempt_int) such that the FIFOs can be refilled.

The I2SOUT registers are listed in Tables 125–129.

The port control register DAOCTL performs two functions, namely, specifying parameters to generate the SCLK and LRCLK clocks to PWM 130, SPDIF Transmitter 1603, I2SOUT block 1601 and I2SIN block 1602, and specifying I2SOUT specific control parameters. Since all active audio channels run synchronously, Channel 0 (DAODATO) is assumed to be the master FIFO for generating interrupts and FIFOCNT (i.e., a dipstick is associated with DAODATO). All the bits are readable & writable by DSP 102 and microprocessor 101 unless otherwise specified in their description field in the tables.

Control bits CNTL_SEL and RSI_I2SOUT switch between DSP 102 and microprocessor 101 control of I2SOUT. In the preferred embodiment, the current controller 101/102 of I2SOUT first ramps down the output, shuts down any active output(s), and directs microprocessor 101 to do the switch (through the inter-processor message protocol) discussed above. Microprocessor 101 then writes an appropriate value to CNTL_SEL register and requests the new controller 101/102 to issue a reset on I2SOUT. The new controller then writes a 1 to RST_I2SOUT bit which resets all registers in I2SOUT except CNTL_SEL and RST_I2SOUT. Then the new controller writes a 0 to RST_I2SOUT, to de-assert reset, and configures the other control bits and enables the output. In normal operation, DSP 102 will mostly be using this block, thus system reset condition is set to give DSP 102 control over I2SOUT 1601.

SLVCLKGT is used to gate the SCLK and LRCLK in the SLAVE mode to ensures no power consumption results when the I2S block in not being used, but configured for S/LRCLK to be input from outside. BURSTMOD allows PWM to be able to play data while I2SIN is in Burst mode. Details of this operation will be explained with respect to I2SIN block 1602.

CNTL_SEL bit is always readable by microprocessor 101, even when microprocessor 101 is not in control of I2SOUT. When microprocessor 101 is not in control of I2SOUT, meaning CNTL_SEL is set to 0, a microprocessor read from DAOCTL will result in the return of a correct value of only the CNTL_SEL bit, other bits will be 0.

The DAOCFG register 1605 controls the relations of I2S-OUT pin with LRCLK and SCLK. It provides a flexible mechanism for specifying the data output formats. The PREDLY field specifies the number of SCLK cycle to wait after an LRCLK edge before outputting sample data. The BITRES field specifies the number of bits per sample (up to 24) to be output. The INTERDLY field specifies the number of SCLK cycles to wait before outputting the next data sample (meaningful only for 4 channel output configuration). Unless otherwise specified, all bits are read/writable by the controller 101/102 in control of this block.

The CLKDIV register is used to specify the divide value which is used to divide the AUD_CLK to generate MCLK, SCLK, and PWMCLK. When EXTMCLK is programmed to be 0, MCLK is generated from clock manager providing AUD_CLK, and is routed to MCLK pin as MCLKOUT, if the bit SLAVE is set to 0. MCLKDIV specifies the divide value with which the AUD_CLK frequency can be divided to produce MCLK. When SLAVE is set to 0, MCLK (generated from AUD_CLK or MCLKIN as specified by EXTMCLK) is divided by SCLKDIV to generate SCLK, and routed to SCLK pin as SCLKOUT. PWMCLKDIV is the divide value with which AUD_CLK is divided and sent to PWM engine 130 as over sampled clock. (As this register resides in I2SOUT, CNTL_SEL is set first to appropriate master before that master can write to this register.)

As mentioned above, I2SOUT block 1601 can generate three interrupts, EMPT_INT, HEMPT_INT and OUT_FSINT, EMPT/HEMPT_TNT: Two events can trigger to these interrupt: FIFO Half Empty (HEMPT) and FIFO Empty (EMPT), when enabled by HEMPT_INT_EN and EMPT_INT_EN bits of register DAOCFG. In particular, these events are generated based on condition of DAODATO; HEMPT is generated when FIFOCNT decreases from 8 to 7 and EMPT is generated when the FIFOCNT decreases from 1 to 0. These interrupts are sent to the processor 101/102 controlling the IS2OUT block.

The OUT_FSINT interrupt is enabled by FSINT_EN bit and takes effect after I2SOUT_EN or PWN_EN is set. If the SLAVE bit is 0, meaning LRCLK and SCLK are being produced from audio block 129 and sent out, then the interrupt occurs on the positive edge of LRCLK_OUT if LRCLK_FLP is 0, and with negative edge of LRCLK_

OUT if LRCLK_FLP is 1. If SLAVE bit is 1, meaning LRCLK and SCLK are being sent from an external source to audio block 129, then the interrupt occurs on the positive edge of LRCLK_IN if LRCLK_FLP is 0, and with negative edge of LRCLK_IN if LRCLK_FLP is 1.

The FSINT bit transitions to 1 on the interrupt occurs and is cleared by the controller 101/102 of I2S_out, by writing a 0 to this bit. Thereafter, the interrupt line is lowered after one controller clock cycle. Thus if another FS interrupt edge occurs during the clearing clock cycle, it is ignored, and interrupt line is lowered at the next edge of controller clock. All the register bits selected to OUT_FSINT belongs to the DAOCTL register.

For either I2SOUT/PWM or I2SIN block 1602 in the preferred embodiment, either CLK(with EXTMCLK==O) or MCLKIN (with EXTMCLK==1) must be present. Thus when I2SIN block 1602 is being used alone, the programmer sets-up the clock controls in CLKDIV and DAOCTL registers in I2SOUT block 1601. This is accomplished by setting appropriate value to CNTL_SEL bit of DAOCTL, and then writing appropriate values to CLKDIV and DAOCTL registers.

The following sequence of operations is preferably start-up the I2SOUT block (no PWM). Microprocessor 101 sets up the I2SOUT control by writing to the DAOCTLCNTL_SEL register. The default value for this register is 0, giving DSP 122 control. The Processor controlling I2SOUT fills the I2SOUT FIFOs, DAODATx, as necessary and sets-up DAOCFG and DAOCTL with appropriate values for data and clock configuration. The controlling processor next enables I2SOUT, by setting I2SOUT_EN and enables CLKEN bit of the DAOCTL register to enable the FIFO data pull out. Audio data starts with the first LRCLK/SCLK output (in SLAVE==0 mode), or after 3 LRCLK delay if LRCLK/SCLK is provided from outside (SLAVE==1 mode). One way to stop the I2SOUT at this point is by setting I2SOUT_EN==O. Otherwise, even if the current FIFO is empty, the last data will be sent out as long as the audio clock is present. Another way of shutting-down I2SOUT block 1601 is by setting CLKEN==O, thus stopping audio clock. However, if I2SIN block 1601 is used at the same time, it is also turned off as the audio clock to I2SIN also comes from I2SOUT clock generation block When the output FIFOs 1604a,c reach an empty state (i.e., read and write pointer are same), and a further read request is performed, the read-pointer is frozen. The device pulling data from the FIFOs keeps receiving the last sample (16th) repeatedly until the processor sends more data into the FIFOS. Hence, a read pointer crossing the write pointer is prevented, which would otherwise cause the FIFO status as being shown as full.

When not in control, microprocessor 101 or DSP 102 cannot read the registers of AUD_10 block, except that microprocessor 101 can always read the CNTL_SEL bit of DAOCTL/DAICTL. When microprocessor 101 is not in control, reading to these two registers produces a correct value for CNTL_SEL bit (==0, as DSP in CNTL), and 0 for all other bits. Reset of AUD_CLK block is same as reset of I2SOUT, thus, when the RST_I2SOUT bit in DAOCTL register is toggled, clock control and divide bits reset. Also, the controller 101/102 controlling I2SOUT block resets and resets the clock control and div registers.

SPDIF transmitter 1603 transmits serial audio data from Ch_0 and Ch_1 in SPDIF format through AUD_OUT pin and can be used along with PWM engine 1604 and I2SIN block 1603. Either SPDIF transmitter 1603 or I2SOUT 1601 can be used at one time. The SPDIF control register bits are listed in Tables 130 and 131.

ISPCTL is the control register for SPDIF Transmitter, and SPCSA and SPCSB are Channel Status registers. All register bits are read and writable unless specified.

In one configuration, the AUD_CLK block 1605 is to generate the SPDIF master clock SP_MCLK. In this mode, PWMCLKDIV is set in the CLKDIV register such that AUD_CLK divided by PWMCLKDIV produces the AudClk. This clock is then used to generate 256Fs using hardware, and then sent to SPDIF Transmitter 1603. If PWN_EN is set, both PWM and SPDIF Transmitters can play audio data from Ch-0 and Ch-1 FIFOS together.

If the bit SP_EXTCLK set to 1, the INTERN_MASTER_CLK is used to GENERATE SP_MCLK. This INTERN_MASTER_CLK can come from External MCLK if EXTMCLK is set to 1 and SLVCLKGT is set to 0 in DAOCTL register. Else, if EXTMCLK is set to 0, AUD_CLK gets divided by MCLKDIV value of CLKDIV register and becomes INTEM_MASTER_CLK. In either case, INTERN-MASTER_CLK is either 256Fs or AudClk frequency, as specified by SP_MCLKRT. Using the information in SP_MCLKRT the INTEM_MASTER_CLK is divided by two or used directly as SP_MCLK.

I2SIN block 1602, shown in further detail in FIG. 16D receives audio input data in either two formats: serial data synchronized by an LR/SCLK clock or a bit stream in a burst mode without synchronization to an LRCLK. The synchronized data can be either uncompressed PCM or compressed bursty data and the unsynchronized data can be bursty compressed data. This block takes SCLK and LRCLK from I2SOUT block 1601. In the illustrated embodiment, I2SIN port 1602 consists of two channel FIFOs 1606a,b, each 16 entries deep and The channel configurations are specified in register. This block generates interrupts when its FIFOs 1605a,b are either half-full or full to the controlling microprocessor 101 or DSP 102 to sequence data exchanges.

The I2SIN control registers are listed in Tables 133–136.

The port control register DAICTL performs two functions: defining modes of operation, and defining control parameters specifying the input data format.

The CNTL SEL and RST I2SIN registers provide control arbitration of I2SIN between microprocessor 101 and DSP 102, similar to that which is done for I2SOUT block 1601. DAIDATO and DAIDAT1 bits have same attributes as DAODATx registers, except working as input data storage.

In CHANMOD=0 mode, input data is synchronized with the LRCLK and SCLK from I2SOUT block 1601. In this mode, the data format is specified by PREDLY and BITRES bits, as is done for the I2SOUT data output. When LRCLK=1, DAIDAT0 receives the data, and when LRCLK=0, DAIDAT1 receives the data (if LRCLK_FLP is set in DAOCTL, LRCLK=0 provides data for DAIDAT0, and LRCLK=1 provided data for DAIDAT1).

A test feature is added called LOOPTEST which can be used to verify I2S block performance. When LOOPTEST is on, the I2S_OUT output of I2SOUT block 1601, is fed back as input to I2SIN block 1602. The controlling processor 101/102 can therefore send data out and receive the same data to verify the I2S performance. For this test mode, the I2SOUT is programmed to output only two channel data, and I2SIN is programmed to input in normal mode. Both blocks preferably have the same PREDLY and BITRES values.

A half Full interrupt is issued as soon as DAIDATO's dipsticks (# of data) goes from 8 to 9, at which point, both the FIFOs, DAIDATO and DAIDATI are guaranteed to be half full.

In the input block 1602 CHANMOD=CMPMOD=0 (Bursty Compressed) mode, a 1 is written to SLAVE bit in DAOCNT register. In this case, the SCLK is actually a Burst mode clock mode, staying low until the data arrives, then rapidly toggling to input the data packet, and finally returning low again until next data packet arrives. As soon as 24 bits of data arrive, they are loaded into the input FIFOs 1606*a,b*. Both the FIFOs act as a single FIFO from Half Full interrupt point of view. Data loading starts from DAIDAT0 1606*a* and when it becomes full, DAIDATI 1606*b* starts loading input data. A half Full interrupt occurs as soon as dipstick of the unified FIFO (FIFOCNT in the CMPSTS register) goes from 16 to 17. A full interrupt is generated when FIFOCNT reaches 32. The controlling processor 101/ 102 reads data out from CMPDAT register in this mode instead of reading from DAIDATx. CMPDAT supplies data from DAIDAT0 or DAIDATI depending on the unified FIFO read pointer. The LRCLK pin is programmed to provide Half_Empty flag to the data sender when the controlling processor 101/102 has processed 16×24 bits of data and is ready to receive another 16×24 bits of data. The polarity of Half-Empty flag is programmable by the HEMPTPOL bit of the DAICTL register.

As already noted, in the Bursty Compressed mode, an irregular SCLK is taken as input to the chip, thus prohibiting I2SOUT block 1601 from playing data out at the same time. Notwithstanding, an internally generated MCLK can be used to generate SCLK and LRCLK which can be used to play/output data to PWM engine 130, although these clocks cannot be used to output I2S_OUT data.

To make both the I2SIN and I2SOUT blocks 1601/1602 operate in PWM-only mode, the DAOCNT register BURSTMOD bit is turned on. This enables I2SOUT to generate S/LRCLK out of AUDCLK/MCLK (as indicated by EXTMCLK), and generate/provide data to PWM engine 130. I2SOUT is turned off by writing a 0 to I2SOUT_EN bit.

In the CHANMOD=CMPMOD=1 (Synced Compressed) mode, compressed data arrives synchronized with the LRCLK and SCLK. Data are written into the unified FIFO only when 24 bits of valid data arrive, not with the change of LRCLK phase. The PREDLY, BITRES are used to define the valid data window for each LRCLK phase. The HFULL and FULL interrupts are generated the same way as in Bursty Compressed mode. LRCLKPIN is used as Half Empty indicator or may be used as input depending on SLAVE bit of DAICTL. The data sender and data receiver both know the data arrival rate, defined by Fs rate and the PREDLY, and BITRES, and thus can establish steady state data flow in and out of FIFO 1606*a,b*.

In the input CHANMOD=1, data is written into the FIFOs 1606*a,b* only when 24 valid data-bits arrive. If there are data packets in which number of data words is not modulo 24, some data may still reside in the shift register at the end of that data packet transmission. In this scenario, the controlling processor 101/102 can read the rest of the data from shift register, and can disregard the old data with next read from CMPDAT to determine the start of next data packet. To facilitate this read to shift register is allowed (SREGDAT), and a pointer indicating # of valid data in shift register is kept in SREGPTR bits of the CMPSTS register. SRERDAT, CMPDAT, DAIDATx all are right adjusted, meaning LSB at bit_0 and MSB varies depending on # of valid data.

The DAISTS register holds the status of DAIDAT0 and DAIDATI FIFOs (all bits are preferably read only, except for FSINT_EN and FSINT). These register all hold audio input data in right-adjusted format.

Block 1607 generates three interrupts, FULL_INT, HfULL_INT, and IN_FSINT. FULL_INT and /HFULL_ INT interrupts are generated on FIFO Full (FULL) and FIFO Half Full (HFULL), respectively. These two event have different interpretation in PCM mode and Compressed mode.

In PCM mode, HFULL is generated when FIFOCNTI transitions from 8 to 9, and FULL is generated when FIFOCNT1 reaches to 16. When HFULL occurs, both the FIFOs 1605*a,b* (DAIDAT0 and DAIDATI) are guaranteed to be half full. Similarly, FULL is issued when both FIFOs 1605*a,b* are full. Thus DAIDAT0 and DAIDATI are synchronized in PCM mode.

In Compressed mode, both FIFOs 1605*a,b* work as a single unified FIFO. HFULL is generated when FIFOCNT transitions from 16 to 17, and FULL is generated when FIFOCNT reaches to 32. When HFULL occurs, the unified FIFO is guaranteed to be half full, and FULL occurs when the unified FIFO is full.

ARM/DSP can program FULL_INT_EN and HFULL_ INT_EN bits of DAICTL to individually enable these interrupts.

The IN_FSINT interrupt is enabled by FSINT_EN bit and is triggered off of the I2S_IN LRCLK edge as is done for I2S_OUT. The I2S_IN LRCLK differs from I2S_OUT LRCLK only when SLAVE bit is the BURSTMOD bit is 1 in the DAOCTL register, and PWM 130 and I2SIN 1602 are enabled. In this case, I2S_IN block 1602 receives LRCLK and SCLK from the outside, while LRCLK and SCLK in I2S_OUT block 1601 are received from clock manager AUD_CLK. The interrupt starts after I2SIN_EN bit of DAICTL register is set. To clear the interrupt, a write 0 to the FSINT bit of the DAISTS register is performed by the controller 101/102 of I2S_IN block 1602.

The preferred start-up procedure for I2S_IN block 1602 is as follows. A write is performed by microprocessor 101 to the CNTL_SEL bit of the DAICTL register to setup the control of I2SIN to the appropriate controller 101/102. This controller then configures I2SIN by writing to the DAICTL and DAISTS registers for the audio input data and interrupts. Control of I2SOUT 1601 block is assumed by writing to I2SOUT CNTL_SEL register and enabling the audio clock by setting up registers in I2SOUT block. I2SIN block 1602 is enabled by writing 1 to I2SIN_EN bit. This starts the process of inputting audio data after some delay. START_ AUD_IN bit of DAISTS transitions to 1 when the data starts shifting in. The selected Controller 101/102 then reads out the data from input FIFOs as they become available. If FIFOs 1605*a,b* become full and a write still occurs, the extra write is ignored. If a FIFO becomes empty, and the controller 101/102 tries to read, the last valid data is sent.

To stop inputting audio data, the I2SIN_EN bit is set to 0, which shuts down the audio clock to I2SIN block down 1602. Alternatively, by setting CLKEN==0 of DAOCTL all audio clocks can be shut down (to PWM, I2SOUT, and I2SIN), thus stopping inputting audio data. As long as the audio clock to I2SIN is active, whatever logic level the audio input pin is at will be accepted by I2SIN as audio input.

PWM block 130 generates left and right channel pulse width modulated (PWM) data for driving external headphones or speakers through the Aud-Out port. In addition to register DAOCTL and PWMCTL used in conjunction with I2SOUT discussed above, PWM control register PWMCTL of Table 134 controls PWM operation.

PWM engine 130 is reset with system reset or R_UP==0. Clocks to PWM engine are gated to 0 as long as PWN_ EN=0. The controlling device (microprocessor 101 or DSP 102) may fill the FIFOS, as done for I2SOUT startup, and sets PWN_EN=1. This starts clocks to PWM engine 130.

The controlling device next sets R_UP=1 and waits for R_UP_DONE. At following positive edge of the clock, PWM engine 130 comes out of reset. After R_UP_DONE becomes 1, the controlling device next enables interrupts (DAOCFG bits), and sets the block 1601 PREDLY, INTERDLY, BITRES (DAOCFG, DAOCFG bits), and I2SOUT_EN(DAOCTL bit) registers, if I2SOUT block 1601 is meant to on at the same time as PWM 130. The controlling processor 101/102 sets CLKEN=1 (DAOCTL bit) and Audio data are sent into PWM engine from DAO-DATO and DAODAT1 FIFO 1604a,b same way as was done using I2SOUT startup. If FIFO becomes empty, PWM engine 130 continues receiving the last valid data.

A preferred sequence of halting PWM engine 130 is as follows. The controlling processor fills DAODAT0 and DAODAT1 FIFOs 1605a,b with 0 AUD_DATA, and waits for these 0 data to start being output. It then sets R_UP=0 and R_DOWN=1 and waits for R_DOWN_DONE to transition to 1. When R DOWN_DONE becomes 1, the following the clock edge puts PWM 130 in reset state. The controlling device sets PWN_EN=0 which gates clocks to PWM 130 to 0 (power save mode) and may set R_DOWN=0 so that PWM 130 is ready for next startup. Setting CLKEN=0 also shuts down PWM 130 as it stops the audio clock.

System 100 has total 32 general purpose I/O (GPIO) pins which are multiplexed with other functional pins and accessible to Microprocessor 101. The GPIO functions are shown generally at block 140 in FIG. 1 and in further detail in FIG. 17. These pins and their various functions are listed in Tables 145–155.

32 GPIO pins 1703 in the illustrated embodiment are controlled by microprocessor 101 individually through APB interface 1701. Each GPIO pin can generate an interrupt request to the microprocessor 101, if selected to do so. Specifically, interrupt block 1702 generates one interrupt request in response to one of four events defined in register occurs at any GPIO pins. An additional register acts as global interrupt enable bit for GPIO and individual pin selection is made through a mask register.

Security Fuse block 119 contains 256 fuses which give a unique ID for each chip.

When the fuses are blown, a flag enables internal security ROM. Meanwhile, a Hamming Code is generated by hardware based upon the 256-bit fuse value for error concealment and correction. The fuse value is read-able by security code only when the fuse is programmed (blown). Depending on the fuse programming, different microprocessor 101 ROM segments are mapped to microprocessor 101 address location 0 for boot-up. The internal 12K-byte Microprocessor 101 ROM contains three different segments: 1 Kbyte Security code, 1 K-byte alternative code, 10K-byte normal code.

Security Gates/Access Protection block 142 provides access protection when the security fuses are programmed. In the preferred embodiment, access permission is granted under the following conditions:

(1) When the fuses are not programmed (non-security chip), access protection is not engaged at any time;
(2) When the fuses are programmed, (security chip), access protection is engaged as default;
(3) Microprocessor 101 is allowed access to the protected areas only in the supervisor mode when the protection is enabled;
(4) Microprocessor 101 is allowed access to the protected areas in either supervisor or user mode when the protection is disabled;
(5) The protection can be disabled by Microprocessor 101 in supervisor mode only;
(6) In the security mode TIC operations are not allowed and only Microprocessor 101 can enable the DMA and LCD; and
(7) The protection mode registers can be modified by Microprocessor 101 only in Privilege Mode.

Timer 131 is a 33-bit down counter 1801, as shown in FIG. 18. The corresponding configuration registers are described in Tables 138–142. The source for this down counter is the 16-bit divider 1802 which provides a divide of up to 65536. The input clock to divider 1802 is either the audio clock (AudClk), the MEMCLK, the USBCLK or the external clock. The select is done using the STC_CLK_SEL field in STCCTL register. The STC_EN bit in register STCCTL is set to 1 for the timer to start the downcount.

On a read of the STC_COUNTER0, the higher 24 bits of the down count are returned, at the same instant a sample of the lower 9 bits are stored into the STC_CNTR_SHDW register 1803. This value is unchanged till the next read of the STC_COUNTER0 register. The instantaneous value of the lower 9 bits can be read by reading the STC_COUNTER1 register.

If the DSP clock is running less that 2× of the STC counter clock (after divide), the read of the results may not be valid. The counter rolls back to the start value after reaching 0.

System 100 operates in conjunction with a "soft cache system" that supports microprocessor 101 designs which do not include a hardware cache and/or memory management unit (MMU). For example, in the preferred embodiment of system 100, an ARM7tdmi microprocessor is used in microprocessor core 101. This particular microprocessor does not include either a hardware cache or MMU.

The soft cache system preferably uses external SRAM for storing code and on-chip memory for data constants or other secure information. In the illustrated embodiment, a virtual (soft cache) memory space of 2 Mbytes of external and internal SRAM is dedicated to soft cache, although the size, as well as the location in memory, are not critical and can change in actual implementations.

The software cache is set-up as a 16-way set associative system, with each set associated with a single cache line in the soft cache memory space. This is shown logically in FIG. 19A and a block diagram is provided in FIG. 19C. The soft cache configuration and control registers are provided in Tables 154–159.

Each set of the 16 sets is represented in register by an entry including a tag field and a validity bit. The cache line size is programmable to 128, 256, 512 or 1024 bytes. Each cache line space is addressable by the N lower order virtual (CPU) address bits N–1:0, where N is 7, 8, 9 or 10, depending on whether the cache line size is 128, 256, 512, or 1024 bytes, respectively. Bits 21:N of the virtual address then represent a cache tag. The remaining bits 31:22 are the block address to the assigned memory block, which could be controlled by hardwired logic. Hardware comparators compare the tag field of each CPU address generated with tag fields stored in the soft cache registers.

A soft cache operation is illustrated in the flow chart of FIG. 19B.

At Step 1901, an virtual (CPU) address is generated by microprocessor 101, which are then checked at Step 1902 to determine whether its block address is within the soft cache address space. The case where the virtual address is within the soft cache address space will be considered first.

The cache tag from the virtual address is compared with the tag fields in the corresponding 16 register entries by the hardware comparators at Step 1903. If a match occurs, the index corresponding to the matching entry in soft cache is taken for use in generating a physical address to the appropriate location in the soft cache memory block. For a 16-way cache system, the entries are indexed with four bits from 0 to 15. In an embodiment where the soft cache address space starts at 0000 and works upward, bits N−1:0 of the CPU address become bits N−1:0 of the physical address and address the location in the cache line. The 4-bit index from the matching soft cache entry replaces bits N+3:N of the physical address and operates as an offset which selects the proper cache line. The remaining bits (31:N+4) come from the virtual address and are used for RAM bank, block and chip select. The required read or write to the addressed area in the soft cache memory space subsequently takes place.

For example, assume that the cache line size is programmed to be 256 bytes. In this case, N=8. Bits 21:8 of the CPU address are therefore compared with the cache tags in the table entries. Also assume that a hit occurs to entry #5 and the corresponding 4-bit index is 5. For simplicity, the soft cacheable block of memory will have an arbitrarily selected starting address of 0. The physical address (in hex) is therefore 000005CC, where CC are bits 7:0 of the CPU address to a location within cache line 5.

Note that the soft cache area in memory could start at a given address, for example 7fff, and work downward. In this case, bits 14:N are modified based on cache size. This scheme insures that location 0000, which maintains the interrupt vectors, does not become part of the cache.

Next consider the case where a cache miss occurs during comparison Step 1903. A hardware soft cache history register is maintained which tracks the last four hits (matches). Preferably, this register is a shift register which shifts in the 4-bit index from each matching entry, if that index differs from the index of the previous matching index. In other words, if two consecutive indices are the same, no shifting takes place such that no two consecutive indices in the shift register are equal. This register improves the performance of the software replacement handler invoked on a cache miss.

On the miss, a soft cache abort is signaled to microprocessor 101 by setting an Abort Status bit in register. (This bit is cleared automatically after being read). The address causing the cache miss (abort) is written into an Abort Address register. Setting the Abort Status bit initiates the replacement handler routine.

The replacement handler routine selects the cache line to be replaced based on the contents of the history register. For example, the cache line replaced can be one of those not corresponding to the four indices stored in the history register. The required data is fetched from its current location in memory, using the address in the Abort Address register and loaded into the selected cache line, and the cache tag in the corresponding cache entry is updated. The source location could be in NAND or serial flash and the software handler is capable of performing the specific access procedures normally required for these types of memory. To implement this memory, the DMA engine and other system resources are invoked as required. Once the data has been encached and the cache tag updated, the instruction causing the cache miss can be successfully reissued.

In the case where the CPU address is not within the soft cache address space and no abort has occurred, then the CPU address is used as the physical address to the RAM (Step 1907).

At Step 1908, the physical address is used to access the addressed RAM space. The data is exchanged with the CPU at Step 1909.

RAM test block 139 contains a weak-write controller, as does DSP RAM test block 144. Two separate RAM weak-write control registers are therefore implemented for microprocessor 101 RAM and DSP RAM respectively. These are described further in Tables 171 and 172. Thus, the corresponding RAM weak-write control register resides in either microprocessor 101 memory space or DSP peripheral space. The RAM modules in either memory space can be divided into two banks so that when one bank is in weak-write test mode and the other can be used for test program.

The microprocessor RAM weak-write control register is used to test the data integrity of microprocessor 101 and along with the associated SRAM retention test mode controller put the microprocessor RAM 137 in the SRAM retention test mode. For the SRAM retention test, the RAM is divided into two portions: High bank and Low bank. The SRAM retention test controller generates two signals for each portion: weak0 and weak1. Hence, in all there are 4 retention test signals.

The 16 most significant bits of the 32-bit address line are decoded by an external decoder to generate a select signal HSELRamTest for the RAM_TEST 139 controller which acts as a slave on 32-bit local AHB bus 104. The remaining 16 bits can address $2^{16}$ registers inside RAM_TEST controller 139; although since only 4 bits are required for retention testing, just one register is addressed. These are preferably the 4 least significant bits of the 32-bit register. An intermediate signal generated by combinational logic acting on the 16 least significant bits of the address line is combined with the HSELRamTest select signal and the HREADY in signal asserted by the previous local AHB slave to generate a register enable signal. Along with appropriate read or write signal, the user can either read this register for the existing retention testing signals or can write new values depending upon the portion of RAM the user wants to test for data integrity by writing either a weak0 or a weak1.

The DSP RAM weak-write control register is used to test the data integrity of DSP RAM 133–136. RAM test block 144 contains a SRAM retention test controller which can put the data and the program RAM in the retention test mode, including a program RAM (PRAM) 133 and the data RAM, consisting of GRAM (Global RAM) 136, XRAM 134, and YRAM 135. So effectively, there are four DSP RAM portions to test for data integrity. For the purpose of retention test, each of these portions is divided into two subportions: High bank and Low bank. The retention test controller generates two signals for each subportion: weakO and weak1. Hence, in all there are 16 retention test signals.

The four most significant bits of the 16-bit DSP address line are decoded by an external decoder to generate an intermediate select signal for the DSP_RAM_TEST block which acts as a peripheral device on 24-bit bi-directional DSP bus. The remaining 12 bits can address $2^{12}$ 24-bit registers inside DSP RAM test controller 144; but since only 16 bits are required for retention testing, just one register is addressed. The address of the register that provides the necessary 16 bits is 0x000, which are preferably the 16 least significant bits of the 24-bit register. An intermediate signal generated by combinational logic acting on the 12 least significant bits of the address line is combined with the previously discussed decoded intermediate signal and a peripheral select signal to generate a register enable signal. Along with appropriate read or write signal, the user can either read this register for the existing retention test signals or can write new values depending upon the sub-portion of data or program RAM the user wants to test for data integrity by writing either a weaklO or a weak1.

System 100 has multiple power planes as listed in Table 175. The advantages of different power planes are the ability to use minimal power supply for a given power plane, and the ability to individually turn on/off power planes for power saving purpose.

Since there are multiple power planes existing in which allow user to turn on/off the supply to save the power consumption, it is essential to provide a means to switch between different power modes. The power modes are defined as follows with reference to FIG. 20A:

1) Cold Mode: All supplies to the chip are off. All circuit blocks are non-functional
2) Super Stand-by Mode: Only RTC and 32 KHz oscillator is running, and Stand-By plane 2005 is powered. Quite-analog (2001), PWMVREF (2002), pad-ring (2003) and core-logic power planes (2004) are off.
3) Normal Mode: All functional units are running, and all power planes (2001–2005) are powered.
4) Standby Mode: All power are on except the VCO 120 is powered down. Thus, there is no clock activities at all, except the Oscillator and RTC are running.
5) Pause Mode: All power planes are on; microprocessor 101 is in pause mode by setting up the APB Pause block. Microprocessor 101 wakes up in response to any interrupt and continues execution. All other functional blocks can be enabled or disabled by microprocessor 101 software.

The transitions between power modes is illustrated in the diagram of FIG. 20B and the flow chart of FIG. 20C. After the power switch of the system is turned on while in cold mode (state/step 2010), the signal STBYVDD is provided to the chip first, at Step 201. This also generates a power-on-reset signal which is fed to PRSTn pin. After STBYVDD is on, on-chip oscillator 120 and RTC 124 start to function. Meanwhile, the active power-on-reset will de-assert STBYn pin controlling the voltages VDDRING, VDDCORE, QVDD and PWMVDD allowing power to flow to the chip. After they become stable, an internal circuit generates a delayed version of PRSTn to reset the rest of the chip. As a result of this transition, the chip enters the normal mode at Step 2012 with all the registers at their default values and the on-chip RAM content is random. Once in normal mode, microprocessor 101 fully controls all the resources on the chip, as well as determines the power mode transition.

When microprocessor 101 causes the chip to leave normal mode for Super-Standby mode, it performs all the necessary system functions, followed by asserting the STBYn bit through the STBY control bit (Step 2013). As the result of asserting STBYn pin, all the power supplies except STBYVDD are turned off and only on-chip oscillator 120 and RTC 124 remain functional (Step 2014).

The transition from super-standby mode to the normal mode requires asserting WAKEUP pin high at Step 2015 for a certain of period. This activates the STBYn pin to the low state which turns on the other power supplies. It also generates a delayed version of reset which resets the entire chip, except for RTC 134, after which the power becomes stable. By releasing the WAKEUP pin from high to low (default value), the status of the chip is exactly same as at the end of the transition from Cold Mode to Normal Mode.

When microprocessor 101 is in normal mode, it can transition to the Stand-by Mode by powering down VCO 120. This shuts-down all clock activity on the chip. Specifically, at Step 2016, microprocessor 101 sets the power down bit for PLL1 which generates the bus clocks and processor clocks in the SYSCON. The power supplies remain on at Step 2017, although the clocked circuitry is effectively off and not consuming powers.

To leave the Stand-by Mode to Normal Mode at Step 2018, any rising edge of GPIO[3:0] or falling edge of GPIO[7:4] is used to prompt microprocessor 101. This event clears the VCO power-down bit so that the VCO 120 resumes activity. It also generates an interrupt to microprocessor 101 (Interrupt (12)) to indicate the exit of stand-by mode. Since the microprocessor 101 interrupt is level sensitive: this interrupt request will last 1 ms and is then de-asserted automatically. It is microprocessor 101 application responsibility to reply to the interrupt.

In Pause Mode, microprocessor 101 is halted at Step 2019. All the other devices on the chip are still powered and functional. Microprocessor 101 can enter the Pause Mode by the setting Microprocessor Sleep register in Remap/Pause block at Step 2020. Any interrupt will wake microprocessor 101 from Sleep mode at Step 2021

Any time all the powers including STBYVDD are taken away (Step 2022), the device enters Cold Mode (Step 2023)

When entire chip is in the Normal Mode, DSP 102 can be in either in a halt or an operation mode. After power up with power-on-reset presented, DSP is by default disabled. Microprocessor 101 must then enable the DSP 102 by asserting the DSP Clock Enable bit in the SYSCON block. Once DSP 102 is activated, it enters its operation mode.

During any time in operation mode, DSP core 102 can execute a HALT instruction and enter halt mode (low-power mode). Any interrupt which is enabled before DSP enters halt mode will wake up the DSP, and bring DSP 102 back into operation mode.

Microprocessor 101 has three different address maps: in each mode, one of the internal microprocessor ROM, RAM or external SRAM/Flash memory is aliased to microprocessor 101 address location "0". The details of the address maps are provided in Tables 176–178. Even though microprocessor 101 instructions support byte/half-word/word access, only internal ROM/RAM, GRAM and external SRAM/Flash allow byte/half-word access.

The DSP Memory Maps are summarized in Tables 179–183.

The power-up (boot-up) modes and hardware configuration are summarized in Tables 184 and 185.

When powering up the device it is mandatory that the PRSTn signal be held low for a minimum of 100 us after Vdd has settled. At the rising edge of Power on Reset (PRSTn), 9 pins will be latched and the memory map of microprocessor 101 will be set to mode X (with the boot ROM at physical address 0). The latched pins will be used to provide mode selection and boot source selection. The latched values will be used by Hardware and Firmware appropriately. All latched pins will have 100K internal pull up resistors and can be disabled via software. The Hardware mode selection pins are: TACK/TRSTn (pin 126), TST[0:1] (Pin 124, 125) and PORTST[0:1](Pin 119, 120). The Software mode selection pins are: GPIO[3:0](Pin 95, 96, 97, 98).

The value of those pins latched upon a rising edge of PRSTn and/or RSTOn will be held in a read-only register-Remap register (ARM Addr 0x8008 0020). Its OPMOD1 field is corresponding to the Hardware mode, and OPMOD0 is corresponding to Software mode.

TACKlTRSTn is used as JTAG Reset when JTAG is enabled. JTAG is disabled during reset and is enabled JTAG via software.

In the Normal 32 KHz mode, the 32 KHz on-chip crystal will be used as reference clock to VCO 120. System boots with the PLLs not locked. If a locked PLL is required to boot (i,e., UART), software will wait until the PLL is locked by polling a PLL lock bit. The REF1 and REF2 voltages are set to select Xtal source and TCM1 and TCM2 are set to select the VCO. In this mode, assertion of RSTOn will cause the TRST, PORTST[1:0] to be re-latched, however TST[1:0] and GPIO[3:0] will not be latched.

In the Normal ExtVCO mode, system 100 will be clocked from the external source (Extclk) clocking the VCO 120. The REF1 and REF2 voltages are set to select external clock source and TCM1 and TCM2 are set to select VCO 120. In this mode assertion of RSTOn will cause the TRST, PORTST[1:0] to be relatched, however TST[1:0] and GPIO [3:0] will not be latched.

In the TestOp VCObp mode, the system 100 is clocked directly from the external source. In this mode VCO 120 is bypassed. TCM1 and TCM2 are set to select the external clock source and REF1 and REF2 are don't care. In this mode assertion of RSTOn will cause the TRST, PORTST [1:0], TST[1:0] and GPIO[3:0] to be latched.

In the TestOp Xtalbp mode, the system 100 is clocked directly from the external source, with the Xtal bypassed. In this mode VCO 120 is also bypassed. TCM1 and TCM2 are set to select the external clock source and REF1 and REF2 are don't care. In this mode assertion of RSTOn will cause the TRST PORTST[1:0], TST[1:0] and GPIO[3:0] to be latched.

In both normal operation and TestOp mode, the device executes the first instruction from internal ROM and branches according to the boot selection indicated by GPIO [3:0] in accordance with Table 185.

The NAND FLASH is assumed to contain an SSFDC compliant file system. The boot ROM will search the NAND FLASH for logical block 4 (the lowest numbered logical block which is not used for file system tables across all NAND FLASH device sizes) and read the contents of logical block 4 into the beginning of microprocessor 101 internal SRAM. The memory map of microprocessor 101 is set to mode 1 (with microprocessor 101 internal SRAM at physical address 0) and microprocessor 101 branches to zero, causing the first instruction of the NAND FLASH code to be executed.

The external EEPROM preferably contains a byte stream including a boot code block. The boot code block is read from the EEPROM into the beginning of microprocessor 101 internal SRAM. The memory map of microprocessor 101 is set to mode 1 (with microprocessor 101 internal SRAM at physical address 0) and microprocessor 101 is branches to zero, causing the first instruction of the EEPROM boot code to be executed.

With respect to external memory, the memory map of microprocessor 101 is set to mode 2 (with the nCSO memory space at physical address 0) and microprocessor 101 branches to zero, causing the first instruction of the external memory to be executed.

Since UART is used during boot-up, one PLL is locked such that the UART has a good clock source. The selected PLL will be configured for a "standard" speed and microprocessor 101 implements a delay until the PLL is locked. Preferably, the UART will be configured for 115,200 baud, 8-N-1. A "<" is sent to the serial port. Then, 8K bytes are read from the serial port into the beginning of microprocessor 101 internal SRAM. Then, a ">" is sent to the serial port. The memory map of microprocessor 101 is then set to mode 1 (with the internal microprocessor 101 SRAM at physical address 0) and microprocessor 101 branches to zero, causing the first instruction read from the UART to be executed.

Since the NAND FLASH can also be accessed by the application running on Windows, the routines used by the boot ROM will be made available for application use. These routines will be APCS compliant Thumb code.

Also available in the boot ROM will be a routine to set the speed of the PLL and wait for it to lock. Again, this will be APCS compliant Thumb code.

For secure parts, the secure boot ROM will behave the exact same way, with the exception of looking for a secure kernel at the specified boot location. Depending upon the requirements of the security provider, it might not be possible to boot secure from all of the possible boot locations (specifically from the UART).

In the Clock test mode, GPIO[10:0] is driven by internal clocks: GPIO[0]=ARMCLK, GPIO[1]=HCLK, GPIO[2]= PCLK, GPIO[3]=DSPCLK, GPIO[4]=DSPMEMCLK, GPIO[5]=OSC32K, GPIO[6]=AUDCLK, GPIO[7]= LCDCLK, GPIO[8]=ADCCLK, GPIO[9]=UARTCLK, GPIO[10]=USBCLK. A similar function can be achieved by asserting CUSDAT[10:0] (GPIOINTEN register bk[26:16]) to view these clocks in mentioned order in the other boot-up mode.

In the ARM-off mode, clocks operate as normal but the microprocessor 101 core will be off. This test will allow the use of the on-chip TIC controller to access the internal AHB. In this test mode the various internal devices are accessible for running specialized test functions.

The Drive All Float Test causes all device pins that can be an output to transition to a high impedance state. All input buffers, except those necessary to maintain the test function are disabled. All pad pull-up and pull-down functions are controlled by the TST[0] pin; when TST[0] is low all pad pull resistors are turned off, and when TST[0] is high the pad pull resistors are active. System 100 enters its lowest possible power dissipation state and can be used for IDDO testing and to testing for parametric leakage and EOS damage. This test mode is used to test the pad pull resistor state and strength. Normal device operation is disabled.

The Drive All High Test causes all output capable pins to drive to a logic high level. All internal pull-up and pull-downs are turned off. This test mode is used to test output pad pull-up driver strength. Normal device operation is disabled.

The Drive All Low Test causes all output capable pins to drive to a logic low level. All internal pull-up and put-downs are turned off. This test mode is used to test output pad pull-down driver strength. Normal device operation is disabled.

The XOR Tree Test causes all pins that can be operated as an input to be configured as an input and connected into an XOR tree. The end of the tree is driven out on the TDO pin. Since the tree is composed of XOR logic gates, the pin order in the tree does not affect the test results. The tree functions as an even parity generator. The connectivity and input trip level of all input buffers can be tested by toggling one input pin at a time and observing that the tree output on TDO changes state when the input is changed. Normal device operation is disabled. The pins included in XOR tree are: WAKEUP, UARTRXD, TST_1 TREQB, TST_0_ TREQA, TMS, TDI, TCK, TACK_TRSTn, SPIRXD, RSTOn, PRSTn, LCDMCLK_GPIO_15, LCDFRM_ GPIO_14, LCDDD_3 GPIO_11, LCDDD 2 GPIO_10, LCDDD_. 1 GPIO_9, LCDDD_0_GPIO_8, LCDCL2_ GPIO_12, LCDCL1_GPIO_13, GPIO_7_LCDDD_7, GPIO_6_LCDDD_6, GPIO_5_LCDDD_5, GPIO_4 LCDDD_4, GPIO_3, GPIO_2, GPIO_1, GPIO_0, EXTCLKI, EEDAT, EECLK, DA-9. DA_8, DA_7, DA_6, DA-5, DA-4, DA_3, DA_2, DA_1, DA-15, MN-14, DA-13, DA-12, DA_11, DA_10, DA-0, DAISCLK, DAIRX, DAIMCLK, DAILRCK, A12CD PORTST1, ASSIC PORTSTO, AD_9_GPIO_25, AD 8_GPIO_24, AD_7_GPIO_23, AD_6_GPIO_22, AD_5_GPIO_21, AD_4_GPIO_20, AD_19 GPIO_19, AD_18_GPIO_18, AD_17 GPIO_17, AD 16_GPIO_16, AD_15_GPIO_31, AD_14_GPIO_30, AD_13_GPIO_29, AD_12_GPIO_28, AD_11_GPIO_27, AD_10_GPIO_26.

As a general concept of security, once the chip is determined as a fuse-blown security chip, all the debugging features (JTAG/TIC) are disabled unless microprocessor 101 code is authorized to enable them. Microprocessor 101 is the only resource that determines which other resources can access selected sections of the chip. In a security chip, accesses to the memory space are protected by configuration bits, setting them allows the access from microprocessor 101 only in supervisor mode. The general security code will be programmed in microprocessor 101 supervisor mode.

FIG. 21 is a diagram of the pin-out for system 100, as packaged in a 128-pin QFP package. The pins are described in Table 188.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

Tables

TABLE 1

| Name | Bit Field | Reset Value | Type | Description |
|---|---|---|---|---|
| \multicolumn{5}{c}{LCDCON1 (LCD Control Register 1, ARM Addr = 0x6000_1000)} | | | | |
| GSMD | [31:30] | 00 | R/W | Gray Scale Mode Bits; enabled for all bit/pixel settings: "bx0": 1 bit per pixel or sub-pixel in the frame buffer; "b01": 2 bits per pixel or sub-pixel in the frame buffer; "b11": 4 bits per pixel or sub-pixel in the frame buffer. |
| ACPreScale | [29:25] | 0x00 | R/W | Toggles MCLK (high-to-low or low-to-high) transition after (n + 1) counts of the falling edge of CL1. "n" is the value programmed for this bit field. The delay of MCLK at the pin is relative to the falling edge of CL1. (value of zero is illegal and MCLK is not generated.) |
| AHBClkPreScale | [24:19] | 0x00 | R/W | AHB Clock Pre-Scale. Divides the AHB clock by (n + 1), where "n" is the value in this bit field. The output of this divider is the pixel clock. (A value of zero is illegal and results in no pixel clock.) |
| LineLength | [18:13] | 0x00 | R/W | Number of dots per line (including sub-dots if color). LineLength = (#dotx_per_line/16)-1 #dots_per_line = (LineLength + 1)*16. This register has a granularity of 16-ots (i.e. 16-dots = 1 unit of this bit field) andid is used internally for line-to-line logic. |
| FBSize | [12:0] | 0x0000 | R/W | Frame Buffer Size. FBSize = (Total_#bits/128) - #QDWORDS in FB = FBSize + 1. (1 QDWORD = 16 bytes) #DWORDS in FB = (FBSize + 1)* 4. #bytes in FB = (FBSize + 1)* 16. #bits in FB = (FBSize + 1)* 128 buffer to support a particular display resolution. After this number of QDWRDs have been read from the frame buffer, the LCD controller will reset to FBADDR and read pixels for the first line of the next frame into the FIFO. This bit field will be used internally for frame-to-frame logic. |
| Reserved | [31:13] | 0x00000 | RO | Reserved. Writes have no effect on this field. |

TABLE 1-continued

LCDCON1 (LCD Control Register 1, ARM Addr = 0x6000_1000)

| Name | Bit Field | Reset Value | Type | Description |
|---|---|---|---|---|
| LCDClkSel | (12) | 0 | R/W | LCD panel interface logic clock select. This bit chooses the clock source for the LCD panel interface logic (FIFO read, pixel datapath and panel clock generation.) Setting this bit to "0" chooses the microprocessor AHB bus clock (HCLK) as the panel interface logic clock. Setting this bit to "1" selects the LCDCLK from one of the PLL outputs in System Clock Control block. |
| FIFOThrsh | [11:8] | 0x5 | R/W | FIFO Threshold. When the number of valid FIFO locations falls to (FIFOThrsh + 1) or less, the LCD controller signals its Bus Master to fill the FIFO. The maximum value for FIFO-Thrsh is 15d. |
| Reserved | [7:6] | 00 | RO | Reserved. Writes have no effect on this field. |
| SubDotPortSwap | [5] | 0 | R/W | Sub-Dot Interface Port Swap - for color dots. Bits "DotPortSwap" and "SubDotPortSwiz" can be set together or exclusively from each other.<br>"1" = Red and Blue sub-dots of a color pixel swap locations at the pins.<br>"0" = No swapping. |
| DotPortSwiz | [4] | 0 | R/W | Dot Interface Port Swizzle. Bits "DotPortSwiz" and "SubDotPortSwap" can be set together or exclusively from each other. 1" = Least least significant dot at the interface, relative to the frame buffer, is mapped to the most significant pin of the bus interface. Most significant dot at the interface, relative to the frame buffer, is mapped to the least significant pin of the bus interface. "0" = No Swizzle |
| PortSize | [3:2] | 00 | R/W | Data Bus Interface Port Size<br>"00" = 4-bits (D[3:0])<br>"01" = 8-bits (D[7:0])<br>"10" = 2-bits (D[1:0])<br>"11" = 1-bit (D[0]) |
| EOFrmCtl | [1] | 0 | R/W | End of Frame Control.<br>"1" = FRM encompasses the last line CL1.<br>"0" = FRM encompasses the first line CL1. |
| LCDEN | [0] | 0 | R/W | LCD Enable Bit.<br>"1" = Enables the LCD controller to Function internally (interface not enabled at the pins at this point). Registerr bit GPIO Mux Selector Register must also be set appropriately to enable the LCD interface signals to the pins.<br>"0" = Sets the state of the LCD interface internal signals to Os to meet the power off requirements of the panel. Then, drives the input to the AHB clock pre-scaler to a known state to conserve power - LCD controller is totally idle - LCD interface signals still 0s. |

TABLE 3

FBADDR (Frame Buffer Start Address, ARM Addr = 0x6000_1008)

| Name | Bit Field | Reset Value | Type | Description |
|---|---|---|---|---|
| FBADDR | [31:4] | 0X0C00_0000 | R/W | Frame Buffer Start Address. The frame buffer is re-locatable on QDWRD boundaries. At the end of every display frame, the LCD controller's Bus Master address is set back to FBADDR. |
| Reserved | [3:0] | 0x0 | RO | Reserved. |

TABLE 4

PALLSW (Palette Least Significant Word, micropressor 101 Addr = 0x6000_100C)

| Name | Bit Field | Reset Value | Type | Description |
|---|---|---|---|---|
| PalLoc7 | [31:28] | 0x0 | R/W | Value for palette location 7 |
| PalLoc6 | [27:24] | 0x0 | R/W | Value for palette location 6 |
| PalLoc5 | [23:20] | 0x0 | R/W | Value for palette location 5 |
| PalLoc4 | [19:16] | 0x0 | R/W | Value for palette location 4 |
| PalLoc3 | [15:12] | 0x0 | R/W | Value for palette location 3 |
| PalLoc2 | [11:8] | 0x0 | R/W | Value for palette location 2 |
| PalLoc1 | [7:4] | 0x0 | R/W | Value for palette location 1 |
| PalLoc0 | [3:0] | 0x0 | R/W | Value for palette location 0 |

TABLE 5

PALMSW (Palette Most Significant Word, ARM Addr = 0x6000_1010)

| PalLoc12 | [19:16] | 0x0 | R/W | Value for palette location 12 |
|---|---|---|---|---|
| PalLoc11 | [15:12] | 0x0 | R/W | Value for palette location 11 |
| PalLoc10 | [11:8] | 0x0 | R/W | Value for palette location 10 |
| PalLoc9 | [7:4] | 0x0 | R/W | Value for palette location 9 |
| PalLoc8 | [3:0] | 0x0 | R/W | Value for palette location 8 |

TABLE 6

FRMPAT1A (Frame Pattern 1A, Addr = 0x6000_1014) Frame Rate Modulation Pattern #1 Register. This register holds the first 4 pattern register bytes (0 through 3) used in the "1 of 9" gray scale generator.

| Name | Bit Field | Reset Value | Type | Description |
|---|---|---|---|---|
| FRMPAT1_3 | [31:24] | 0x00 | R/W | Pattern 3 when a palette location value = 0x1 |
| FRMPAT1_2 | [23:16] | 0x00 | R/W | Pattern 2 when a palette location value = 0x1 |
| FRMPAT1_1 | [15:8] | 0x00 | R/W | Pattern 1 when a palette location value = 0x1 |
| FRMPAT1_0 | [7:0] | 0x00 | R/W | Pattern 0 when a palette location value = 0x1 |

TABLE 7

FRMPAT1B (Frame Pattern 18, ARM Addr = 0x6000_1018) Frame Rate Modulation Pattern #1 Register. This register holds the 4th through 7th pattern register bytes used in the "1 of 9" gray scale generator.

| Name | Bit Field | Reset Value | Typo | Description |
|---|---|---|---|---|
| FRMPAT1_7 | [31:24] | 0x00 | R/W | Pattern 7 when a palette location value = 0x1 |
| FRMPAT1_6 | [23:16] | 0x00 | R/W | Pattern 6 when a palette location value = 0x1 |
| FRMPAT1_5 | [15:8] | 0x00 | R/W | Pattern 5 when a palette location value = 0x1 |
| FRMPAT1_4 | [7:0] | 0x00 | R/W | Pattern 4 when a palette location value = 0x1 |

TABLE 8

FRMPATIC (Frame Pattern 1C, ARM Addr = 0x6000_101C) Frame Rate Modulation Pattern #1 Register. This register holds the byte 8 in the "1 of 9" gray scale generator.

| Name | Bit Field | Reset Value | Type | Description |
|---|---|---|---|---|
| Reserved | [31:8] | 0x000000 | RO | Reserved. Writes have no effect on this field. |
| FRMPAT1_8 | [7:0] | 0x00 | R/W | Pattern 8 when a palette location value = 0x1 |

TABLE 9

FRMPAT2A (Frame Pattern 2A, ARM Addr = 0x6000_1020) Frame Rate Modulation Pattern #2 Register. This register holds the first 4 pattern register bytes (0 through 3) used in the "1 of 5" gray scale generator.

| Name | Bit Field | Reset Value | 7ypra | Description |
|---|---|---|---|---|
| FRMPAT2_3 | [31:24] | 0x00 | R/W | Pattern 3 when a palette location value = 0x2 |
| FRMPAT2_2 | [23:16] | 0x00 | R/W | Pattern 2 when a palette location value = 0x2 |
| FRMPAT2_1 | [15:8] | 0x00 | R/W | Pattern 1 when a palette location value = 0x2 |
| FRMPAT2_0 | [7:0] | 0x00 | R/W | Pattern 0 when a palette location value - 0x2 |

TABLE 10

FRMPAT2B (Frame Pattern 2B, ARM Addr = 0x6000_1024) Frame Rate Modulation Pattern #2 Register. This register holds the last pattern register byte (4) used in the "1 of 5" gray scale generator.

| Name | Bit Field | Reset Value | Type | Description |
|---|---|---|---|---|
| Reserved | [31:8] | 0x000000 | RO | Reserved. Writes have no effect on this field. |
| FRMPAT2_4 | [7:0] | 0X00 | R/W | Pattern 4 when a palette location value = 0x2 |

TABLE 11

FRMPAT3A (Frame Pattern 3A, ARM Addr = 0x6000_1028) Frame Rate Modulation Pattern #3 Register. This register holds the first 4 pattern register bytes (0 through 3) used in the "4 of 15" gray scale generator.

| Name | Bit Field | Reset Value | Type | Description |
|---|---|---|---|---|
| $FRMPAT3_{13}$ 3 | [31:24] | 0x00 | R/W | Pattern 3 when a palette location value = 0x3 |
| FRMPAT3_2 | [23:16] | 0x00 | R/W | Pattern 2 when a palette location value = 0x3 |
| FRMPAT3_1 | [15:8] | 0x00 | R/W | Pattern 1 when a palette location value = 0x3 |
| FRMPAT3_0 | [7:0] | 0x00 | R/W | Pattern 0 when a palette location value = 0x3 |

TABLE 12

FRMPAT3B (Frame Pattern 3B, ARM Addr = 0x6000_102C)
Frame Rate Modulation Pattern #3 Register. This register
holds the pattern register bytes (4 through 7)
used in the "4 of 15" gray scale generator.

| Name | Bit Field | Reset Value | Type | Description |
|---|---|---|---|---|
| FRMPAT3_7 | [31:24] | 0x00 | R/W | Pattern 7 when a palette location value = 0x3 |
| FRMPAT3_6 | [23:16] | 0x00 | R/W | Pattern 6 when a palette location value = 0x3 |
| FRMPAT3_5 | [15:8] | 0x00 | R/W | Pattern 5 when a palette location value = 0x3 |
| FRMPAT3_4 | [7:0] | 0x00 | R/W | Pattern 4 when a palette location value = 0x3 |

TABLE 13

FRMPAT3C (Frame Pattern 3C, ARM Addr = 0x6000_1030)
Frame Rate Modulation Pattern #3 Register. This register
holds the pattern register bytes (8 through 11)
used in the "4 of 15" gray scale generator.

| Name | Bit Field | Reset Value | Type | Description |
|---|---|---|---|---|
| FRMPAT3_B | [31:24] | 0x00 | R/W | Pattern 11 when a palette location value = 0x3 |
| FRMPAT3_A | [23:16] | 0x00 | R/W | Pattern 10 when a palette location value = 0x3 |
| FRMPAT3_9 | [15:8] | 0x00 | R/W | Pattern 9 when a palette location value = 0x3 |
| FRMPAT3_8 | [7:0] | 0x00 | R/W | Pattern 8 when a palette location value = 0x3 |

TABLE 14

FRMPAT3D (Frame Pattern 3D, ARM Addr = 0x6000_1034)
Frame Rate Modulation Pattern #3 Register. This register
holds the last 3 pattern register bytes (12 through 14)
used in the "4 of 15" gray scale generator.

| Name | Bit Field | Reset Value | Type | Description |
|---|---|---|---|---|
| Reserved | [31:24] | 0x00 | R/W | Reserved. Writes have no effect on this field |
| FRMPAT3_E | [23:16] | 0x00 | R/W | Pattern 14 when a palette location value = 0x3 |
| FRMPAT3_D | [15:8] | 0x00 | R/W | Pattern 13 when a palette location value = 0x3 |
| FRMPAT3_C | [7:0] | 0x00 | R/W | Pattern 12 when a palette location value = 0x3 |

TABLE 15

FRMPAT4A (Frame Pattern 4A, ARM Addr = 0x6000_1038)
Frame Rate Modulation Pattern #4 Register. This register
holds the first 4 pattern register bytes (0 through 3)
used in the "3 of 9" gray scale generator.

| Name | Bit Field | Reset Value | Type | Description |
|---|---|---|---|---|
| FRMPAT4_3 | [31:24] | 0x00 | R/W | Pattern 3 when a palette location value = 0x4 |
| FRMPAT4_2 | [23:16] | 0x00 | R/W | Pattern 2 when a palette location value = 0x4 |

TABLE 15-continued

FRMPAT4A (Frame Pattern 4A, ARM Addr = 0x6000_1038)
Frame Rate Modulation Pattern #4 Register. This register
holds the first 4 pattern register bytes (0 through 3)
used in the "3 of 9" gray scale generator.

| Name | Bit Field | Reset Value | Type | Description |
|---|---|---|---|---|
| FRMPAT4_1 | [15:8] | 0x00 | R/W | Pattern 1 when a palette location value = 0x4 |
| FRMPAT4_0 | [7:0] | 0x00 | R/W | Pattern 0 when a palette location value = 0x4 |

TABLE 16

FRMPAT4B (Frame Pattern 4B, ARM Addr = 0x6000_103C)
Frame Rate Modulation Pattern #4 Register. This register
holds the pattern register bytes (4 through 7)
used in the "3 of 9" gray scale generator.

| Name | Bit Field | Reset Value | Type | Description |
|---|---|---|---|---|
| FRMPAT4_7 | [31:24] | 0x00 | R/W | Pattern 7 when a palette location value = 0x4 |
| FRMPAT4_6 | [23:16] | 0x00 | R/W | Pattern 6 when a palette location value = 0x4 |
| FRMPAT4_5 | [15:8] | 0x00 | R/W | Pattern 5 when a palette location value = 0x4 |
| FRMPAT4_4 | [7:0] | 0x00 | R/W | Pattern 4 when a palette location value = 00 |

TABLE 17

FRMPAT4C (Frame Pattern 4C, ARM Addr = 0x6000_1040)
Frame Rate Modulation Pattern #4 Register. This register
holds the last pattern register byte (8)
used in the "3 of 9" gray scale generator.

| Name | Bit Field | Rsset Value | Type | Description |
|---|---|---|---|---|
| Reserved | [31:8] | 0x000000 | RO | Reserved. Writes have no effect on field. |
| FRMPAT4_8 | [7:0] | 0x00 | R/W | Pattern 8 when a palette location value = 0x4 |

TABLE 18

FRMPAT5A (Frame Pattern 5A, ARM Addr = 0x6000_1044)
Frame Rate Modulation Pattern #5 Register. This register
holds the first 4 pattern register bytes (0 through 3)
used in the "2 of 5" gray scale generator.

| Name | Bit Field | Reset Value | Type | Description |
|---|---|---|---|---|
| FRMPAT5_3 | [31:24] | 0x00 | R/W | Pattern 3 when a palette location value = 0x5 |
| FRMPAT5_2 | [23:16] | 0x00 | R/W | Pattern 2 when a palette location value = 0x5 |
| FRMPAT5_1 | [15:8] | 0x00 | R/W | Pattern 1 when a palette location value = 0x5 |
| FRMPAT5_0 | [7:0] | 0x00 | R/W | Pattern 0 when a palette location value = 0x5 |

TABLE 19

FRMPAT5B (Frame Pattern 5B, ARM Addr = 0x6000_1048)
Frame Rate Modulation Pattern #5 Register. This register
holds the last pattern register byte (4)
used in the "2 of 5" gray scale generator.

| Name | Bit Field | Reset Value | Type | Description |
|---|---|---|---|---|
| Reserved | [31:8] | 0x000000 | RO | Reserved. Writes have no effect on this field. |
| FRMPAT5_4 | [7:0] | 0x00 | R/W | Pattern 4 when a palette location value = 0x5 |

TABLE 20

FRMPAT6A (Frame Pattern 6A, ARM Addr = 0x6000_104C)
Frame Rate Modulation Pattern #6 Register. This register
holds the first 4 pattern register bytes (0 through 3)
used in the "4 of 9" gray scale generator.

| Name | Bit Field | Reset Value | Type | Description |
|---|---|---|---|---|
| FRMPAT6_3 | [31:24] | 0x00 | R/W | Pattern 3 when a palette location value = 0x6 |
| FRMPAT6_2 | [23:16] | 0x00 | R/W | Pattern 2 when a palette location value = 0x6 |
| FRMPAT6_1 | [15:8] | 0x00 | R/W | Pattern 1 when a palette location value = 0x6 |
| FRMPAT6_0 | [7:0] | 0x00 | R/W | Pattern 0 when a palette location value = 0x6 |

TABLE 21

FRMPAT6B (Frame Pattern 6B, ARM Addr = 0x6000_1050)
Frame Rate Modulation Pattern #6 Register. This register
holds the pattern register bytes (4 through 7)
used in the "4 of 9" gray scale generator

| Name | Bit Field | Reset Value | Type | Description |
|---|---|---|---|---|
| FRMPAT6_7 | [31:24] | 0x00 | R/W | Pattern 7 when a palette location value = 0x6 |
| FRMPAT6_6 | [23:16] | 0x00 | R/W | Pattern 6 when a palette location value = 0x6 |
| FRMPAT6_5 | [15:8] | 0X00 | R/W | Pattern 5 when a palette location value = 0x6 |
| FRMPAT6_4 | [7:0] | 0x00 | R/W | Pattern 4 when a palette location value = 0x6 |

TABLE 22

FRMPAT6C (Frame Pattern 6C, ARM Addr = 0x6000_1054)
Frame Rate Modulation Pattern #6 Register. This register
holds the last pattern register byte (8)
used in the "4 of 9" gray scale generator.

| Name | Bit Field | Reset Value | Type | Description |
|---|---|---|---|---|
| Reserved | [31:8] | 0x000000 | R/W | Reserved. Writes have no effect on this field. |
| FRMPAT6_8 | [7:0] | 0x00 | R/W | Pattern 8 when a palette location value = 0x6 |

TABLE 23

FRMPAT7 (Frame Pattern 7, ARM Addr = 0x6000_1058)
Frame Rate Modulation Pattern #7 and 8 Register. This register
holds the pattern register bytes (0 and 1)
used in the "1 of 2" gray scale generator.

| Name | Bit Field | Reset Value | Type | Description |
|---|---|---|---|---|
| Reserved | [31:16] | 0x0000 | R/W | Reserved. Writes have no effect on this field. |
| FRMPAT7_1 | [15:8] | 0x00 | R/W | Pattern 1 when a palette location value = 0x7 or 0x8 |
| FRMPAT7_0 | [7:0] | 0x00 | R/W | Pattern 0 when a palette location value = 0x7 or 0x8 |

TABLE 24

FIFOWrCtl (LCD FIFO Test Write Control, ARM Addr = 0x6000_1080)
LCD FIFO test mode write control register. The LCD FIFO is accessible via this
register only when the LCDEN bit of the LCDCON2 register is 0. When LCDEN is 1,
the FIFO is inaccessible by bus masters, and only the LCD controller internal logic
has access to the FIFO.

| Name | Bit Field | Reset Value | Type | Description |
|---|---|---|---|---|
| Reserved | [31:5] | 0x0000000 | RO | Reserved. Writes have no effect on this field. |
| FIFOWriteEnable | [4] | 0 | R/W | When this bit is set, the FIFO word at FIFOWrAddress will be written w/ the value {FIFOBit33WrData[0], FIFOWrData[31:0]}. |
| FIFOWrAddress | [3:0] | 0x0 | R/W | Selectes which of the 16 LCD FIFO locations will be written when FIFOWriteEnable is set. |

TABLE 25

FIFOWrData (LCD FIFO Test Write Data, ARM Addr = 0x6000_1084) LCD FIFO test mode write data register. The LCD FIFO is accessible via this register only when the LCDEN bit of the LCDCON2 register is 0. When LCDEN is 1, the FIFO is inaccessible by bus masters, and only the LCD controller internal logic has access to the FIFO.

| Name | Bit Field | Reset Value | Type | Description |
|---|---|---|---|---|
| FIFOWrData | [31:0] | 0x0000000 | R/W | Data written to bits [31:0] of LCD FIFO location FIFOWrAddress) when FIFOWriteEnable is 1. |

TABLE 26

FIFOBit33WrData (LCD FIFO Test Write Bit33 Data, ARM Addr = 0x6000_1088) LCD FIFO test mode write data register for bit 33 of the FIFO data word. The LCD FIFO is accessible via this register only when the LCDEN bit of the LCDCON2 register is 0. When LCDEN is 1, the FIFO is inaccessible by bus master, and only the LCD the controller internal logic has access to the FIFO.

| Name | Bit Field | Reset Value | Type | Description |
|---|---|---|---|---|
| FIFOBit33WrData | [0] | 0 | R/W | Data written to bit [32] of LCD FIFO location [FIFOWrAddress] when FIFOWriteEnable is 1. The FIFO is 33 bits wide. |

TABLE 27

FIFORdCtl (LCD FIFO Test Read Control, ARM Addr = 0x6000_108C) LCD FIFO test mode read control register. The LCD FIFO is accessible via this register only when the LCDEN bit of the LCDCON2 register is 0. When LCDEN is 1, the FIFO is inaccessible by bus master, and only the LCD controller internal logic has access to the FIFO.

| Name | Bit Field | Reset Value | Types | Description |
|---|---|---|---|---|
| Reserved | [31:5] | 0x0000000 | R/W | Reserved. Writes have no effect on this field. |
| FIFORdClkEnable | [4] | 0 | R/W | When this bit is set, the FIFO location at FIFORdAddress will be readable from the FIFORdData and FIFOBit33RdData registers. This bit also enables the FIFO read clk. |
| FIFORdAddress | [3:0] | 0x0 | R/W | Selects which of the 16 LCD FIFO locations will be read when FIFORdClkEnable is set. |

TABLE 28

FIFORdData (LCD FIFO Test Read Data, ARM Addr = 0x6000_1090) LCD FIFO test mode read data register. The LCD FIFO is accessible via this register only when the LCDEN bit of the LCDCON2 register is 0. When LCDEN is 1, the FIFO is inaccessible by bus master, and only the LCD controller internal logic has access to the FIFO, and this register reads back zeros.

| Name | Bit Field | Reset Value | Type | Description |
|---|---|---|---|---|
| FIFOWrData | [31:0] | 0x0000000 | R/W | Data read from bits [31:0] of LCD FIFO location [FIFORdAddress) when FIFORdClkEnable is 1. |

TABLE 29

FIFOBit33RdData (LCD FIFO Test Write Bit33 Data, ARM Addr = 0x6000_1094) LCD FIFO test mode read data register for bit 33 of the FIFO data word. The LCD FIFO is accessible via this register only when the LCDEN bit of the LCDCON2 register is 0. When LCDEN is 1, the FIFO is inaccessible by bus masters, and only the LCD controller internal logic has access to the FIFO, and this register reads back zeros.

| Name | Bit Field | Reset Value | Type | Desedptjon |
|---|---|---|---|---|
| FIFOBit33WrData | [0] | 0 | R/W | Data read from bit [32] of LCD FIFO location [FIFORdAddress] when FIFORdClkEnable is 1. The FIFO is 33 bits wide. |

TABLE 30

List of DMA Channel Requests

| | Channel I | Channel 2 |
|---|---|---|
| Request 1 | Disabled | Used by ARM Software |
| Request 2 | Used by ARM Software | Disabled |
| Request 3 | Disabled | Disabled |
| Request 4 | Disabled | Disabled |

TABLE 31

DMA Channel 1 Source Address Pointer (DMASRC1, ARM Addr = 0x6000_0000)

| Name | Bit Field | Reset Value | Type | Description |
|---|---|---|---|---|
| DMASRC1 | [31:0] | 0 | R/W | DMA channel 1 source address pointer. Must be word aligned. Read returns the internal current source address pointer instead of written value which RDTSTEN1=0 in DMACONT1 register. Setting RDTSTEN1=1, read returns the written value of DMASRC1. |

TABLE 32

DMA Channel 1 Destination Address Pointer (DMADEST1, ARM Addr = 0x6000_0004)

| Name | Bit Field | Reset Value | Type | Description |
|---|---|---|---|---|
| DMADEST1 | [31:0] | 0 | R/W | DMA channel 1 destination address pointer. Must be word aligned. Read returns the internal current destination address pointer instead of written value which RDTSTEN1=0 in DMACONT1 register. Setting RDTSTEN1=1, read returns the written value of DMADEST1. |

TABLE 33

DMA Channel 1 Transfer Counter (DMATC1, ARM Addr = 0x6000_0008)

| Name | Bit Field | Reset Value | Type | Description |
|---|---|---|---|---|
| Reserved | [31:16] | | | Unknown during read. |
| DMATC1 | [15:0] | 0 | R/W | DMA channel 1 transfer counter up to one less than 64K transfer. Read returns the number of transfer remaining. |

TABLE 34

DMA Channel 1 Control Register (DMACONT1, ARM Addr =OX6000_OOOC

| Name | Bit Field | Reset Value | Type | Description |
|---|---|---|---|---|
| RDTSTEN1 | [31] | 0 | R/W | Source/Destination register read test enable. When clear, read source/destination address register of channel 1 returns internal value instead of written value. By setting this bit, it returns the written value. I |
| Reserved | [31:9] | | | |
| INT | [8] | 0 | R/W | When set, generates interrupt to ARM if INTEN=1. |
| INTEN | [7] | 0 | R/W | When set, the INT bit will generate interrupt to ARM. |
| RES [1:0] | [6:5] | 0 | R/W | Source request for channel 1. |
| DDEC | [4] | 0 | R/W | [DDES:DINC]=00, no address change [DDES:DINC]=10, address decrement [DDES:DINC]=01, address increment [DDES:DINC]=11, no address change |
| DINC | [3] | 0 | R/W | see above |
| SDEC | [2] | 0 | RNW | [SDES:SINCI=00, no address change [SOES:SINC]=10, address decrement [SDES:SINCI=01, address increment [SDES:SINC]=11, no address change |
| SINC | [1] | 0 | R/W | See above. |
| EN | [0] | 0 | R/W | When set, enables DMA channel. When clear, suspend DMA channel. |

TABLE 35

DMA Channel 2 Source Address Pointer (DMASRC2, ARM Addr = 0x6000_0010)

| Name | Bit Field | Reset Value | Type | Description |
|---|---|---|---|---|
| DMASRC2 | [31:0] | 0 | R/W | DMA channel 2 source address pointer. Must be word aligned. Read returns the internal current source address pointer instead of written value which RDTSTEN2=0 in DMACONT2 register. Setting RDTSTEN2=1, read returns the written value of DMASRC2. |

TABLE 36

DMA Channel 2 Destination Address Pointer (DMADEST2, ARM Addr = 0x6000_0014)

| Name | Bit Field | Reset Value | Type | Description |
|---|---|---|---|---|
| DMADEST2 | [31:0] | 0 | R/W | DMA channel 2 destination address pointer. Must be word aligned. Read returns the internal current destination address pointer instead of written value which RDTSTEN2=0 in DMACONT2 register. Setting ROTSTEN2=1, read returns the written value of OMASRC2. |

TABLE 37

DMA Channel 2 Transfer Counter (DMATC2, ARM Addr = 0x6000_0018)

| Name | Bit Field | Reset Value | Type | Description |
|---|---|---|---|---|
| Reserved | [31:16] | | | |
| DMATC2 | [15:0] | 0 | R/W | DMA channel 2 transfer counter up to one less than 64K transfer. Read returns the number of transfer remaining. |

TABLE 38

DMA Channel 2 Control Register (DMACONT2, ARM Addr = Ox6000_001C)

| Name | Bit Field | Reset Value | Type | Description |
|---|---|---|---|---|
| RDTSTEN2 | [31] | 0 | R/W | Source/Destination register read test enable. When clear, read source/destination address register of channel 2 returns internal value instead of written value. By setting this bit, it returns the written value. |
| Reserved | [30:9] | | | |
| INT | [8] | 0 | R/W | When set, generates interrupt to ARM if INTEN=1 |
| INTEN | [7] | 0 | R/W | When set, the INT bit will generate interrupt to ARM. |
| RES (1:0) | [6:5] | 0 | R/W | Source request for channel 2. |
| DDEC | [4] | 0 | R/W | [DDES:DINC]=00, no address change<br>[DDES:DINC]=10, address decrement<br>[DDES:DINC]=01, address increment<br>[DDES:DINC]=11, no address change |
| DINC | [3] | 0 | R/W | see above |
| SDEC | [2] | 0 | R/W | [SDES:SINC]=00, no address change<br>[SDES:SINC]=10, address decrement<br>[SDES:SINC]=01, address increment<br>[SDES:SINC]=11, no address change |
| SINC | [1] | 0 | R/W | See above. |
| EN | [0] | 0 | R/W | When set, enables DMA channel. When clear, suspend DMA channel. |

TABLE 39

DMA Channel 1 TimeOut Register (DMATIMEOUT1, ARM Addr = 0x6000_0020)

| Name | Bit Field | Reset Value | Type | Description |
|---|---|---|---|---|
| Reserved | [31:16] | | | |
| T01 | [15:0] | OxFFFF | R/W | The value defines a maximum number of transfers channel 1 can continuously perform after which channel 1 has to give up the permission to channel 2. |

TABLE 40

DMA Channel 2 TimeOut Register (DMATIMEOUT2, ARM Addr = 0x6000_0024)

| Name | Bit Field | Reset Value | Type | Description |
|---|---|---|---|---|
| Reserved | [31:16] | | | |
| T02 | [15:0] | OxFFFF | R/W | The value defines a maximun number of transfers channel 2 can continuously perform after which channel 2 has to give up the permission to channel 1. |

TABLE 41

DMA Global TimeOut Register (DMATIMEOUTG~ARM Addr = 0x6000_0028)

| Name | Bit Field | Reset Value | Type | Description |
|---|---|---|---|---|
| TOG | [31:0] | OxFFFFFFFF | R/W | The value defines a maximum number of transfers including channel 1 and 2 DMA can perform on the AHB bus, after which DMA has to give up the AHB bus for one cycle and re-issue the AHB bus request again in order to resume the remaining transfers. |

TABLE 42

ARM DMA Channel 1 Request Resister (DMAARMREGI, ARM Addr = OX6000_002C)

| Name | Bit Field | Reset Value | Type | Description |
|---|---|---|---|---|
| Reserved | [31:11] | | | |
| ARMREQ1 | [0] | 0 | R/W | By setting the bit, ARM request/enable the DMA channel 1 service. The bit will be automatically cleared by hardware after DMA gets the AHB bus and starts channel 1 transfer. |

TABLE 43

ARM DMA Channel 2 Request Register (DMAARMREG2, ARM Addr = 0x6000_0030)

| Name | Bit Field | Reset Value | Type | Description |
|---|---|---|---|---|
| Reserved | [31:11] | | | |
| ARMRE02 | [0] | 0 | R/W | By setting the bit ARM request/enable the DMA channel 2 service. The bit will be automatically cleared by hardware after DMA gets the AHB bus and starts channel 2 transfer. |

TABLE 44

ARM_DSP_MASK Register (ARM Addr: Ox600D_0200)

| Name | Bits | Default | Type | Description |
|---|---|---|---|---|
| DIR015-MASK: DIRQ1-MASK | [31:17] | 0 | R/W | Mask for DIRQ15-1 for ARM. Clearing the bit, mask off the corresponding DSP interrupt source from sending request to ARM. |
| | [16:0] | | | RESERVED READ VALUE: 0 |

TABLE 45

DSP_INT_MASK Register (ARM Addr. 0x8000_0204)

| Name | Bits | Default | Type | Description |
|---|---|---|---|---|
| | [31:16] | | | RESERVED READ VALUE: 0 |
| DIRQ15_MASK- | [15:1] | | R/W | Mask for DIRQ 15-1 for |

TABLE 45-continued

DSP_INT_MASK Register (ARM Addr. 0x8000_0204)

| Name | Bits | Default | Type | Description |
|---|---|---|---|---|
| DIRQ1_MASK | | | | DSP Clearing the bit, masks off the corresponding DSP interrupt source from sending request to DSP. |
| | [0] | | | RESERVED READ VALUE: 0 |

TABLE 46

SW_INT_GEN Register (ARM Addr: Ox800D_0208)

| Name | Bits | Default | Type | Description |
|---|---|---|---|---|
| SW_GEN_INT | [31:17] | 0 | R/W | When set, lets ARM core interrupt DSP via DSP interrupt [15:1] using the lower bits of this register. |
| | [16] | | | RESERVED READ VALUE: 0 |
| SW_INT15-SW INT1 | [15:1] | 0 | R/W | Software Interrupt values for DSP interrupt 15-1. When the bit is set and corresponding SW_GEN_INT[x] bit is set as well, the interrupt generated by DSP hardware peripheral will be ignored. |
| | [0] | | | RESERVED READ VALUE: 0 |

TABLE 47

FIQ_INT_MASK Register (ARM Addr: Ox80VD_020C)

| Name | Bits | Default | Type | Description |
|---|---|---|---|---|
| FIQ_MASK 31:FIQ_MASK_0 | [31:0] | 0 | R/W | All 32 interrupts listed on ARM IRQ[31:0] side can be selected to generate ARM FIQ. Clearing the bit, mask off the corresponding interrupt source from generating FIQ. ARM Int[1] (the software-only self-generated interrupt) is not affected by FIQ_MASK_1. |

TABLE 48

Interrupt map for the ARM IRQs and FIQs

| Name | Mapped to: |
|---|---|
| IRO0 | Clocks Control interrupts (SYSCON) |
| IR01 | ARM controlled self-generated interrupt |
| IRQ2 | Logic 'OR' of 4 IPC interrupts |
| IR03 | GPIO interrupt |
| IR04 | Logic "OR' of 2 DMA interrupt |
| IR05 | Logic 'OR' of 6 interrupts from three Timers |
| IRQ6 | RTC interrupt |
| IRQ7 | Logic OR' of 2 USB interrupts |
| IRQB | Logic 'OR' of 4 DART interrupts |
| IRC19 | 12C interrupt |
| IR010 | Logic "OR" of 3 SPI interrupts |
| IRQ11 | ADC Interrupt |

TABLE 48-continued

Interrupt map for the ARM IRQs and FIQs

| Name | Mapped to: |
|---|---|
| IR012 | ARM Wakeup from Sleep Mode interrupt. Generated any rising edge of GPIO [3:O] or falling edge of GPIO [7:4] during ARM Steep Mode. |
| IR013 | Reserved |
| IR014 | Reserved |
| IR015 | Reserved |
| IR016 | Reserved |
| IR017–31 | DSP Interrupts from DSPINTI (IRQ17) b DSPINT15 (IRQ 31) |

TABLE 49

Interrupt map for the DSP Interrupts

| Name | Mapped to: |
|---|---|
| DSPint0 | Reserved for DSP embedded 12C port only for debugging purpose. |
| DSPint1 | DSP debugger Interrupt |
| DSPint2 | Main PLL (PLLO) out-of-lock interrupt |
| DSPint3 | Second PLL (PLL1) out-of-lock interrupt |
| DSPint4 | Digital Audio input full interrupt. |
| DSPint5 | Digital Audio output empty interrupt |
| DSPint6 | Digital Audio input half-full interrupt |
| DSPint7 | Digital Audio output half-empty interrupt |
| DSPint8 | Digital Audio input FS (sample rate) interrupt |
| DSPint9 | Digital Audio output FS interrupt |
| DSPint10 | DSP STCTmer interrupt |
| DSPint11 | ARM Attention 1 (ARM is able to interrupt DSP using proper SW_INT_GEN setting). No harware source is connected to this interrupt.) |
| DSPint12 | ARM Attention 2 (ARM is able to interrupt DSP using proper SW_INT_GEN setting). No harware source is connected to this interrupt) |
| DSPint13 | ARM Attention 3 (ARM is able to interrupt DSP using proper SW_INT_GEN setting). No harware source is connected to this interrupt.) |
| DSPint14 | ARM Attention 4 (ARM is able to interrupt DSP using proper SW_INT_GEN setting). No harware source is conned to this interrupt.) |
| DSPint15 | ARM Attention 5 (ARM is able to interrupt DSP using proper SW_INT_GEN setting). No hardware source is connected to this interrupt.) |

TABLE 50

ADC Control/Status Register (32 bits, ARM addr: 0004)

| Name | Bits | Description | Default Value | Read/write |
|---|---|---|---|---|
| | [31:10] | Reserved. | 0 | |
| COUNTERLATCH | [9] | Latch the value of the counter to the data register in test mode. | 0 | R/W |
| COUNTER RST | [8] | Reset counter. | 0 | R/W |
| TEST_MODE | [7] | When 1, ADC runs in test mode. | 0 | R/W |
| TEST-CLOCK | [6] | When the ADC is in test mode, this bit can be flipped manually to run the counter. | 0 | R/W |
| CLBR_MODE | [5] | 1'b1: calibration before every A/D conversion 1'b0: one-time calibration when ADC-EN is activated | 0 | R/W |
| CLBR_READY | [4] | When offset calibration is over, this bit is set to 1. | 0 | R |

TABLE 50-continued

ADC Control/Status Register (32 bits, ARM addr: 0004)

| Name | Bits | Description | Default Value | Read/write |
|---|---|---|---|---|
| ADC-EN | [3] | ENABLE flag for the ADC. When 0, the ADC is in power down mode | 0 | R/W |
| ADC-DATA-READY | [2] | When this bit is 1, the data in data register is ready for DSP to read. ARM will set this bit to 0 every time when ARM read data from data register. | 0 | R |
| ADC_INTEN | [1] | Interrupt enable. When 1. ADC could send interrupt to ARM. | 0 | R/W |
| ADC_IN_SEL | [0] | ADC input source select: 1b1=Vin1 1'b0=Vtn0 | 0 | R/W |

TABLE 51

ADC DATA Register (32 bits, ARM addr: 0000)

| Name | Bits | Description | Default Value | Read/Write |
|---|---|---|---|---|
|  | [31:8] | Set to 0. |  |  |
| ADC DATA | [7:0] | Sample value. | 0 | R |

TABLE 52

ADC Divider Value Register (32 bits, ARM addr: 0008)

| Name | Bits | Description | Default Value | Read/Write |
|---|---|---|---|---|
| ADC_DV | [31:0] | Set the divider value to treat the sample clock from ADC clock generated in clock manager. | 0 | R/W |

TABLE 53

Clock Control Register 1 (CMCTL1) for PLL1 (ARM Addr: 0x8007_0000)

| Name | Bits | Default | Type | Description |
|---|---|---|---|---|
| lockb_intl | [31] |  | R | Sticky bit for lockb_int. This is set when the lockb_int is asserted when the pll looses lock and Men is set. Can be reset by writing 0. Rst value 0 |
|  | [30:28] | 0 |  | Reserved. |
| Ipcmp1 | [27] | 0 | R/W | PLL fdbk loop complete for testing. Rst viol = 0; when 1, selects vco as fdbk src. Even ff tan is 1. |
|  | [28:24] | 0 |  | Reserved. |
| LOCKBI | [23] |  | R | PLL lock indicator. Low when PLL is locked. |
| VBLOCK1 | [22] |  | R | VCO Bias lock indicator. Goes low when VCO bias current calibration sequence has completed. |
| HIGH | [21] |  | R | High Frequency indicator flag for VCO bias calibration. 0: VCO frequency less than reference frequency 1: VCO frequency greater than reference frequency |
| LOW | [20] |  | R | Low Frequency indicator flag for VCO bias calibration. 1: VCO frequency less than reference frequency 0: VCO frequency greater than reference frequency |
| HILO_VALID | [19] |  | R | When this bit toggles, a new measurement is taken to compare the VCO frequency with the reference frequency; used in VCO bias calibration |
| VBLOCK_RST | [18] | 0 | R/W | When set, initiates the calibration circuits and clears the VBLOCK bit if necessary. In order to perform bias calibration, assert this bit high and de-assert after the HILO_VALID bit toggles. In normal operation, this bit should be low. |
|  | [17] |  |  | Reserved |
| VCO81 | [18:11] | Ox1C | R/W | VCO Bias value. Controls bias current to the VCO. The reset value is Ox1C. It can not be written when BLEN=1 |
| TCM1 | [10] | 0 | R/W | Test mode. Drives D1 and D2 dividers with DSP clock instead of VCO output. Gives controlled test visibility for all dividers |
| PWRDN | [9] | 0 | R/W | PLL Power down mode, Default 0 |
| LKIEN | [8] | 0 | R/W | PLL lock interrupt enable. When set, a rising edge of LOCK generates an interrupt to the DSP |
| BLEW | [7] | 0 | R/W | Bias lock enable. When set, enables VCO bias calibration sequence. |
| CP_TRI | [6] | 0 | R/W | Tristate Charge Pump. When set, it tristates the VCO charge pump, and allows characterization of the VCO. |
| DSPBYP | [5] | 0 | R/W | Routes DSPCLK to AUDIO Clocks when set. |
| EXTEND | [4] | 0 | R/W | When set, it switches on an onset bias current that allows the VCO to run −20 MHz faster than the current VCOB setting. |
| BIAS TST | [3] | 0 | R/W | BIAS Test Enable for VCO bias current. When set, it muxes out the bias current to FLT2 pin for testing purposes |
| VCOENI | [2] | 0 | R/W | VCO Enable. When dear, VCO tuning voltage is set to its nominal value. When set, VCO is enabled to track tuning voltage changes. |
| RDSW1 | [1] | 0 | R/W | Read switch. When cleared, reading M, N, G. HDTV, PDIV, MDIV, DSP-DIV or D values gives values |

TABLE 53-continued

Clock Control Register 1 (CMCTL1) for PLL1 (ARM Addr: 0x8007_0000)

| Name | Bits | Default | Type | Description |
|---|---|---|---|---|
| | | | | written to modulo register. When set, reading M, N. G, HDTV, PDIV, MDIV, DSPDIV or D gives actual counter value for test visibility. |
| REF1 | [0] | 0 | R/W | Reference Clocks Source Selector:<br>0: Reference Clock = on-chip 32 KHz oscillator<br>1: Reference Clocks - Ext clock |

TABLE 54

Supporting Frequency and Dividers for PLL1

| f_ref (kHz) | f_vco (MHz) | f_PD (KHz) | f_AudClk (MHz) | FS(KHz) | f_UARTCLK1 (MHz) | f_SYSCLK (MHz) | M1 | N | D1 | G1 | H1 |
|---|---|---|---|---|---|---|---|---|---|---|---|
| 32.768 | 147.456 | 32.768 | 24.576 | 48.000 | 3.6864 | 73.728 | 1 | 41500 | 6 | 40 | 2 |
| 32.768 | 158.073 | 32.768 | 22.582 | 44.105 | 3.6761 | 79.037 | 1 | 4824 | 7 | 43 | 2 |
| 32.786 | 147.456 | 32.768 | 16.384 | 32.000 | 3.6864 | 73.728 | 1 | 4500 | 9 | 40 | 2 |

TABLE 55

Supporting Frequency and Dividers for PLL2

| f_ref (KHz) | f_vco (MHz) | f_PD (KHz) | f_AudClk (MHz) | FS(KHz) | f_UARTCLK2 (MHz) | F_USBCLK (MHZ) | M2 | N2 | D2 | G2 | H2 |
|---|---|---|---|---|---|---|---|---|---|---|---|
| 32.768 | 48.005 | 32.768 | N/A | N/A | 3.6927 | 48.005 | 1 | 1465 | 1 | 13 | N/A |
| 32.768 | 47.972 | 32.768 | N/A | N/A | 3.6902 | 47.972 | 1 | 1464 | 1 | 13 | N/A |
| 32.768 | 47.940 | 32.768 | N/A | N/A | 3.6877 | 47.940 | 1 | 1463 | 1 | 13 | N/A |

TABLE 56

MCLK/HCLK/PCLK/DSPCLK frequencies

| f_SYSCLK (MHZ) | Divider Value (MCLKDIV/HCLKDIV/PCLKDIV/DSPCLKDIV) | Frequency (MHz) (f_MCLK/f_HCLK/f_PCLK/f_DSPCLK) |
|---|---|---|
| 73.728 | 1 | 73.728 |
| 73.728 | 1.5 | 49.152 |
| 73.728 | 2 | 36.864 |
| 73.728 | 3 | 24.576 |
| 73.728 | 4 | 18.432 |
| 73.728 | 5 | 14.745 |
| 73.728 | 6 | 12.288 |
| 73.728 | 7 | 10.533 |
| 73.728 | 8 | 9.216 |
| 79.037 | 1 | 79.037 |
| 79.037 | 1.5 | 52.691 |
| 79.037 | 2 | 39.519 |
| 79.037 | 3 | 26.346 |
| 79.037 | 4 | 19.759 |
| 79.037 | 5 | 15.807 |
| 79.037 | 6 | 13.173 |
| 79.037 | 7 | 11.291 |
| 79.037 | 8 | 9.880 |

TABLE 57

Clock Control Register2 (CMCTL2) for PLL2 (ARM Addr: 0x8007_0004)

| Name | Bits | Default | Type | Description |
|---|---|---|---|---|
| lockb_int2 | 31 | | R | Sticky bit for lockb int. This is set when the lockb_int is asserted when the PLL looses lock and Wen is set. Can be reset by writing 0. Rst value 0 |
| | 30:28 | 0 | | reserved. Read vat 3'b000 |
| Ipcmp2 | 27 | 0 | R/W | PLL fdbk loop complete for testing. Rst value=0, when VCO selects as feedback source |
| | 26:24 | 0 | | reserved: read value Yb000 |
| LOCKB2 | 23 | | R | PLL lock indicator. Low when PLL is locked. |
| VBLOCK2 | 22 | | R | VCO Bias lock indicator. Goes low when VCO bias current calibration sequence has completed |
| HIGH | 21 | | R | High Frequency indicator flag for VCO bias calibration.<br>0: VCO frequency less than reference frequency |

TABLE 57-continued

Clock Control Register2 (CMCTL2) for PLL2 (ARM Addr: 0x8007_0004)

| Name | Bits | Default | Type | Description |
|---|---|---|---|---|
| LOW | 20 | | R | 1: VCO frequency greater than reference frequency Low Frequency indicator flag for VCO bias calibration. 1: VCO frequency less than reference frequency 0: VCO frequency greater than reference frequency |
| HILO-VALID | 19 | | R | When this bit toggles, a new measurement is taken to compare the VCO frequency with the reference frequency; used in VCO bias calibration |
| VBLOCK_RST | 18 | 0 | R/W | When set, it initiates the calibration circuits and clears the VBLOCK bit if necessary. In order to perform bias calibration, assert this bit high and de-assert after the HILO_VALID bit toggles. In normal operation, this bit should be low. |
| LCDSEL | 17 | | R/W | Set source for LCD dk: 0: VCO1 1: VCO2 Reset value 0 |
| VCOB2 | 18:11 | 0x11 | R/W | VCO Bias value. Controls bias current to the VCO. The reset value is 0x11. |
| TCM2 | 10 | 0 | R/W | Test mode. Drives D1 and D2 dividers with DSP clock instead of VCO output. Gives controlled test visibility for all dividers. |
| PWRDN | 9 | 0 | R/W | PLL power down mode, Default 1 |
| LKIEN | 8 | 0 | R/W | PLL lock interrupt enable. When set, a rising edge of LOCK generates an interrupt to the DSP |
| BLEN2 | 7 | 0 | R/W | Bias lock enable. When set, enables VCO bias calibration sequence. |
| CP TRI | 6 | 0 | R/W | Tristate Charge Pump. When set, it tristates the VCO charge pump, and allows characterization of the VCO. |
| USBBYP | 5 | 0 | R/WI | Route USBCLK to AudClk output. When USBBYP asserted, supersedes DSPBYP |
| EXTEND | 4 | 0 | R/W | When set, it switches on an offset bias current that allows the VCO to run −20 MHz faster than the current VCO setting. |
| BIAS_TST | 3 | 0 | R/W | BIAS Test Enable for VCO bias current. When set, it muxes out the bias, current to FLT? pin for testing purposes |
| VCOEN2 | 2 | 0 | R/W | VCO Enable. When clear, VCO tuning voltage is set to its nominal value. When set, VCO is enabled to track tuning voltage changes. |
| RDSW2 | 1 | 0 | R/W | Read switch. When cleared, reading M, N, CA HDTV, PDIV, MDIV, DSP-DIV or D values gives values written to modulo register. When set, reading M, N. G HDTV, PDIV, MDIV, DSPDIV or D gives actual counter value for test visibility. |
| REF? | 0 | 0 | R/WI | Reference Clocks Source Selector: 0: Reference Clocks = On-chip 32 KHz oscillator 1: Reference Clocls = Ext clock |

TABLE 58

Clock Divider Register 1 (CMDIVI) for PLL1 (ARM Addr: 0x8007_0008)

| Name | Bits | Default | Type | Description |
|---|---|---|---|---|
| D1 | [31:28] | 0x5 | R/W | 4-bit value for divide-by-D counter. |
| M1 | [27:14] | 0 | R/W | 14-bit value for divide-by-M counter. |
| N1 | [13:0] | 0x1193 | R/W | 14-bit value for divide-by-N counter. |

TABLE 59

Clock Divider Register 2 (CMDIV2) for PLL2 (ARM Addr: 0x8007_OOOC)

| Name | Bits | Default | Type | Description |
|---|---|---|---|---|
| D2 | [31:28] | 0 | R/W | 4-bit value for divide-by-0 counter. |
| M2 | [27:14] | 0 | R/W | 14-bit value for divide-by-M counter. |
| N2 | [13:0] | 0x5b8 | R/W | 14-bit value for divide-by-N counter. |

TABLE 60

Clock Divider Register 3 (CMDIV3) for UART (ARM Addr: 0x8007_0010)

| Name | Bits | Default | Type | Description |
|---|---|---|---|---|
| | [31:18] | | | Reserved |
| UARTEN | [17] | 0 | R/W | UART clock enable. |
| USEL | [16] | 0 | R/W | Select source of DART CLK: O: PLL 1 1: PLL 2 |
| | [15:14] | | | Reserved |
| G2 | [13:8] | 0x0C | R/W | 6-bit G2 counter. |
| | [7:6] | | | Reserved. |
| G1 | [5:0] | 0x27 | R/W | 6-bit G1 counter. |

TABLE 61

Clock Configuration Register 1 (CMCFG1) for PLL1 (ARM Addr: 0x8007_0014)

| Name | Bits | Default | Type | Description |
|---|---|---|---|---|
| | [31:24] | | | Reserved |
| PHASE_LOCK | [23] | | R | Set when phase difference is smaller than the defined value. |
| FREQ_LOCK | [22] | | R | Set when frequency variation between reference clock and VCO feed-back clock is smaller than the defined range. |
| DSPCLKEN | [21] | 0 | R/W | DSP clock enable. |
| HCLKEN | [20] | 1 | R/W | AHB clock enable. |
| PHASE_LOCKB_S | [19] | | R/W | Sticky bit. Set when PHASE_LOCK bit is 0. Cleared by DSP writing 0. |
| FREQ_LOCKB_S | [18] | | R/W | Sticky bit. Set when FREQ_LOCK bit is 0. Cleared by DSP writing 0 |
| FSCLKEN | [17] | 0 | | Audio clock enable. |
| PHASE_LOCK_EN | [15] | 0 | R/W | When set. Phase difference measurement component is selected for PLL lock evaluation. |
| FREQ_LOCK_EN | [14] | 0 | R/W | When set. Frequency comparator is selected for PLL lock evaluation. |
| MCLKEN | [13] | 1 | R/W | ARM clock enable. |
| PCLKEN | [12] | 1 | R/W | APB Clock enable. |
| PHASE_LOCK_DS | [11:8] | 0 | R/W | Phase Lock Detector Sensitivity. It is considered phase out-of-lock when more than PHASE_LOCK_DS+1) consecutive samples with UP_DN_DIFF low. |
| FREQ_LOCK_DS | [7:4] | 0 | R/W | Frequency Lock Detector Sensitivity. It is considered frequency out-of-lock when the variation between reference clock and VCO feedback clock is greater than (FREQ_LOCK_DS+1)/128. |
| HYST_F_OUTLOCK | [3:2] | 0 | R/W | (HYST_F_OUTLOCK+1) is the hysteresis value when frequency out of lock is evaluated; the hysteresis value is the number of consecutive measurements of which the variation of two clocks is greater than the desired range. |
| HYST_F_INLOCK | [1:0] | 0 | R/W | (HYST_F_INLOCK+1) is the hysteresis value when frequency into lock is evaluated; the hysteresis value is the number of consecutive measurements of which the variation of two clocks is smaller than the desired range. |

TABLE 62

Clock Configuration Register 2 (CMCFG2) for PLL2 (ARM Addr: 0x8007_0018)

| Name | Bits | Default | Type | Description |
|---|---|---|---|---|
| | [31:24] | | | Reserved |
| PHASE_LOCK | [23] | | R | Set when phase difference is smaller than the defined value. |
| FREQ_LOCK | [22] | | R | Set when frequency variation between reference clock and VCO feedback clock is smaller than the defined range. |
| DISPCLKEN | [21] | 0 | R/W | Enable for display (LCD) clock. |
| ADCCLKEN | [20] | 0 | R/W | Enable for ADC clock. |
| PHASE_LOCKB_S | [19] | | R/W | Sticky bit. Set when PHASE_LOCK bit is 0. Cleared by DSP writing 0. |
| FREQ_LOCKB_S | [18] | | R/W | Sticky bit. Set when FREQ_LOCK bit is 0. Cleared by DSP writing 0. |
| USBCLKEN | [17] | 0 | | USB clock enable. Default 0 |
| PHASE_LOCK_EN | [15] | 0 | R/W | When set. Phase difference measurement component is selected for PLL lock evaluation. |

TABLE 62-continued

Clock Configuration Register 2 (CMCFG2) for PLL2 (ARM Addr: 0x8007_0018)

| Name | Bits | Default | Type | Description |
|---|---|---|---|---|
| FREQ_LOCK_EN | [14] | 0 | R/W | When set. Frequency comparator is selected for PLL lock evaluation. |
|  | [13:12] | 1 | R/W | Reserved |
| PHASE-LOCK-S | [11:8] | 1 | R/W | Phase Lock Detector Sensitivity. It is considered phase out-of-lock when more than (PHASE_LOCK_DS+1) consecutive samples with Up_Dn_Diff low. Default 0. |
| FREQ_LOCK_DS | [7:4] | 0 | R/W | Frequency Lock Detector Sensitivity. It is considered frequency out-of-lock when the variation between reference clock and VCO feedback clock is greater than (FREQ_LOCK DS+1)/128. Default 0. |
| HYST_F_OUTLOCK | [3:2] | 0 | R/W | (HYST_F_OUTLOCK+1) is the hysteresis value when frequency out of lock is evaluated; the hysteresis value is the number of consecutive measurements of which the variation of two clocks is greater than the desired range. Default 0. |
| HYST_F_INLOCK | [1:0] | 0 | R/W | HYST_F_INLOCK+1) is the hysteresis value when frequency into lock is evaluated; the hysteresis value is the number of consecutive measurements of which the variation of two clocks is smaller than the desired range. Default 0. |

TABLE 63

Clock Configuration Register 3 (CMCFG3) for Clock Dividers (ARM Addr: 0x8007_001C)

| Name | Bits | Default | Type | Description |
|---|---|---|---|---|
| ADCDIV | [31:28] | 0x3 |  | 4 bit value for ADCDIV. Value = divider − 1; reset val = 'b0011 |
| DISPDIV | [27:24] | 0xF |  | 4 bit value for DISPDIV. Value = divider − 1; reset val = 'b1111 |
| ARM_LCK | [20] | 1 |  | The 3 ARM clocks rising edges are locked when this is set. reset val 'b1 |
| PDIV | [19:16] | 0x3 |  | 4 bit value for PDIV. Value = divider − 1; reset val = 'b0011 |
| MDIV | [15:12] | 0x3 |  | 4 bit value for MDIV. Value = divider − 1; reset val = 'b0011 |
| HDIV | [11:8] | 0x3 |  | 4 bit value for HDIV. Value = divider − 1; reset val = 'b0011 |
| DSPDIV | [7:4] | 0x3 |  | 4 bit value for DSPDIV. Value = divider − 1; reset val = 'b0011 |
| SYSDIV | [3:0] | 0xF |  | 4 bit value: Divide by = (SYSDIV + 1). SYSDIV = 'b0000 is invalid. At reset DSPDIV = 'b1111 => Divider is div by 16 of VCO |

TABLE 64

Data Interface Register (DATAI, ARM Address: 0x8005_0000)

| Name | Am | DetWlt | Type | Description |
|---|---|---|---|---|
|  | 31:4 |  |  | Reserved. |
| SLA1 | 3 | 0 | R/W | When SLA1 pin is configured as an output, it follows data written to this register bit On read the SLA1 pin state is reported on this bit, not the value written |
| SLAG | 2 | O | R/W | When SLAO pin is configured as an output, it follows data written to this register bit On read the SLAG pin state is reported on this bit, not the value written. |
| EEDAT | 1 | 0 | R/W | When EEDAT pin is configured as an output, it pin follows data written to this register bit On read, the EEDAT pin state is reported on this bit, not the value written. |
| EECLK | 0 | 0 | R/W | When EECLK pin is configured as an output, it follows data written to this register bit. On read, EECLK pin state is reported on this bit, not the value written. |

TABLE 65

Configuration Interface Register (CFGI, ARM Address: 0x8005_0004)

| Name | Bit | Default | Type | Description |
|---|---|---|---|---|
| | (31:18] | | | Reserved. |
| INTEN | [17] | 0 | R/W | Interrupt Enable: 1 - Transition (either high or low) on EECLK input generates an interrupt and sets the INT bit to a one; 0 - ignore transitions on EECLK, hold INT cleared |
| INT | [16] | 0 | R | Interrupt status (read-only): Set by a transition on the EECLK input when INTEN is high. Cleared by writing a one to the bit, or by writing zero to INTEN. |
| | [15:14] | | | Reserved. |
| STRT | [13] | 0 | R/W | EEPROM Engine Start: Transition from 1 to 0, when DIS bit is low, starts the EEPROM engine. Used by software to initiate EEPROM loads. |
| DIS | [12] | 0 | R/W | EEPROM Engine Disable: 1 - Halts any EEPROM engine activity, or prevents engine from starting of it has not begun. Used by software to gain control of the 12C port. |
| FDBCK | [11] | | | Data feedback source select: 1 - Data source for Data Interface reads is the output register bit: 0 - Data source for Data Interface reads is the pin. Used for port test. |
| EESPD | [10] | 0 | R/W | EEPROM engine clock speed: Engine runs at 1× normal speed, 0 - Engine runs at normal speed. |
| EEST | [9] | 0 | R | EEPROM engine status (read-only): 1 - Engine active, 0 - Engine inactive. |
| EELD | [8] | 0 | R | EEPRO load status (load-only): 0 = EEPROM load aborted (EE not present or header mismatch). 1 + EEPROM load successful. |
| S10D | [7] | 0 | R/W | The SLA1 driver type: 1 - Open-drain. 0 - Push-pull. |
| SOOD | [6] | 0 | R/W | The SLAO driver type: 1 - Open-drain. 0 - Push-pull. |
| DOD | [5] | 0 | R/W | The EEDATA driver type: 1 - Open-drain, 0 - Push-pull. |
| COD | [4] | 0 | R/W | The EECLK driver type: 1 - Open-drain, 0 - Push-pull. |
| S1 DIR | [3] | 1 | R/W | The SLA1 pin direction: 1 - Output, 0 - Input |
| SODIR | [2] | 1 | R/W | The SLAO pin direction: 1 - Output, 0 - Input. |
| DDIR | [1] | 0 | R/W | The EEDATA pin direction: 1 - Output, 0 - Input. |
| CDIR | [0] | 0 | R/W | The EECLK pin direction: 1 - Output, 0 - Input. |

TABLE 66

Test Control Register (ARM Address: 0x8O05_0008)

| Name | Bits - | Default | Type | Description |
|---|---|---|---|---|
| | [31:2] | | | Reserved. |
| TESTEN | [1] | 0 | R/W | Enable the test mode when set |
| TISEL | [0] | 0 | R/W | Use the data in test input stimulus register as input instead of pins. |

TABLE 67

Test Control Register (ARM Address: Ox8005_OOOC)

| Name | Bit | Default | Type | Description |
|---|---|---|---|---|
| | [31:8] | | | Reserved. |
| TISR | [7:0] | 0 | RnW | Test control data. Data value used when TISEL bit is high. It provides the data bit for exercising the block. |

TABLE 68

EEPROM Configuration Content

| Byte Offset | Field Description | Configuration Location | Notes |
|---|---|---|---|
| 0 | Header/Version: Constant 55h | N/A | Abort if <> 55h |
| 1 | Configuration word 0, byte 0 | 0x8005 0010 | |
| 2 | Configuration word 0, byte 1 | 0x8005_0011 | |
| 3 | Configuration word 0, byte 2 | 0x8005 0012 | |
| 4 | Configuration word 0, byte 3 | 0x8005_0013 | |
| 5 | Configuration word 1, byte 0 | 0x8005_0014 | |
| 6 | Configuration word 1, byte 1 | 0x8005_0015 | |
| 7 | Configuration word 1, byte 2 | 6x8005_0018 | |
| 8 | Configuration word 1, byte 3 | 0x8005_0017 | |
| 9 | Configuration word 2, byte 0 | 0x8005_0018 | |
| 10 | Configuration word 2, byte 1 | 0x8005_0019 | |
| 11 | Configuration word 2, byte 2 | Ox8005_001A | |
| 12 | Configuration word 2, byte 3 | 0x8005_0018 | |
| 13 | Configuration word 3, byte 0 | Ox8005_001C | |
| 14 | Configuration word 3, byte 1 | 0x8005_001 D | |
| 15 | Configuration word 3, byte 2 | 0x8005_001 E | |
| 16 | Configuration word 3, byte 3 | 0x8005 001F | |
| 17 | Configuration word 4, byte 0 | 0x8005 0020 | |
| 18 | Configuration word 4, byte 1 | 0x8005 0021 | |
| 19 | Configuration word 4, byte 2 | 0x8005 0022 | |
| 20 | Configuration word 4, byte 3 | 0x8005_0023 | |
| 21 | Configuration word 5, byte 0 | 0x8005_0024 | |
| 22 | Configuration word 5, byte 1 | 0x8005_0025 | |
| 23 | Configuration word 5, byte 2 | 0x8005 0026 | |
| 24 | Configuration word 5, byte 3 | 0x8005_0027 | |
| 25 | Configuration word 6, byte 0 | 0x8005_0028 | |
| 26 | Configuration word 6, byte 1 | 0x8005 0029 | |
| 27 | Configuration word 6, byte 2 | 0x8005 O02A | |
| 28 | Configuration word 6, byte 3 | 0x8005 0028 | |
| 29 | Configuration word 7, byte 0 | 0x8005 002C | |

TABLE 68-continued

EEPROM Configuration Content

| Byte Offset | Field Description | Configuration Location | Notes |
|---|---|---|---|
| 30 | Configuration word 7, byte 1 | 0x8tO5_002D | |
| 31 | Configuration word 7, byte 2 | 0x8005_O02E | |
| 32 | Configuration word 7, byte 3 | 0x8005 002E | |
| 33 | Configuration word 8, byte 0 | 0x8005_0030 | |
| 34 | Configuration word 8, byte 1 | 0x8005 0031 | |
| 35 | Configuration word 8, byte 2 | 0x8005 0032 | |
| 36 | Configuration word 8, byte 3 | 0x8005_0033 | |
| 37 | Configuration word 9, byte 0 | 0x8005_0034 | |
| 38 | Configuration word 9, byte 1 | 0x8005_0035 | |
| 39 | Configuration word 9, byte 2 | 0x8005 0036 | |

TABLE 69

RTO Control Register (RTCCR ARM Address: 0x8009_0010

| Name | Bit | Default | Type | Description |
|---|---|---|---|---|
| | [31:2] | | | Same as RTCCR defined in PrimeCell-RTC documents |
| RTCRSTST | [1] | 0 | R/W | Reset status. The flag can be used to distinguish different resets. |
| | [0] | | R/W | Same as RTCCR defined in PrimeCell-RTC documents |

TABLE 70

USB Standard Request Codes

| BRequest | Value | Supported |
|---|---|---|
| GET_STATUS | 0x0 | yes |
| CLEAR-FEATURE | 0x1 | yes |
| Reserved | 0x2 | n/a |
| SET FEATURE | 0x3 | yes |
| Reserved | 0x4 | n/a |
| SET ADDRESS | 0x5 | yes |
| GET DESCRIPTOR | 0x8 | yes |
| SET DESCRIPTOR | 0x7 | no |
| GET CONFIGURATION | 0xe | yes |
| SET CONFIGURATION | 0x9 | yes |
| GET_INTERFACE- SET_INTERFACE | 0xA us | yes yes |
| SYNCH FRAME | 0xC | no |
| USB Vendor/Class Commands | | |

TABLE 71

USBCTL (USB Control Register, ARM Address = 0x8000_0000)

| Name | Bit | Reset Value | Type | Description |
|---|---|---|---|---|
| UDC-STATE | [11:9] | 000 | R | These are the internal state bits for the UDC side of the USB-APB bridge:<br>000 UDC-IDLE<br>001 UDC-READ<br>010 UDC_WRITE<br>011 UDC-SETUP-WRITE<br>100 UDC_FIFO_WRITE<br>101 UDC-FIFO-READ<br>110 UDC-STALL |
| ARMCFGRDY | [8] | 0 | R/W | Set by ARM after the USB-APB bridge configuration registers are programmed. At this point the bridge will begin sending the appropriate bytes to the UDC. |
| VC_CMDEN | [7] | 0 | R/W | When set, Vendor/Class commands are supported. When clear, the bridge will NAK the UDC which will then NAK the host over the USB cable if Enpoint 1 is accessed. |
| BRIDGERST | [6] | 0 | W | Set this bit to 1 to reset the USB-APB bridge. This bit is self resetting so, although reading is supported, it is not meaningful. Setting this bit will reset the bridge state, DG registers, and FIFO state. It does not reset the UDC. Due to the self-resetting nature of this bit, once this bit is set microprocessor 101 should not write to the bridge for at least four APB clocks to allow all registers to reset and the bit to self-reset. |
| USBBLKDIR | [5] | 0 | R | USB bulk transfer direction. When 0, Bulk IN is in progress. When 1, Bulk OUT is in progress. |
| UDCSTALL | [4] | 0 | R/W | When set, the bridge will stall the UDC which in turn will stall the host. The UDC stores the stall state until cleared by the host through a CLEAR FEATURE command. |
| UDCRESUME | [3] | 0 | R/W | Set high to resume USB operation from suspend mode. Setting this bit when UDCSUSPND is asserted will initiate the remote wakeup feature. This bit is cleared automatically after the de-assertion of UDCSUSPND. Setting this bit when UDCSUSPEND is not set has no effect |
| UDCSUSPND | [2] | 0 | R | Set when USB cable in suspend mode (idle for 3 ms or set by host). Cleared when USB cable goes non-idle or microprocessor 101 sets the UDCRESUME bit. |
| UDCCFGRDY | [1] | 0 | R | Set when the USB, APB bridge has completed the initialization of the UDC from FIFO0 |
| USBEN | [0] | 0 | R/W | USB Port Enable. When low, the UDC is held in reset. Set high in normal operation. If this bit is cleared after having been set, the ARM must reinitialize the UDC configuration registers. |

TABLE 72

USBDAT0 (USB DATA0 Register, ARM Address = 0x8000_0004)

| Name | Bit | Reset Value | Type | Description |
|---|---|---|---|---|
| DATA0 | [31:0] | 0x00000000 | R/W | DATA for FIFO0 Unregistered access to FIFO0 is accomplished through this port. Microprocessor 101 can fill or drain the FIFO as needed without any intervention from the UDC or bridge. |

TABLE 73

USBDAT1 (USB DATA1 Register, ARM Address = 0x8000_0008)

| Name | Bit | Reset Value | Type | Description |
|---|---|---|---|---|
| DATA1 | [31:0] | 0x00000000 | R/W | DATA for FIF01. Unregistered access to FIF01 is accomplished through this port. Microprocessor 101 can fill/drain the FIFO as needed without any intervention from the UDC or bridge. |

TABLE 74

USBDATCN0 (USB DATA0 FIFO Control Register, ARM Address = Ox8000_OOOC)

| Name | Bit | Reset Value | Type | Description |
|---|---|---|---|---|
| TOTLCNT | [7:0] | 0x00 | R/W | When a Bulk OUT packet is received by the bridge from the UDC this register is loaded with the number of valid bytes. When a Bulk IN is active this register is written by microprocessor 101 to indicate the number of valid bytes in the FIFO. Writing this register is an indication to the bridge that microprocessor 101 is done writing the FIFO and data can then be sent to the UDC. |

TABLE 75

USBDATCN1 (USB DATA1 FIFO Control Register, ARM Address = 0x8000_0010)

| Name | Bit | Reset Value | Type | Description |
|---|---|---|---|---|
| TOTLCNT | [7:0] | 0x00 | R/W | When a Bulk OUT packet Is received by the bridge from the UDC, this register is loaded with the number of valid bytes. When a Bulk IN is active this register is written by microprocessor 101 to indicate the number of valid bytes in the FIFO. Writing this register is an indication to the bridge that microprocessor 101 is done writing the FIFO and data can then be sent to the UDC. |

TABLE 76

USBFIFOST (USB FIFO Status Register, ARM Address = 0x8000_0014)

| Name | Bit | Reset Value | Type | Description |
|---|---|---|---|---|
| FIFO-1-STATE | [8:7] | 00 | R | These are the internal state bits for FIF01: 00 FIFO IDLE 01 FIFO WRITE 10 FIFO-READ 11 FIFO FULL Note that the FIFO-FULL state does not necessarily mean that the FIFO is full; it merely means that the writer of the FIFO is done with its writing and the data can now be drained. For a Bulk OUT transfer the UDC indicates the transfer is complete and the state transitions from FIFO_WRITE to FIFO_FULL. For a Bulk IN, microprocessor 101 writing the TOTLCNT will cause the state transition from FIFO-WRITE to FIFO_FULL. |
| FIFO-0-STATE | [6:5] | 00 | R | These are the internal state bits for FIFO0: 00 FIFO IDLE 01 FIFO WRITE 10 FIFO READ 11 FIFO FULL Note that the FIFO FULL state does not necessarily mean that the FIFO is "full," it merely means that the writer of the FIFO is done with its writing and the data can now be drained. For a Bulk OUT transfer the UDC indicates the transfer is complete and the state transitions from FIFO WRITE to FIFO-FULL. For a Bulk IN, microprocessor 101 writing the TOTLCNT will cause the state transition from FIFO_WRITE to FIFO-FULL. |
| FIFOSTRT | [4] | 0 | R/W | For a Bulk IN this bit is set by microprocessor 101 whenever it fills both FIFO9 at once. It tells the bridge which FIFO to read first when two FIFOs are full. After setting this bit, it will be toggled by the hardware as it ping-pongs between each FIFO. If both FIFOs are allowed to drain, microprocessor 101 must set this bit again after filling the two FIFOs. |
| FIFO1 RST | [3] | 0 | R/W | Setting this bit will reset FIF01. It is not self-resetting. |
| FIFO0RST | [2] | 0 | R/W | Setting this bit will reset FIFO 0. It is not self-resetting. |
| FIF01 RDY | [1] | 0 | R | Bulk IN active (USBBLKDIR=0) – FIF01 is empty. Bulk OUT active (USBBLKDIR=1) – FIF01 has a valid packet. |
| FIFO0RDY | [0] | 0 | R | Bulk IN activ (USBBLKDIR0)=0) – FIFO 0 is empty. Bulk OUT active (USBBLKDIR=1) – FIFO 0 has a valid packet. |

TABLE 77

USBINTRCN (USB General Interrupt Control Register, ARM Address = 0x8000_0018)

| Name | Bit | Reset Value | Type | Description |
|---|---|---|---|---|
| | [31] | 0 | | Reserved |
| RESINTR | [30] | 0 | R/W | Set by bridge when it detects a RESUME event from UDC. Clear by writing 1. |
| SUSINTR | [29] | 0 | R/W | Set by bridge when it detects that the UDC is entering USB SUSPEND. Clear by writing 1. |
| STROK5 | [28] | 0 | R/W | Set by ARM to indicate that there is valid data in STRBUF5. This bit is cleared by hardware after the valid data is sent to the UDC. |
| STROK4 | [27] | 0 | R/W | Set by ARM to indicate that there is valid data in STRBUF4. This bit is cleared by hardware after the valid data is sent to the UDC. |
| STROK3 | [26] | 0 | R/W | Set by ARM to indicate that there is valid data in STRBUF3. This bit is cleared by hardware after the valid data is sent to the UDC. |
| STROK2 | [25] | 0 | R/W | Set by ARM to indicate that there is valid data in STRBUF2. This bit is cleared by hardware after the valid data is sent to the UDC. |
| STROK1 | [24] | 0 | R/W | Set by ARM to indicate that there is valid data in STRBUF1. This bit is cleared by hardware after the valid data is sent to the UDC. |
| STROK0 | [23] | 0 | R/W | Set by ARM to indicate that there is valid data in STRBUF0. This bit is cleared by hardware after the valid data is sent to the UDC. |
| STRINTR5 | [22] | 0 | R/W | String Descriptor 5 interrupt Set when the UDC attempts to read the STRBUF5 and the STROK5 bit is not set. Clear by writing 1. |
| STRINTR4 | [21] | 0 | R/W | String Descriptor 4 interrupt. Set when the UDC attempts to read the STRBUF4 and the STROK4 bit is not set. Clear by writing 1. |
| STRINTR3 | [20] | 0 | R/W | String Descriptor 3 interrupt Set when the UDC attempts to read the STRBUF3 and the STROK3 bit is not set. Clear by writing 1. |
| STRINTR2 | [19] | 0 | R/W | String Descriptor 2 interrupt Set when the UDC attempts to read the STRBUF2 and the STROK2 bit is not set. Clear by writing 1. |
| STRINTR1 | [18] | 0 | R/W | String Descriptor 1 interrupt Set when the UDC attempts to read the STRBUF1 and the STROK1 bit is not set. Clear by writing 1. |
| STRINTR0 | [17] | 0 | R/W | String Descriptor 0 interrupt Set when the UDC attempts to read the STRBUF0 and the STROK0 bit is not set. Clear by writing 1. |
| BLKINTR | [16] | 0 | R/W | Bulk-transfer request. When set, microprocessor 101 must read the USB-BLKDIR bit and the FIFO0RDY/FIFO1RDY bits to determine its next course of action. Clear by writing 1. |
| | [15:10] | 0 | | Reserved |
| USBINTOEN | [9] | 0 | R/W | Master enable for general interrupts. When set, any interrupt not masked by it mask bit in bits [8:0] may generate a general interrupt (INTR) to microprocessor 101. |
| RESINTMSK | [8] | 0 | R/W | Resume interrupt mask. When set, the RESINTR general interrupt is enabled. Clear to mask interrupt. |
| SUSINTMSK | [7] | 0 | R/W | Suspend interrupt mask. When set. the SUSINTR general interrupt is enabled. Clear to mask interrupt. |
| STRINTMSK5 | [6] | 0 | R/W | String Descriptor 5 interrupt mask. When set, the STRINTR5 general interrupt is enabled. Clear to mask interrupt. |
| STRINTMSK4 | [5] | 0 | R/W | String Descriptor 4 interrupt mask. When set, the STRINTR4 general interrupt is enabled. Clear to mask interrupt. |
| STRINTMSK3 | [4] | 0 | R/W | String Descriptor 3 interrupt mask. When set, the STRINTR3 general interrupt is enabled. Clear to mask interrupt. |
| STRINTMSK2 | [3] | 0 | R/W | String Descriptor 2 interrupt mask. When set, the STRINTR2 general interrupt is enabled. Clear to mask interrupt. |
| STRINTMSK1 | [2] | 0 | R/W | String Descriptor 1 interrupt mask. When set, the STRINTR1 general interrupt is enabled. Clear to mask interrupt. |
| STRINTMSK0 | [1] | 0 | R/W | String Descriptor 0 interrupt mask. When set, the STRINTR0 general interrupt is enabled. Clear to mask interrupt. |
| BLKINTMSK | [0] | 0 | R/W | Bulk-transfer interrupt mask. When set, the BLKINTR general interrupt is enabled. Clear to mask interrupt. |

TABLE 78

USBSTROBUF (USB String 0 Buffer Register, ARM Address = 0x8000_001C)

| Name | Bit | Reset Value | Type | Description |
|---|---|---|---|---|
| STRBUF0 | [31:0] | 0x00000000 | R/W | String Buffer 0 for Control IN after GET_DESCRIPTOR (String 0) command. Firted and drained in little endian byte order. |

TABLE 79

USBSTRBUF (USB String 1 Buffer Register, ARM Address = 0x8000_0020)

| Name | Bit | Reset Value | Type | Description |
|---|---|---|---|---|
| STRBUF1 | [31:0] | 0x00000000 | R/W | String Buffer 1 for Control IN after GET_DESCRIPTOR (String 1) command. Filled and drained in little endian byte order. |

TABLE 80

USBSTR2BUF (USB String 2 Buffer Register, ARM Address = 0x8000_0024)

| Name | Bit | Reset Value | Type | Description |
|---|---|---|---|---|
| STRBUF2 | [31:0] | 040000000 | R/W | String Buffer 2 for Control IN after GET_DESCRIPTOR (String 2) command. Filled and drained in little endian byte order. |

TABLE 81

USSSTR3BUF (USB String 3 Buffer Register, ARM Address = 0x8000_0028)

| Name | Bit | Reset Value | Type | Description |
|---|---|---|---|---|
| STRBUF3 | [31:0] | "0x00000000 | R/W | String Buffer 3 for Control IN after GET_DESCRIPTOR (String 3) command. Filled and drained in little endian byte order. |

TABLE 82

USBSTR4BUF (USB String 4 Buffer Register, ARM Address = f8000_002C)

| Name | Bit | Reset Value | Type | Description |
|---|---|---|---|---|
| STRBUF4 | [31:0] | 0x00000000 | R/W | String Buffer 4 for Control IN after GET-DESCRIPTOR (String 4) command. Filled and drained in little endian byte order. |

TABLE 83

USBSTR5BUF (USB String 5 Buffer Register, ARM Address = 0x8000_0030)

| Name | Bit | Reset Value | Type | Description |
|---|---|---|---|---|
| STRBUF5 | [31:0] | 0x00000000 | R/W | String Buffer 5 for Control IN after GET DESCRIPTOR (String 5) command. Filled and drained in little endian byte order. |

TABLE 84

VC_SETHI (Vendor/Class Command Setup, ARM Address = 0x8000_0034)

| Name | Bit | Reset Value | Type | Description |
|---|---|---|---|---|
| VC_SETHI | [31:0] | 0x00000000 | R | First 4 bytes of Vendor/Class command SETUP packet in big endian order. Byte 1 - VC_SETHI [31:24] - bmRequestType Byte 2 - VC_SETHI [23:16] - bRequest Byte 3 - VC_SETHI [15:8]- Value [15:8] Byte 4 - VC_SETHI [7:0]- Value [7:0] As mentioned above, this register will always contain any SETUP packet sent by the UDC. |

TABLE 85

VC_SETLO (Vendor/Class Command SETUP, ARM Address = 0x8000_0038)

| Name | Bit | Rest Value | Type | Description |
|---|---|---|---|---|
| VC_SETLO | [31:0] | 0x00000000 | R | Second 4 bytes of Vendor/Class command SETUP packet in big endian order: Byte 5 - VC_SETLO (31:24) - wIndex [15:8] Byte 8 - VC_SETLOi23:18]- wIndex [7:0] Byte t - VC_SETLO [15:8] - wLength (15:8) Byte 8 - VC_SETLOi7:0] - wLength [7:0] This register always contains any SETUP packet sent by the UDC. |

TABLE 86

VC_INHI (Vendor/Class Command Control IN Register, ARM Address = 0x8000_003C)

| Name | Bit | Reset Value | Type | Description |
|---|---|---|---|---|
| VC_INHI | [31:O] | 0x00000000 | R/W | First d bytes for Vendor/Class command Control IN. Sent in big endian byte order: Byte 1 - VC_INHI [31:24] Byte 2 - VC_INHI [23:18] Byte 3 - VC_INHI [15:8] Byte 4 - VC INHI [7:0] |

TABLE 87

VC_INLO (Vendor/Class Command Control IN Register, ARM Address = 0x8000_0040)

| Name | Bit | Reset Value | Type | Description |
|---|---|---|---|---|
| VC_INLO | [31:0] | 0x00000000 | R/W | Second 4 bytes for Vendor/Class command Control IN. Sent in big endian byte order:<br>Byte 5 - VC_INLO [31:24]<br>Byte 6 - VC_INLO [23:18]<br>Byte 7 - VC_INLO [15:8]<br>Byte 8 - VC_INLO [7:0] |

TABLE 88

VC_OUTHI (Vendor/Class Command Control OUT Register, ARM Address-W000-0044)

| Name | Bit | Reset Value | Type | Description |
|---|---|---|---|---|
| VC_OUTHI | [31:0] | 0x00000000 | R | First 4 bytes for Vendor/Class command Control OUT. Filled in big endian byte order.<br>Byte 1 - VC_INHI [31:24]<br>Byte 2 - VC_INHI [23:18j<br>Byte 3 - VC_INHI [15:8]<br>Byte 4 - VC_INHI [7:01] |

TABLE 89

VC_OUTLO (Vendor/Class Command Control OUT, ARM Address = 0x8000_0048)

| Name | Bit | Reset Value | Type | Description |
|---|---|---|---|---|
| VC_OUTLO | [31:0] | 0x00000000 | R | Second 4 bytes for Vendor/Class command Control OUT Filled in big endian byte order:<br>Byte 5 - VC_INLO [31:24]<br>Byte 6 - VC_INLO [23:18]<br>Byte 7 - VC_INLO [15:8]<br>Byte 8 - VC INLO [7:O] |

TABLE 90

VC_INTRCN (Vendor/Class Command Interrupt Control, ARM Address = 0x8000_004C)

| Name | Bit | Reset Value | Type | Description |
|---|---|---|---|---|
| VC_OUTINTR | [18] | 0 | R/W | Vends/Class command Control OUT interrupt. When set, I microprocessor 101 reads the data from a Control OUT following a Vendor/Class command held in the VC_OUTHILO registers. Clear by writing 1. |
| VC_ININTR | [17] | 0 | R/W | Vendor/Class command Control IN interrupt. When set, the ARM reads the VC_INHI/LO registers for a Control IN following a Vendor/Class command. Clear by writing 1. |
| VC_SETINTR | [18] | 0 | R/W | Vendor/Class command SETUP interrupt. When set, the ARM reads and decodes the Vends/Class command held in the VC SETHIILO registers. Clear by writing 1. |
|  | [15:12] | 0 |  | Reserved |
| VC_INTREN | [11] | 0 | R/W | Master enable for Vendor/Class command interrupts. When set, any interrupt not masked by its mask b8 in bits [8:0] may generate a Vendor/Class command interrupt (VC_INTR) to microprocessor 101. |
| VC_OUTINTMSK | [10] | 0 | R/W | VC_OUTINTR mask. When set, VC_OUTINTR will generate a VC INTR to ARM. |
| VC_ININTMSK | [9] | 0 | R/W | VC_ININTR mask. When set, VC_ININTR will generate a VC INTR to ARM. |
| VC_SETINTMSK | [8] | 0 | R/W | VC SETINTR mask. When set, VC_SETINTR will generate a VC INTR to ARM. |
| VC_INCNT | [7:4] | 0x0 | R/W | Number of valid bytes in VC_INHI/LO which the bridge must send to UDC. |
| VC_OUTCNT | [3:0] | 0x0 | R/W | Number of valid bytes in VC_OUTHI/LO which microprocessor 101 must read. Clear by writing 1's. |

TABLE 91

DEVICEDESC0 (Device Descriptor 0 Register, ARM Address = 0x8000_0050)

| Name | Bit | Reset Value | Type | Description |
|---|---|---|---|---|
|  | [31:16] | 0 | R | Reserved |
| d_bLength | [15:8] | 0x12 | R | Size of this descriptor in bytes. |
| d_bDescriptorType | [7:0] | 0x01 | R | DEVICE Descriptor Type. |

TABLE 92

DEVICEDESCI (Device Descriptor 1 Register, ARM Address = 0x8000_0054)

| Name | Bit | Reset Value | Type | Description |
|---|---|---|---|---|
| d_tx:dUSB | [31:16] | 0x0011 | R | USB Specification Release Number in Binary Coded Decimal (BCD). The UDC is USB 1.1 compliant. |
| d_bDeviceClass | [15:8] | 0x00 | R/W | Class code. |
| d_bDeviceSubClass | [7:0] | 0x00 | R/W | Subclass code. |

TABLE 93

DEVICEDESC2 (Device Descriptor 2 Register, ARM Address = 0x8000_0058)

| Name | Bit | Reset Value | Type | Description |
|---|---|---|---|---|
| d_bDeviceProtocol | [31:24] | 0x00 | R/W | Protocol code. |
| d_bMaxPacketSize0 | [23:16] | 0x08 | R | Maximum packet size for endpoint zero. |
| d_dVendor | [15:0] | 0x0000 | R/W | Vendor ID |

TABLE 94

DEVICEDESC3 (Device Descriptor 3 Register, ARM Address = 0x8000_005C)

| Name | Bit | Reset Value | Type | Description |
|---|---|---|---|---|
| d_idProduct | [31:16] | 0x0000 | R/W | Product ID. |
| d_bcdDevice | [15:0] | 0x0000 | R/W | Device release number in BCD. |

TABLE 95

DEVICEDESC4 (Device Descriptor 4 Register, ARM Address = 0x8000_0060)

| Name | Bits | Reset Value | Type | Description |
|---|---|---|---|---|
| d_Manufacturer | [31:24] | 0x00 | R/W | Index of string descriptor describing manufacturer. |
| d_iProduct | [23:16] | 0x00 | R/W | Index of string descriptor describing product. |
| d_iSerialNumber | [15:8] | 0x00 | R/W | Index of string descriptor describing device's serial number. |
| d_NumConfigurat'rons | [7:0] | 0x02 | R | Number of possible configurations |

TABLE 96

CFG0DESC0 (Configuration 0 Descriptor 0 Register, ARM Address = 0x8000_0064)

| Name | Bit | Reset Value | Type | Description |
|---|---|---|---|---|
|  | [31:8] | 0x000000 | R | Reserved |
| c0_blength | [7:0] | 0x09 | R | Size of this descriptor in bytes |

TABLE 97

CFG0DESCI (Configuration 0 Descriptor 1 Register, ARM Address = 0x8000_0068)

| Name | Bit | Reset Value | Type | Description |
|---|---|---|---|---|
| c0_bDescriptorType | [31:24] | 0x02 | R | CONFIGURATION |
| c0_wTotalLength | [23:8] | 0x0012 | R | Total length of data returned for this configuration. Includes the combined length of all the descriptors (configuration, interface, endpoint, and class or vendor specific) returned for this configuration. |
| c0_bNuminterfaces | [7:0] | 0x01 | R | Number of interfaces supported by this configuration. |

TABLE 98

CFG0DESC2 (Configuration 0 Descriptor 2 Register, ARM Address = 0x8000_006C)

| Name | Bit | Reset Value | Type | Description |
|---|---|---|---|---|
| c0_bConfigurationValue | [31:24] | 0x00 | R/W | Value to use as an argument to Set Configuration to select this configuration. |
| c0_iConfiguration | [23:18] | 0x00 | R/W | Index of string descriptor describing this configuration. |
| c0_bmAttributes | [15:8] | 0x00 | R/W | Configuration characteristics D7 Bus Powered D6 Self Powered D5 Remote Wakeup D4..0 Reserved (reset to 0) A device configuration that uses power from the bus and a local source set both D7 and D6. The actual |

TABLE 98-continued

CFGODESC2 (Configuration 0 Descriptor 2 Register, ARM Address = Ox8000_006C)

| Name | Bit | Reset Value | Type | Description |
|---|---|---|---|---|
| c0_MaxPower | [7:0] | 0x00 | R/W | power source at runtime may be determined using the Get Status device request. If a device configuration supports remote wakeup, D5 is set to 1. Maximum power consumption of USB device from the bus in this specific configuration when the device is fully operational. Expressed in 2 mA units (i.e., 50 = 100 mA). |

TABLE 99

CFGOIFODESCO (Configuration 0 Interface 0 Descriptor 0, ARM Address-0x8000_0070)

| Name | Bit | Reset Value | Type | Description |
|---|---|---|---|---|
| c0i0_bLength | [31:8] | 0x000000 | R | Reserved |
|  | [7:0] | 0x09 | R | Size of this descriptor in bytes. |

TABLE 100

CFGOIFODESCI (Configuration 0 Interface 0 Descriptor 1, ARM Address = Ox8000_0074)

| Name | Bit | Reset Value | Type | Description |
|---|---|---|---|---|
| c0i0_bDescriptorType | [31:24] | 0x04 | R | INTERFACE Descriptor Type. |
| c0i0_bInterfaceNumber | [23:16] | 0x00 | R | Number of Interface. |
| c0i0_bAlternateSetting | [15:8] | 0X00 | R/W | Value used to select alternate setting for the interface identified in the prior field. |
| c0i0 = bNumEndpoints- | [7:0] | 0x00 | R | Number of endpoints used by this interface (excluding endpoint zero). If this value is 0. this interface only uses endpoint 0. |

TABLE 101

CFGOIFODESC2 (Configuration 0 Interface 0 Descriptor 2, ARM Address = 0x8000_0078)

| Name | Bit | Reset Value | Type | Description |
|---|---|---|---|---|
| c0i0- bInterfaceClass | [31:24] | OX00 | R/W | Class code. |
| c0i0 bInterfaceSubClass | [23:16] | OX00 | R/W | Subclass code. |
| c0i0- binterfaceProtocol | [15:8] | OX00 | RW | Protocol code. |
| c0i0_iInterface | [7:0] | 0x00 | R/W | Index of string descriptor describing this interface |

TABLE 102

CFG1 DESCO (Configuration 1 Descriptor 0 Register, ARM Address = 0x8000_007C)

| Name | Bit | Reset Value | Type | Description |
|---|---|---|---|---|
| c1_bLength | [31:8] | 0x000000 | R | Reserved |
|  | [7:0] | 0x09 | R | Size of this descriptor in bytes. |

TABLE 103

CFGIDESCI (Configuration 1 Descriptor 1 Register, ARM Address = 0x8000_0080)

| Name | Bit | Reset Value | Type | Description |
|---|---|---|---|---|
| c1_bDescriptorType | [31:24] | 0x02 | R | CONFIGURATION |
| c1_wTotallength | [23:8] | 0x0027 | R | Total length of data returned for this configuration. Includes the combined length of all the descriptors (configuration, interface, endpoint, and class or vendor specific) returned for this configuration. |
| c1_bNumInterfaces | [7:0] | 0x01 | R | Number of interfaces supported by this configuration. |

TABLE 104

CFGIDESC2 (Configuration 1 Descriptor 2 Register, ARM Address = 0x8000_0084)

| Name | Bit | Reset Value | Type | Description |
|---|---|---|---|---|
| c1_bConfigurationValue | [31:24] | 0x00 | R/W | Value to use as an argument to Set Configuration to select this configuration. |
| c1_iConfiguration | [23:16] | 0X00 | R/W | Index of string descriptor describing this configuration. |
| c1_bmAttributes | [15:8] | 0X00 | R/W | Configuration characteristics D7 Bus Powered D6 Self Powered D5 Remote Wakeup D4..0 Reserved (reset to 0) A device configuration that uses power from the bus and a local source set both 07 and 06. The actual power source at runtime may be determined using the Get Status device request. If a device configuration supports remote wakeup, 05 is set to 1. |
| c1_MaxPower | [7:0] | 0X00 | R/W | Maximum power consumption of USB device from the bus in this specific configuration when the device is fully operational. Expressed in 2 mA units (i.e., 50 = 100 mA). |

TABLE 105

CFGIIFODESC0 (Configuration 1 Interface 0 Descriptor 0, ARM Address = 0x8000_0088)

| Name | Bit | Reset Value | Type | Description |
|---|---|---|---|---|
|  | [31:8] | 0x000000 | R | Reserved |
| c1_i0_bLength | [7:0] | 0x09 | R | Size of this descriptor in bytes. |

TABLE 106

CFGIIFODESC1 (Configuration 1 Interface 0 Descriptor 1, ARM Address = 0x8000_008C)

| Name | Bit | Reset Value | Type | Description |
|---|---|---|---|---|
| c1_i0_bDescriptorType | [31:24] | 0x04 | R | INTERFACE Descriptor Type. |
| c1i0_bInterfaceNumber | [23:16] | 0x00 | R | Number of interface. |
| c1i0_blternateSetfing | [15:8] | 0x00 | R/W | Value used to select alternate setting for the interface identified in the prior field. |
| c1i0_bNumEndpoints | [7:0] | 0x03 | R | Number of endpoints used by this interface (excluding endpoint zero.) If this value is 0, this interface only uses endpoint 0. |

TABLE 107

CFGIIFODESC2 (Configuration 1 Interface 0 Descriptor 2, ARM Address = 0x8000_0090)

| Name | B8 | Reset Value | Type | Description |
|---|---|---|---|---|
| c1_0_bintenrFaceCtall | [31:24] | 0x00 | R/W | Class code. |
| c0i0- bInterfaceSubClass | [23:16] | 0x00 | R/W | Subclass code. |
| c0i0- bInterfaceProtocol | [15:8] | 0x00 | R/W | Protocol code. |
| c0i0_iInterface | [7:0] | 0x00 | R/W | Index of string descriptor describing this interface |

TABLE 108

EP1DESC0 (Endpoint 1 Descriptor 0, ARM Address = 0x8000_0094)

| Name | Bit | Reset Value | Type | Description |
|---|---|---|---|---|
|  | [31:24] | 0x00 | R | Reserved |
| ep1_bLength | [23:16] | 0x09 | R | Length of this descriptor in bytes. |
| ep1_bDescriptorType | [15:8] | 0x05 | R | ENDPOINT Descriptor Type. |
| ep1_bEndpointAddress | [7:0] | 0x01 | R | The address of the endpoint on the USB device described by this descriptor. The address is encoded as follows: Bit 0..3: The endpoint number Bit 4..6: Reserved, reset to 0 Bit 7: Direction, ignored for control endpoints 0 OUT endpoint 1 IN endpoint |

TABLE 109

EP1DESC1 (Endpoint 1 Descriptor 1, ARM Address = 0x8000_0098)

| Name | Bit | Reset Value | Type | Description |
|---|---|---|---|---|
| ep1- bmAttributes | [31:24] | 0x00 | R | This field describes the endpoint's attributes when it is configured using the bConfigurationValue. Bit 0..1: Transfer Type 00 Control 01 Isochronous 10 Bulk 11 Interrupt All other bits are reserved. |
| ep1- wMaxPacketSize | [23:8] | 0x0008 | R | Maximum packet size this endpoint is capable of sending or receiving when this configuration is selected. |
| ep1_bInterval | [7:0] | 0x00 | R | Interval for polling endpoint for data transfters. Expressed in milliseconds. This field is ignored for bulk and control endpoints. |

TABLE 110

EP2DESC0 (Endpoint 2 Descriptor 0, ARM Address = 0x8000_009C)

| Name | Bit | Reset Value | Type | Description |
|---|---|---|---|---|
|  | [31:24] | 0x00 | R | Reserved |
| ep2_bLength | [23:16] | 0x09 | R | Size of this descriptor in bytes. |
| ep2_bDescriptorType | [15:8] | 0x05 | R | ENDPOINT Descriptor Type. |

TABLE 110-continued

EP2DESC0 (Endpoint 2 Descriptor 0,
ARM Address = Ox8000_009C)

| Name | Bit | Reset Value | Type | Description |
|---|---|---|---|---|
| ep2_bEndpointAddress | [7:0] | 0x82 | R | The address of the endpoint on the USB device described by this descriptor. The address is encoded as follows:<br>Bit 0..3: The endpoint number<br>Bit 4..6: Reserved, reset to 0<br>Bit 7: Direction, ignored for control endpoints<br>0 OUT endpoint---<br>1 IN endpoint |

TABLE 111

EP2DESC1 (Endpoint 1 Descriptor 1,
ARM Address = 0x8000_OOA0)

| Name | Bit | Reset Value | Type | Description |
|---|---|---|---|---|
| ep2_bmAttributes | [31:24] | 0x02 | R | This field describes the endpoint's attributes when it is configured using the bConfigurationValue. Bit 01: Transfer Type 00 Control 01 Isochronous 10 Bulk 11 Interrupt All other bits are reserved. |
| ep2_wMaxPacketSize | [23:8] | 0x040 | R | Maximum packet size this endpoint is capable of sending or receiving when this configuration is selected. |
| ep2_bInterval | [7:0] | 0x00 | R | Interval for polling endpoint for data transfters. Expressed in milliseconds. This field is ignored for bulk and control endpoints. |

TABLE 112

EP3DESC0 (Endpoint 3 Descriptor 0,
ARM Address = 0x8000_OOA4)

| Name | Bit | Reset Value | Type | Description |
|---|---|---|---|---|
| | [31:24] | 0x00 | R | Reserved |
| ep3_bLength | [23:16] | 0x09 | R | Size of this descriptor in bytes. |
| ep3_bDescriptorType | [15:8] | 0x05 | R | ENDPOINT Descriptor Type. |
| ep3_bEndpointAddress | [7:0] | 0x03 | R | The address of the endpoint on the USB device described by this descriptor. The address is encoded as follows:<br>Bit 0..3: The endpoint number<br>Bit 4..6: Reserved. reset to 0<br>Bit 7: Direction, ignored for control endpoints<br>0 OUT endpoint<br>1 IN endpoint |

TABLE 113

EP3DESC1 (Endpoint 3 Descriptor 1,
ARM Address = 0x8000_OOA8)

| Name | Bit | Reset Value | Type | Description |
|---|---|---|---|---|
| ep3_bmAttributes | [31:24] | 0x02 | R | This field describes the endpoint's attributes when it is configured using the bConfigurationValue.Bit 01: Transfer Type<br>00 Control<br>01 Isochronous<br>10 Bulk<br>11 Interrupt<br>All other bits are reserved. |
| ep3_wMaxPacketSize | [23:8] | 0x0040 | R | Maximum packet size this endpoint is capable of sending or receiving when this configuration is selected. |
| ep3_bInterval | [7:0] | 0x00 | R | Interval for polling endpoint for data transfers. Expressed in milliseconds. This field is ignored for bulk and control endpoints. |

TABLE 114

UDC Configuration Register Values (FIFO0

| UDC Register | Value |
|---|---|
| ConfigBuf0 | 0x00120100 |
| ConfgBuf1 | 0x00270200 |
| String8uf0 | 0x040400 |
| StringBuf1 | 0x040800 |
| StringBuf2 | 0x041000 |
| StringBuf3 | 0x042000 |
| StringBuf4 | 0x044000 |
| StringBuf5 | 0x048000 |
| EndPtBuf0 | 0x0000100000 |
| EndPtBuf1 | 0x1500100040 |
| EndPtBuf2 | 0x2528800080 |
| EndPtBuf3 | 0x35208000c0 |

TABLE 115

DEBUGCFG(0–3) (ARM Addr: 0x8011_0000,
0x8011_0040, 0x8011_0080,
0x8011_OOCO: DSP Addr: 0x200, 0x2040, 0x2080, Ox20C0)

| Name | Bits | Default | Description |
|---|---|---|---|
| dbgen | [23] | 0 | Debug enable : Reset Value 0 |
|  | [22:20] |  | Reserved |
| inten | [19] | 0 | Debug enable: Reset Value 0 |
|  | [18:16] |  | Reserved |
| owner | [15] | 0 | Owner: Read only: Reset Value 0 |
|  | [14:12] |  | Reserved |
| other_wr | [11] | 1 | Other Processor write enable: Reset Value: 1 |
|  | [10:8] |  | Reserved |
| Gk_frz_en | [7] | 0 | Clock Freeze enable. Reset Value : 0 |
|  | [6:4] |  | Reserved |
| mem | [3:2] | 00 | Selects the memory to look at:<br>00 : X mem<br>01 : Y mem<br>10 : P mem<br>11 : reserved<br>Reset Value: 00 |
|  | [1] |  | Reserved |
| rd wrb | [0] | 0 | Read event when '1': Write event when '0' Reset value:<br>0. It further specifies the trigger event of not only accessing the defined location, but also performing read/write operation. |

TABLE 116

DEBUG_STRT_RNG (0–3) (ARM Addr: 0x8011_0004, 0x8011_0044, 0x8011_0084, 0x8011_00C4; DSP Addr: 0x2004, 0x2044, 0x2084, 0x20C4)

| Name | Bits | Default | Description |
|---|---|---|---|
| | [23:16] | 0 | Reserved: Read only: Reset value 0 |
| START RANGE | [15:0] | 0 | Start address range: Reset value 0 |

TABLE 117

DEBUG_END_RNG (0–3) (ARM Addr: 0x8011_0008, 0x8011_0048, 0x8011_0088, 0x8011_00C8; DSP Addr: 0x2008, 0x2048, 0x2088, 0x20C8)

| Name | Bits | Default | Description |
|---|---|---|---|
| | [23:16] | 0 | Reserved : Read only: Reset value 0 |
| END RANGE | [15:0] | 0 | End address range: Reset value 0 |

TABLE 118

DEBUG_HIT_CNT (0–3) (ARM Addr: 0x8011_000C, 0x8011_004C, 0x8011_008C, 0x8011_00CC; DSP Addr: 0x200C, 0x204C, 0x208C, 0x20CC)

| Name | Bits | Default | Description |
|---|---|---|---|
| | [23:8] | 0 | Reserved : Read only : Reset value 0 |
| HIT-COUNT | [7:0] | 0 | Current Hit count Reset value 0 |

TABLE 119

DEBUG_HIT2TRG (0–3)(ARM Addr: 0x8011_0010, 0x8011_0050, 0x8011_0090, 0x8011_00D0; DSP Addr: 0x2010, 0x2050, 0x2090, WOW)

| Name | Bits | Description |
|---|---|---|
| | [23:8] | Reserved : Read only: Reset value 0 |
| HIT2TRIGGER | [7:0] | Hits before Triggered Reset value 0 Interrupt/Clock freeze occurs when HIT COUNT > HIT2TRIGGER |

TABLE 120

DEBUG_CTL (ARM Addr: 0x8011_00F0; DSP Addr: 0x20F0)

| Name | Bits | Default | Description |
|---|---|---|---|
| CLK FREEZE | [23] | 0 | Set when Clock to DSP is frozen. A write '0' restarts the DSP CLK. Reset value 0 |
| | [22:3] | | Reserved |
| DSP_RESET | [4] | 0 | When set, reset the DSP core. Default value 0 |
| DBGINTSRC | [3:0] | 0 | Status of the interrupt lines of debug block 3-0: Reset Value 0 : read only |

TABLE 121

Inter-processor Communication Register1 to ARM (IPC2ARM1 ARM_Addr--0x800F_0000; DSP 10 Addr-0x3000)

| Field Name | Bit | Default | Description |
|---|---|---|---|
| | [31:24] | 0 | Reserved by ARM only. |
| | [23:4] | 0 | Reserved. |
| DSPINT1 | [0] | 0 | DSP Interrupt request 1; When set, generates, interrupt request to ARM. |

TABLE 122

Interprocessor Communication Register2 to ARM (IPC2ARM2 ARM_Addr-0x800F_0004; DSP_10_Addr-0x3001)

| Field Name | Bits | Default | Description |
|---|---|---|---|
| DSPINT2 | [23:4] | 0 | Reserved. |
| | [0] | 0 | DSP Interrupt request 2; When set, generates interrupt request to ARM. |

TABLE 123

Inter-processor Communication Register3 to ARM (IPC2ARM3 ARM Addr-0x800F_0008; DSP_10_Addr-3002)

| Field Name | Bits | Default | Description |
|---|---|---|---|
| | [31:24] | 0 | Reserved by ARM only. |
| | [23:4] | 0 | Reserved. |
| DSPINT3 | [01] | 0 | DSP Interrupt request 3; When set, generates interrupt request to ARM. |

TABLE 124

Inter-processor Communication Register4 to ARM (IPC2ARM4 ARM_Addr-0x800F_000C; DSP_10_Addr = 3003)

| Field Name | Bits | Default | Description |
|---|---|---|---|
| | [31:24] | 0 | Reserved by ARM only. |
| | [23:4] | 0 | Reserved. |
| DSPINT4 | [0]. | 0 | DSP interrupt request 4; When set, generates interrupt request to ARM. |

TABLE 125

List of Registers in I2SOUT Block

| NAME | ARM ADD (32 bit) | DSP DD (16-bit) | DESCRIPTION |
|---|---|---|---|
| DAOCFG | 800E0000 | 1000 | Provides flexible scheme of outputting data |
| DAOCTL | 800E0004 | 1001 | Species clock ratios and generates interrupts |
| DAODAT0 | 800E0008 | 1002 | Ch 0 data for its or PWM output |
| DAODAT1 | 800E000C | 1003 | Ch 1 data for its or PWM output |
| DAODAT2 | 800E0010 | 1004 | Ch 2 data for its output |
| DAODAT3 | 800E0014 | 1005 | Ch 3 data for its output |
| PWMCTL | 800E0018 | 1006 | PWM ramp up/down controls |
| CLKDIV | 800E001C | 1007 | Divide values of mclk, sclk, pwmclk |
| SPCTL | 800E0020 | 1008 | Specifies controls of spdif transmitter |
| SPCSA | 800E0024 | 1009 | Channel status of Ch A in spdif_output |
| SPCSB | 800E0028 | 100A | Channel status of Ch B in spdif_output |

TABLE 126

DAOCTL Register Bits Description

| Field | Bits | Reset | Description |
|---|---|---|---|
| RESERVED | [31:24] | 0 | Accessible only by ARM. Read only. |
| FSINT | [23] | 0 | Sets when FS interrupt happens, needs clearing (0) by ARM/DSP. |
| FSINT EN | [22] | 0 | Enables FS interrupt. |
| CNTL_SEL | [21] | 0 | DSP Controls I2SOUT if 0, else microprocessor 101 controls I2S, only microprocessor 101 writable |
| RST-I2SOUT | [20] | 0 | When 1, reset all registers except CNTL_SEL and RST-I2SOUT in this block |
| SLAVE | [19] | 0 | When 1, both SCLK and LRCLK are inputs, MCLK is ignored. |
| SLVCLKGT | [18] | 1 | When 1, gates clocks coming from M/S/LRCLK pins to 0, for power saving |
| BURSTMOD | [17] | 0 | When 1, SCLK sent to I2SIN is from SCLK pin, but S/LRCLK used in I2SOUT is derived from AUDCLK or MCLK as specified by EXTMCLK |
| EDGE | [16] | 0 | When 0, transitions of LRCLK are aligned with falling edge of SCLK, and data bits are shifted out by falling edge of SCLK(i2sout); data bits are captured by rising edge of SCLK(i2sin). When 1, transitions of LRCLK are aligned with rising edge of SCLK, and data bits are shifted out by rising edge of SCLK(i2sout); data bits are captured by falling edge of SCLK(i2sin). |
| CLKEN | [15] | 0 | When 1, SCLK. LRCLK and MCLK (if ECTMCLK = 0) are sent out. When 0, SCLK and LRCLK output are tristated. MCLK is on only when CLKEN = 1, and EXTMCLK = 0, otherwise MCLK output is tristated. CLKEN = 1 is also used to start the audio data output from FIFO, both for PWM and I2S. |
| EXTMCLK | [14] | 0 | When 1, use external MCLK as input. When 0, I2SOUT generates MCLK as output with frequency of AUDCLK/(MCLKDIV + 1). |
| SCLKRT | [13:11] | 0 | Ratio of SCLK w.r.t. Fs, both for I2SOUT and I2SIN<br>000: SCLK = 32Fs<br>001: SCLK = 64Fs<br>010: SCLK = 128Fs<br>011: SCLK = 256Fs<br>100: SCLK = AudClk<br>101: SCLK = 48Fs |
| LRCLK_FLP | [10] | 0 | When 1, outputting (I2SOUT) and/or inputting (I2SIN) audio data is done with reversed LRCLK polarity |
| PWM_EN | [9] | 0 | When 1, PWM is enabled outputting Ch 0 (LRCLK = 1) and Ch 1 (LRCLK = 0). Assumption LRCLK FLP = 0. |
| I2SOUT-EN | [8] | 0 | When 1, I2S OUT is enabled, # of channels output depends on ALLCH_EN, If ALLCH_EN = 1 outputs Ch 0 and Ch 2 (LRCLK = 1) and Ch 1 and Ch 3 (LRCLK = 0). if ALLCH_EN = 0, outputs Ch 0 (LRCLK = 1) and Ch 1 (LRCLK = 0). Assumption LRCLK FLP = 0. |
| ALLCH_EN | [7] | 0 | When 1, all 4 channel outputs enabled, else two channel outputs enabled |
| DAOTEST | [6] | 0 | When 1, DSP/ARM can read DAO FIFOs for test purposes |
| RSTFIFO | [5] | 0 | When and as long as 1, reset read and write pointers, FIFOCNT |
| FIFOCNT | [4:0] | 0 | Dipstick attached to Ch 0 FIFO, shows the number of wards waiting to be sent out in Ch 0 FIFO. Read only. |

TABLE 127

DAOCFG Register Bits Description

| Field | Bits | Reset | Description |
|---|---|---|---|
| RESERVED | [31:24] | 0 | Accessible only by ARM. |
| EMPT | [23] | 1 | Empty. Set high when Ch 0 FIFO is empty. Read only. |
| HEMPT | [22] | 1 | Had Empty. Set high when Ch 0 FIFO is half empty. Read only |
| EMPT INT_EN | [21] | 0 | When 1, FIFO Empty event generates interrupt. |
| HEMPT INT EN | [20] | 0 | When 1, FIFO Half Empty event generates interrupt. |
| INTERDLY | [19:13] | 0 | # of SCLK delays between two successive samples. Meaningful only when I2SOUT is in 4 channel I2S OUT mode |
| BITRES | [12:8] | 0 | # of bit per sample data (range O to 23) (= BITRES + 1) |
| PREDLY | [7:0] | 0 | # of SCLK delay between LRCLK transition and first sample data (ranging 0–256) |

TABLE 128

DAODATx Register Bits Description

| Field | Bits | Reset | Description |
|---|---|---|---|
| RESERVED | [31:24] | 0 | Accessible only by ARM. Read only. |
| FIFODAT | [23:0] | X | Audio Data up to 24 bit per sample. MSB is always Bit [23]. LSB varies based upon the resolution of sample data (BITRES). |

TABLE 129

CLKDIV Register Bits Description

| Field | Bits | Reset | Description |
|---|---|---|---|
| RESERVED | [31:24] | 0 | Accessible only by ARM. Read only. |
| RESERVED | [23:16] | 0 | Unused. Read only. |
| PWMCLKDIV | [15:8] | 0 | (Divide + I value to create pwmclk out of and clk |
| SCLKDIV | [7:4] | 0 | (Divide + 1) value to create sclk (SLAVE = 0 case) out of mclk |
| MCLKDIV | [3:0] | 0 | (Divide + 1) value to create mclk (EXTMCLK = 0 case) out of aud-clk |

TABLE 130

SPCTL Register Bits Description

| Field | Bits | Reset | Description |
|---|---|---|---|
| RESERVED | [31:24] | 0 | Reserved. Read-only. Accessible by microprocessor 101 only. |
| RESERVED | [23:10] | 0 | Reserved. Read-only. |
| SP_EXTCLK | [9] | 0 | When 0, chooses aud_clk else chooses interm_master_Clk to generate s_pmdk |
| SP_MCLKRT | [8] | 0 | When SP EXTCLK = 1, this bit specifies interm_master_Gk rate, 0 meaning 256Fs, 1 meaning AudClk |
| SP_EN | [7] | 0 | When 1, SpdH_Transmitter is enabled, and I2SOUT is disabled, also used to gate sp_mclk. |

TABLE 130-continued

SPCTL Register Bits Description

| Field | Bits | Reset | Description |
|---|---|---|---|
| V | [6] | 0 | Validity bit |
| U | [5] | 0 | User bit |
| SP_OE | [4] | 0 | SpdiF_output enable bit |
| CSMD | [3] | 0 | Channel Status Mode. When low, SPCS (A/B) is read once per block by transmitter. When high, they are read every 32 subframes. |
| BLKST | [2] | 0 | Block Start. A low to high transition specifies a new channel status block boundary. This bit is normally high, when low, the FIFO is disabled. |
| BYTCLK | [1] | 0 | Byte Clock. Status bit that is the channel status byte clock. It is high for 16 subframes and low for 16 subframes. Read only. |
| CBL | [0] | 0 | Channel status Block Clock. Status bit that goes high at the block boundary and low 64 subframes later. Read only. |

TABLE 131

SPCSA(SPCSB) Register Bits Description

| Field | Bite | Reset | Description |
|---|---|---|---|
| RESERVED | [31:23] | 0 | Reserved. Read-only. Accessible by microprocessor 101 only. |
| XMTCSA(B) | [23:8] | 0 | Channel status for Ch_0(Ch_1). The LSB is shifted out first. |
| RESERVED | [7:0] | 0 | Reserved. Read-only. |

TABLE 132

PWMCTL Register Bits Description

| Fields | Bit | Reset | Description |
|---|---|---|---|
| RESERVED | [31:24] | 0 | Accessible only by ARM. Read only. |
| RESERVED | [23:6] | 0 | Unused. Read only. |
| R_UP_DONE | [5] | 0 | When 1, means ramping up of PWM outputs completed. Read only. |
| R_DOWN_DONE | [4] | 1 | When 1, means ramping down of PWM outputs completed 8 PWM engine goes to reset state. Read only. |
| PWM_OUT_EN | [3] | 0 | When 1, PWM_drivers output audio data, else they are tri-stated. |
| FAST-START | [2] | 0 | When 1, ramp-up procedure is by-passed and r_up_done gets set by PWM_ENGINE immidiately after R_UP is set. Used only in test mode to facillitate fast testing as ramp-up takes 1 sec to be done. |
| R_UP | [1] | 0 | When 1, PWM engine comes out of reset and starts ramping up. |
| R_DOWN | [0] | 0 | When 1, ramping down starts. |

TABLE 133

List of Registers in I2SIN Block

| NAME | ARM ADD(32 bit) | DSP ADD(16 bit) | DESCRIPTION |
|---|---|---|---|
| DAICTL | 800E0040 | 1010 | Provides flexible scheme to input data |
| DAISTS | 800E0044 | 1011 | Reflects status of the two input FIF0 |
| CMPSTS | 800E0048 | 1012 | Reflects status of unified FIFO in Compressed Mode |
| DAIDAT0 | 800E004C | 1013 | Ch 0 input data |
| DAIDATI | 800E0050 | 1014 | Ch 1 input data |
| CMPDAT | 800E0054 | 1015 | Input data in Compressed mode |
| SREGDAT | 800E0058 | 1016 | Shift Register inputting data |

TABLE 134

DAICTL Register Bits Description

| Field | Bits | Reset | Description |
|---|---|---|---|
| RESERVED | [31:24] | 0 | Accessible only by ARM. Read only |
| HEMPTPOL | [23] | 0 | When 1, logic high on Half-Empty pin (in Bursty Compressed mode) means halt Empty. When 0, half empty. |
| CMPMOD | [22] | 0 | When 1, compressed data is expected to be synced with LRCLK, thus valid data. Window can be specified using PREDLY, BITRES. When 0, compressed data is expected to arrive in burst with SCLK, no LRCLK sync is needed, thus PREDLY 8 BITRES are meaningless. Applicable only if CHANMOD has been set to 1. |
| DAITEST | [21] | 0 | When 1, ARM/DSP can write to the input FIFOs. |
| CNTL SEL | [20] | 0 | When 1, microprocessor 101 controls I2SIN, else DSP controls I2SIN. |
| RST-I2SIN | [19] | 0 | When, and as long as 1, reset registers except CNTL_SEL and RST-I2SIN |
| FULL_INT EN | [18] | 0 | When 1, FULL event contributes to I2SIN_INT interrupt |
| HFULL_INT_EN | [17] | 0 | When 1, HFULL event contributes to I2SIN_INT interrupt |
| I2SIN-EN | [16] | 0 | When 0, I2S_IN is tristated. When 1, audio_dc to I2SIN is enabled. |
| PREDLY | [15:6] | 0 | # of SCLK delays between two successive samples. |
| BITRES | [7:3] | 0 | # of bits per sample data (range 1 to 23) which is equal to BITRES + 1 |
| CHANMOD | [2] | 0 | When 1, input data arrives in compressed mode. Whether data is synced with LRCLK is defined by COMPMOD. When 0, input data arrives synced with LRCLK, Ch 0 data is expected when LRCLK = 1, and Ch 1 data is expected when LRCLK = 0, Polarity of LRCLK ws.t expected data can be reversed by setting LRCLK_FLP bit Of DAOCTL. |
| LLOOPTEST | [1] | 0 | When 1, take I2S-OUT as input source instead of I2S_IN, test mode |
| RSTFIFO | [0] | 0 | When 1, reset read and write pointer for both the FIFOs |

TABLE 135

DAISTS Register Bits Description

| Field | Bits | Reset | 0sscription |
|---|---|---|---|
| RESERVED | [31:24] | 0 | Accessible only by ARM. |
| RESERVED | [23:15] | 0 | Unused |
| FSINT | [16] | 0 | On FS interrupt, cleared by ARM/DSP |
| FSINT EN | [15] | 0 | When get, FS interrupt is enabled. |
| START_AUD_IN | [14] | 0 | When 1, shfreg will start to input audio data from next posedge (neg edge if edge = 1 in DAOCTL) of sdk |
| HFULL1 | [13] | 0 | When 1, DAIDAT1 FIFO is hall full. |
| FULL1 | [12] | 0 | When 1, DAIDATI FIFO is full |
| FIFOCNTI | [11:7] | 0 | Dipstick attached to DAIDATI, # of data available |
| HFULL0 | [6] | 0 | When 1, DAIDAT0 FIFO is hall full |
| FULL0 | [5] | 0 | When 1, DAIDAT0 FIFO is full |
| FIFOCNT0 | [4:0] | 0 | I Dipstick attached to DAIDAT0, # of data available |

TABLE 136

CMPSTS Register Bits Description

| Field | Bits | Reset | Description |
|---|---|---|---|
| RESERVED | [31:24] | 0 | Accessible by microprocessor 101 only. |
| RESERVED | [23:13] | 0 | Unused |
| SREGPTR | [12:8] | 0 | # of valid bits in SREGDAT, counting from LSB being 0 |
| HFULL | [7] | 0 | When 1, unified FIFO is half full |
| FULL | [6] | 0 | When 1, unified FIFO is full |
| FIFOCNT | [5:0] | 0 | # of words residing in unified FIFO |

TABLE 137

Audio Data Input Register Bits Description

| Field | Bits | Reset | Description |
|---|---|---|---|
| RESERVED | [31:24] | 0 | Accessible by microprocessor 101 only. Read only. |
| FIFODAT | [23:0] | X | Audio input data up to 24 bit per sample. LSB is always Bit[0]. MSB varies based upon the resolution of sample data (BITRES). Only DAIDATx are writable and only in DAITEST mode. |

TABLE 138

STC Control Register (STC_STL, microprocessor 101 Addr: 0x8010 0000, DSP Addr: 0x4000)

| Name | Bits | Description |
|---|---|---|
| STC EN | [23] | SC Enable: Reset Value 0 |
| RESERVED | [22:20] | RESERVED: VAL 0 |
| STC_INT S | [19] | Sticky interrupt bit set when stc cnt = 0 and stc_en; rst val = 0; cleaned by writing 0. |
| RESERVER | [22:2] | RESERVED: VAL 0 |
| STC_CLK_SEL | [1:0] | Clocks Source Selector:<br>00: STC CLK : memdk<br>01: STC_CLK :AudClk<br>10:STC_CLK:USBclk<br>11 : external clk |

TABLE 139

STC Counter0 Register (STC_COUNTER0, microprocessor 101 Addr: 0x8010_0004, DSP Addr: 0x4001)

| Name | Bits | Description |
|---|---|---|
| STC_COUNTER0 | [23:0] | Value of STC counter (high 24 bits) |

TABLE 140

STC Counter1 Register (STC_COUNTERI, microprocessor 101 Addr: 0x8010_0008, DSP Addr: 0x4002)

| Name | Bits | Description |
|---|---|---|
| | [23:9] | RESERVED: Val 0 |
| STC_COUNTER1I | [8:0] | Value of STC counter (lower 9 tits) |

TABLE 141

STC Divider Register (STC_DIV, microprocessor 101 Addr: 0x8010_000C, DSP Addr: 00003)

| Name | Bits | Description |
|---|---|---|
| RESERVER | [23:18] | RESERVED: VAL 0 |
| STC DIV_VAL | [15:0] | STC clock divider value. 0 => Divide/1 |

TABLE 142

STC Shadow Register (STC_CNTR_SHDW, microprocessor 101 Addr: 0x8010_0010, DSP Addr: 0x4004)

| Name | Bits | Description |
|---|---|---|
| | [23:9] | RESERVED: Val 0 |
| STC_CNTR_SHDW | [8:0] | Value of STC counter (lower 9 bits) at time of last COUNTERI read. Read only |

TABLE 143

GPIO Data Register (GPIODR microprocessor 101 Address: 0x8002_0000)

| Name | Bit | Type | Default Value | Description |
|---|---|---|---|---|
| GPIOD | [31:0] | R/W | 0 | GPIO Data Register. Bit[1] corresponds to pin GPIO[i] (i = 0,...31). When read, returns the current status on the physical GPIO pins. When write, it sets the value on the GPIO pins if the pins are chosen to be GPIO output mode. |

TABLE 144

GPIO Data Direction Register (GPIODDR microprocessor 101 Address: 0x8002_0004)

| Name | Bit | Type | Default Value | Description |
|---|---|---|---|---|
| GPIOOD | [31:0] | R/W | 0 | GPIO Data Direction. When Bit[i] is 1, pin GPIO[i] is output; When Bit4 is 0. pin GPIO14 is Input. (i = ....31) |

TABLE 145

GPIO MUX Selector Register (GPIOMIX microprocessor 101 Address: 0x8002_0008)

| Name | Bit | Type | Default Value | Description |
|---|---|---|---|---|
| GPIOMUX | [31:8] | R/W | 0 | GPIO pin mux selection. When Bit[7] is 1, pin GPIO[i] is GPIO function; When Bit[i] is 0, the GPIO function of pin GPIO[i] is overwritten by the other corresponding function on that particular pin. (i = 8....31) |
| GPIOMUX | [7:4] | R/W | 1 | GPIO pin mux selection. When Bit[i] is 1, pin GPIO[i] is GPIO function: When Bit [i] is 0. the GPIO function of pin GPIO[i] is overwritten by the other corresponding function on that particular pin. (i = 4....7) |
| GPIOMUX | [3:0] | R/W | 0 | GPI pin mux selection. For GPIO[3:0], the value GPIO- MUX[3:0] does NOT affect the pin function since they are dedicated GPIOs. |

TABLE 146

GPIO Interrupt Mast Register (GPIOINTMSK microprocessor 101 Address: Ox8002_OOOC)

| Name | Bit | Type | Default Value | Description |
|---|---|---|---|---|
| GPIOINTMSK | [31:01] | R/W | 0 | GPIO Interrupt Mask. When Bit[i] is set and GPIOINTEN is also set, value 1 on pin GPIO[i] generates interrupt to ARM. (i = 0...31) |

TABLE 147

GPIO Interrupt Enable Register (GPIOINTEN microprocessor 101 Address: 0x8002_0010)

| Name | Bit | Type | Default Value | Description |
|---|---|---|---|---|
| CUSDAT | [31:18] | R/W | 0 | 16 bit custom data. used for various purpose. When bit [31:29] are set. GPIO[2:0] are routed to USB block as D+/D−/XverData for testing purpose in order to bypass the analog transceiver. By setting bits [31:18] individually, the internal clocks are sent to the GPIO pins as output for visibility instead of normal GPIO function. |
|  | [15:1] |  | 0 | Reserved |
| GPIOINTEN | [0] | R/W | 0 | GPIO Interrupt Enable. When, interrupt generation is disabled. When 1, value 1 on any unmasked (GPIOINTMSK[Q] pin GPO[[i] generated interrupt to ARM. (i = 0,...31) |

TABLE 148

GPIO Interrupt Event Select Register 0 (GPIOINTESC0 microprocessor 101 Address: 0x8002_0014)

| Name | Bit | Type | Default Value | Description |
|---|---|---|---|---|
| GPIOIES[15] | [31:30] | R/W | 0 | GPIO Interrupt Event Select for GPIO[15]. Sensitivity is as in GPIOIES[0]. |

TABLE 148-continued

GPIO Interrupt Event Select Register 0 (GPIOINTESC0 microprocessor 101 Address: 0x8002_0014)

| Name | Bit | Type | Default Value | Description |
|---|---|---|---|---|
| GPIOIES[14] | [29:28] | RIV1f | 0 | GPIO Interrupt Event Select for GPIO[14]. Sensitivity is as in GPIOIES[0]. |
| GPIOIES[13] | [27:28] | R/W | 0 | GPIO Interrupt Event Select for GPIO[13]. Sensitivity is as in GPIOIES[O]. |
| GPIOIES[12] | [25:24] | RJW | 0 | GPIO Intertupt Event Select for GPIO[2]. Sensitivity is as in GPIOIES[O]. |
| GPtOIES[11] | [23:22] | RNV | 0 | GPIO Interrupt Event Select for GPIO[11]. Sensitivity is as in GPIOIES[0]. |
| GPIOIES[10] | [21:20] | R/W | 0 | GPIO Interrupt Event Select for GPIO[10]. Sensitivity is as in GPIOIES[0]. |
| GPIOIES[9] | [19:18] | RAN | 0 | GPIO Interrupt Event Select for GPIO[9]. Sensitivity is as in GPIOS[0]. |
| GPIOIES[8] | [17:18] | R/W | 0 | GPIO Interrupt Event Select for GPIO[8]. Sensitivity is as in GPIOIES(0). |
| GPIOIES[7] | [15:14] | R/W | 0 | GPIO Interrupt Event Select for GPIO[7]. Sensitivity is as in GPIOIES[0]. |
| GPIOIES[8] | [13:12] | R/W | 0 | GPiO Interrupt Event Select for GPIO[8]. Sensitivity is as in GPIOIES[0]. |
| GPIOIES[5] | [11:10] | R/W | 0 | GPIO Interrupt Event Select for GPIO[5]. Sensitivity is as in GPIOIES[O]. |
| GPIOIES[4] | [9:8] | R/W | O | GPIO Interrupt Event Select for GPIO[4]. Sensitivity is as in GPIOIES[0[. |
| GPIOIES[3] | [7:6] | R/W | 0 | GPIO Interrupt Event Select for GPIO[3]. Sensitivity is as in GPIOIES[0]. |
| GPIOIES[2] | [5:4] | R/W | 0 | GPIO Interrupt Event Select for GPIO[2]. Sensitivty is as in GPIOIES[01] |
| GPIOIES[1] | [3:2] | R/W | 0 | GPIO Interrupt Event Select for GPIO[1]. Sensitivity is as in GPIOIES[01. |
| GPIOIES[0] | [1:0] | R/W | 0 | GPIO Interrupt Event Select for GPIO[0]. 00: GPIO pin active high: 01: GPIO pin active low: 10: GPIO pin rising edge: 11: GPIO pin falling edge: |

TABLE 149

GPIO Interrupt Event Select Register 1 (GPIOINTES1 microprocessor 101 Address: 0x8002_0018)

| Name | Bit | Type | Default Value | Description |
|---|---|---|---|---|
| GPIOIES[31] | [31:30] | R/W | 0 | GPIO Interrupt Event Select for GPIO[31]. Sensitivity is as in GPIOIES[0] |
| GPIOIES[30] | [29:28] | R/W | 0 | GPIO Interrupt Event Select for GPIO[30]. Sensitivity is as in GPIOIES[O] |
| GPIOIES[29] | [28:26] | R/W | 0 | GPIO Interrupt Event Select for GPIO[29]. Sensitivity is as in GPIOIES[O] |
| GPIOIES[28] | [25:24] | R/W | 0 | GPIO Interrupt Event Select for GPIO[28]. Sensitivity is as in GPIOIES[O] |
| GPIOIES[27] | [23:22] | R/W | 0 | GPIO Interrupt Event Select for GPIO[27]. Sensitivity is as in GPIOIES[0] |
| GPIOIES[26] | [21:20] | RIVV | 0 | GPIO Interrupt Event Select for GPIO [26]. Sensitivity is as in GPIOIES[0] |
| GPIOIES[25] | [19:18] | RIYII | 0 | GPIO Interrupt Event Select for GPIO [25]. Sensitivity is as in GPIOIES[0] |
| GPIOIES[24] | [17:16] | R/W | 0 | GPIO Interrupt Event Select for GPIO[24]. Sensitivity is as in GPIOIES[0] |
| GPIOIES[23] | [15:14] | R/W | 0 | GPIO Interrupt Event Select for GPIO[23]. Sensitivity is as in GPIOIES[0]. |
| GPIOIES[22] | [13:12] | R/W | 0 | GPIO Interrupt Event Select for GPIO[22]. Sensitivity is as in GPIOIES[0]. |
| GPIOIES[21] | [11:10] | R/W | 0 | GPIO Interrupt Event Select for GPIO[21]. Sensitivity is as in GPIOIES[0]. |
| GPIOIES[20] | [9:8] | R/W | 0 | GPIO Interrupt Event Select for GPIO[20]. Sensitivity is as in GPIOIES[0]. |

TABLE 149-continued

GPIO Interrupt Event Select Register 1 (GPIOINTES1 microprocessor 101 Address: 0x8002_0018)

| Name | Bit | Type | Default Value | Description |
|---|---|---|---|---|
| GPIOIES[19] | [7:6] | R/W | 0 | GPIO Interrupt Event Select for GPIO[19]. Sensitivity is as in GPIOIES[01 |
| GPIOIES[18] | [5:4] | R/W | 0 | GPIO Interrupt Event Select for GPIO[18]. Sensitivity is as in GPIOIES[0]. |
| GPIOIES[17] | [3:2] | R/W | 0 | GPIO Interrupt Event Select for GPIO[17]. Sensitivity is as in GPIOIES[O] |
| GPIOIES[6] | [1:0] | R/W | 0 | GPIO Interrupt Event Select for GPIO[16]. Sensitivity is as in GPIOIES[01 |

TABLE 150

GPIO Interrupt Event Status Register (GPIOINTST microprocessor 101 Address: 0x8002_001C)

| Name | Bit | Type | Default Value | Description |
|---|---|---|---|---|
| GPIOINTST[31:0] | [31:0] | R/W | 0 | GPIO interrupt event status. Bit[i] corresponding to GPIO[i]. When the selected event occurs, the corresponding bit will be asserted by the event. Microprocessor 101 interrupt subroutine and clears the bit in order to avoid extra interrupt. |

TABLE 151

GPIO Test Clock Enable Register (GPIOTCER microprocessor 101 Address: 0x8002_0040 -0x8002_007C)

| Name | Bit | Type | Default Value | Description |
|---|---|---|---|---|
|  | [31:01] | R/W |  | When in cleared, a test clock enable is produced when this register is accessed (read or write). |

TABLE 152

GPIO Test Control Register (GPIOTCR microprocessor 101 Address: 0x8002_0080)

| Name | Bit | Type | Default Value | Description |
|---|---|---|---|---|
|  | [31:5] |  | 0 | Reserved. |
| TESTINPSEL | [4] | R/W | 0 | The bit selects the source of primary input. When bit is 0, the primary inputs are taken from the external pads (normal operation). When the bit is 1. the values programed in GPI-OTISR are used as the inputs to the GPIO. |
| TESTRST | [3] | R/W | 0 | When the bit is set, a reset is asserted throughout the module, EXCEPT the test registers. |
| REGCLK | [21] | R/W | 0 | 0 = Strobe cock mode is selected which generates a test clock enable on every AMBA/APB access (read/write) to the block, allows testing with less test vectors when testing functions |

TABLE 152-continued

GPIO Test Control Register (GPIOTCR microprocessor 101 Address: 0x8002_0080)

| Name | Bit | Type | Default Value | Description |
|---|---|---|---|---|
| TESTCLKEN | [1] | R/W | 0 | such as counters. 1 = Registered clock mode is selected which only generates a test clock enable on an AMBA/PB access to the GPIOT- CER location. Ths bit has no effect unless bit[0]and bit[1] are both set to 1. Selects the source of test clock: O = The internal clock enable is continuously HIGH. 1 = The internal test clock enable is selected, test clocks are enabled for only period of the input clock per AMBA/ APB access. The internal clock enable mode depends on the setting of Bit[21]. This bit has no effect unless bit 0 is set to 1. |
| TESTEN | [0] | R/W | 0 | 0 = Normal operation mode is selected. 1 = Test mode is selected. Bit[1] and Bit[2] have no effect unless bit[O] is 1. |

TABLE 153

GPIO Test Input Stimulus Register (GPIOTISR microprocessor 101 Address: 0x8002_0084)

| Name | Bit | Type | Default Value | Description |
|---|---|---|---|---|
| GPIO | [31:0] | R/W | 0 | Programmable test stimulus to primary input of GPIO when TESTINPSEL is set to 1. |

TABLE 154

Soft Cache Control (SCCREG, microprocessor 101 Addr: 0x6000_4000)

| Bits | Description |
|---|---|
| [0] | Soft cache enable |
| [2:1] | Soft cache size (00: 2 k; 01: 4 k: 10: 8 k; 11:16 k) |
| [30:3] | Reserved. '0' when read. |
| [31] | Soft Cache Map mode. When 0 (default), the cache starts from internal microprocessor 101 RAM offset 0. When 1, the soft cache starts from microprocessor 101 RAM offset Ox7FFF. |

TABLE 155

Abort Address (ABRTADDR, microprocessor 101 Addr: 0x6000_4004)

| Bits | Description |
|---|---|
| [31:0] | Address that caused the abort (softcache) |

TABLE 156

Abort Status (ABRTSTATUS, microprocessor 101 Addr: 0x6000_4008)

| Bits | Description |
|---|---|
| [0] | Set by soft cache hardware cleared on miss. Indicates soft cache miss |
| [1] | Set by security hardware, cleared on read. Indicates security abort. |

TABLE 157

Soft Cache Tags (SCTAG0..15, microprocessor 101 Addr. 0x6000_400C..4048)

| Bits | Description |
|---|---|
| [6:0] | Reserved. 0 when read. |
| [20:7] | Tag. Bits 7, 8, 9 are, ignored depending on cache sae. |
| [21] | Tag valid. '0' indicates invalid. |
| [31:22] | Reserved. '0' when read. |

TABLE 158

Security Abort Address (SECABTADDR, microprocessor 101 Addr: Ox6000_404C)

| Bits | Description |
|---|---|
| [31:0] | Address that caused the abort (Security) |

TABLE 159 schist: Soft Cache History (SCHIST, microprocessor 101 Addr 0x6000_4050):

| Bits | Description |
|---|---|
| [31:4] | Reserved. |
| [15:12] | Fourth last hit tag ID. |
| [11:8] | Third last hit tag ID. |
| [7:4] | Second last hit tag ID. |
| [3:0] | Last hit tag ID. |

TABLE 160

Pause Register (ARM Address 0x8008_0000)

| Name | Bit | Type | Default | Description |
|---|---|---|---|---|
| PAUSE | [31:0] | W | 0 | Write any data to this register will cause the activity on main AHB to pause. Read always returns 0. Any interrupt will bring it out of pause mode. |

TABLE 161

Microprocessor 101 Sleep Register (ARM Address 0x8008_003C)

| Name | Bit | Type | Default | Description |
|---|---|---|---|---|
| ARMSLEEP | [31:01] | W | 0 | Write any data to this register will cause the activity of microprocessor 101 core to pause. Read always returns 0. Any interrupt will bring it out of ARM Sleep mode: |

TABLE 162

Remap Register (ARM Address 0x8008_0020)

| Name | Bit | Type | Default | Description |
|---|---|---|---|---|
|  | [31:2] | R | 0 | Reserved. |
| OPMOD1 | [28:24] | R | 1 | Reset operation mode 1. At the power-on-reset and/or user-reset, the value of pins TRSTTST[1:0] and PORTST[1:0] are latched to this field. Bit[25:24]: PORTST[1:0]; Bit[27:28] : TST[1:0]: Bit[28] : TRST, |
| OPMOD0 | [19:16] | R | 1 | Reset operation mode 0. At the power-on-reset and/or user-reset, the value of pins GPIO[3:0] is set to this field. |
| TICEN | [5] | R/W | 0 | When set, enable the TIC interlace while it is allowed. |
| JTAGEN | [4] | R/W | 0 | When set, enables microprocessor 101 JTAG feature while it is allowed. |
| REMAPMOD | [1:0] | R/W | 0 | ARM address remap mode:<br>00: Address Mode 0. [Default]<br>01: Address Mode 1.<br>10: Address Mode 2;<br>11: Not supported. |

TABLE 163

Chip Super Stand-by Register (ARM Address 0x8008_0038)

| Name | Bit | Type | Default | Description |
|---|---|---|---|---|
|  | [31:1] | R | 0 | Reserved. |
| STBY | [0] | R/W | 0 | The value of bit[O] is driven to the pin STBYn, which can be used to control an external power-FET to switch on/off the supplies. With default value 0, it is used to control a p-channel FET [logic low to turn on the switch). Write 1 to this bit will turn off the FET. The bit is cleared by WAKEUP pin asserting high. |

TABLE 164

Identification Register (ARM Address 0x8OO8_0010)

| Name | Bit | Type | Default | Description |
|---|---|---|---|---|
| BND | [31] | R | — | Read returns the BOND pin value for the chip. |
|  | [30:8] | R | 0 | Reserved. |
| IDENTIFICATION | [7:0] | R | 0 | Identification flags. |

TABLE 165

Reset Status Register (ARM Address 0x8008_0030)

| Name | Bit | Type | Default | Description |
|---|---|---|---|---|
| | [31:8] | R | 0 | Reserved. |
| RESETSTATUS | [7:0] | R/W | 0x01 | Reset Status. The bit[0] is set high on reset, low when cleared. Bit[0] can not be set high by software. Write 7'b1to bit[7:1] will set the value of RESETSTATUS[7:1]. |

TABLE 166

Reset Status Clear Register (ARM Address 0x8008_0034)

| Name | sit | Type | Default | Description |
|---|---|---|---|---|
| | [31:8] | R | 0 | Reserved. |
| RESETSTATUS | [7:0] | W | N/A | Reset Status clear. Write 7'b1 to Bit[7:1] will clear the RESETSTATUS[7:1] in Reset Status Register. |

TABLE 167

Pad Pull Resistor Control Register 1 (ARM Address 0x8008_0004)

| Name | Bit | Type | Default | Description |
|---|---|---|---|---|
| | [31:0] | R/W | 0xFFFF_FFFF | Individual pad pull resistor control. |

TABLE 168

Pad Pull Resistor Control Register 2 (ARM Address Ox8008_OOOC)

| Name | Bit | Type | Default | Description |
|---|---|---|---|---|
| | [31:0] | R/W | 0xFFFF_FFFF | Individual pad pull resistor control. |

TABLE 169

Pad Pull Resistor Control Register 3 (ARM Address 0x8008_0014)

| Name | Bit | Type | Default | Description |
|---|---|---|---|---|
| | [31:0] | R/W | 0xFFFF_FFFF | Individual pad pull resistor control. |

TABLE 170

Pad Pull Resistor Control Register 4 (ARM Address 0x8008_001 C)

| Name | Bit | Type | Default | Description |
|---|---|---|---|---|
| | [31:0] | R/W | 0xFFFF_FFFF | Individual pad pull resistor control. |

TABLE 171 microprocessor 101 RAM Weak-Write Control Register (ARM Addr. 0x6000_3000)

| Name | am | Type | Default | Description |
|---|---|---|---|---|
| | [31:4] | | | Reserved. |
| a ram weak_wr1_b_lo | [3] | R/W | 1 | RAM low subportion weak1 bit |
| a ram_weak_wr0_b_lo | [2] | R/W | 1 | RAM low subportion weak0 bit |
| a ram_weak_wr1_b_hi | [1] | R/W | 1 - | RAM high subportim weak1[bit] |
| a ram_weak_wr0_b_hi | [0] | R/W | 1 | RAM high subportion weak0 bit. |

TABLE 172

DSP RAM Weak-Write Control Register (DSP Addr: 0x5000)

| Name | Bit | Type | OHault | Description |
|---|---|---|---|---|
| | [23:18] | | | Reserved. |
| gram_weak_wr1_b_l0 | [15] | R/W | 1 | Global RAM low subportion weak1 bit |
| gram_weak_wr0_b___lo | [14] | R/W | 1 | Global RAM low subportion weak0 bit. |
| gram_weak_wr1 b_hi | [13] | R/W | 1 | Global RAM high subportion weakl bit. |
| gram_weak_wr0_b_hi | [12] | R/W | 1 | Global RAM high subportion weak0 bit. |
| pram_weak_wr1 b_lo | [11] | R/W | 1" | Program RAM low subportion weakl bit. |
| pram_weak_wr0_b_lo | [10] | R/W | 1 - | Program RAM low subportion weak0 bit |
| pram_weak_wr1_b_hi | [9] | R/W | 1 | Program RAM high subportion weak1 bit.i |
| pram-weak_wr0_b_hi | [8] | R/W | 1 | Program RAM high subportion weak0 bit. |
| xram_weak_wr1_b_lo | [7] | R/W | 1 | X RAM low subportion weak1 bit. |
| xram weak_wr0_b | [6] | R/W | 1 | X RAM low subportion weak0 bit. |
| xram-weak_wr1_b_hi | [5] | R/W | 1 | X RAM high subponion weak1 bit. |
| xram weak-wr0-b_hr | [4] | R/W | 1 | X RAM high subportion weak0 bit. |
| yram_weak_wri_b_b | [3] | R/W | 1 | Y RAM low subportion weak1 bit. |
| yram weak_wr0_b_lo | [2] | R/W | 1 | Y RAM low subportion weak0 bit. |
| yram-weak_wrl_b_hi | [1] | R/W | 1 | Y RAM high subportion weak1 bit. |
| yram weak_wr0_b_hi | [0] | R/W | 1 | Y RAM high subportion weak0 bit. |

TABLE 173

APSRAM (ARM RAM Access Protection Register, microprocessor 101 Addr: 0x6000_5000)

| Name | Bit | Type | Default | Description |
|---|---|---|---|---|
| APSRAM | [31:0] | R/W | 0 | Access Protection to microprocessor 101 RAM. When 0, the access to microprocessor 101 RAM is allowed only in Privillege Mode. The bit value can be modified only in Privilege Mode. Each bit controls each 1 K-Byte space of total 32 K-Byte microprocessor 101 RAM. Bit[0] is responding to the 1 K-Byte from 0x0000_0000 to 00000_03FF and bit[1] is for 0x0000_0400 to 0x0000_07FF, and so on. |

TABLE 174

APPERIP (ARM Peripheral Access Protection Register, microprocessor 101 Addr: 0x6000_5004)

| Name | Bit | Type | Default | Description |
|---|---|---|---|---|
| | [31:8] | R | 0 | Reserved |
| APPERIP | [17:0] | RNV | 0 | Access Protection to microprocessor 101 Peripheral Space. When 0, the access to the corresponding Peripheral block is allowed only in Privillege Mode. The bit value can be modified only in Privillege Mode. APPERIP[0 : USB block; APPERIP[1] : UART APPERIP[2] : GPIO: APPERIP[3] : Battery/volume checker (ADC); APPERIP[4] : SPI; APPERIP[5] : 12C; |

TABLE 174-continued

APPERIP (ARM Peripheral Access Protection Register, microprocessor 101 Addr: 0x6000_5004)

| Name | Bit | Type | Default | Description |
|------|-----|------|---------|-------------|
| | | | | APPERIP[6] : Security Fuse: |
| | | | | APPERIP[7]: System Clocks Control: |
| | | | | APPERIP[8] : Remap/Pause Control; |
| | | | | APPERIP[9] : RTC; |
| | | | | APPERIP[10]:TImer1; |
| | | | | APPERIP[11]:Timer2; |
| | | | | APPERIP[12]:Timer3; |
| | | | | APPERIP[13]:Interrupt ControNer: |
| | | | | APPERIP[14]:I2S/PWW |
| | | | | APPERIP[15]iPC; |
| | | | | APPERIP[16]:DSP TimeNCounter; |
| | | | | APPERIP[17]DSP Debugs,; |

TABLE 175

APCS (ARM External Memory Access Protection Register, microprocessor 101 Addr: 0x6000_5008)

| Name | Bit | Type | Default | Description |
|------|-----|------|---------|-------------|
| | [31:4] | R | 0 | Reserved |
| APCS | [3:0] | R/W | 0 | Access Protection to microprocessor 101 External Memory. When 0. the access to microprocessor 101 RAM is allowed only in Privilege Mode. The bit value can be modified only in Priviilege Mode. APCS[O]: The first external memory bank controlled by CSO: APCS[1]: The first external memory bank controlled by CSI; APCS[2]: The first external memory bank controlled by CS2; APCS[3]: The first external memory bank controlled by CS3; |

TABLE 176

Power Planes and Their Functional Blocks

| Power Plane | Supply Pins | Functional Blocks |
|-------------|-------------|-------------------|
| Stand-By (3.3 V) | STBYVDD331 STBYGND33 | RTC, 32.768 KHz on-chip oscillator, pin RTCTALO and RTCTALI, PRSTn, RSTOn, STBYn, WAKEUP |
| Quiet-Analog (3.3 V) | QVDD331QGND33 | PLL. ADC analog, pin MLPFLT/MTPFLT and ULPFLT/UTPFLT, and VIN<1:0>. |
| PWMxVDD (3.3 V) | PWMLVDD/PWMRVDD and PWMLGNDIPWM RGND | PWM Output Driver Pins: PWMLVDO, PWMRVDD. PWML. PWMR. |
| Pad-Ring (3.3 V) | VDDringIGNDring | All the pads and voltage step-up circuitry in the core logic. except the ones listed above for Oscillator. PLL, ADC and PWM. |
| Core-Logic (1.5 V 2.5 V) | VDOcae/GNDca | All the internal functional blocks except the ones listed above, for RTC, PLL, OSC, ADO analog. |

TABLE 177 microprocessor 101 Memory Remap Mode 0 (Default) Segment Allocation (32 bit/word, byte addressing)

| ARM Memory Address (Hex) | Size (Byte) | Function Block |
|--------------------------|-------------|----------------|
| 0000 0000 - 0000_2FFF | 12K | Abased Internal microprocessor 101 ROM (6K × 16) |
| 0000 3000-1FFF FFFF | | Reserved |
| 2000_0000 - 2000_7FFF | 32K | Internal microprocessor 101 RAM (8K × 32) |

TABLE 177-continued microprocessor 101 Memory Remap Mode 0 (Default) Segment Allocation
(32 bit/word, byte addressing)

| ARM Memory Address (Hex) | Size (Byte) | Function Block |
|---|---|---|
| 2000 8000-2FFF FFFF | | Reserved |
| 3000 0000 - 3000 7FFF | 32K | Global RAM (81k × 32) byte-addressable from ARM) |
| 3000_8000-3001-FFFF | | Reserved |
| 3002_0000 - 3002-3FFF | 16K | DSP DataO RAM (41k × 24) word addressable only; microprocessor 101 bus bit[31:24] are not provided by DataO RAM |
| 3002_4000-3002_FFFF | | Reserved |
| 3003_0000 - 3003-FFFF | 64K | DSP DataO ROM (16k × 24) word addressable only; microprocessor 101 bus bit[31:24] are not provided by DataO ROM) |
| 3004_0000- 30W3FFF | 16K | DSP Data1 RAM (41k × 24)word addressable only; microprocessor 101 bus bit[31–24] are not provided by Data 1 RAM) |
| 3004 4000-3004-FFFF | | Reserved |
| 3005_0000 - 3005_FFFF | 64K | DSP Data1 ROM (16k × 24)word addressable only; microprocessor 101 bus bit[31:24] are not provided by Data 1 ROM) |
| 3006 0000-3006 3FFF | 16K | DSP Program RAM (41k × 32 word addressable only) |
| 3006 4000 - 3FFF FFFF | | Reserved |
| 4000 0000 - 5FFF FFFF | 512 M | Remappable External Flash/SRAM Memory |
| 6000 0000 - 6000-0FF | 4K | DMA Configurration Registers |
| 6000 1000 - 6000 1 FFF | 4K | LCD Display Interface |
| 6000 2000 - 6000 2FFF | 4K | External FlashISRAM Interface Control Registers |
| 6000_3000 - 6000-3FFF | 4K | ARM RAM Weak-Write Test Controller |
| 6000 4000 - 6000 4FFF | 4K | Soft Cache Control Registers |
| 6000 5000 - 6000-SFFF -- | 4K | ARM Security Access Protection |
| 60006000 - 6000_6FFF | 4K | ARMTTDMI Test Registers |
| 6000_7000 -6FFF FFFF | | Reserved |
| 7000 0000 -7000_2FFF | 12K | Internal microprocessor 101 ROM (6k × 18). |
| 7000 3000 - 77FF-FFFF | | Reserved |
| 7800_0000 - 781 F FFFF | 2 M | Virtual Memory Space supported by Soft Cache. |
| 7820 0000-7FFF FFFF | | Reserved |
| 8000 0000 - 8000 FFFF | 64K | USB Device Port |
| 8001 0000 - 8001 FFFF | 64K | UART |
| 8002 0000 - 8002 FFFF | 64K | GPIO |
| 8003_0000 - 8003_FFFF | 64K | Battery_Volumn Checker |
| 8004_0000 - 8004 FFFF | 64K | SPI for Serial Media Interface |
| 8005 FFFF - 8005 FFFF | 64K | 12C Master Port |
| 8006 0000 - 8006 FFFF | 64K | Security Fuse and Control Circuit |
| 8007 0000 - 8007 FFFF | 64K | Clock Control |
| 8008_0000 - 8008 FFFF | 64K | Remap/Pause Cantror |
| 8009 0000-8009 FFFF | 64K | RTC* |
| 800A_0000 - 800A_FFFF | 64K | Timerl |
| 8008 0000 - 8008 FFFF | 64K | Timer2 |
| 800C 0000 - 800C_FFFF | 64K | Timer3 |
| 800D 0000 - 800D FFFF | 64K | Interrupt Controller |
| 800E 0000 - 800E FFFF | 64K | I2SIPWM |
| 800E 0000 - 800F FFFF | 64K | IPC |
| 8010 0000 - 8010-FFFF | 64K | DSP Timer and Counter |
| 8011 0000 - 8011 FFFF | 64K | DSP Debugger |
| 8012_0000-FFFF FFFF | | Reserved |
| 0000 0000 - 0000 7FFF | 32K | Internal microprocessor 101 RAM (8K × 32) |
| 0000 8000-1FFF FFFF | | Reserved |
| 2000 0000 - 2000 7FFF | 32K | Internal microprocessor 101 RAM (8K × 32) |
| 2000 8000-2FFF FFFF | | Reserved |
| 3000 0000 - 3000 7FFF | 32K | Global RAM (8K × 32)byte-addressable from ARM) |
| 3000_8000-3001_FFFF | | Reserved |
| 3002_0000 - 3002_3FFF | 16K | DSP Data0RAM (4K × 24) word addressable only; microprocessor 101 bus bit[31:24] are not provided by Data0 RAM |
| 3002 4000-3002 FFFF | | Reserved |
| 3003_0000 - 3003-FFFF | 64K | DSP Data0ROM (16K × 24) word addressable only; microprocessor 101 bus bit[31:24] are not provided by DataO ROM) |
| 3004_0000 - 3004_3FFF | 16K | DSP Data 1 RAM (4K × 24) word addressable only; microprocessor 101 bus bit[31:24] are not provided by Data 1 RAM) |
| 3004_4000 - 3004-FFFF | | Reserved |

TABLE 177-continued microprocessor 101 Memory Remap Mode 0 (Default) Segment Allocation
(32 bit/word, byte addressing)

| ARM Memory Address (Hex) | Size (Byte) | Function Block |
|---|---|---|
| 3005_0000 - 3005-FFFF | 64K | DSP Data1 ROM (16K × 24) word addressable only; microprocessor 101 bus bit[31:24] are not provided by Data 1 ROM) |
| 3006 0000 - 3006 3FFF | 16K | DSP Program RAM (4K × 32 word addressable only) |
| 3006_4000-3FFF FFFF | | Reserved |
| 4000 0000 - 5FFF FFFF | 512 M | Remappable External Flash/SRAM Memory |
| 6000 0000 - 6000 0FFF | 4K | DMA Configurration Registers |
| 6000 1000 - 6000 1 FFF | 4K | LCD Display Interface |
| 6000 2000 - 6000 2FFF | 4K | External Flash/SRAM Interface Control Registers |
| 6000 3000 - 6000 3FFF | 4K | RAM Retention Test Controller |
| 6000 4000 - 6000 4FFF | 4K | Soft Cache Control Registers |
| 6000 5000 - 6000 5FFF | 4K | ARM Security Access Protection |
| 6000 6000 - 6000 6FFF | 4K | ARM7TDMI Test Registers |
| 6000 7000-6FFF FFFF | | Reserved |
| 7000 0000 -7000 2FFF | 12K | Internal microprocessor 101 ROM (6k × 16) |
| 7000 3000 - 77FF-FFFF | | Reserved |
| 7800 0000 - 781 F FFFF | 2 M | Vrtual Memory Space supported by Soft Cache. |
| 7820 0000-7FFF FFFF | | Reserved |
| 8000 0000 - 8000 FFFF | 64K | USB Device Port |
| 8001 0000 - 8001-FFFF | 64K | DART |
| 8002_0000 - 8002 FFFF | 64K | GPIO |
| 8003_0000 - 8003 FFFF | 64K | Battery Volumn Checker |
| 8004 0000 - 8004 FFFF | 64K | SPI for Serial Media Interface |
| 8005 FFFF - 8005 FFFF | 64K | SSI Master Port |
| 8006 0000 - 8006 FFFF | 64K | Security Fuse and Control Circuit |
| 8007 0000 - 8007-FFFF | 64K | Clocks Control |
| 8008_0000 - 8008 FFFF | 64K | Remap Control |
| 8009 0000-8009_FFFF | 64K | RTC |
| 800A 0000 - 800A FFFF | 64K | Timer1 |
| 8008 0000 - 8008- FFFF | 64K | Timer2 |
| 800C 0000 - 800C FFFF | 64K | Timer3 |
| 8000 0000 - 800D FFFF | 64K | Interrupt Controller |
| 800E 0000 - 800E FFFF | 64K | I2SIPWW |
| 80OF0000 - 800F FFFF | 64K | IPC |
| 8010 0000 - 8010_FFFF | 64K | DSP Timer and Counter |
| 8011 0000 - 8011 FFFF | 64K | DSP Debugger |
| 8012 0000-FFFF FFFF | | Reserved |

TABLE 178

Memory Remap Mode 2 Segment Allocation (32 bit-word, byte addressing)

| ARM Memory Address (Hex) | Size (Byb) | Function Block |
|---|---|---|
| 0000 0000-1FFF FFFF | 512 M | Alleged External FlastVSRAM Memory |
| 2000_0000 - 2000 7FFF | 32K | Internal microprocessor 101 RAM (8K × 32) |
| 2000 8000-2FFF FFFF | | Reserved |
| 3000_0000 - 3000 7FFF | 32K | Global RAM (8K × 32 byte-addressable from ARM) |
| 3000_8000-3001-FFFF | | Reserved |
| 3002_0000 - 3002-3FFF | 16K | DSP Data0 RAM (4K × 24 word addressable only; microprocessor 101 bus bit[31:24} are not provided by Data0 RAM |
| 3002 4000-3002_FFFF | | Reserved |
| 3003_0000 - 3003-FFFF | 64K | DSP Data0 ROM (16K × 24 word addressable only; microprocessor 101 bus bit[31:24] are not provided by Data0 ROM) |

TABLE 179

MM Memory Remap Mode 2 Segment Allocation (32 bit/word, byte addressing)

| ARM Memory Address (Hex) | Size (Byte) | Function Block |
|---|---|---|
| 3004_0000 - 3004-3FFF | 16K | DSP Data RAM (4K × 24 word addressable only; microprocessor 101 bus bit[31:24] are not provided by Data 1 RAM) |
| 3004 4000-3004_FFFF | | Reserved |
| 3005_0000 - 3005_FFFF | 64K | DSP Data 1 ROM (16K × 24 word addressable only; microprocessor 101 bus bit[31:24] are not provided by Data ROM) |
| 3006 0000 - 3006 3FFF | 16K | DSP Program RAM (4K × 32 word addressable only) |
| 3006 4000-3FFF FFFF | | Reserved |
| 4000 0000 - 5FFF FFFF | 512 M | Remappable External Flash/SRAM Memory |
| 6000 0000 - 6000 0FFF | 4K | DMA Contigurration Registers |
| 6000 1000 -6000 1 FFF | 4K | LCD Display Interface |
| 6000_2000 - 6000 2FFF | 4K | External Flash/SRAM Interface Control Registers |
| 6000 3000 - 6000 3FFF | 4K | RAM Weak-Write Test Controller |
| 6000_4000 - 6000 4FFF | 4K | Soft Cache Control Registers |
| 6000 5000 - 6000 5FFF | 4K | ARM Security Access Protection |
| 6000 6000 - 6000_6FFF | 4K | ARM7TDM) Test Registers |
| 6000 7000-6FFF FFFF | | Reserved |
| 7000_0000 - 7000-2FFF | 12K | Internal microprocessor 101 ROM (8k × 16) |
| 7000 3000 - 77FF-FFFF | | Reserved |
| 7800 0000 - 781 F FFFF | 2 M | Virtual Memory Space supported by Soft Cache. |
| 7820 0000-7FFF FFFF | | Reserved |
| 8000 0000 - 8000-FFFF | 64K | USS Device Port |
| 8001 0000-8001-FFFF | 64K | UART |
| 8002 0000 - 8002 FFFF | 64K | GPIO |
| 8003 0000 - 8003 FFFF | 64K | Batery Volume Checker |
| 8004 0000 - 8004 FFFF | 64K | SPI for Serial Media Interface |
| 8005 FFFF - 8005 FFFF | 64K | SSI Master |
| 8006 0000 - 8006 FFFF | 64K | Security Fuse and Control Circuit |
| 8007 0000 - 8007 FFFF | 64K | Clocks Contror |
| 8008 0000 - 8008 FFFF | 64K | Remap Pause ControL |
| 8009 0000-8009 FFFF | 64K | RTC. |
| 800A 0000 - 800A_FFFF | 64K | Timer1 |
| 800B_0000 - 8008_FFFF | 64K | Timer2 |
| 800C 0000 - 800C FFFF | 64K | Tmer3 |
| 800D 0000 - 800D_FFFF | 64K | Interrupt Controller |
| 8OOE_0000 - 800E_FFFF | 64K | 12S/PWW |
| 800E 0000 - 800F FFFF | 64K | IPC |
| 8010 0000 - 8010-FFFF | 64K | DSP Timer and Counter |
| 8011 0000 - 8011 FFFF | 64K | DSP Debugger |
| 8012_0000-FFFF FFFF | | Reserved |

TABLE 180

DSP Program Memory (32 bit/word, word addressing)

| Address (Hex) | Size | Defirdtlon |
|---|---|---|
| 0000 - 0FFF | 4K × 32 | DSP Program RAM |
| 1000 - 7FFF | | Reserved |
| 8000 - 9FFF | 8K × 32 | Global RAM |
| A000 - FFFF | | Reserved |

TABLE 181

DSP Data0 Memory (24 bit/word, word addressing)

| Address (Hex) | Size | Defnition |
|---|---|---|
| 0000 - 0FFF | 4K × 24 | DSP X/Data0 RAM |
| 1000 - 3FFF | | Reserved |
| 4000 - 7FFF | 16K × 24 | DSP x/Data0 ROM |
| 8000 - 9FFF | 8K × 24 | |
| A000 - FFFF | | Reserved |

TABLE 182

DSP Data1 Memory (24 bWword, word addressing)

| Address | Size | Definition |
|---|---|---|
| 0000-0FFF | 4K × 24 | DSP Data1 RAM |
| 1000-3FFF | | Reserved |
| 4000-7FFF | 16K × 24 | DSP Data1 ROM |

TABLE 183

DSP Data1 Memory (24 bit/word, word addressing)

| Address | Size | Definition |
|---|---|---|
| 8000-9FFF | 8K × 24 | Global RAM |
| A000-FFFF | | Reserved |

TABLE 184

DSP Peripheral Memory Map (24 bitlword, word addressing)

| Address | Size | Definition |
|---|---|---|
| 0000-0FFF | 4K × 24 | DSP Internal Registers |
| 1000-1FFF | 4K × 24 | I2SIPWM |
| 2000-2FFF | 4K × 24 | DSP Debugger |
| 3000-3FFF | 4K × 24 | PC |
| 4000-4FFF | 4K × 24 | DSP Timer/Counter |
| 5000-5FFF | 4K × 24 | DSP G/X/Y/Z RAM Weak-write Control Register |
| 6000-FFFF | | Reserved |

TABLE 185

Hardware Modes (Boot-up Modes)

| | TACKITRSTn | TST[1:0] | PORTSTa1:0] |
|---|---|---|---|
| Normal 32 KHZ | x | 11 | )m |
| Normal ExtVCO | x | 00 | xx |
| TestOp VCObp | 1 | 10 | 11 |
| TestOp Xtalbp | 0 | 10 | 11 |
| Clocks Test | x | 10 | 10 |
| SCAN | x | 10 | 01 |
| ARM Off/bp | x | 10 | 00 |
| HiZ | x | at | 11 |
| VoL | 0 | 01 | 10 |
| VoH | 1 | 01 | 10 |
| XOR Tree | x | 01 | 01 |
| ARM ONby | x | 01 | 00 |
| Reserved | | | |

TABLE 186

Software Boot Sources

| GPIO[3:0] | Boot Source |
|---|---|
| 1111 | Boot from NAND FLASH |
| 1110 | Boot from External memory (CSO) |
| 1101 | Boot from Reserved |
| 1100 | Boot from Reserved |
| 1011 | Boot from Reserved |
| 1010 | Boot From Reserved |
| 1001 | Boot from Reserved |
| 1000 | Boot from Reserved |
| 0111 | Boot from Reserved |
| 0110 | Boot from Reserved |
| 0101 | Boot from Reserved |
| 0100 | Boot from DART |
| 0011 | Boot from Reserved |
| 0010 | JTAG enabled then loop |
| 0001 | GPIO Slave Boot |
| 0000 | Test Code (Bur-in) |

TABLE 187

SCAN Pins and Their Functions

| Pin | Function |
|---|---|
| GPIO[9:0] | Scan Data In[9:0] |
| GPIO[9:10] | Scan Data Out[9:0] |
| GPIO[26:201 | Scan Clock[8:0] |
| GPIO[29:271 | Scan Reset Fix[2:0] |
| GPIO[30] | Scan Enable |

TABLE 188

| DiePad | BGABall | QFPPin | Signal Name | Type | Strength | DefaultValue | PullResistor | Description |
|---|---|---|---|---|---|---|---|---|
| 126 | 82 | 1 | TDO | Digital Output | 4mA | 1 | 100K Up | JTAG Data Output |
| 127 | A2 | 2 | TCK | Digital Input | | 1 | 100K Up | JTAG Clocks Input |
| 128 | A1 | 3 | SPIFRM | Digital Output | 4mA | 1 | 100K Up | SPI Frame Signal |
| 1 | 81 | 4 | SPIRXD | Digital Input | | 1 | 100K Up | SPI Receiving Data |
| 2 | C2 | 5 | SPITXD | Digital Output | 4mA | 1 | 100K Up | SPI Transmitting Data |
| 3 | C1 | 6 | SPICLK | Digital Output | 8mA | 1 | 100K Up | SPI Serial Clock |
| 4 | D3 | 7 | CS4WEN | Digital Output | 4mA | 1 | 100K UP | Write Enable for Memory Space 4 |
| 5 | D2 | 8 | CS40EN | Digital Output | 4mA | 1 | 100K UP | Output Enable for Memory Space 4 |
| 6 | — | 9 | VDO RING | Supply | N/A | | | 3.3 V supply for I/O ring |
| 6 | — | 9 | VDD_RING | Supply | N/A | | | 3.3 V supply for I/O ring |
| 7 | — | — | SPEEDBND | | WA | | | |
| 8 | — | 10 | GND | Ground | N/A | | | Ground for I/O ring |
| 8 | — | 10 | GND | Ground | N/A | | | Ground for I/O ring |
| 9 | E3 | 11 | LCDMCLK/GPIO<15> | Digital InOut | 8mA | 1 | 100K UP | Master Clocks for LCD display panel/GPIO pin <15> (default) |
| 10 | E2 | 12 | LCDFRM/GPIO<14> | Digital InOut | 8mA | 1 | 100K UP | LCD Frame SignalUPIO pin <14> (default) |
| 11 | E1 | 13 | LCDCLI/GPIO<13> | Digital InOut | 4mA | 1 | 100K UP | LCDCL1/GPIO13 pin <13> (default) |
| 12 | F3 | 14 | LCDCL2/GPIO<12> | Digital InOut | 4mA | 1 | 100K UP | LCDCL2/GPIO pin <12> (default) |
| 13 | F1 | 15 | LCDDD<3>/GPIO<11> | Digital InOut | 4mA | 1 | 100K UP | LCD display Data<3>/GPIO pin <12> (default) |
| 14 | F2 | 16 | LCDDD<2>/GPIO<10> | Digital InOut | 4mA | 1 | 100K UP | LCD display Data<2>/GPIO pin <10> (default) |
| 15 | G3 | 17 | LCDGD<1>/-GPIO<9> | Digital InOut | 4mA | 1 | 100K UP | LCD <1> /display Data GPIO pin <9> (default) |
| 16 | G2 | 18 | LCDDO<0>/ GPIO<8> | Digital InOut | 4mA | 1 | 100K UP | LCD display Data<0>/GPIO pin <8> (default) |
| 17 | — | 19 | _VDD_CORE | Supply | N/A | | | 1.8 V–2.5 V supply for core circuit |
| 17 | — | 19 | VDD_CORE | Supply | WA | | | 1.8 V 2.5 V supply for core circuit |

TABLE 188-continued

| DiePad | BGABall | QFPPin | Signal Name | Type | Strength | DefaultValue | PullResistor | Description |
|---|---|---|---|---|---|---|---|---|
| 18 | — | 20 | GND | Ground | N/A | | | ground for core circuit |
| 18 | — | 20 | GND | Ground | N/ | | | ground for core circuit |
| 19 | G1 | 21 | GPIO<4>/LCDDD<4> | Digital InOut | 4mA | 1 | 100K UP | GPIO pin <4>(default LCD isplay Data<4> |
| 20 | H3-I | 2 | GPIO<5>/LCDDD<5> | Digital InOut | 4A | 1 | 100K UP | GPIO pin <5>(defaultu LCD display Data<5> |

TABLE 189

Pin-Out in BGA and QFP Packages

| | | | | | | | | |
|---|---|---|---|---|---|---|---|---|
| 21 | H1 | 23 | GPIO<6>/LCDDD<6> | Digital InOut | 4mA | 1 | 100K UP | GPIO pin <6>(default)/LCD display Data<6> |
| 22 | H2 | 24 | GPIO<7>/LCDDD<7> | Digital InOut | 4mA | 1 | 100K UP | GPIO pin <7>(default)/LCD display Data<7> |
| 23 | J2 | 25 | AD<19>/GPIO<19> | Digital InOut | 4mA | 1 | 100K UP | External Memory Address<19>(default)/GPIO pin <19> |
| 24 | I1 | 26 | AD<18>/GPIO<18> | Digital InOut | 4mA | 1 | 100K Up | External Memory Address<18>(default)/GPIO pin <18> |
| 25 | J3 | 27 | AD<17>/GPIO<17> | Digital InOut | 4mA | 1 | 100K UP | External Memory Address-0 7>(defautt)/GPIO pin <17> |
| 26 | K1 | 28 | AD<16>/GPIO<16> | Digital InOut | 4mA | 1 | 100K UP | External Memory Address<16>(defautt)/GPIO pin <16> |
| 27 | — | 29 | VDD RING | Supply | | | | 3.3 V supply for I/O ring |
| 27 | — | 29 | VDD RING | Supply | | | | 3.3 V supply for I/O ring |
| 28 | — | 30 | GND | Ground | | | | Ground for I/O ring |
| 28 | — | 30 | GND | Ground | | | | Ground for I/O ring |
| 29 | K2 | 31 | AD-05>/GPIO<31> | Digital InOut | 4mA | 1 | 100K UP | External Memory Address<15>(default)/GPIO pin <31> |
| 30 | L1 | 32 | AD<14>/IGPIO<30> | Digital InOut | 4mA | 1 | 100K UP | External Memory Address<14>(default)/GPIO pin <30> |
| 31 | K3 | 33 | AD<13>/GPIO<29> | Digitat InOut | 4mA | 1 | 100K UP | External Memory Address<13>(default)/GPIO pin <29> |
| 32 | L2 | 34 | AD<12>/GPIO<28> | Digihl InOut | 4mA | 1 | 100K UP | External Memory Address<12>(default)/GPIO pin <28> |
| 33 | M1 | 35 | AD<11>I GPIO<27> | Digital Inout | 4mA | 1 | I 00K UP | External Memory Address<11>(defauR) / GPIO pin >27> |
| 34 | N2 | 36 | AD<10>/GPIO<26> | Digital InOut | 4mA | 1 | 100K UP | External Memory Address<10>(default)/GPIO pin <26> |
| 35 | M3 | 37 | AD<9>/GPIO<25> | Digital InOut | 4mA | 1 | 100K UP | External Memory Address<9>(default)/GPIO pin <25> |

TABLE 189-continued

Pin-Out in BGA and QFP Packages

| | | | | | | | | |
|---|---|---|---|---|---|---|---|---|
| 36 | N3 | 38 | AD<8>/ GPIO<24> | Digital InOut | 4mA | 1 | 100K UP | External Memory Address<8>(default)/GPIO pin <24> |
| 37 | L4 | 39 | AD<7>/ GPIO<23> | Digital InOut | 4mA | 1 | 100K UP | External Memory Address<7>(default)/GPIO pin <23> |
| 38 | M4 | 40 | AD<6>/ GPIO<22> | Digital InOut | 4mA | 1 | 100K UP | External Memory Address<6>(default)/GPIO pin <22> |
| 39 | N4 | 41 | AD<5>/ GPIO<21> | Digital Ou | 4mA | 1 | 100K UP | External Memory Address<5>(default)/GPIO pin <21> |
| 40 | L5 | 42 | AD<4>/ GPIO<20> | Digital InOut | 4mA | 1 | 100K UP | External Memory Address<4>(defauft)/GPIO pin <20> |
| 41 | | 43 | VDD RING | Supply | | | | 3.3 V supply for I/O ring |
| 41 | | 43 | VDD RING | Supply | | | | 3.3 V supply for I/O ring |
| 42 | | 44 | GND | Ground | | | | Ground for I/O ring |
| 42 | | 44 | GND | Ground | | | | Ground for I/O ring |
| 43 | M5 | 45 | AD<3> | Digital Output | 4mA | 1 | 100K UP | External Memory Address<> |
| 44 | N5 | 46 | AD<2> | Digital Output | 4mA | 1 | 100K UP | External Memory Address<2> |
| 45 | L6 | 47 | AD<1> | Digital Output | 4mA | 1 | 100K UP | External Memory Address<1> |
| 46 | N6 | 48 | AD<0> | Digital Output | 4mA | 1 | 100K Up | External Memory Address<0> |
| 47 | M6 | 49 | RDn | Digital Output | 8mA | 1 | 100K Up | External Memory Read Enable |
| 48 | L7 | 50 | WRn | Digital Output | 8mA | 1 | 100K Up | External Memory Write Enable |
| 49 | N7 | 51 | DA<0> | Digital InOut | 4mA | 1 | 100K. Up | Data<0> for External Memory Interface |
| 50 | M7 | 52 | DA<1> | Digital InOut | 4mA | 1 | 100K Up | Data<1> for External Memory Interface |
| 51 | LS | 53 | DA<2> | Digital InOut | 4mA | 1 | 100K Up | Data-<2> for External Memory Interface |
| 52 | M8 | 54 | DA<3> | Digital InOut | 4mA | 1 | 100K Up | Data<3> for External Memory Interface |
| 53 | N8 | 55 | DA<4> | Digital InOut | 4mA | 1 | I 00K Up | Data<4> for External Memory Interface |
| 54 | L9 | 56 | DA<5> | Digital InOut | 4mA | 1 | 100K Up | Data<5> for External Memory Interface |
| 55 | N9 | 57 | DA<S> | Digital InOut | 4mA | 1 | 100K Up | Data<6> for External Memory Interface |
| 56 | M9 | 58 | DA<7> | Digital InOut | 4mA | 1 | 100K Up | Data-<7> for External Memory Interface |
| 57 | — | 59 | VDD_CORE | Supply | N/A | | | 1.8 V–2.5 V supply for core circuit |
| 57 | — | 59 | VDD_CORE | Supply | N/A | | | 15 SV–2.5 V supply for core circuit |
| 58 | — | 60 | _GND- | Ground | N/A | | | Ground for core circuit |
| 58 | — | 60 | GND | Ground | N/A | | | Ground for core circuit |
| 59 | — | 61 | VDD_RING | Supply | N/A | | | |
| 59 | — | 61 | VDD_RING | Supply | N/A | | | |
| 60 | — | 62 | GND | Ground | WA | | | |
| 60 | — | 62 | GND | Ground | N/A | | | |
| 61 | M10 | 63 | DA<8> | Digital InOut | 4mA | 1 | 100K Up | Data<8> for External Memory Interface |

TABLE 189-continued

Pin-Out in BGA and QFP Packages

| | | | | | | | | |
|---|---|---|---|---|---|---|---|---|
| 62 | N71 | 64 | DA<9> | Digital InOut | 4mA | 1 | 100K Up | Data-<9> for External Memory Interface |
| 63 | M11 | 65 | DA<10> | Digital InOut | 4mA | 1 | 100K Up | Data<10> for External Memory Interface |
| 64 | L10 | 66 | DA<11> | Digital InOut | 4mA | 1 | 100K Up | Data<11> for External Memcry Interface |
| 65 | N12 | 67 | DA<12> | Digital InOut | 4mA | 1 | 100K Up | Data<12> for External Memory Interface |
| 66 | M13 | 68 | DA<13> | Digital InOut | 4mA | 1 | 100K Up | Data<13> for External Memory interface |
| 67 | L12 | 69 | DA<14> | Digital InOut | 4mA | 1 | 100K Up | Data<14> for External Memory Interface |
| 68 | L13 | 70 | DA<15> | Digital InOut | 4mA | 1 | 100K Up | Data<15> for External Memory Interface |
| 69 | K5 | 71 | VDD RING | Supply | | | | |
| 69 | K5 | 71 | VDD RING | Supply | | | | |
| 70 | — | 72 | GND | Ground | | | | |
| 70 | — | 72 | GND | Ground | | | | |
| 71 | K12 | 73 | CSn<0> | Digital Output | 4mA | 1 | 100K Up | Chip Select <0> for External Memory Interface |
| 72 | K13 | 74 | CSn<1> | Digital Output | 4mA | 1 | 100K Up | Chip Select <1> for External Memory Interface |
| 73 | K11 | 75 | CSn<2> | Digital Output | 4mA | 1 | 100K Up | Chip Select <2> for External Memory Interface |
| 74 | J13 | 76 | CSN<3> | Digital Output | 4mA | 1 | 100K Up | Chip Select <3> for External Memory Interface |
| 75 | J12 | 77 | DQM<0> | Digital Output | 4mA | 1 | 100K Up | Byte Enable <0> |
| 76 | i11 | 78 | DQM<1> | Digital Output | 4mM | 1 | 100K Up | Byte Enable <1> |
| 77 | H13 | 79 | DAIMCLK | Digital InOut | 8mA | 1 | 100K Up | Digital Audio Interface Master Clocks |
| 78 | H11 | 80 | DAISCLK | Digital InOut | 8mA | 1 | 100K Up | Digital Audio Interface Serial Clocks |
| 79 | G13 | 81 | DAILRCK | Digital InOut | 4mA | 1 | 100K Up | Digital Audio Interface LR Clocks |
| 80 | G11 | 82 | DAIRX | Digital Input | | 1 | 100K Up | Digital Audio Input Data |
| 81 | H12 | 83 | DAITX | Digital Output | 4mA | 1 | 100K Up | Digital Audio Output Data |
| 82 | F13 | 84 | PWMLVDD | Supply | | | | PWM VDD for external components for L-Channel |
| 83 | F11 | 85 | PWML | Analog out | | | | PWM L-channel Output |
| 84 | G12 | 86 | PWMLGND | Ground | | | | PWM Driver Ground for L-channel |
| | — | 87 | | | | | | |
| 85 | E13 | 88 | PWMRGND | Ground | | | | PWM Driver Ground for R-channel |
| 86 | E11 | 89 | PWMR | Analog out | | | | PWM R-channel Output |
| 87 | F12 | 90 | PWMRVDD | Supply | | | | PWM VDD for external components far R-Channel |
| 88 | — | 91 | GND | Ground | | | | |
| 88 | — | 91 | GND | Ground | | | | |
| 89 | — | 92 | VDD CORE | Supply | | | | |

TABLE 189-continued

Pin-Out in BGA and QFP Packages

| 89 | — | 92 | VDD CORE | Supply | | | | |
| 90 | E12 | 93 | USBp | Analog InOut | | | | Use D+ pin |
| 91 | D12 | 94 | USBn | Analog InOut | | | | Use D− pin |
| 92 | D13 | 95 | GPIO<0> | Digital InOut | 4mA | 1 | 100K Up | GPIO pin <0> with Interrupt capability |
| 93 | D11 | 98 | GPIO<1> | Digital InOut | 4mA | 1 | 100K Up | GPIO pin <1> with Interrupt capability |
| 94 | C13 | 97 | GPIO<2> | Digital InOut | 4mA | 1 | 100K Up | GPIO pin <2> with Interrupt capability |
| 95 | C12 | 98 | GPIO<3> | Digital InOut | 4mA | 1 | 100K Up | GPIO pin <3> with Interrupt capability |
| 98 | — | 99 | VDD RING | Supply | | | | |
| 96 | — | 99 | VDD_RING | Supply | | | | |
| 97 | — | 100 | GND | Ground | | | | |
| 97 | — | 100 | GND | Ground | | | | |
| 98 | B12 | 101 | UARTRXD | Digital Input | | 1 | 100K Up | UART input data |
| 99 | B11 | 102 | UARTTXD | Digital Output | 4mA | 1 | 100K Up | UART output data |
| 100 | C11 | 103 | STBYGND | Ground | | | | Standby ground |
| 101 | A11 | 104 | RTCXTALO | Analog Output | | | | On-chip 32 KHz Oscillator Output |
| 102 | B10 | 105 | RTCXTALI | Analog Input. | | | | On-chip 32 KHz Oscillator Input |
| 103 | C10 | 108 | STBYVDD | Supply | | | | Standby 3.3 V supply |
| 104 | A10 | 107 | WAKEUP | Digital input | | | | Wake up signal to exit stand-by mode |
| 105 | C9 | 108 | STBYn | Digital Output | 4mA | 0 | | Super Stand-by mode (active low) |
| 106 | A9 | 109 | PRSTn | Digital Input | | 1 | 60K Up | Power On Reset (active low) |
| 107 | B9 | 110 | RSTOn | Digital Input | | 1 | 60K Up | User Reset (active low) |
| 108 | C8 | 111 | VIN<1> | Analog Input | | | | Filter pin for PLL1 loop filter (for main clocks) |
| 109 | A8 | 112 | VIN<0> | Analog input | | | | Filter pin for PLL2 finer topology (for main clocks) |
| 110 | B8 | 113 | QVDD33 | Supply | | | | |
| 111 | C7 | 114 | QGND33 | Ground | | | | |
| 112 | 87 | 115 | MTPFLT | Analog InOut | | | | Filter pin for PLL2 finer topology (for USB) |
| 113 | A7 | 116 | MLPFLT | Analog InOut | | | | Filter pin for PLL2 loop Filter (for USB) |
| 114 | C6 | 117 | UTPFLT | Analog InOut | | | | Voltage input <1> for ADC |
| 115 | B6 | 118 | ULPFLT | Analog InOut | | | | Voltage input <0> for ADC |
| 116 | A6 | 119 | ASSIC/ PORTSTO | Digital InOut, Open Drain when in DSP SSI debug mode | 4mA | 1 | 100K Up | DSP SSI debug clock/additional test mode selection by PRSTn signal. |

TABLE 189-continued

Pin-Out in BGA and QFP Packages

| | | | | | | | | |
|---|---|---|---|---|---|---|---|---|
| 117 | C5 | 120 | A12CD/ PORTSTI | Digital InOut, Open Drain when in DSP SSI debug mode | 4mA | 1 | 100K Up | DSP SSI debug data/additional test mode selection by PRSTn signal. |
| 118 | A5 | 121 | EXTCLKI | Digital Input | | 1 | | External Clocks Input |
| 119 | B5 | 122 | EECLK | Digital Output | 8mA | 1 | 100K Up | ARM SSI peripheral clock. |
| 120 | C4 | 123 | EEDAT | Digital InOut | 4mA | 1 | 100K Up | ARM SSI peripheral data. |
| 121 | A4 | 124 | TEST<1>/ TREQB | Digital Input | | I | 100K Up | Test Mode 1/TIC Req B |
| 122 | B4 | 125 | TEST<0>/ TREQA | Digital Input | | I | 100K Up | Test Mode 0/TIC Req A |
| 123 | C3 | 126 | TACK/TRSTn | Digital InOut | 4mA | 1 | 100K Up | TIC Acknowledge/JTAG Reset |
| 124 | A3 | 127 | TMS | Digital Input | | 1 | 100K Up | JTAG mode selection |
| 125 | B3 | 128 | TDI | Digital Input | | 1 | 100K Up | JTAG data input |
| | L11 | | GND | | | | | |
| | M12 | | GND | | | | | |
| | N13 | | GND | | | | | |
| | D7 | | GND | | | | | |
| | D9 | | GND | | | | | |
| | F10 | | GND | | | | | |
| | J10 | | GND | | | | | |
| | K7 | | GND. | | | | | |
| | K9 | | GND | | | | | |
| | K10 | | GND | | | | | |
| | 05 | | GND | | | | | |
| | E4 | | GND | | | | | |
| | G4 | | GND | | | | | |
| | H4 | | GND | | | | | |
| | K6 | | GND | | | | | |
| | D8 | | VDD CORE | | | | | |
| | E10 | | VDD CORE | | | | | |
| | K8 | | VDD_CORE | | | | | |
| | D6 | | VDD_CORE | | | | | |
| | F4 | | VDD CORE | | | | | |
| | D10 | | VDD RING | | | | | |
| | 04 | | VDD RING | | | | | |
| | G10 | | VDD RING | | | | | |
| | H10 | | VDD RING | | | | | |
| | J4 | | VDD RING | | | | | |
| | K4 | | VDD RING | | | | | |
| | K5 | | VDD RING | | | | | |
| | L3 | | VDD RING | | | | | |
| | M2 | | VDD RING | | | | | |
| | N1 | | VDD RING | | | | | |
| | N10 | | NC1 | | | | | |
| | 813 | | NC2 | | | | | |
| | A13 | | NC3 | | | | | |
| | A12 | | NC4 | | | | | |
| | D1 | | NC5 | | | | | |

What is claimed:

1. A debug subsystem for testing a system-on-a-chip including an embedded processor and memory comprising:
   at least one sub-block operable to:
   monitor a data bus between the processor and the memory to detect program selected triggering events, the triggering events including predetermined data values appearing on the data bus;
   count the number of triggering events detected; and
   when the number of triggering events reaches a program selected threshold, generating a debugging signal.

2. The debug subsystem of claim 1 wherein the triggering events further include memory accesses.

3. The debug subsystem of claim 2 wherein the memory accesses are selected from the group including reads and writes.

4. The debug subsystem of claim 2 wherein the triggering events comprise memory accesses within a selected address range.

5. The debug subsystem of claim 1 wherein the debugging signal is operable to freeze a clock timing the operation of the processor.

6. The debug subsystem of claim 1 wherein the debugging signal comprises an interrupt to the processor.

7. A system on a chip comprising:

at least one processor;

a plurality of memory spaces accessible by said processor via address and data buses; and a debug block comprising a plurality of independently programmable debug sub-blocks each for monitoring accesses to a selected one of said memories and detecting triggering events, each sub-block comprising:

a first register for setting triggering event parameters;

a second register for setting a threshold number of triggering events;

a counter for maintaining a count of detected triggering events; and circuitry for generating a control signal when the count reaches the threshold.

8. The system of claim 7 wherein said triggering event parameters set in said first register select a selected one of the memories, select a memory access type and select an address range for detecting the access.

9. The system of claim 8 wherein said control signal freezes a dock driving said processor.

10. The system of claim 7 wherein said triggering event parameters set in said first register select a value of data accessed from the selected one of the memories.

11. The system of claim 7 wherein said control signal comprises an interrupt to said processor.

12. The system of claim 7 further comprising a second processor and said control signal comprises an interrupt to at least one of said processors.

13. The system of claim 12 wherein said second processor can access said memories and generate trigger events.

14. The system of claim 12 wherein said processor comprises a digital signal processor and said second processor comprises a microprocessor.

15. A method of debugging a single-chip system including an embedded processor and memory including a plurality of memory spaces, comprising the steps of:

selecting programmable triggering event parameters including selecting one of the memory spaces for monitoring;

monitoring transactions between the processor and the memory to detect triggering events corresponding to the selected triggering event parameters;

counting the number of triggering events detected; and when the number of triggering events reaches a programmed predetermined threshold, generating a debugging signal.

16. The method of claim 15 wherein said step of selecting triggering event parameters further comprises the substeps of:

selecting a triggering memory access type; and selecting a triggering address range.

17. The method of claim 15 wherein said step of monitoring comprises the step of monitoring an address bus to the memory for memory accesses meeting the triggering event parameters.

18. The method of claim 15 wherein said step of selecting triggering event parameters further comprises the substep of selecting triggering events to step through code being run by the processor.

\* \* \* \* \*

UNITED STATES PATENT AND TRADEMARK OFFICE
CERTIFICATE OF CORRECTION

PATENT NO. : 6,948,098 B2
APPLICATION NO. : 09/822052
DATED : September 20, 2005
INVENTOR(S) : Sanjay Ramakrishna Pillay and Raghunath Kirisha Rao It is certified that error appears in the above-identified patent and that said Letters Patent is hereby corrected as shown below:

Column 19, Line 67, last paragraph, "he" should be -- the --;

Column 20, Line 2, "706k" should be --706 --;

Column 25, Line 42, "disturbe" should be -- disturb --;

Column 25, Line 46, "688" should be -- 68 --;

Column 27, Line 2, "FIFO_1 STATE" should be -- FIFO_1_STATE --;

Column 27, last line, "microprocessor" should be -- Microprocessor --;

Column 40, Line 17, "STC_COUNTERO" should be -- STC_COUNTER0 --;

Column 42, last line, after "weak1", the following sentence should be inserted:
-- Tables 173-175 illustrate the mapping for the microprocessor 101 memory access projection registers. --;

Column 48, Table 1, description for LineLength, line beginning "dots = 1", "andid" should be -- andld --;

Column 57, Table 26, Line 6 of header, "master" should be -- masters --;

Column 57, Table 27, Line 4 of header, "master" should be -- masters --;

Column 58, Table 28, Line 5 of header, "master" should be -- masters --;

Column 60, Table 34, Type for "SDEC" should be -- R/W --;

Column 64, Table 49, Lines 30, 33, 36 and 39, "harware" should be -- hardware --;

Column 75, Table 65, Line 24, should read -- prevents engine from starting if it has --;

Column 88, Table 95, Line 1 of table, "d_Manufacturer" should be
-- d_iManufacturer --;

UNITED STATES PATENT AND TRADEMARK OFFICE
CERTIFICATE OF CORRECTION

PATENT NO. : 6,948,098 B2
APPLICATION NO. : 09/822052
DATED : September 20, 2005
INVENTOR(S) : Sanjay Ramakrishna Pillay and Raghunath Kirisha Rao It is certified that error appears in the above-identified patent and that said Letters Patent is hereby corrected as shown below:

Column 95, Table 111, First line of Header should read
-- EP2DESC1 (Endpoint 2 Descriptor1, --;

Column 97, Table 113, the Reset Value for "ep3_wMaxPacket Size" should be
-- 0x40 --;

Column 102, Table 130, Line 61, "s_pmdk" should be -- sp_mdk --;

Column 109, Table 146, Line 1 of header should begin with -- GPIO Interrupt Mask Register --;

Column 109, Table 147, next to last line of table, "generated" should be -- generates --;

Column 111, Table 148, Line 12, "GPIO[2]" should read -- GPIO[12] --;

Column 116, Table 157, second line of table "sae" should be -- case --;

Column 125, Table 177, Function Block for line beginning "8008_0000 - 8008_FFFF" should read -- Remap Pause Control --;

Column 129, Table 179, Function Block for line beginning "8003 0000 - 8003 FFFF" should read -- Battery Volume Checker --;

Column 129, Table 180, second line of header, "Defirdtlon" should be -- Definition --;

UNITED STATES PATENT AND TRADEMARK OFFICE
CERTIFICATE OF CORRECTION

PATENT NO. : 6,948,098 B2
APPLICATION NO. : 09/822052
DATED : September 20, 2005
INVENTOR(S) : Sanjay Ramakrishna Pillay and Raghunath Kirisha Rao It is certified that error appears in the above-identified patent and that said Letters Patent is hereby corrected as shown below:

Spanning Columns 131 & 132, Table 188, the description for DiePad 12 should read -- DCL2/GPIO1 pin <12> default) --;

Spanning Columns 131 & 132, Table 188, the Signal Name for 17 (second occurrence) should be -- _VDD_CORE --.

Signed and Sealed this

Seventh Day of October, 2008

JON W. DUDAS
*Director of the United States Patent and Trademark Office*